US011990392B2

(12) United States Patent
Hayashi et al.

(10) Patent No.: US 11,990,392 B2
(45) Date of Patent: May 21, 2024

(54) SEMICONDUCTOR DEVICE

(71) Applicant: ROHM CO., LTD., Kyoto (JP)

(72) Inventors: Kenji Hayashi, Kyoto (JP); Takumi Kanda, Kyoto (JP); Hidetoshi Abe, Kyoto (JP)

(73) Assignee: ROHM CO., LTD., Kyoto (JP)

(*) Notice: Subject to any disclaimer, the term of this patent is extended or adjusted under 35 U.S.C. 154(b) by 296 days.

(21) Appl. No.: 17/437,715

(22) PCT Filed: May 13, 2020

(86) PCT No.: PCT/JP2020/019072
§ 371 (c)(1),
(2) Date: Sep. 9, 2021

(87) PCT Pub. No.: WO2020/235410
PCT Pub. Date: Nov. 26, 2020

(65) Prior Publication Data
US 2022/0148949 A1    May 12, 2022

(30) Foreign Application Priority Data

May 20, 2019    (JP) ................................ 2019-094797
May 24, 2019    (JP) ................................ 2019-097989

(51) Int. Cl.
*H01L 23/495*    (2006.01)
*H01L 23/00*    (2006.01)
*H01L 23/31*    (2006.01)

(52) U.S. Cl.
CPC .... *H01L 23/49562* (2013.01); *H01L 23/3121* (2013.01); *H01L 24/48* (2013.01); *H01L 2224/48177* (2013.01)

(58) Field of Classification Search
CPC .......... H01L 23/49562; H01L 23/3121; H01L 23/49541; H01L 23/49548; H01L 23/49568; H01L 23/3107; H01L 24/48
See application file for complete search history.

(56) References Cited

U.S. PATENT DOCUMENTS

2004/0262720 A1    12/2004    Satou et al.
2006/0226532 A1    10/2006    Satou et al.
(Continued)

FOREIGN PATENT DOCUMENTS

JP    2005026294    1/2005
JP    2016072376    5/2016
(Continued)

OTHER PUBLICATIONS

International Preliminary Report on Patentability issued for International Patent Application No. PCT/JP2020/019072, dated Dec. 2, 2021, 15 pages including English translation.
(Continued)

*Primary Examiner* — Marc Anthony Armand
(74) *Attorney, Agent, or Firm* — HSML P.C.

(57) ABSTRACT

A semiconductor device includes a substrate including a main surface, a semiconductor element mounted on the main surface, a drive pad, and drive wires. The semiconductor element includes a front surface that faces in a same direction as the main surface and a drive electrode formed on the front surface and containing SiC. The drive wires are spaced apart from each other and connect the drive electrode to the drive pad. The drive wires include a first drive wire and a second drive wire configured to be a combination of furthermost ones of the drive wires. The first drive wire and the second drive wire are separated from each other by a greater (Continued)

distance at the drive pad than at the drive electrode as viewed in a first direction that is perpendicular to the main surface of the substrate.

20 Claims, 65 Drawing Sheets

(56) References Cited

U.S. PATENT DOCUMENTS

| | | |
|---|---|---|
| 2009/0236728 A1 | 9/2009 | Satou et al. |
| 2010/0276798 A1 | 11/2010 | Satou et al. |
| 2013/0020715 A1 | 1/2013 | Satou et al. |
| 2014/0332866 A1 | 11/2014 | Satou et al. |
| 2015/0380378 A1 | 12/2015 | Satou et al. |
| 2016/0093561 A1* | 3/2016 | Tabira .................. H01L 24/97 257/676 |
| 2016/0240654 A1 | 8/2016 | Ohtani et al. |
| 2016/0294379 A1 | 10/2016 | Hayashiguchi et al. |
| 2017/0179108 A1* | 6/2017 | Okuda ................ H01L 23/4952 |
| 2018/0090463 A1 | 3/2018 | Satou et al. |
| 2018/0190642 A1 | 7/2018 | Okuda et al. |
| 2018/0204943 A1 | 7/2018 | Ohtani et al. |
| 2021/0143132 A1* | 5/2021 | Kakefu .................. H01L 24/48 |

FOREIGN PATENT DOCUMENTS

| | | |
|---|---|---|
| JP | 2016152242 | 8/2016 |
| JP | 2017147433 | 8/2017 |
| JP | 2017174951 | 9/2017 |
| JP | 2019071490 A | 5/2019 |

OTHER PUBLICATIONS

International Search Report and Written Opinion issued for International Patent Application No. PCT/JP2020/019072, dated Jul. 28, 2020, 17 pages including English translation of Search Report.
Notice of Reasons for Refusal issued for Japanese Patent Application No. 2021-520729, Dispatch Date: Jan. 16, 2024, 16 pages including English machine translation.

* cited by examiner

SEMICONDUCTOR DEVICE

TECHNICAL FIELD

The present disclosure relates to a semiconductor device.

BACKGROUND ART

A semiconductor device includes a substrate, a semiconductor element that is a power transistor or the like and is mounted on the substrate, a drive lead having a drive pad connected to a source electrode of the semiconductor element by drive wires, a control lead having a control pad connected to a gate electrode of the semiconductor element by a control wire, and an encapsulation resin encapsulating at least the semiconductor element (refer to, for example, Patent Documents 1 and 2). In Patent Document 2, the drive lead includes a drive terminal projecting from the encapsulation resin. The semiconductor element is connected to the substrate by solder.

PRIOR ART DOCUMENTS

Patent Documents

Patent Document 1: Japanese Laid-Open Patent Publication No. 2017-174951
Patent Document 2: Japanese Laid-Open Patent Publication No. 2016-152242

SUMMARY OF THE INVENTION

Problems that the Invention is to Solve

For example, in the semiconductor device disclosed in Patent Document 1, three drive wires are arranged next to one another at slight distances. Since the three drive wires are connected to the source electrode and the drive pad, inductance is reduced as compared to a structure having a single drive wire. However, there is still room for improvement in reduction of an inductance that is caused by a layout relationship of drive wires. Such an issue is not limited to a switching element and may be applied to a semiconductor device including a diode instead of a switching element.

In addition, for example, in the semiconductor device described in Patent Document 2, the substrate is exposed from the rear surface of the encapsulation resin to improve the heat dissipation performance of the semiconductor element. However, because the substrate is exposed from the rear surface of the encapsulation resin, there is room for improvement in dielectric strength between the drive terminal and the substrate.

It is an object of the present disclosure to provide a semiconductor device that reduces the inductance and also provide a semiconductor device that improves a dielectric withstanding voltage while limiting the lowering of the heat dissipation performance of a semiconductor element.

Means for Solving the Problems

To achieve the above object a first aspect of a semiconductor device according to the present disclosure includes a substrate including a main surface, a semiconductor element mounted on the main surface, the semiconductor element including a front surface that faces in a same direction as the main surface and a drive electrode formed on the front surface and containing SiC, a drive pad, and drive wires spaced apart from each other and connecting the drive electrode to the drive pad. The drive wires include a first drive wire and a second drive wire configured to be a combination of furthermost ones of the drive wires. The first drive wire and the second drive wire are connected to the drive electrode and the drive pad so that the first drive wire and the second drive wire are separated from each other by a greater distance at the drive pad than at the drive electrode as viewed in a first direction that is perpendicular to the main surface.

An increase in the distance between the first drive wire and the second drive wire, which are configured to be the combination of the furthermost ones of the drive wires, reduces the inductance between the drive electrode and the drive pad. In this regard, in the semiconductor device, the distance between the two drive wires is increased, so that the inductance between the drive electrode and the drive pad is reduced.

A second aspect of a semiconductor device according to the present disclosure includes a substrate including a main surface, a semiconductor element mounted on the main surface, the semiconductor element including a front surface that faces in a same direction as the main surface and a drive electrode formed on the front surface and containing SiC, a drive pad; and drive wires spaced apart from each other and connecting the drive electrode to the drive pad. The semiconductor element includes an insulation film formed on the drive electrode and an opening formed in a portion of the insulation film to expose the drive electrode. When a direction perpendicular to the main surface is a first direction, a direction orthogonal to the first direction is a second direction, and a direction orthogonal to the first direction and the second direction is a third direction, the opening is rectangular so that a short-side direction conforms to the second direction and a long-side direction conforms to the third direction as viewed in the first direction. The drive wires include a first drive wire and a second drive wire configured to be a combination of furthermost ones of the drive wires. The drive electrode includes an exposed region exposed by the opening. The exposed region includes a first exposed end and a second exposed end that are opposite ends in the third direction. The first drive wire is connected to a portion of the exposed region located closer to the first exposed end than a central portion of the exposed region in the third direction. The second drive wire is connected to a portion of the exposed region located closer to the second exposed end than the central portion of the exposed region in the third direction.

An increase in the distance between the first drive wire and the second drive wire, which are configured to be the combination of the furthermost ones of the drive wires, reduces the inductance between the drive electrode and the drive pad. In this regard, in the semiconductor device, the distance between the two drive wires is increased, so that the inductance between the drive electrode and the drive pad is reduced.

A third aspect of a semiconductor device according to the present disclosure includes a substrate including a main surface and a rear surface that face in opposite directions, a semiconductor element mounted on the main surface of the substrate and containing SiC, an encapsulation resin that encapsulates the semiconductor element, and a terminal projecting from a first side surface of the encapsulation resin that faces in a direction parallel to the main surface. The rear surface of the substrate includes a portion located toward the first side surface and including an indent that extends from the rear surface toward the main surface. The encapsulation resin is partially received in the indent, so that a distance from the first side surface to an exposed surface of the rear surface of the substrate exposed from the encapsulation resin is greater than a distance from another side surface of the encapsulation resin to the exposed surface.

In this configuration, the substrate includes the exposed surface exposed from the rear surface of the encapsulation resin. This limits lowering of the performance of the substrate that dissipates heat from the semiconductor element. In addition, the indent formed in the rear surface of the substrate increases the distance from the first side surface of the encapsulation resin to the exposed surface along the rear surface of the encapsulation resin. This extends the creepage distance, that is, the distance from the terminal to the exposed surface along the front surface of the encapsulation resin. Thus, the dielectric withstanding voltage of the semiconductor device is improved. As a result, while limiting the lowering of the heat dissipation performance of the semiconductor element, the dielectric withstanding voltage is improved.

Effects of the Invention

The semiconductor device described above reduces an inductance. The semiconductor device also improves the dielectric withstanding voltage while limiting the lowering of the heat dissipation performance of a semiconductor element.

MODES FOR CARRYING OUT THE INVENTION

Embodiments of a semiconductor device will be described below with reference to the drawings. The embodiments described below exemplify configurations and methods for embodying a technical concept and are not intended to limit the material, shape, structure, layout, dimensions, and the like of each component to those described below. The embodiments described below may undergo various modifications.

First Embodiment

Figure 4:
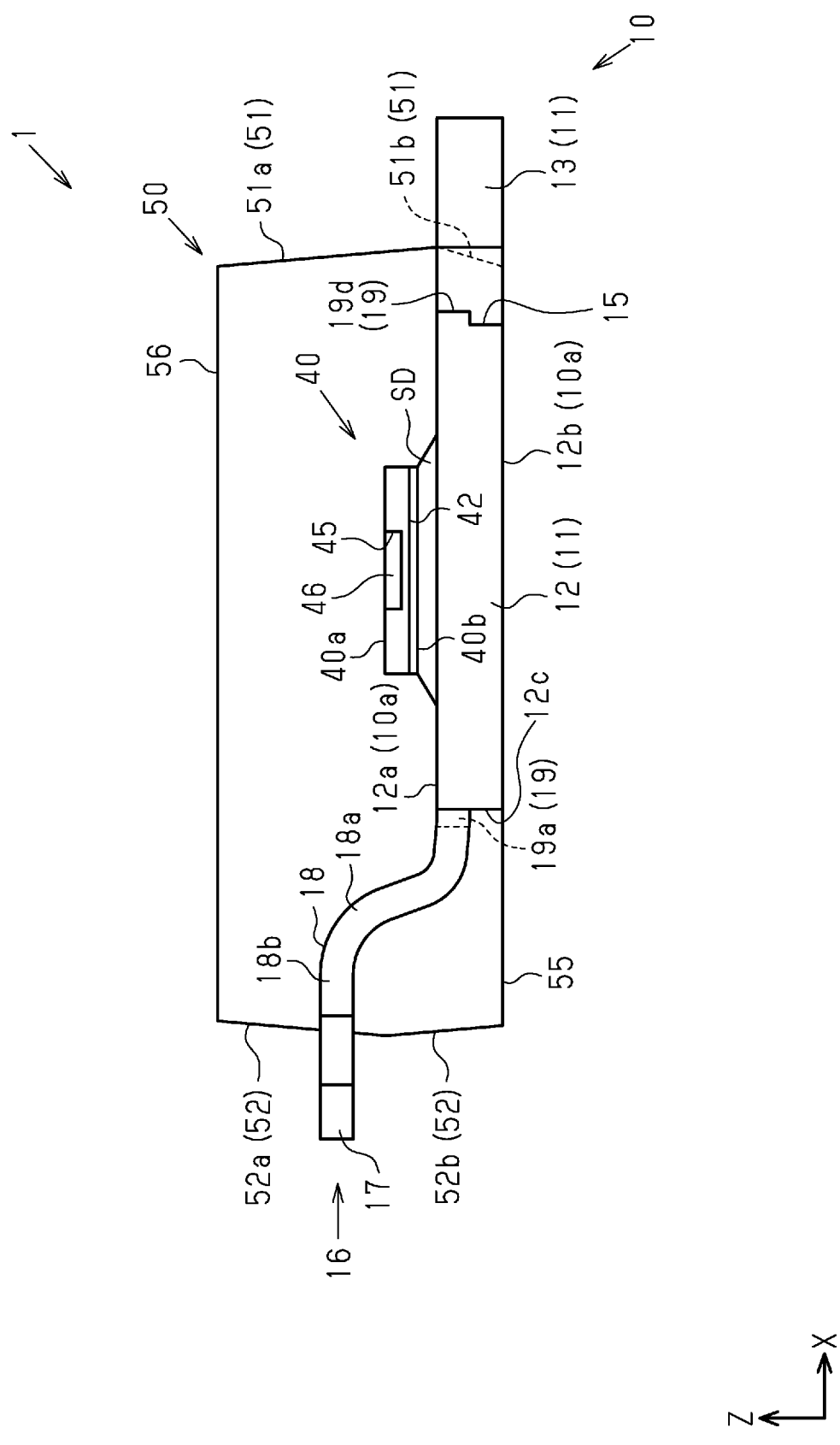
FIG. 4 is a schematic cross-sectional view taken along line 4-4 in FIG. 1.
Figure 5:
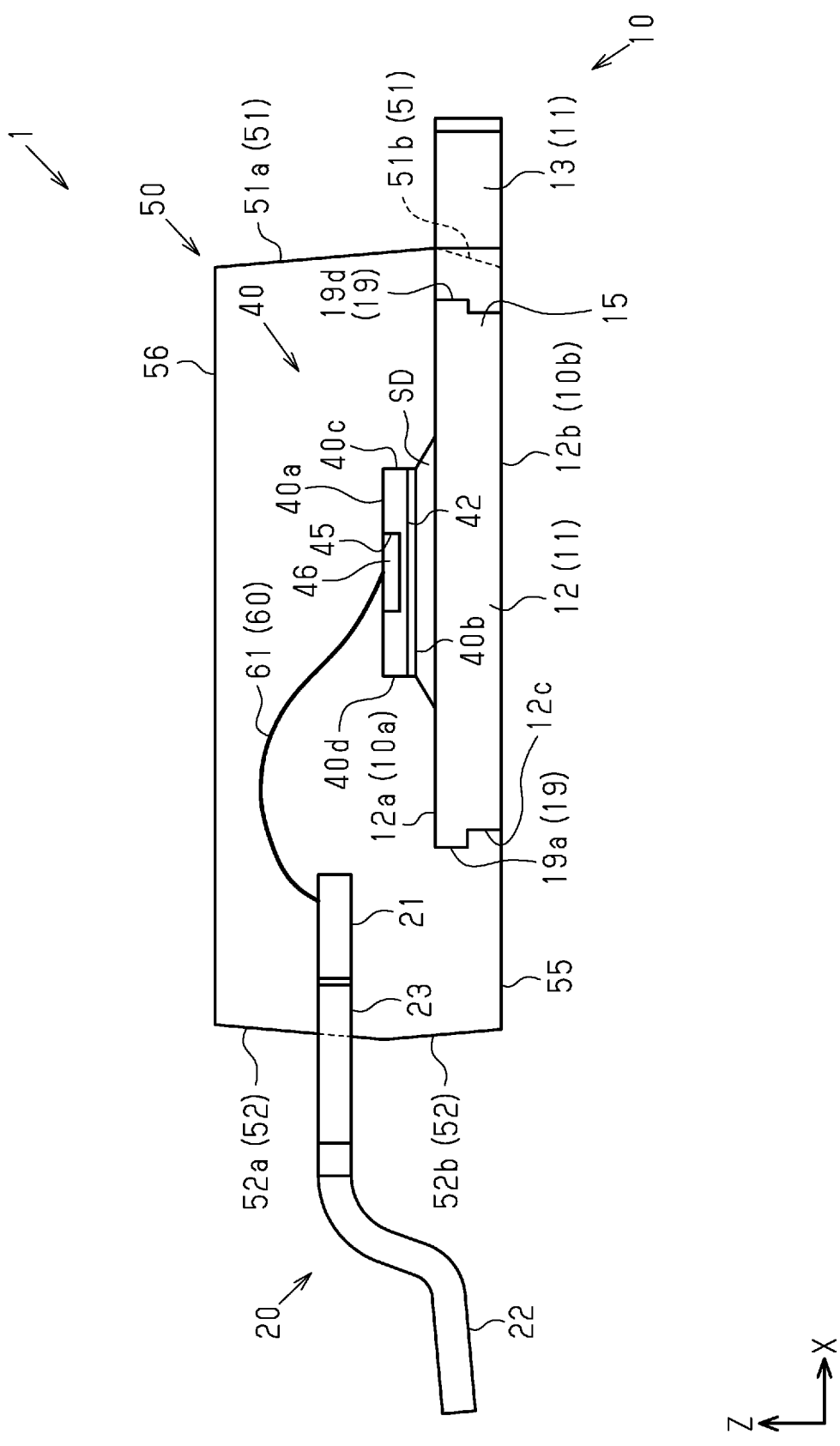
FIG. 5 is a schematic cross-sectional view taken along line 5-5 in FIG. 1.

A first embodiment of a semiconductor device will now be described with reference to FIGS. 1 to 11. In FIGS. 4 and 5, hatching is omitted from the cross-sectional views for the sake of convenience.

Figure 1:
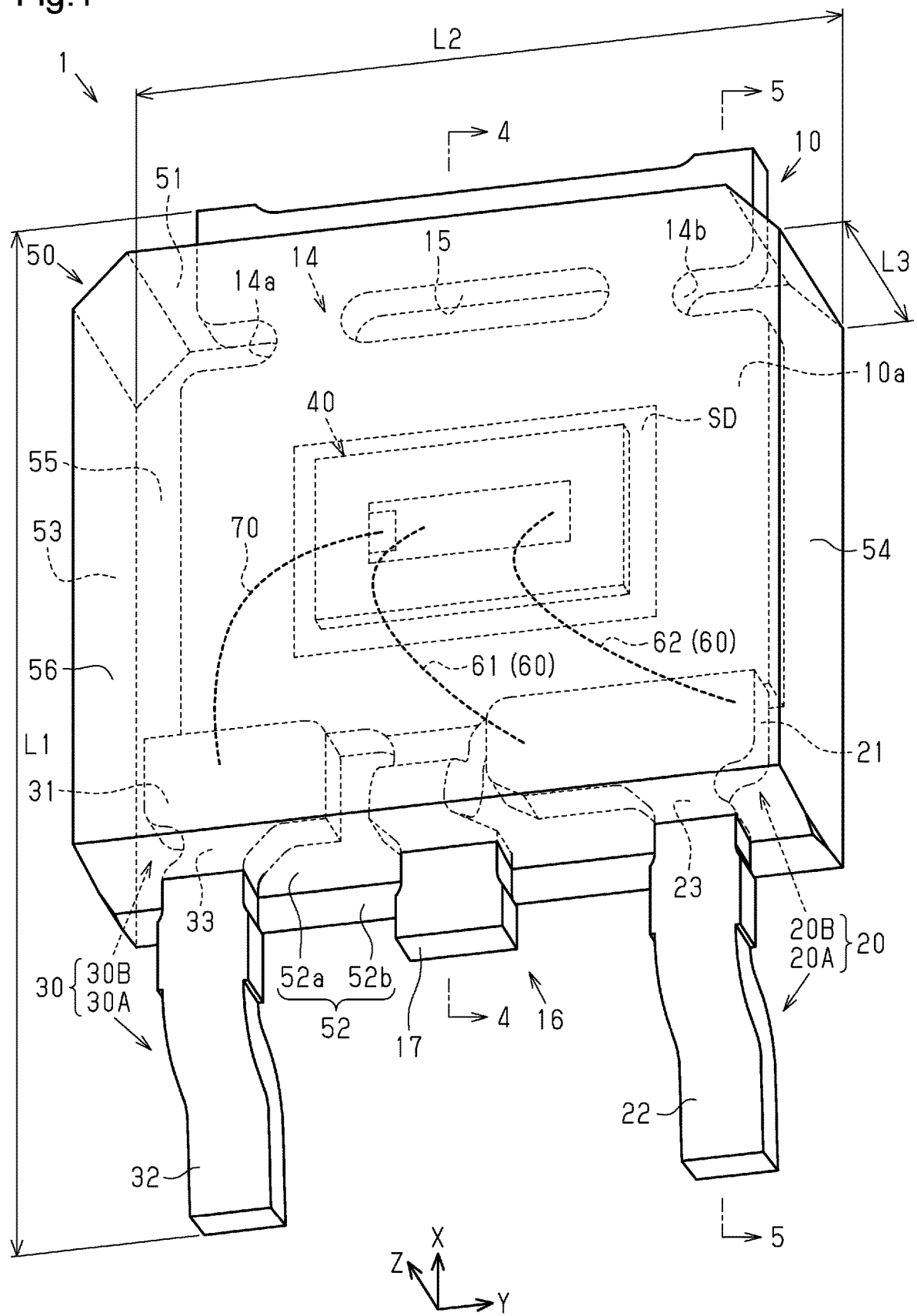
FIG. 1 is a perspective view showing a first embodiment of a semiconductor device.

As shown in FIG. 1, a semiconductor device 1 includes a substrate 10, a drive lead 20, a control lead 30, a semiconductor element 40 mounted on a main surface 10a of the substrate 10, and an encapsulation resin 50 encapsulating the semiconductor element 40. The drive lead 20 includes an outer lead 20A projecting from the encapsulation resin 50 and an inner lead 20B arranged in the encapsulation resin 50 and electrically connected to the outer lead 20A. In the present embodiment, the outer lead 20A and the inner lead 20B are integrated with each other as a single component. The control lead 30 includes an outer lead 30A projecting from the encapsulation resin 50 and an inner lead 30B arranged in the encapsulation resin 50 and electrically connected to the outer lead 30A. In the present embodiment, the outer lead 30A and the inner lead 30B are integrated with each other as a single component. Preferably, the encapsulation resin 50 of the semiconductor device 1 has a lateral dimension L2 that is less than or equal to 10 mm. The semiconductor device 1 of the present embodiment is a package having a package outline standard (Japan Electronics and Information Technology Industries Association (JEITA) standard) of TO (Transistor Outline)-252. More specifically, the semiconductor device 1 has a longitudinal dimension L1 that is 9.5 mm to 10.50 mm, a lateral dimension L2 that is 6.4 mm to 6.8 mm, and a thickness-wise dimension L3 that is 2.1 mm to 2.3 mm. The semiconductor device 1 is a single inline package (SIP) type so that the outer lead 20A of the drive lead 20 and the outer lead 30A of the control lead 30 extend from one of the surfaces of the encapsulation resin 50.

As shown in FIG. 1, the encapsulation resin 50 is rectangular-box-shaped. The encapsulation resin 50 is an electrically-insulative synthetic resin. In an example, the encapsulation resin 50 is epoxy resin. The encapsulation resin 50 includes six surfaces, namely, a first encapsulation resin side surface 51, a second encapsulation resin side surface 52, a third encapsulation resin side surface 53, a fourth encapsulation resin side surface 54, an encapsulation resin rear surface 55, and an encapsulation resin top surface 56. The first encapsulation resin side surface 51 and the second encapsulation resin side surface 52 are separated from each other and face in opposite directions. The third encapsulation resin side surface 53 and the fourth encapsulation resin side surface 54 are separated from each other and face in opposite directions. The encapsulation resin rear surface 55 and the encapsulation resin top surface 56 are separated from each other and face in opposite directions. In the description hereafter, the direction in which the encapsulation resin rear surface 55 and the encapsulation resin top surface 56 are arranged is referred to as a thickness-wise direction Z. The direction in which the first encapsulation resin side surface 51 and the second encapsulation resin side surface 52 are arranged is referred to as a longitudinal direction X. The direction in which the third encapsulation resin side surface 53 and the fourth encapsulation resin side surface 54 are arranged is referred to as a lateral direction Y. The longitudinal direction X and the lateral direction Y are orthogonal to the thickness-wise direction Z. The longitudinal direction X is orthogonal to the lateral direction Y. The thickness-wise direction Z corresponds to a first direction. The longitudinal direction X corresponds to a second direction. The lateral direction Y corresponds to a third direction.

The encapsulation resin 50 is formed by molding. Each of the side surfaces 51 to 54 of the encapsulation resin 50 includes an inclined surface that is inclined with respect to the thickness-wise direction Z so that a draft slope is provided to facilitate removal of a mold when forming the encapsulation resin 50. Specifically, each of the side surfaces 51 to 54 includes a first inclined surface having a draft angle configured to facilitate removal of an upper mold and a second inclined surface having a draft angle configured to facilitate removal of a lower mold. The upper mold forms the encapsulation resin top surface 56 and a portion of each of the side surfaces 51 to 54 located toward the encapsulation resin top surface 56. The lower mold forms the encapsulation resin rear surface 55 and a portion of each of the side surfaces 51 to 54 located toward the encapsulation resin rear surface 55. In an example, as shown in FIGS. 4 and 5, the first encapsulation resin side surface 51 includes a first inclined surface 51a and a second inclined surface 51b. The first inclined surface 51a is inclined toward the second encapsulation resin side surface 52 at positions closer to the encapsulation resin top surface 56. The second inclined surface 51b is inclined toward the second encapsulation resin side surface 52 as the second inclined surface 51b extends toward the encapsulation resin rear surface 55. The first inclined surface 51a is longer than the second inclined surface 51b. The second encapsulation resin side surface 52 includes a first inclined surface 52a and a second inclined surface 52b. The first inclined surface 52a is inclined toward the first encapsulation resin side surface 51 as the first inclined surface 52a extends toward the encapsulation resin top surface 56. The second inclined surface 52b is inclined toward the first encapsulation resin side surface 51 as the second inclined surface 52b extends toward the encapsulation resin rear surface 55. The first inclined surface 52a is longer than the second inclined surface 52b. The second inclined surface 52b extends over the substrate 10 toward the encapsulation resin top surface 56. The length of the first inclined surface 51a and the length of the second inclined surface 51b may be changed in any manner. The length of the first inclined surface 52a and the length of the second inclined surface 52b may be changed in any manner.

Figure 2:
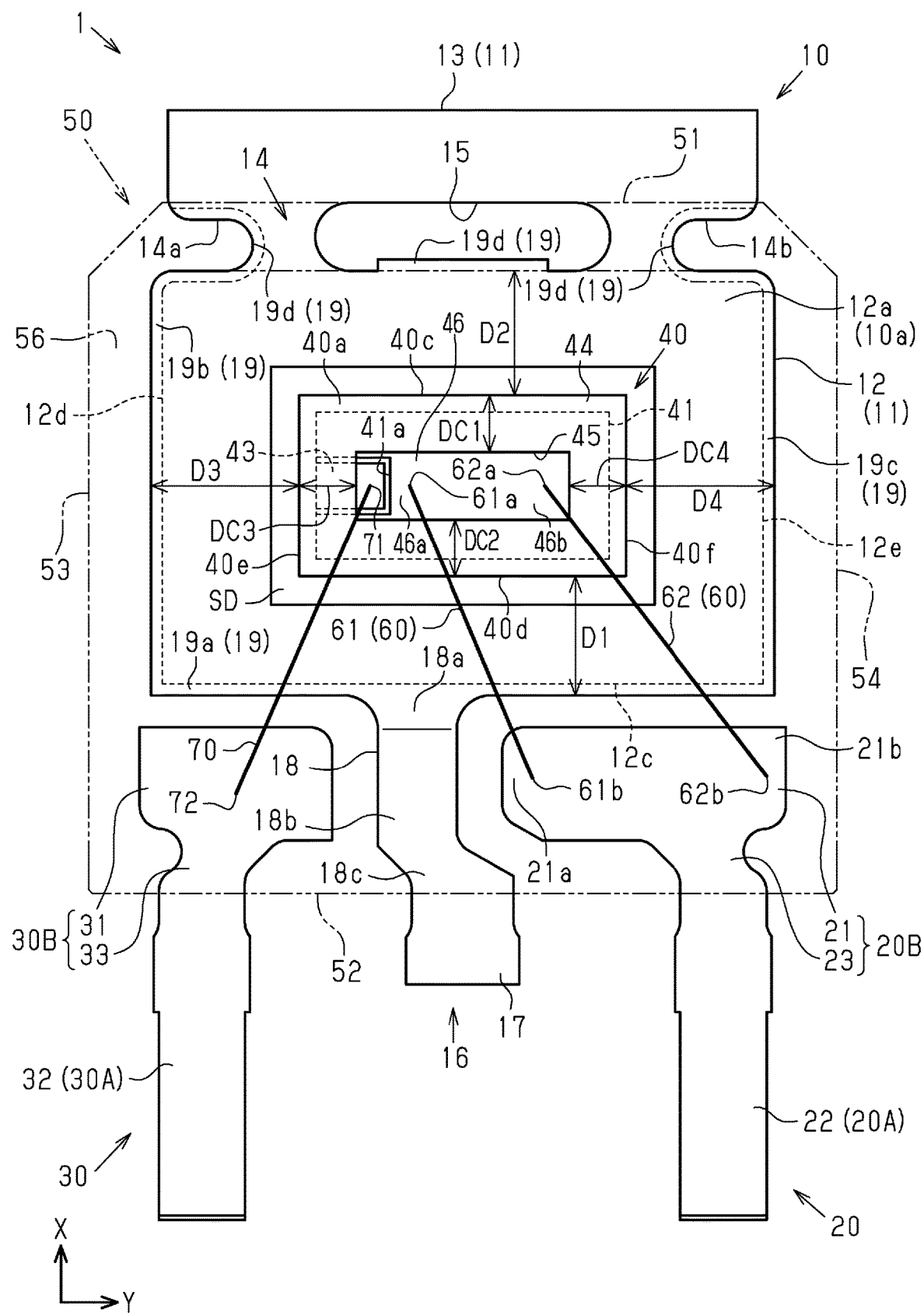
FIG. 2 is a plan view showing the internal structure of the semiconductor device shown in FIG. 1.

FIG. 2 is a diagram of the semiconductor device 1 viewed from the encapsulation resin top surface 56 in the thickness-wise direction Z. In FIG. 2, for the sake of convenience, the encapsulation resin 50 is indicated by a double-dashed line, and components in the encapsulation resin 50 are indicated by solid lines.

As shown in FIG. 2, when the semiconductor device 1 is viewed from the encapsulation resin top surface 56 in the thickness-wise direction Z (hereafter, referred to as "plan view"), the encapsulation resin 50 is rectangular so that a long-side direction conforms to the longitudinal direction X and a short-side direction conforms to the lateral direction Y. In a plan view, the first encapsulation resin side surface 51 and the second encapsulation resin side surface 52 are side surfaces extending in the lateral direction Y, and the third encapsulation resin side surface 53 and the fourth encapsulation resin side surface 54 are side surfaces extending in the longitudinal direction X.

Figure 3:
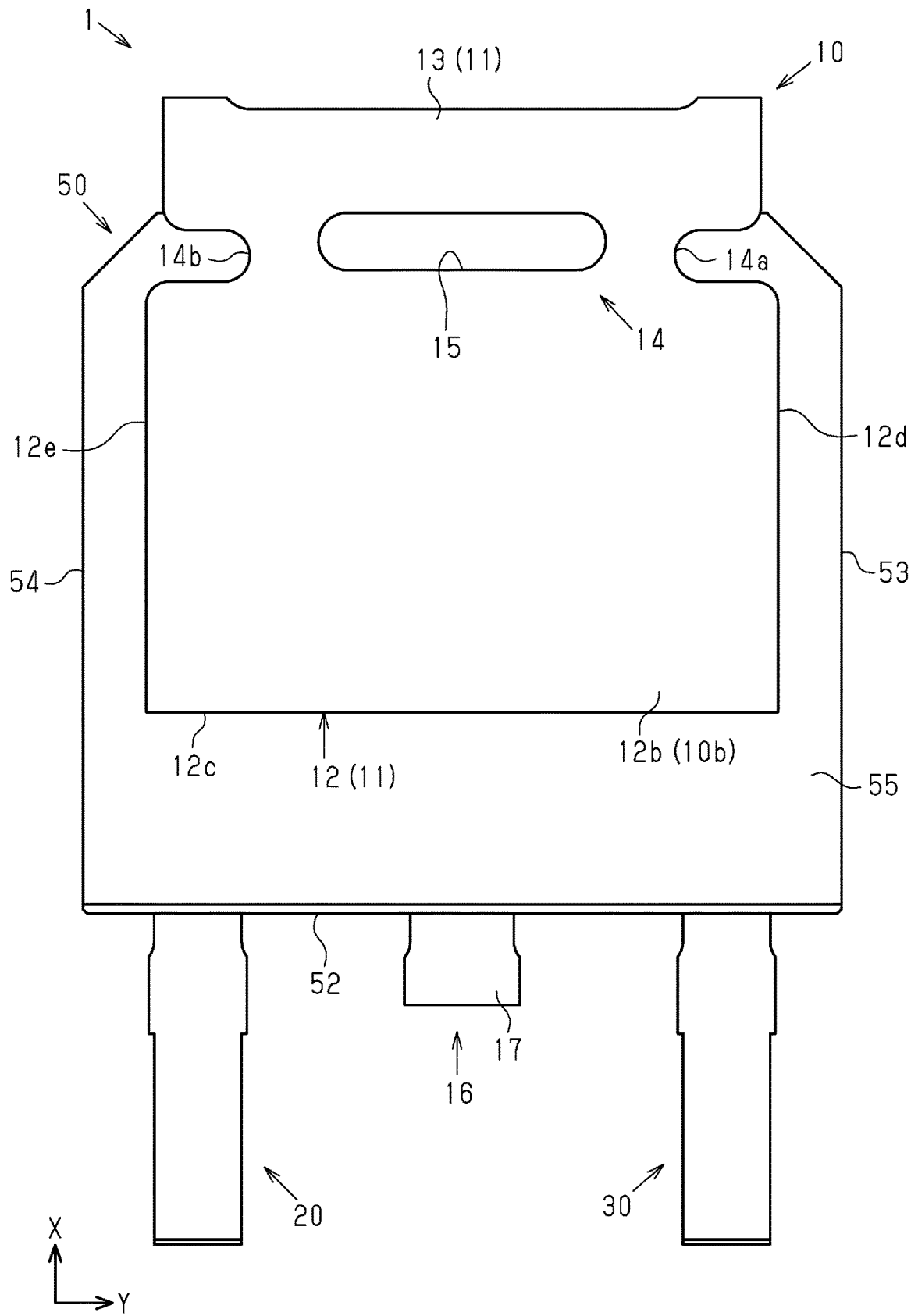
FIG. 3 is a rear view of the semiconductor device shown in FIG. 1.

The substrate 10 includes the main surface 10a and a rear surface 10b that face opposite sides in the thickness-wise direction Z (refer to FIG. 3). The main surface 10a and the encapsulation resin top surface 56 face in the same direction. The rear surface 10b and the encapsulation resin rear surface 55 face in the same direction. The substrate 10 is formed of, for example, aluminum (Al) or copper (Cu). The substrate 10 includes a flat substrate body 11 and a lead portion 16. In the present embodiment, the substrate body 11 and the lead portion 16 are integrated with each other as a single component.

The substrate body 11 may be divided into an inner body 12 covered by the encapsulation resin 50 and a projection 13 projecting from the encapsulation resin 50. The inner body 12 and the projection 13 are located beside each other in the longitudinal direction X. The projection 13 projects from the first encapsulation resin side surface 51 in the longitudinal direction X. In the present embodiment, the dimension of the projection 13 in the lateral direction Y is less than the dimension of the inner body 12 in the lateral direction Y. The dimension of the projection 13 in the lateral direction Y may be changed in any manner. In an example, the dimension of the projection 13 in the lateral direction Y may be equal to the dimension of the inner body 12 in the lateral direction Y.

In a plan view, the inner body 12 is arranged so that the center of the inner body 12 in the longitudinal direction X is located closer to the first encapsulation resin side surface 51 than the center of the encapsulation resin 50 in the longitudinal direction X. The inner body 12 includes a main surface 12a, a rear surface 12b (refer to FIG. 3), a first side surface 12c, a second side surface 12d, and a third side surface 12e. The main surface 12a and the rear surface 12b face opposite sides in the thickness-wise direction Z. The main surface 12a is configured to be a portion of the main surface 10a of the substrate 10. The rear surface 12b is configured to be the rear surface 10b of the substrate 10. Thus, the main surface 12a faces the encapsulation resin top surface 56, and the rear surface 12b faces the encapsulation resin rear surface 55. The first side surface 12c faces the second encapsulation resin side surface 52. The second side surface 12d faces the third encapsulation resin side surface 53. The third side surface 12e faces the fourth encapsulation resin side surface 54. The first side surface 12c extends in the lateral direction Y The second side surface 12d and the third side surface 12e are spaced apart and opposed to each other in the lateral direction Y. The second side surface 12d and the third side surface 12e extend in the longitudinal direction X.

The inner body 12 has an end located toward the projection 13 and including a narrow portion 14. The narrow portion 14 is defined by a curved recess 14a recessed from the second side surface 12d toward the fourth encapsulation resin side surface 54 in the lateral direction Y and a curved recess 14b recessed from the third side surface 12e toward the third encapsulation resin side surface 53 in the lateral direction Y. The dimension of the narrow portion 14 in the lateral direction Y is less than the dimension of a portion of the inner body 12 excluding the narrow portion 14 in the lateral direction Y The dimension of the narrow portion 14 in the lateral direction Y is less than the dimension of the projection 13 in the lateral direction Y. The narrow portion 14 is arranged next to the first encapsulation resin side surface 51 of the encapsulation resin 50 in the longitudinal direction X. The narrow portion 14 includes a through hole 15 extending through the narrow portion 14 in the thickness-wise direction Z. In a plan view, the through hole 15 has a shape of an elongated circle, the longitudinal direction of which conforms to the lateral direction Y.

The inner body 12 includes flanges 19 projecting from body side surfaces of the inner body 12.

The flanges 19 include a first flange 19a, a second flange 19b, a third flange 19c, and fourth flanges 19c. The first flange 19a projects from the first side surface 12c of the inner body 12 toward the second encapsulation resin side surface 52. The second flange 19b projects from the second side surface 12d of the inner body 12 toward the third encapsulation resin side surface 53. The third flange 19c projects from the third side surface 12e of the inner body 12 toward the fourth encapsulation resin side surface 54. The fourth flanges 19c are arranged on opposite ends of the narrow portion 14 in the lateral direction Y and in the through hole 15 at a position toward the second encapsulation resin side surface 52.

The first flange 19a, the second flange 19b, the third flange 19c, and the fourth flanges 19c are flush with the main surface 12a of the inner body 12. Thus, the main surface 10a of the substrate 10 includes the main surface 12a of the inner body 12, the first flange 19a, the second flange 19b, the third flange 19c, and the fourth flanges 19c. In addition, the first flange 19a, the second flange 19b, the third flange 19c, and the fourth flanges 19c are arranged closer to the main surface 12a than the rear surface 12b of the inner body 12. Thus, the rear surface 10b of the substrate 10 includes the rear surface 12b of the inner body 12. Such structures of the flanges 19a to 19d limit separation of the encapsulation resin 50 from the substrate 10.

As shown in FIG. 3, the rear surface 10b of the substrate 10 (the rear surface 12b of the inner body 12) is exposed from the encapsulation resin rear surface 55. This improves the heat dissipation performance of the substrate 10. The encapsulation resin 50 is received in the recesses 14a and 14b and the through hole 15 of the narrow portion 14 of the inner body 12. This further limits separation of the encapsulation resin 50 from the substrate 10.

As shown in FIGS. 2 and 4, the lead portion 16 extends toward the second encapsulation resin side surface 52 from an end of the inner body 12 located toward the first side surface 12c and projects from the second encapsulation resin side surface 52. The lead portion 16 may be divided into a terminal portion 17 projecting from the second encapsulation resin side surface 52 and a coupling portion 18 that couples the terminal portion 17 to the inner body 12.

The coupling portion 18 is arranged on a portion of the inner body 12 located closer to the second side surface 12d than a central portion of the inner body 12 in the lateral direction Y. The coupling portion 18 is continuous from the first flange 19a. More specifically, the thickness of the coupling portion 18 at a part connected to the first flange 19a is equal to the thickness of the first flange 19a. The coupling portion 18 includes an inclined part 18a. The inclined part 18a is inclined toward the encapsulation resin top surface 56 as the inclined part 18a extends from the first flange 19a toward the second encapsulation resin side surface 52. The coupling portion 18 includes an intermediate portion 18b between the inclined part 18a and the terminal portion 17. The intermediate portion 18b is located closer to the encapsulation resin top surface 56 than the main surface 12a of the inner body 12. In a plan view, the intermediate portion 18b includes a bent part 18c that is bent toward the fourth encapsulation resin side surface 54. The intermediate portion 18b includes a part that is in contact with the second encapsulation resin side surface 52. The part is located on a central portion of the second encapsulation resin side surface 52 in the lateral direction Y.

The terminal portion 17 projects from the central portion of the second encapsulation resin side surface 52 in the lateral direction Y. The terminal portion 17 and the intermediate portion 18b are located at the same position in the thickness-wise direction Z. That is, the terminal portion 17 is located closer to the encapsulation resin top surface 56 than the main surface 12a of the inner body 12.

As shown in FIG. 2, in a plan view, the drive lead 20 and the control lead 30 are spaced apart from the substrate 10 in the longitudinal direction X and located closer to the second encapsulation resin side surface 52 of the encapsulation resin 50 than the substrate 10. The drive lead 20 and the control lead 30 are spaced apart from each other in the lateral direction Y. The lead portion 16 is located between the drive lead 20 and the control lead 30 in the lateral direction Y.

The drive lead 20 includes a drive pad 21, a drive terminal 22, and a coupling portion 23 that couples the drive pad 21 to the drive terminal 22. The drive pad 21 and the coupling portion 23 are configured to be the inner lead 20B. The drive terminal 22 is configured to be the outer lead 20A. The drive pad 21 and the coupling portion 23 are located between the substrate 10 and the second encapsulation resin side surface 52 in the longitudinal direction X. In the lateral direction Y, the drive pad 21 and the coupling portion 23 are located closer to the fourth encapsulation resin side surface 54 than a central portion of the encapsulation resin 50 in the lateral direction Y.

In a plan view, the drive pad 21 is rectangular so that a long-side direction conforms to the lateral direction Y and a short-side direction conforms to the longitudinal direction X. The drive pad 21 includes a first end 21a and a second end 21b that are opposite ends in the lateral direction Y. The first end 21a is an end of the drive pad 21 located toward the third encapsulation resin side surface 53. The second end 21b is an end of the drive pad 21 located toward the fourth encapsulation resin side surface 54. The first end 21a overlaps the bent part 18c of the lead portion 16 as viewed in the longitudinal direction X. The second end 21b is located closer to the fourth encapsulation resin side surface 54 than the third side surface 12e of the inner body 12. In the present embodiment, the dimension of the drive pad 21 in the lateral direction Y is less than the dimension of the semiconductor element 40 in the lateral direction Y. As shown in FIG. 5, the drive pad 21 is located closer to the encapsulation resin top surface 56 than the main surface 12a of the inner body 12 in the thickness-wise direction Z. Also, the drive pad 21 is located closer to the encapsulation resin top surface 56 than a front surface 40a of the semiconductor element 40 in the thickness-wise direction Z. As shown in FIGS. 4 and 5, in the present embodiment, the drive pad 21 and the intermediate portion 18b of the lead portion 16 are located at the same position in the thickness-wise direction Z.

As shown in FIG. 2, the coupling portion 23 is continuous from an end of the drive pad 21 located toward the second encapsulation resin side surface 52. The coupling portion 23 is located closer to the fourth encapsulation resin side surface 54 than a central portion of the drive pad 21 in the lateral direction Y. The drive terminal 22 is configured to be a source terminal. As shown in FIG. 5, the drive terminal 22 projects from the first inclined surface 52a of the second encapsulation resin side surface 52.

As shown in FIG. 2, the control lead 30 includes a control pad 31, a control terminal 32, and a coupling portion 33 that couples the control pad 31 to the control terminal 32. The control pad 31 and the coupling portion 33 are configured to be the inner lead 30B. The control terminal 32 is configured to be the outer lead 30A. The control pad 31 and the coupling portion 33 are located between the substrate 10 and the second encapsulation resin side surface 52 in the longitudinal direction X. The control pad 31 and the coupling portion 33 are located closer to the third encapsulation resin side surface 53 than a central portion of the encapsulation resin 50 in the lateral direction Y.

In a plan view, the control pad 31 is rectangular so that a long-side direction conforms to the lateral direction Y and a short-side direction conforms to the longitudinal direction X. The dimension of the control pad 31 in the lateral direction Y is less than the dimension of the drive pad 21 in the lateral direction Y. This allows for an increase in the dimension of the drive pad 21 in the lateral direction Y. The control pad 31 is located closer to the encapsulation resin top surface 56 than the main surface 12a of the inner body 12 in the thickness-wise direction Z. Also, the control pad 31 is located closer to the encapsulation resin top surface 56 than the front surface 40a of the semiconductor element 40 in the thickness-wise direction Z. In the present embodiment, the control pad 31 and the intermediate portion 18b of the lead portion 16 are located at the same position in the thickness-wise direction Z.

The coupling portion 33 is continuous from an end of the control pad 31 located toward the second encapsulation resin side surface 52. The coupling portion 33 is located on the control pad 31 at a position toward the third encapsulation resin side surface 53 in the lateral direction Y. The control terminal 32 is configured to be a gate terminal. The control terminal 32 projects from the first inclined surface 52a of the second encapsulation resin side surface 52.

As shown in FIGS. 4 and 5, the semiconductor element 40 is mounted on the main surface 12a of the inner body 12 using solder SD. As shown in FIG. 2, in the present embodiment, the semiconductor element 40 is located on a central portion of the inner body 12. Specifically, in a plan view, a first distance D1 between the semiconductor element 40 and an edge of the first flange 19a of the inner body 12 located toward the second encapsulation resin side surface 52 is equal to a second distance D2 between the semiconductor element 40 and the narrow portion 14 of the inner body 12. Also, a third distance D3 between the semiconductor element 40 and an edge of the second flange 19b of the inner body 12 located toward the third encapsulation resin side surface 53 is equal to a fourth distance D4 between the semiconductor element 40 and an edge of the third flange 19c of the inner body 12 located toward the fourth encapsulation resin side surface 54. The first distance D1 being equal to the second distance D2 includes, for example, an error of 5% of the first distance D1. When a difference between the first distance D1 and the second distance D2 is, for example, within 5% of the first distance D1, it is considered that the first distance D1 is equal to the second distance D2. Also, when a difference between the third distance D3 and the fourth distance D4 is, for example, within 5% of the third distance D3, it is considered that the third distance D3 is equal to the fourth distance D4. As shown in FIG. 2, the semiconductor element 40 and the drive pad 21 are located at different positions in the longitudinal direction X. The semiconductor element 40 and the control pad 31 are located at different positions in the longitudinal direction X.

The semiconductor element 40 contains silicon carbide (SiC). In the present embodiment, a SiC metal-oxide-semiconductor field-effect transistor (MOSFET) is used as the semiconductor element 40. The semiconductor element 40 (SiC MOSFT) is an element capable of high-speed switching in response to a drive signal having a frequency between 1 kHz and a few hundred kHz, inclusive. Preferably, the semiconductor element 40 is an element capable of high-speed switching in response to a drive signal having a frequency between 1 kHz and 100 kHz, inclusive. In the present embodiment, the semiconductor element 40 performs high-speed switching in response to a drive signal having a frequency of 100 kHz.

The semiconductor element 40 is flat. Specifically, in a plan view, the semiconductor element 40 is rectangular so that a long-side direction conforms to the lateral direction Y and a short-side direction conforms to the longitudinal direction X. In the present embodiment, the dimension of the semiconductor element 40 in the lateral direction Y is 3 mm. The dimension of the semiconductor element 40 in the lateral direction Y includes an error of 5% of 3 mm (±0.15 mm).

As shown in FIGS. 2 and 4, the semiconductor element 40 includes the front surface 40a, a rear surface 40b, a first side surface 40c, a second side surface 40d, a third side surface 40e, and a fourth side surface 40f. The front surface 40a and the rear surface 40b face opposite sides in the thickness-wise direction Z. The front surface 40a faces the encapsulation resin top surface 56. That is, the front surface 40a and the main surface 10a of the substrate 10 face in the same direction. The rear surface 40b faces the encapsulation resin rear surface 55. The rear surface 40b is opposed to the main surface 12a of the inner body 12. The first side surface 40c faces the first encapsulation resin side surface 51. The second side surface 40d faces the second encapsulation resin side surface 52. The third side surface 40e faces the third encapsulation resin side surface 53. The fourth side surface 40f faces the fourth encapsulation resin side surface 54.

The front surface 40a includes a main surface drive electrode 41 and a control electrode 43. The rear surface 40b includes a rear surface drive electrode 42 (refer to FIG. 4). In the present embodiment, the main surface drive electrode 41 is configured to be a source electrode, and the rear surface drive electrode 42 is configured to be a drain electrode. The control electrode 43 is configured to be a gate electrode. The rear surface drive electrode 42 is electrically connected to the inner body 12 by the solder SD.

The main surface drive electrode 41 is formed on a large portion of the front surface 40a. In a plan view, the main surface drive electrode 41 is rectangular so that a short-side direction conforms to the longitudinal direction X and a long-side direction conforms to the lateral direction Y. The main surface drive electrode 41 includes a recess 41a that is open toward the third encapsulation resin side surface 53. The recess 41a is formed in an end of the main surface drive electrode 41 located toward the third encapsulation resin side surface 53 at a center in the longitudinal direction X. The control electrode 43 is formed in the recess 41a.

The semiconductor element 40 includes a passivation film 44 that is an insulation film formed on the main surface drive electrode 41 and the control electrode 43. The passivation film 44 includes an opening 45 that exposes a portion of the main surface drive electrode 41 and a portion of the control electrode 43.

In a plan view, the opening 45 is rectangular so that a long-side direction conforms to the lateral direction Y and a short-side direction conforms to the longitudinal direction X. The dimension of the opening 45 in the lateral direction Y is less than the dimension of the drive pad 21 in the lateral direction Y. In other words, the dimension of the drive pad 21 in the lateral direction Y is greater than the dimension of the opening 45 in the lateral direction Y.

The opening 45 is arranged in a central portion of the front surface 40a of the semiconductor element 40 in the longitudinal direction X. Specifically, a first distance DC1 between the opening 45 and the first side surface 40c of the semiconductor element 40, a second distance DC2 between the opening 45 and the second side surface 40d of the semiconductor element 40, a third distance DC3 between the opening 45 and the third side surface 40e of the semiconductor element 40, and a fourth distance DC4 between the opening 45 and the fourth side surface 40f of the semiconductor element 40 are equal to each other. When the largest one of differences between the first distance DC1, the second distance DC2, the third distance DC3, and the fourth distance DC4 is, for example, within 5% of the first distance DC1, it is considered that the first distance DC1, the second distance DC2, the third distance DC3, and the fourth distance DC4 are equal to each other.

The main surface drive electrode 41 includes an exposed region 46 exposed by the opening 45. The exposed region 46 includes a first exposed end 46a and a second exposed end 46b that are opposite ends in the lateral direction Y. The first exposed end 46a is an end of the exposed region 46 located toward the third side surface 40e of the semiconductor element 40. The second exposed end 46b is an end of the exposed region 46 located toward the fourth side surface 40f of the semiconductor element 40.

The semiconductor device 1 includes drive wires 60 and a control wire 70. In the present embodiment, the drive wires 60 include two drive wires, namely, a first drive wire 61 and a second drive wire 62. More specifically, the first drive wire 61 and the second drive wire 62 are configured to be a combination of the furthermost ones of the drive wires 60. The first drive wire 61 is located closer to the control wire 70 than the second drive wire 62.

The first drive wire 61 and the second drive wire 62 are formed of the same metal. In the present embodiment, the first drive wire 61 and the second drive wire 62 contain aluminum. The first drive wire 61 and the second drive wire 62 have the same diameter. When a difference between the diameter of the first drive wire 61 and the diameter of the second drive wire 62 is, for example, within 5% of the diameter of the first drive wire 61, it is considered that the first drive wire 61 and the second drive wire 62 have the same diameter. In the present embodiment, the first drive wire 61, the second drive wire 62, and the control wire 70 have the same diameter. When a difference between the diameter of each of the first drive wire 61 and the second drive wire 62 and the diameter of the control wire 70 is, for example, within 5% of the diameter of the control wire 70, it is considered that the first drive wire 61, the second drive wire 62, and the control wire 70 have the same diameter. In an example, the diameter of each of the first drive wire 61, the second drive wire 62, and the control wire 70 is 125 μm to 250 μm. In the present embodiment, the diameter of each of the first drive wire 61, the second drive wire 62, and the control wire 70 is 125 μm.

The first drive wire 61 and the second drive wire 62 are spaced apart from each other and connect the main surface drive electrode 41 of the semiconductor element 40 to the drive pad 21. Each of the first drive wire 61 and the second drive wire 62 is connected to the main surface drive electrode 41 and the drive pad 21 by, for example, wire bonding. In a plan view, the first drive wire 61 and the second drive wire 62 are spaced apart from each other in the lateral direction Y. The first drive wire 61 and the second drive wire 62 are ones of the drive wires 60 located at opposite ends in the lateral direction Y.

In a plan view, the first drive wire 61 and the second drive wire 62 are connected to the main surface drive electrode 41 and the drive pad 21 so that the first drive wire 61 and the second drive wire 62 are separated by a greater distance at the drive pad 21 than at the main surface drive electrode 41. In a plan view, the distance between the first drive wire 61 and the second drive wire 62 increases from the main surface drive electrode 41 toward the drive pad 21. The configurations of the first drive wire 61 and the second drive wire 62 will be specifically described below.

Figure 6:
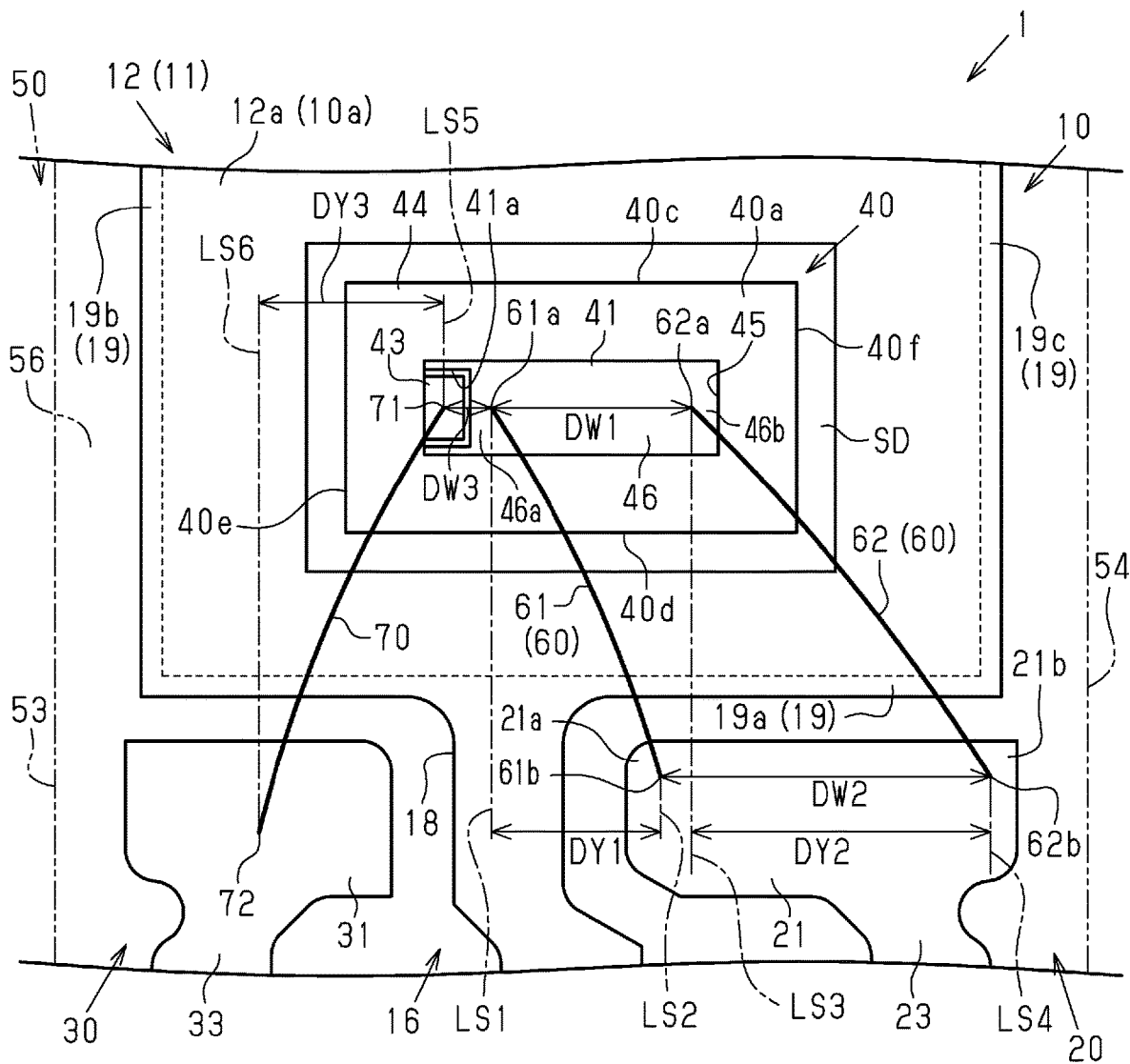
FIG. 6 is an enlarged view showing the semiconductor element shown in FIG. 2 and its surroundings.

As shown in FIG. 6, the first drive wire 61 includes a drive electrode end 61a and a drive pad end 61b. The second drive wire 62 includes a drive electrode end 62a and a drive pad end 62b. In a plan view, a distance DW2 between the drive pad end 61b and the drive pad end 62b is greater than a distance DW1 between the drive electrode end 61a and the drive electrode end 62a. As shown in FIG. 6, in a plan view, the distance DW1 is the minimum distance between the first drive wire 61 and the second drive wire 62, and the distance DW2 is the maximum distance between the first drive wire 61 and the second drive wire 62.

An auxiliary line LS1 extends from the drive electrode end 61a in the longitudinal direction X. An auxiliary line LS2 extends from the drive pad end 61b in the longitudinal direction X. The distance between the auxiliary line LS1 and the auxiliary line LS2 in the lateral direction Y is referred to as a distance DY1. An auxiliary line LS3 extends from the drive electrode end 62a in the longitudinal direction X. An auxiliary line LS4 extends from the drive pad end 62b in the longitudinal direction X. The distance between the auxiliary line LS3 and the auxiliary line LS4 in the lateral direction Y is referred to as a distance DY2. In this case, the distance DY2 is greater than the distance DY1.

The drive electrode end 61a of the first drive wire 61 is connected to the main surface drive electrode 41 at a position closer to the first exposed end 46a than a central portion of the exposed region 46 in the lateral direction Y. In the present embodiment, the drive electrode end 61a is connected to the first exposed end 46a. Specifically, the drive electrode end 61a is connected to a portion of the main surface drive electrode 41 located next to the control electrode 43 in the lateral direction Y, that is, a portion of the main surface drive electrode 41 defining the bottom of the recess 41a.

The drive pad end 61b of the first drive wire 61 is connected to the drive pad 21 at a position closer to the first end 21a than a central portion of the drive pad 21 in the lateral direction Y. In the present embodiment, the drive pad end 61b is connected to the first end 21a of the drive pad 21. In an example, the drive pad end 61b is arranged at the limit position toward the third encapsulation resin side surface 53 in a region of the first end 21a of the drive pad 21 where wire bonding is performable. Specifically, the position of the drive pad end 61b in relation to the first end 21a in the lateral direction Y is set so that a capillary of a wire bonding device that supplies the first drive wire 61 is located at an edge of the first end 21a of the drive pad 21 located toward the third encapsulation resin side surface 53. In the longitudinal direction X, the drive pad end 61b is arranged on a portion of the drive pad 21 located closer to the semiconductor element 40 than a central portion of the drive pad 21 in the longitudinal direction X. The drive pad end 61b is located closer to the fourth encapsulation resin side surface 54 than the drive electrode end 61a.

The drive electrode end 62a of the second drive wire 62 is connected to the main surface drive electrode 41 at a position closer to the second exposed end 46b than the central portion of the exposed region 46 in the lateral direction Y. In the present embodiment, the drive electrode end 62a is connected to the second exposed end 46b. In an example, the drive electrode end 62a is arranged at the limit position toward the fourth side surface 40f in a region where wire bonding is performable in an end of the opening 45 located toward the fourth side surface 40f of the semiconductor element 40 in the lateral direction Y. Specifically, the position of the drive electrode end 62a in relation to the second exposed end 46b of the exposed region 46 in the lateral direction Y is set so that a capillary of the wire bonding device that supplies the second drive wire 62 is located at an edge of the exposed region 46 located toward the fourth side surface 40f. The drive electrode end 62a and the drive electrode end 61a of the first drive wire 61 are located at the same position in the longitudinal direction X and arranged in the lateral direction Y. The state in which the drive electrode end 62a and the drive electrode end 61a are located at the same position includes a state in which the drive electrode ends 61a and 62a overlap with each other in the longitudinal direction X and a state in which the drive electrode ends 61a and 62a partially overlap due to a manufacturing error caused by wire bonding. In other words, when a difference between the drive electrode ends 61a and 62a in the longitudinal direction X is an extent of a variation caused when performing wire bonding, it is considered that the drive electrode ends 61a and 62a are located at the same position in the longitudinal direction X.

The drive pad end 62b of the second drive wire 62 is connected to the drive pad 21 at a position closer to the second end 21b than the central portion of the drive pad 21 in the lateral direction Y. In the present embodiment, the drive pad end 62b is connected to the second end 21b of the drive pad 21. In an example, the drive pad end 62b is arranged at the limit position toward the fourth encapsulation resin side surface 54 in a region of the second end 21b of the drive pad 21 where wire bonding is performable. Specifically, the position of the drive pad end 62b in relation to the second end 21b in the lateral direction Y is set so that a capillary of the wire bonding device that supplies the second drive wire 62 is located at an edge of the second end 21b of the drive pad 21 located toward the fourth encapsulation resin side surface 54. In the longitudinal direction X, the drive pad end 62b is arranged on a portion of the drive pad 21 located closer to the semiconductor element 40 than the central portion of the drive pad 21 in the longitudinal direction X. The drive pad end 62b is located closer to the fourth encapsulation resin side surface 54 than the drive electrode end 62a. The drive pad end 62b is located closer to the fourth encapsulation resin side surface 54 than the semiconductor element 40 in the lateral direction Y. In the present embodiment, the drive pad end 62b and the drive pad end 61b are located at the same position in the longitudinal direction X and arranged in the lateral direction Y. The state in which the drive pad end 62b and the drive pad end 61b are located at the same position in the longitudinal direction X includes a state in which the drive pad ends 61b and 62b overlap with each other in the longitudinal direction X and a state in which the drive pad ends 61b and 62b partially overlap due to a manufacturing error caused by wire bonding. In other words, a difference between the drive pad ends 61b and 62b in the longitudinal direction X is an extent of a variation caused when performing wire bonding, it is considered that the drive pad ends 61b and 62b are located at the same position in the longitudinal direction X.

The control wire 70 connects the control electrode 43 of the semiconductor element 40 to the control pad 31. The control wire 70 is connected to the control electrode 43 and the control pad 31 by, for example, wire bonding. The same material is used in the control wire 70 and the drive wires 60. The control wire 70 includes a control electrode end 71 and a control pad end 72. The control electrode end 71 is an end of the control wire 70 connected to the control electrode 43. The control pad end 72 is an end of the control wire 70 connected to the control pad 31. In the control electrode end 71, a distance DW3 between the control electrode end 71 of the control wire 70 and the drive electrode end 61a of the first drive wire 61 is less than the distance DW1. An auxiliary line LS5 extends from the control electrode end 71 in the longitudinal direction X. An auxiliary line LS6 extends from the control pad end 72 in the longitudinal direction X. A distance DY3 between the auxiliary line LS5 and the auxiliary line LS6 is greater than the distance DY1 and less than the distance DY2. The distance DY3 may be changed in any manner. In an example, the distance DY3 is less than or equal to the distance DY1.

The operation of the present embodiment will now be described.

In a semiconductor device including a semiconductor element containing SiC, even an inductance on the order of a nanohenry (nH) greatly affects the property of the semiconductor device. There is a need for a configuration that reduces the inductance of the semiconductor device.

In the semiconductor device, an inductance contained between a source electrode and a source terminal decreases as the width of a conductor connecting the source electrode and the source terminal increases in a plan view. When the conductor includes drive wires, the width of the conductor in a plan view is specified by the distance between two drive wires configured to be a combination of the furthermost ones of the drive wires.

The two drive wires configured to be a combination of the furthermost ones of the drive wires indicate that when two drive wires 60 are used as in the present embodiment, the two drive wires 61 and 62 are configured to be a combination of the furthermost ones of the drive wires 60.

The first drive wire 61 and the second drive wire 62 are separated by a greater distance at the drive pad 21 (source terminal) than at the main surface drive electrode 41 (source electrode). Specifically, the distance DW2 between the drive pad end 61b and the drive pad end 62b is greater than the distance DW1 between the drive electrode end 61a and the drive electrode end 62a. This configuration increases the width of the conductor in a plan view as compared to a configuration in which the first drive wire 61 is parallel to the second drive wire 62 in a plan view.

In addition, in the present embodiment, the drive electrode end 61a of the first drive wire 61 is connected to a portion of the main surface drive electrode 41 located next to the control electrode 43 in the lateral direction Y, and the drive electrode end 62a of the second drive wire 62 is connected to an end of the main surface drive electrode 41 exposed by the opening 45 located toward the fourth side surface 40f. As a result, the distance DW1, that is, the minimum distance between the first drive wire 61 and the second drive wire 62, is increased, thereby increasing the width of the conductor in a plan view.

The semiconductor device 1 of the present embodiment has the following advantages.

(1-1) In a plan view, the first drive wire 61 and the second drive wire 62 are connected to the main surface drive electrode 41 and the drive pad 21 so that the first drive wire 61 and the second drive wire 62 are separated by a greater distance at the drive pad 21 than at the main surface drive electrode 41. This configuration increases the distance between the first drive wire 61 and the second drive wire 62, thereby decreasing the inductance between the main surface drive electrode 41 and the drive pad 21. The present embodiment obtains a result such that the inductance is decreased by 5 to 7 (nH) as compared to a configuration in which the first drive wire 61 and the second drive wire 62 are separated by the distance DW1 and parallel to each other in a plan view. The distance DW1 is the distance between the drive electrode end 61a of the first drive wire 61 and the drive electrode end 62a of the second drive wire 62.

(1-2) The dimension of the drive pad 21 in the lateral direction Y is greater than the dimension of the opening 45 in the lateral direction Y. This configuration allows for an increase in the distance DW2 between the drive pad end 61b of the first drive wire 61 and the drive pad end 62b of the second drive wire 62. As a result, the inductance between the main surface drive electrode 41 and the drive pad 21 is reduced.

(1-3) The drive pad end 61b of the first drive wire 61 is connected to the first end 21a of the drive pad 21. The drive pad end 62b of the second drive wire 62 is connected to the second end 21b of the drive pad 21. This configuration increases the distance DW2 between the drive pad end 61b and the drive pad end 62b. As a result, the distance between the first drive wire 61 and the second drive wire 62 is increased, thereby decreasing the inductance between the main surface drive electrode 41 and the drive pad 21.

(1-4) The drive electrode end 61a of the first drive wire 61 is connected to the first exposed end 46a of the exposed region 46 of the main surface drive electrode 41. The drive electrode end 62a of the second drive wire 62 is connected to the second exposed end 46b of the exposed region 46. This configuration increases the distance DW1 between the drive electrode end 61a and the drive electrode end 62a. As a result, the distance between the first drive wire 61 and the second drive wire 62 is increased, thereby decreasing the inductance between the main surface drive electrode 41 and the drive pad 21.

(1-5) Each of the drive pad end 61b of the first drive wire 61 and the drive pad end 62b of the second drive wire 62 is connected to a portion of the drive pad 21 closer to the semiconductor element 40 than the central portion of the drive pad 21 in the longitudinal direction X. This configuration shortens the first drive wire 61 and the second drive wire 62, thereby further decreasing the inductance between the main surface drive electrode 41 (source electrode) and the drive terminal 22 of the drive lead 20 (source terminal).

(1-6) The same material is used in the first drive wire 61 and the second drive wire 62. The first drive wire 61 and the second drive wire 62 have the same diameter. In this configuration, the same wire may be used when performing a task for connecting the drive wires 61 and 62 to the main surface drive electrode 41 and the drive pad 21. This simplifies the process of the task.

(1-7) The same material is used in the drive wires 60 and the control wire 70. The drive wires 60 and the control wire 70 have the same diameter. In this configuration, the same wire may be used when performing tasks for connecting the drive wires 60 to the main surface drive electrode 41 and the drive pad 21 and a task for connecting the control wire 70 to the control electrode 43 and the control pad 31. This simplifies the process of the tasks.

Modified Examples of First Embodiment

The semiconductor device 1 of the first embodiment may be modified, for example, as follows. The modified example described below may be combined with one another as long as there is no technical inconsistency. In the following modified examples, the same reference characters are given to those elements that are the same as the corresponding elements of the first embodiment. Such elements will not be described in detail.

Figure 7:
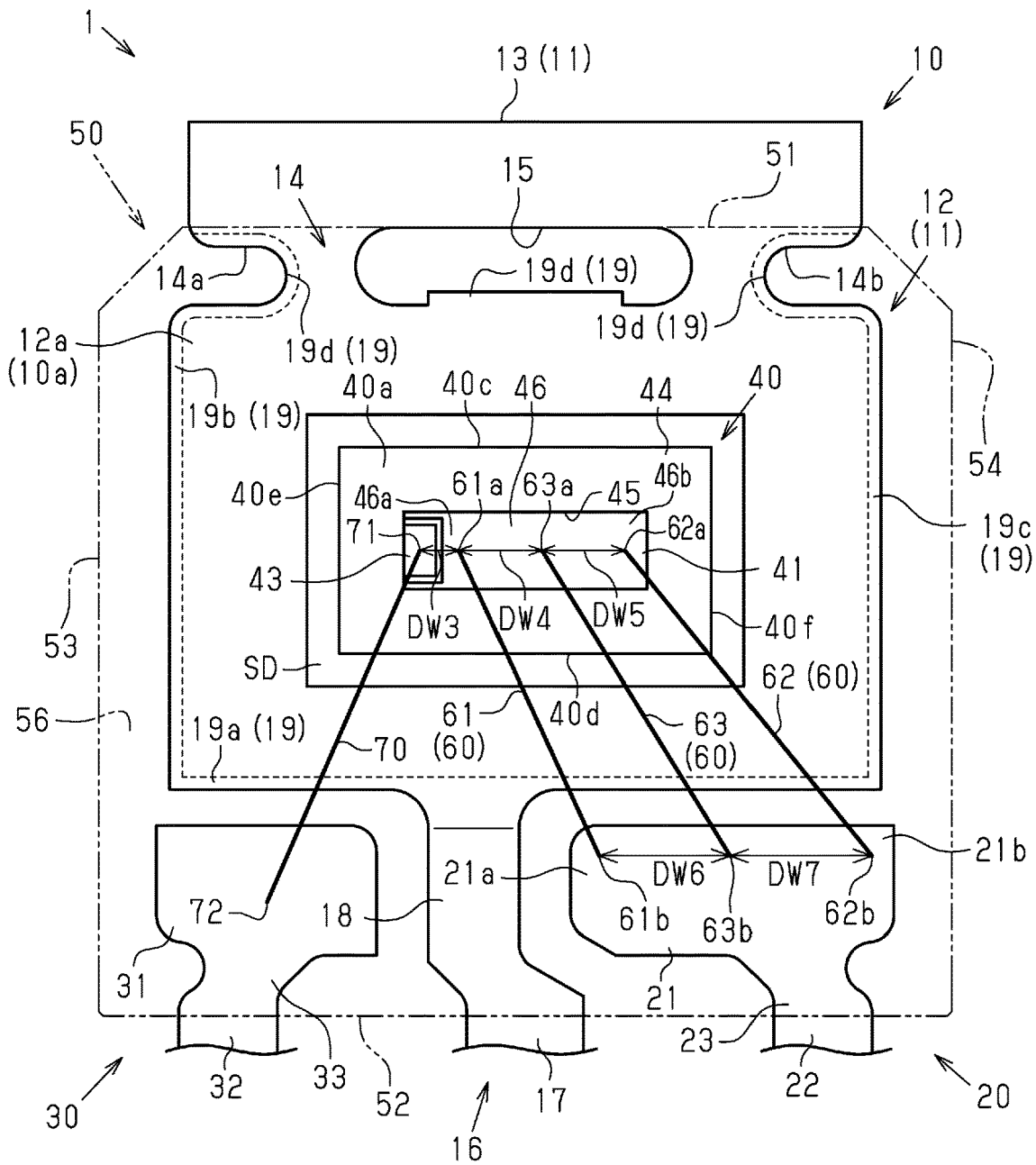
FIG. 7 is an enlarged view showing a semiconductor element and its surroundings in a modified example of the semiconductor device of the first embodiment.

The number of drive wires 60 is not limited to two and may be changed in any manner. In an example, as shown in FIG. 7, the drive wires 60 may include three drive wires, namely, the first drive wire 61, the second drive wire 62, and a third drive wire 63. The third drive wire 63 is arranged between the first drive wire 61 and the second drive wire 62. In this case, the first drive wire 61 and the second drive wire 62 are configured to be a combination of the furthermost ones of the drive wires 60.

More specifically, when three or more drive wires are used, the combination of the furthermost ones correspond to two drive wires that are located at the furthermost positions. For example, when three or more drive wires are arranged in the lateral direction Y, the combination of the furthermost ones is a combination of drive wires located at opposite ends in the lateral direction Y.

The third drive wire 63 includes a drive electrode end 63a and a drive pad end 63b. The drive electrode end 63a is an end of the third drive wire 63 connected to the main surface drive electrode 41. The drive pad end 63b is an end of the third drive wire 63 connected to the drive pad 21. A distance DW4 between the drive electrode end 63a and the drive electrode end 61a of the first drive wire 61 is equal to a distance DW5 between the drive electrode end 63a and the drive electrode end 62a of the second drive wire 62. When a difference between the distance DW4 and the distance DW5 is, for example, within 5% of the distance DW4, it is considered that the distance DW4 is equal to the distance DW5. In FIG. 7, the distances DW4 and DW5 are greater than the distance DW3 between the drive electrode end 61a of the first drive wire 61 and the control electrode end 71 of the control wire 70.

In FIG. 7, the drive electrode end 61a of the first drive wire 61, the drive electrode end 62a of the second drive wire 62, and the drive electrode end 63a of the third drive wire 63 are located at the same position in the longitudinal direction X and arranged in the lateral direction Y. The state in which the drive electrode ends 61a, 62a, and 63a are located at the same position in the longitudinal direction X includes a state in which the drive electrode ends 61a, 62a, and 63a overlap with each other in the longitudinal direction X and a state in which the drive electrode ends 61a, 62a, and 63a partially overlap due to a manufacturing error caused by wire bonding. In other words, when a difference between the drive electrode ends 61a, 62a, and 63a in the longitudinal direction X is an extent of a variation caused when performing wire bonding, it is considered that the drive electrode ends 61a, 62a, and 63a are located at the same position in the longitudinal direction X.

In the longitudinal direction X, the drive pad end 63b of the third drive wire 63 is arranged on a portion of the drive pad 21 located closer to the semiconductor element 40 than the central portion of the drive pad 21 in the longitudinal direction X. A distance DW6 between the drive pad end 61b of the first drive wire 61 and the drive pad end 63b is greater than the distance DW4. A distance DW7 between the drive pad end 62b of the second drive wire 62 and the drive pad end 63b is greater than the distance DW5. In FIG. 7, the distance DW6 is equal to the distance DW7. When a difference between the distance DW6 and the distance DW7 is, for example, within 5% of the distance DW6, it is considered that the distance DW6 is equal to the distance DW7.

The first drive wire 61 and the third drive wire 63 are connected to the main surface drive electrode 41 and the drive pad 21 so that the first drive wire 61 and the third drive wire 63 are separated by a greater distance at the drive pad 21 than at the main surface drive electrode 41. In a plan view, the distance between the first drive wire 61 and the third drive wire 63 gradually increases from the main surface drive electrode 41 toward the drive pad 21. The third drive wire 63 and the second drive wire 62 are connected to the main surface drive electrode 41 and the drive pad 21 so that the third drive wire 63 and the second drive wire 62 are separated by a greater distance at the drive pad 21 than at the main surface drive electrode 41. In a plan view, the distance between the third drive wire 63 and the second drive wire 62 gradually increases from the main surface drive electrode 41 toward the drive pad 21. The position of the drive pad end 63b in relation to the drive pad 21 may be changed in any manner. In an example, the drive pad end 63b may be connected to the drive pad 21 so that the distance DW6 is less than the distance DW7.

Figure 8:
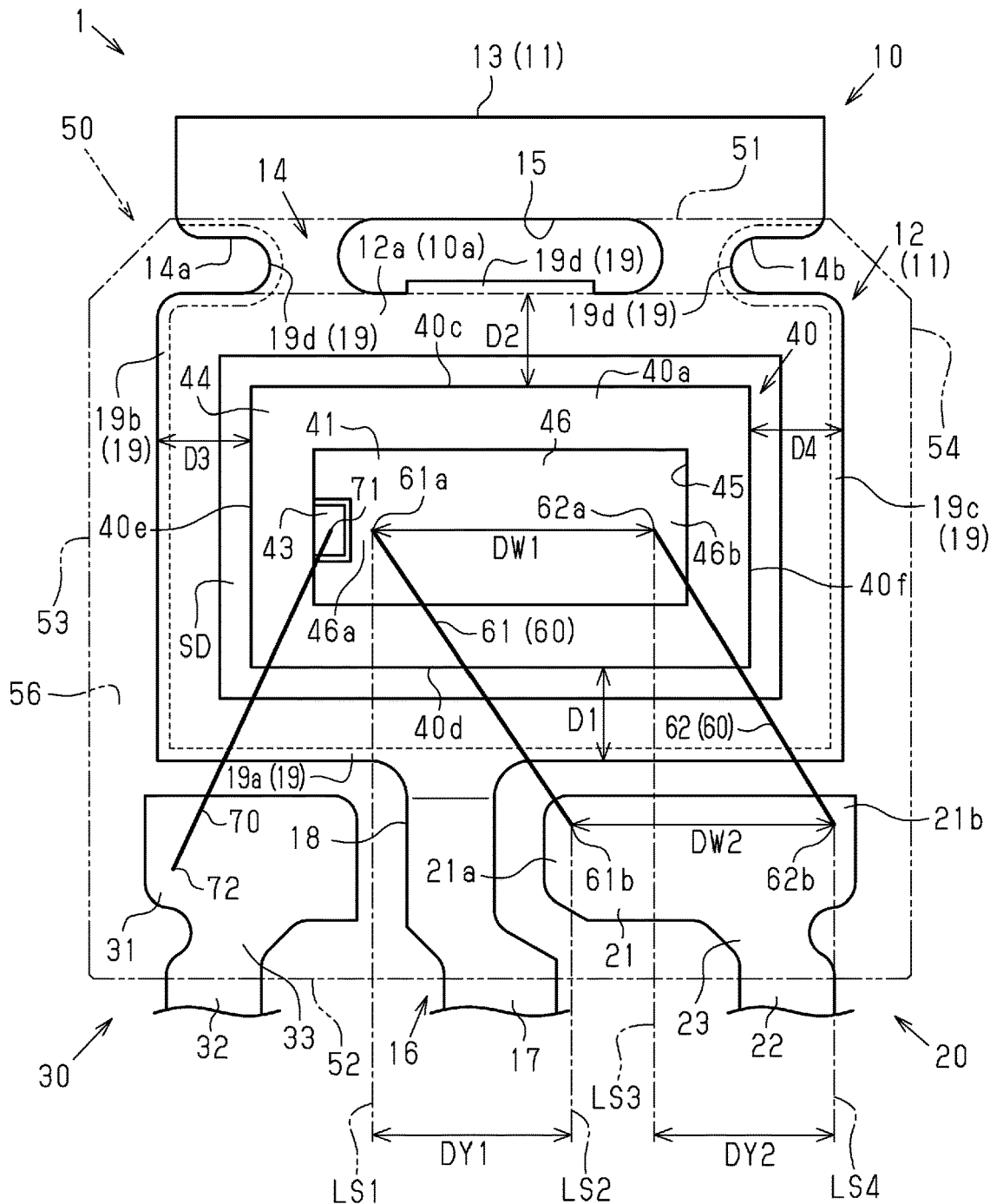
FIG. 8 is an enlarged view showing a semiconductor element and its surroundings in a modified example of the semiconductor device of the first embodiment.

The size of the semiconductor element 40 may be changed in any manner. In an example, as shown in FIG. 8, the semiconductor element 40 may have a greater size than the semiconductor element 40 of the first embodiment. In FIG. 8, the semiconductor element 40 is greater in size in the longitudinal direction X and the lateral direction Y than the semiconductor element 40 of the first embodiment. In accordance with the increase in size of the semiconductor element 40, the main surface drive electrode 41 and the opening 45 formed on the front surface 40a may be increased in size in the longitudinal direction X and the lateral direction Y. In FIG. 8, the dimension of the opening 45 in the lateral direction Y is greater than in the dimension of the drive pad 21 in the lateral direction Y.

The semiconductor element 40 is arranged on the central portion of the inner body 12. Specifically, in a plan view, the first distance D1 between the semiconductor element 40 and the edge of the first flange 19a of the inner body 12 located toward the second encapsulation resin side surface 52, the second distance D2 between the semiconductor element 40 and the narrow portion 14 of the inner body 12, the third distance D3 between the semiconductor element 40 and the edge of the second flange 19b of the inner body 12 located toward the third encapsulation resin side surface 53, and the fourth distance D4 between the semiconductor element 40 and the edge of the third flange 19c of the inner body 12 located toward the fourth encapsulation resin side surface 54 are equal to each other. When the largest one of differences between the first distance D1, the second distance D2, the third distance D3, and the fourth distance D4 is, for example, within 5% of the first distance D1, it is considered that the first distance D1, the second distance D2, the third distance D3, and the fourth distance D4 are equal to each other.

As in the first embodiment, the semiconductor device 1 includes the first drive wire 61 and the second drive wire 62 as the drive wires 60. In the same manner as the drive electrode end 61a of the first embodiment, the drive electrode end 61a of the first drive wire 61 is connected to the first exposed end 46a of the exposed region 46 of the main surface drive electrode 41. In the same manner as the drive pad end 61b of the first embodiment, the drive pad end 61b of the first drive wire 61 is connected to the first end 21a of the drive pad 21. In the same manner as the drive electrode end 62a of the first embodiment, the drive electrode end 62a of the second drive wire 62 is connected to the second exposed end 46b of the exposed region 46 of the main surface drive electrode 41. In the same manner as the drive pad end 62b of the first embodiment, the drive pad end 62b of the second drive wire 62 is connected to the second end 21b of the drive pad 21. Also, as in the first embodiment, the drive electrode end 61a and the drive electrode end 62a are located at the same position in the longitudinal direction X and arranged in the lateral direction Y. In the longitudinal direction X, each of the drive pad end 61b and the drive pad end 62b is connected to a portion of the drive pad 21 located closer to the semiconductor element 40 than the central portion of the drive pad 21 in the longitudinal direction X.

In a plan view, the distance DW2 between the drive pad end 61b and the drive pad end 62b is less than the distance DW1 between the drive electrode end 61a and the drive electrode end 62a. In FIG. 8, the distance DY1 in the lateral direction Y between the auxiliary line LS1 extending from the drive electrode end 61a in the longitudinal direction X and the auxiliary line LS2 extending from the drive pad end 61b in the longitudinal direction X is greater than the distance DY2 in the lateral direction Y between the auxiliary line LS3 extending from the drive electrode end 62a in the longitudinal direction X and the auxiliary line LS4 extending from the drive pad end 62b in the longitudinal direction X. In a plan view, the first drive wire 61 and the second drive wire 62 are connected to the main surface drive electrode 41 and the drive pad 21 so that the first drive wire 61 and the second drive wire 62 are located closer to each other at the drive pad 21 than at the main surface drive electrode 41. In a plan view, the distance between the first drive wire 61 and the second drive wire 62 gradually decreases from the main surface drive electrode 41 toward the drive pad 21.

This configuration increases the distance between the first drive wire 61 and the second drive wire 62, thereby decreasing the inductance between the main surface drive electrode 41 (source electrode) and the drive terminal 22 of the drive lead 20 (source terminal).

The relationship between the distance DW1 and the distance DW2 may be changed in any manner. In an example, the distance DW1 may be equal to the distance DW2. In this case, in a plan view, the first drive wire 61 is parallel to the second drive wire 62.

Figure 9:
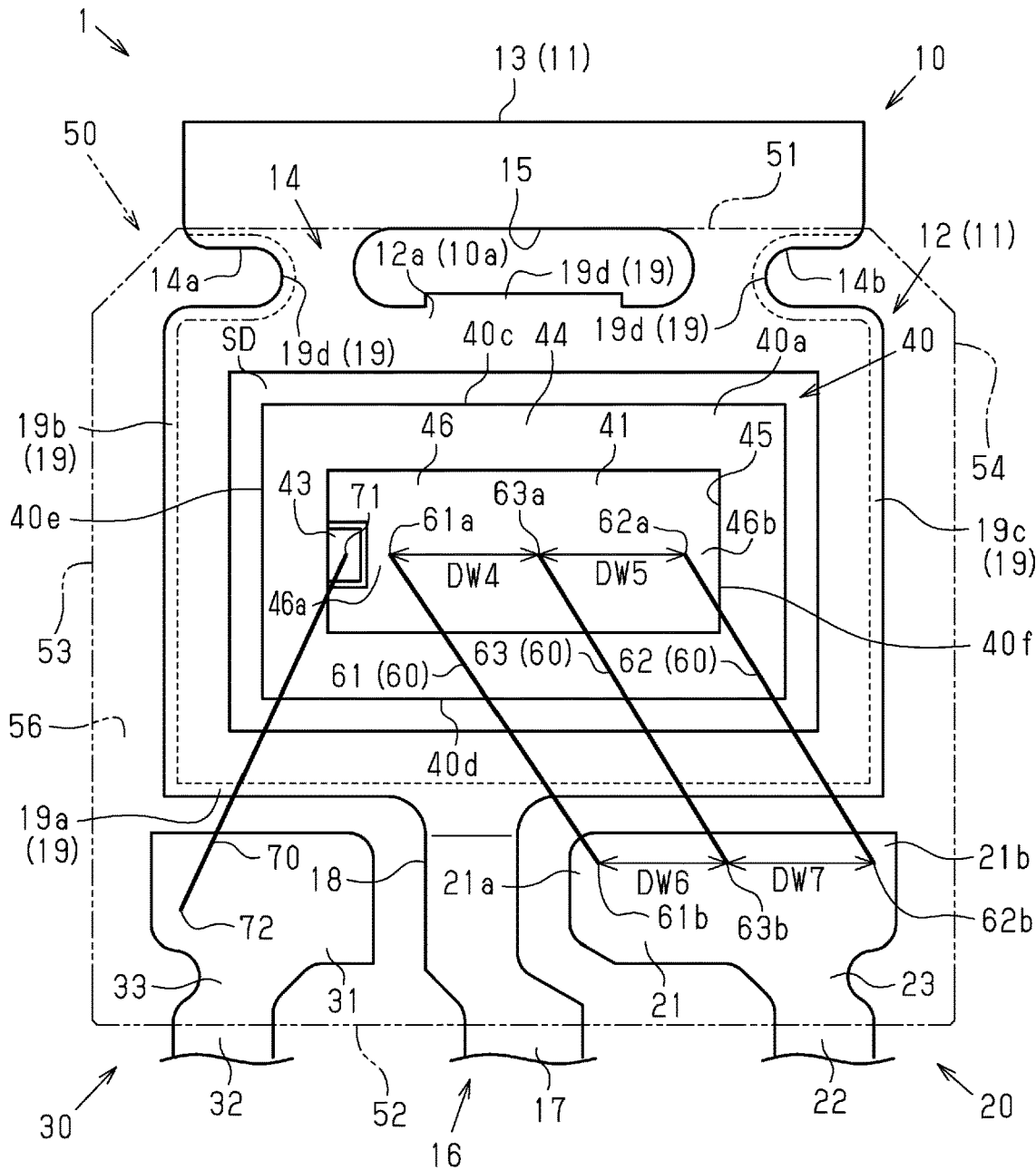
FIG. 9 is an enlarged view showing a semiconductor element and its surroundings in a modified example of the semiconductor device of the first embodiment.

In the modified example shown in FIG. 8, the number of drive wires 60 is not limited to two and may be changed in any manner. In an example, as shown in FIG. 9, the drive wires 60 may include three drive wires, namely, the first drive wire 61, the second drive wire 62, and a third drive wire 63. The third drive wire 63 is arranged between the first drive wire 61 and the second drive wire 62. In this case, the first drive wire 61 and the second drive wire 62 are configured to be the combination of the furthermost ones of the drive wires 60. The third drive wire 63 includes a drive electrode end 63a and a drive pad end 63b. A distance DW4 between the drive electrode end 63a and the drive electrode end 61a of the first drive wire 61 is equal to a distance DW5 between the drive electrode end 63a and the drive electrode end 62a of the second drive wire 62. When a difference between the distance DW4 and the distance DW5 is, for example, within 5% of the distance DW4, it is considered that the distance DW4 is equal to the distance DW5.

As in the semiconductor device 1 shown in FIG. 7, in FIG. 9, the drive electrode end 61a of the first drive wire 61, the drive electrode end 62a of the second drive wire 62, and the drive electrode end 63a of the third drive wire 63 are located at the same position in the longitudinal direction X and arranged.

In the longitudinal direction X, the drive pad end 63b of the third drive wire 63 is arranged on a portion of the drive pad 21 located closer to the semiconductor element 40 than the central portion of the drive pad 21 in the longitudinal direction X. The distance DW6 between the drive pad end 61b of the first drive wire 61 and the drive pad end 63b is less than the distance DW4. The distance DW7 between the drive pad end 62b of the second drive wire 62 and the drive pad end 63b is equal to the distance DW5. When a difference between the distance DW7 and the distance DW5 is, for example, within 5% of the distance DW7, it is considered that the distance DW7 is equal to the distance DW5.

In a plan view, the first drive wire 61 and the third drive wire 63 are connected to the main surface drive electrode 41 and the drive pad 21 so that the first drive wire 61 and the third drive wire 63 are located closer to each other at the drive pad 21 than at the main surface drive electrode 41. In a plan view, the distance between the first drive wire 61 and the third drive wire 63 gradually decreases from the main surface drive electrode 41 toward the drive pad 21. The third drive wire 63 is parallel to the second drive wire 62.

Figure 10:
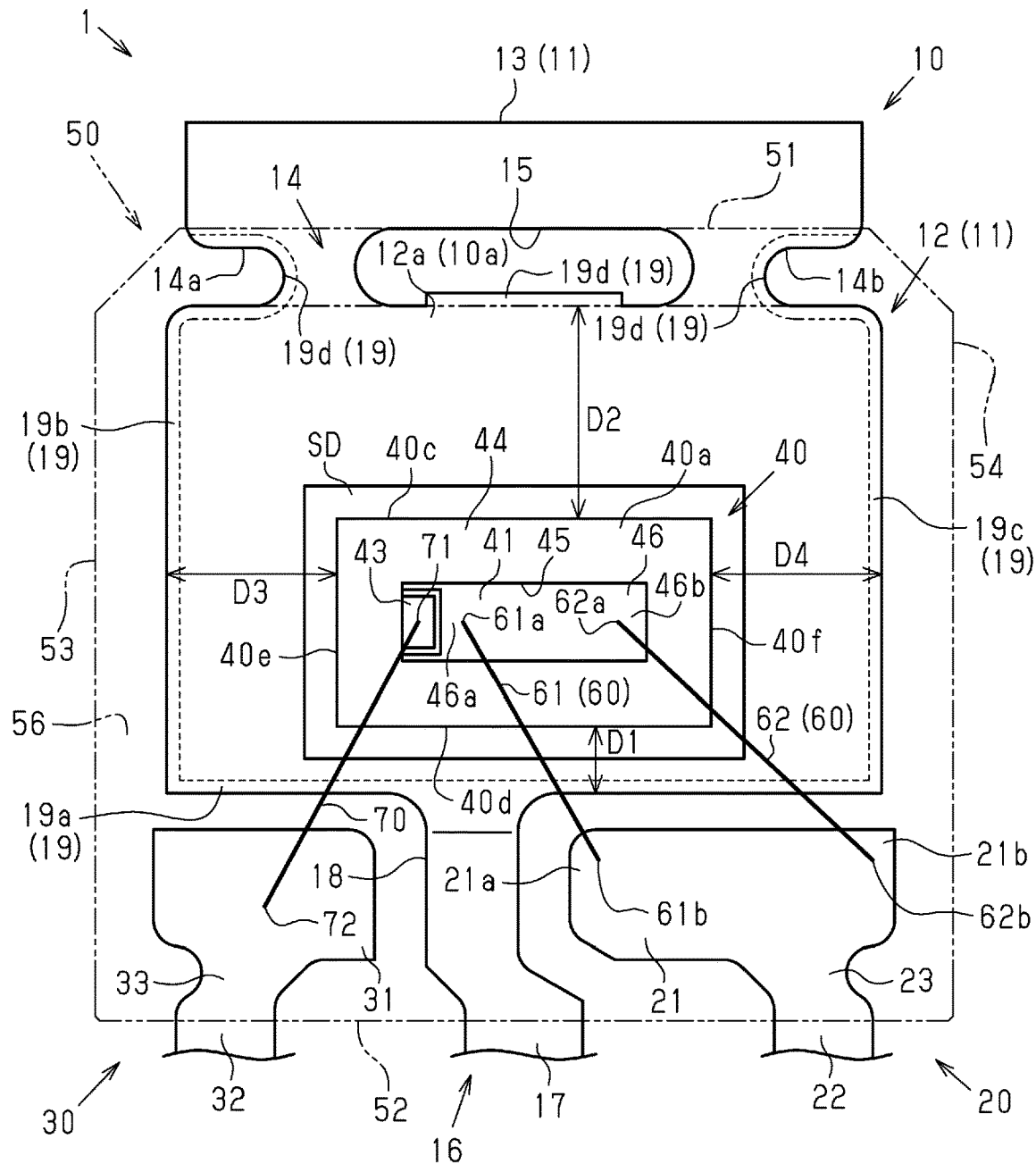
FIG. 10 is an enlarged view showing a semiconductor element and its surroundings in a modified example of the semiconductor device of the first embodiment.

The position of the semiconductor element 40 in relation to the inner body 12 may be changed in any manner. In a first example, as shown in FIG. 10, the semiconductor element 40 may be arranged on a portion of the inner body 12 located toward the second encapsulation resin side surface 52. Specifically, the first distance D1 between the semiconductor element 40 and the edge of the first flange 19a of the inner 12 located toward the second encapsulation resin side surface 52 is less than the second distance D2 between the semiconductor element 40 and the narrow portion 14 of the inner body 12.

In the lateral direction Y, the semiconductor element 40 is arranged on the central portion of the inner body 12. Specifically, the third distance D3 between the semiconductor element 40 and the edge of the second flange 19b of the inner body 12 located toward the third encapsulation resin side surface 53 is equal to the fourth distance D4 between the semiconductor element 40 and the edge of the third flange 19c of the inner body 12 located toward the fourth encapsulation resin side surface 54. When a difference between the third distance D3 and the fourth distance D4 is, for example, within 5% of the third distance D3, it is considered that the third distance D3 is equal to the fourth distance D4.

This configuration decreases the distance between the opening 45 of the semiconductor element 40 and the drive pad 21, thereby shortening the first drive wire 61 and the second drive wire 62. As a result, the inductance between the main surface drive electrode 41 (source electrode) and the drive terminal 22 of the drive lead 20 (source terminal) is further decreased.

Figure 11:
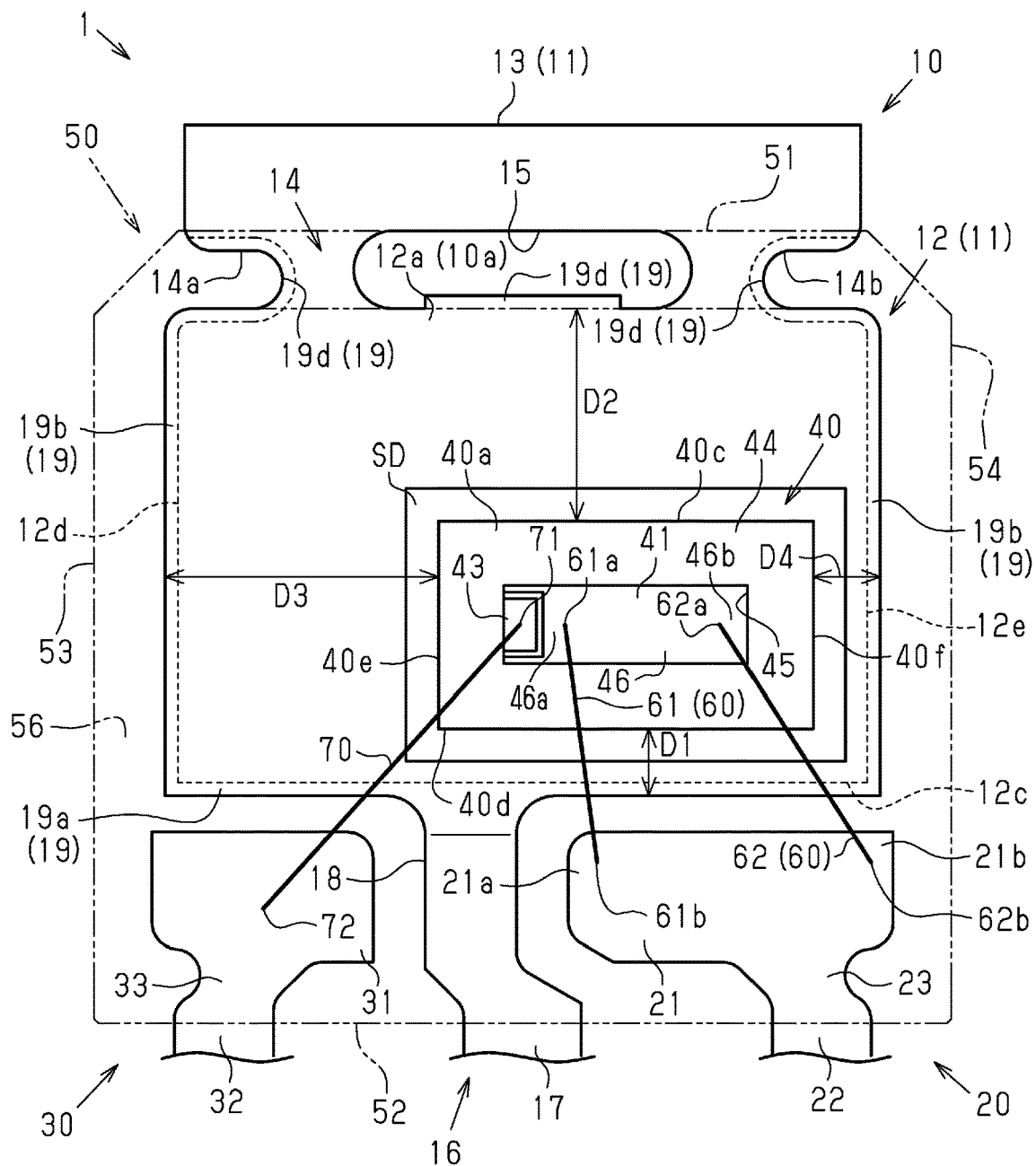
FIG. 11 is an enlarged view showing a semiconductor element and its surroundings in a modified example of the semiconductor device of the first embodiment.

In a second example, as shown in FIG. 11, the semiconductor element 40 may be arranged on a portion of the inner body 12 located toward the second encapsulation resin side surface 52 and toward the fourth encapsulation resin side surface 54. Specifically, the first distance D1 between the semiconductor element 40 and the edge of the first flange 19a of the inner 12 located toward the second encapsulation resin side surface 52 is less than the second distance D2 between the semiconductor element 40 and the narrow portion 14 of the inner body 12. In addition, the third distance D3 between the semiconductor element 40 and the edge of the second flange 19b of the inner body 12 located toward the third encapsulation resin side surface 53 is greater than the fourth distance D4 between the semiconductor element 40 and the edge of the third flange 19c of the inner body 12 located toward the fourth encapsulation resin side surface 54.

This configuration further decreases the distance between the opening 45 of the semiconductor element 40 and the drive pad 21, thereby further shortening the first drive wire 61 and the second drive wire 62. As a result, the inductance between the main surface drive electrode 41 (source electrode) and the drive terminal 22 of the drive lead 20 (source terminal) is further decreased.

In the first embodiment, the lead portion 16 may be omitted from the substrate 10 of the semiconductor device 1. In this case, the drive pad 21 and the control pad 31 are located next to each other in the lateral direction Y. The drive pad 21 may be increased in size in the lateral direction Y by an amount corresponding to the lead portion 16 that is omitted. This configuration increases the distance DW2 between the drive pad end 61b of the first drive wire 61 and the drive pad end 62b of the second drive wire 62, thereby decreasing the inductance between the main surface drive electrode 41 and the drive pad 21.

Second Embodiment

A second embodiment of a semiconductor device 1 will now be described with reference to FIGS. 12 to 21. The semiconductor device 1 of the present embodiment differs from the semiconductor device 1 of the first embodiment in that the substrate 10, the drive lead 20, the control lead 30, and the encapsulation resin 50 have different shapes and that a sense lead 80 is added. In the present embodiment, for the sake of convenience, the same reference characters are given to those elements that are the same as the corresponding elements of the first embodiment. Such elements may not be described in detail.

Figure 12:
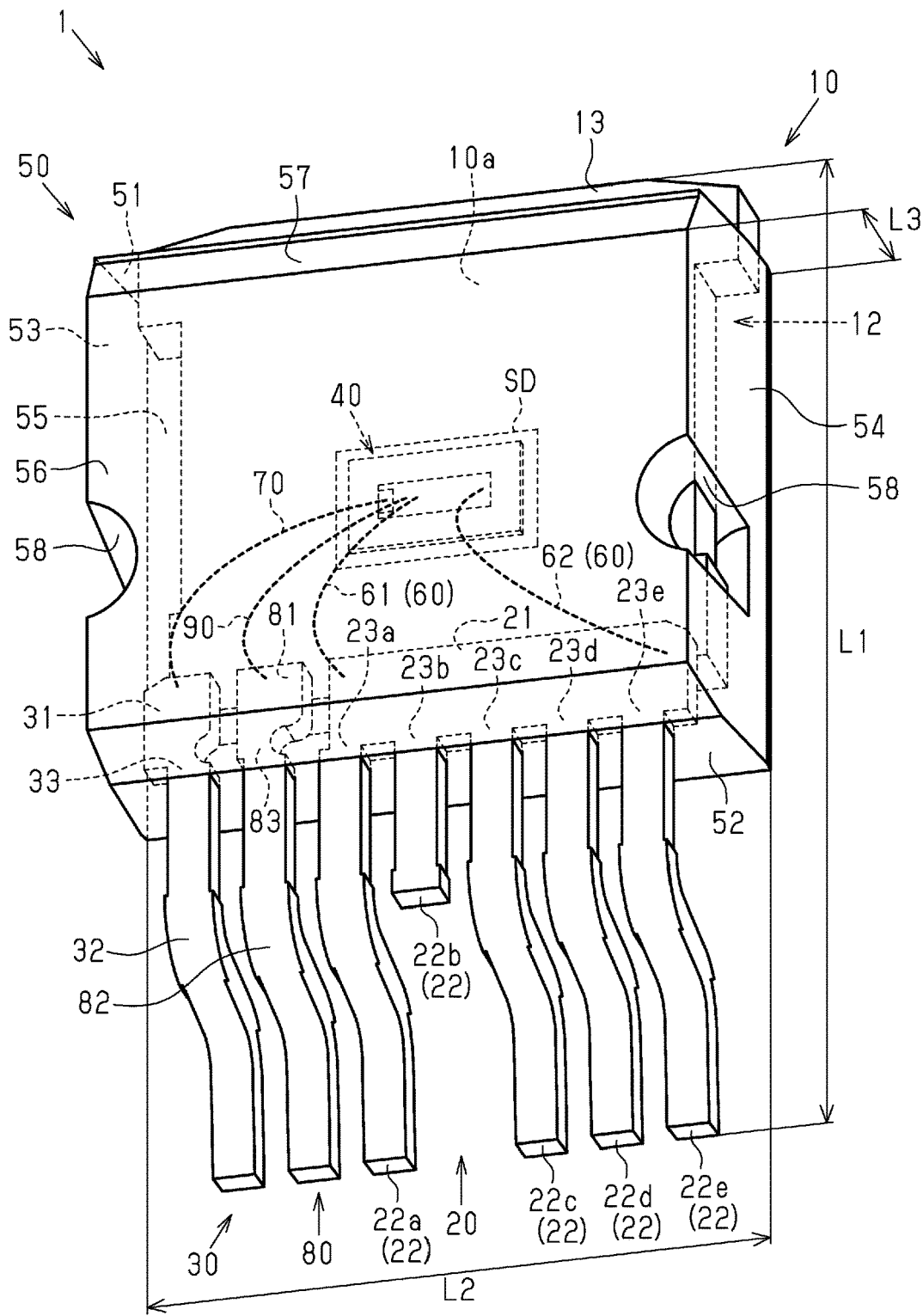
FIG. 12 is a perspective view showing a second embodiment of a semiconductor device.

As shown in FIG. 12, the semiconductor device 1 of the present embodiment is a package having a package outline standard (JEITA standard) of TO-263. Specifically, the semiconductor device 1 has a longitudinal dimension L1 that is 14.7 mm to 15.5 mm, a lateral dimension L2 that is 10.06 mm to 10.26 mm, and a thickness-wise dimension L3 that is 4.40 mm to 4.70 mm. The semiconductor device 1 is an SIP type. Thus, the semiconductor device 1 of the present embodiment is greater in size than the semiconductor device 1 of the first embodiment.

As shown in FIG. 12, the encapsulation resin 50 is rectangular-box-shaped. The encapsulation resin 50 is formed by molding. Each of the side surfaces 51 to 54 of the encapsulation resin 50 includes an inclined surface that is inclined with respect to the thickness-wise direction Z so that a draft slope is provided to facilitate removal of a mold when forming the encapsulation resin 50. Specifically, each of the side surfaces 51 to 54 includes a first inclined surface having a draft angle configured to facilitate removal of an upper mold and a second inclined surface having a draft angle configured to facilitate removal of a lower mold. The upper mold forms the encapsulation resin top surface 56 and a portion of each of the side surfaces 51 to 54 located toward the encapsulation resin top surface 56. The lower mold forms the encapsulation resin rear surface 55 and a portion of each of the side surfaces 51 to 54 located toward the encapsulation resin rear surface 55. An inclined surface 57 is formed between the first encapsulation resin side surface 51 and the encapsulation resin top surface 56 and has a greater inclination angle than the draft slope.

The encapsulation resin 50 includes opposite ends in the lateral direction Y including recesses 58. The recess 58 located at the third encapsulation resin side surface 53 of the encapsulation resin 50 is curved and recessed from the third encapsulation resin side surface 53 in the lateral direction Y. The recess 58 located at the fourth encapsulation resin side surface 54 of the encapsulation resin 50 is curved and recessed from the fourth encapsulation resin side surface 54 in the lateral direction Y. The recesses 58 extend from the encapsulation resin top surface 56 to the main surface 10a of the substrate 10. That is, the main surface 10a of the substrate 10 is partially exposed by the recesses 58. The recesses 58 are located closer to the second encapsulation resin side surface 52 than the central portion of the encapsulation resin 50 in the longitudinal direction X.

Figure 13:
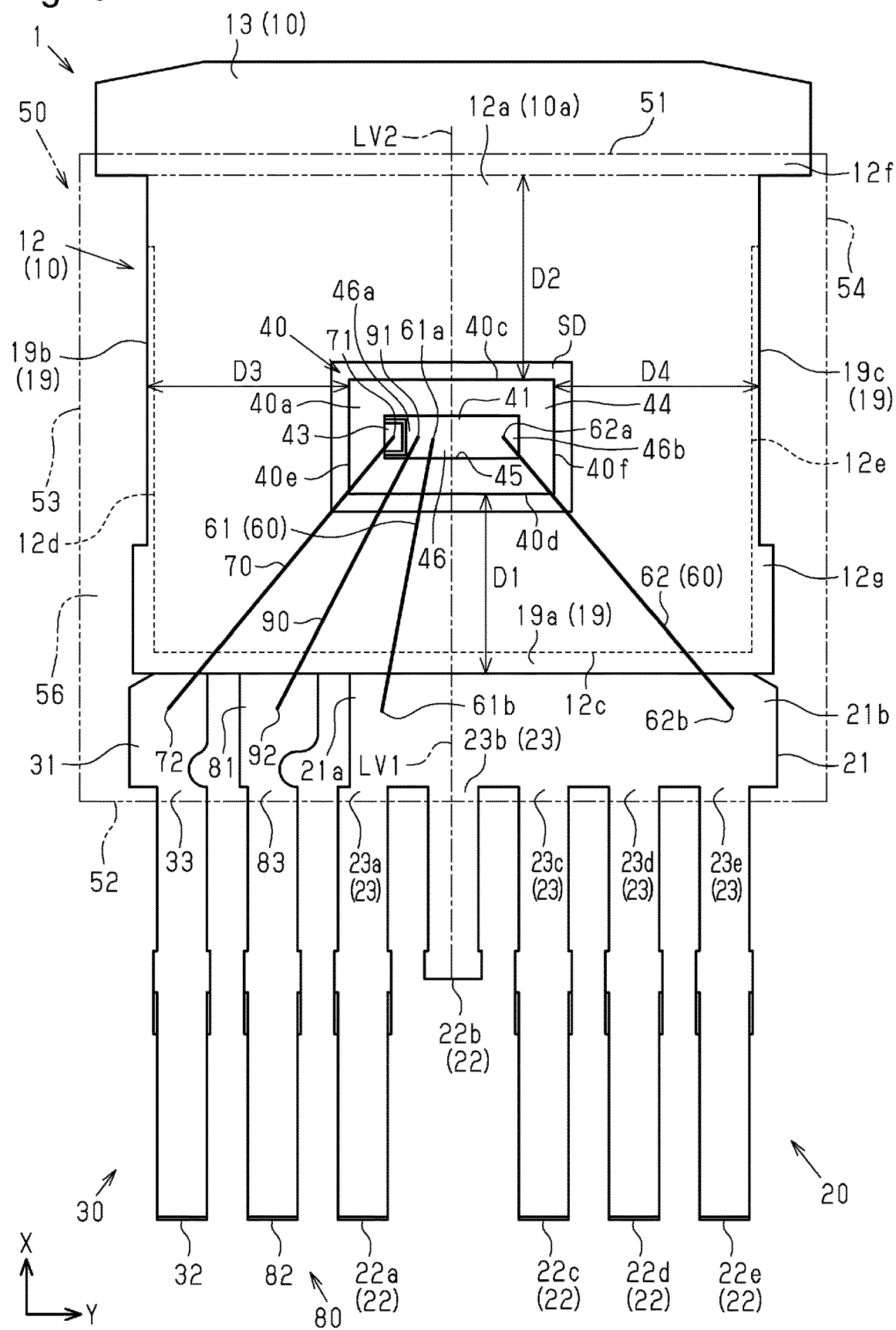
FIG. 13 is a plan view showing the internal structure of the semiconductor device shown in FIG. 12.

FIG. 13 is a diagram of the semiconductor device 1 viewed from the encapsulation resin top surface 56 in the thickness-wise direction Z. In FIG. 13, for the sake of convenience, the encapsulation resin 50 is indicated by a double-dashed line, and components in the encapsulation resin 50 are indicated by solid lines. As shown in FIG. 13, in a plan view, the encapsulation resin 50 is rectangular so that a long-side direction conforms to the lateral direction Y and a short-side direction conforms to the longitudinal direction X.

As shown in FIGS. 12 and 13, the substrate 10 may be divided into the inner body 12 located in the encapsulation resin 50 and the projection 13 projecting from the encapsulation resin 50. The inner body 12 and the projection 13 are located beside each other in the longitudinal direction X. The substrate 10 is formed of, for example, aluminum (Al) or copper (Cu).

The inner body 12 includes a first wide portion 12f on an end located toward the projection 13. The dimension of the first wide portion 12f in the lateral direction Y is greater than the dimension of the portion of the inner body 12 excluding the first wide portion 12f in the lateral direction Y. The first wide portion 12f is arranged next to the first encapsulation resin side surface 51 of the encapsulation resin 50 in the longitudinal direction X.

The inner body 12 includes a second wide portion 12g on an end located toward the second encapsulation resin side surface 52. The dimension of the second wide portion 12g in the lateral direction Y is greater than the dimension of the portion of the inner body 12 excluding the first wide portion 12f in the lateral direction Y. The dimension of the second wide portion 12g in the lateral direction Y is less than the dimension of the first wide portion 12f in the lateral direction Y.

The projection 13 projects from the first encapsulation resin side surface 51 in the longitudinal direction X. In the present embodiment, the dimension of the projection 13 in the lateral direction Y is equal to the dimension of the first wide portion 12f of the inner body 12 in the lateral direction Y. The dimension of the projection 13 in the lateral direction Y may be changed in any manner. In an example, the dimension of the projection 13 in the lateral direction Y may be less than the dimension of the first wide portion 12f of the inner body 12 in the lateral direction Y.

The inner body 12 includes flanges 19 projecting from body side surfaces of the inner body 12. In the present embodiment, the inner body 12 and the flanges 19 are integrated with each other as a single component.

The flanges 19 include a first flange 19a, a second flange 19b, and a third flange 19c. The first flange 19a projects from the first side surface 12c of the inner body 12 toward the second encapsulation resin side surface 52. The first flange 19a is configured to be a part of the second wide portion 12g. The second flange 19b projects from the second side surface 12d of the inner body 12 toward the third encapsulation resin side surface 53. A part of the second flange 19b is configured to be a part of the second wide portion 12g. The third flange 19c projects from the third side surface 12e of the inner body 12 toward the fourth encapsulation resin side surface 54. The third flange 19c is configured to be a part of the second wide portion 12g.

The first flange 19a, the second flange 19b, and the third flange 19c are flush with the main surface 12a of the inner body 12. Thus, the main surface 10a of the substrate 10 includes the main surface 12a of the inner body 12, the first flange 19a, the second flange 19b, and the third flange 19c. In addition, the first flange 19a, the second flange 19b, and the third flange 19c are arranged closer to the main surface 12a than the rear surface 12b (refer to FIG. 13) of the inner body 12. Thus, the rear surface 10b (refer to FIG. 13) of the substrate 10 includes the rear surface 12b of the inner body 12. Such structures of the flanges 19a to 19c limit separation of the encapsulation resin 50 from the substrate 10.

Figure 14:
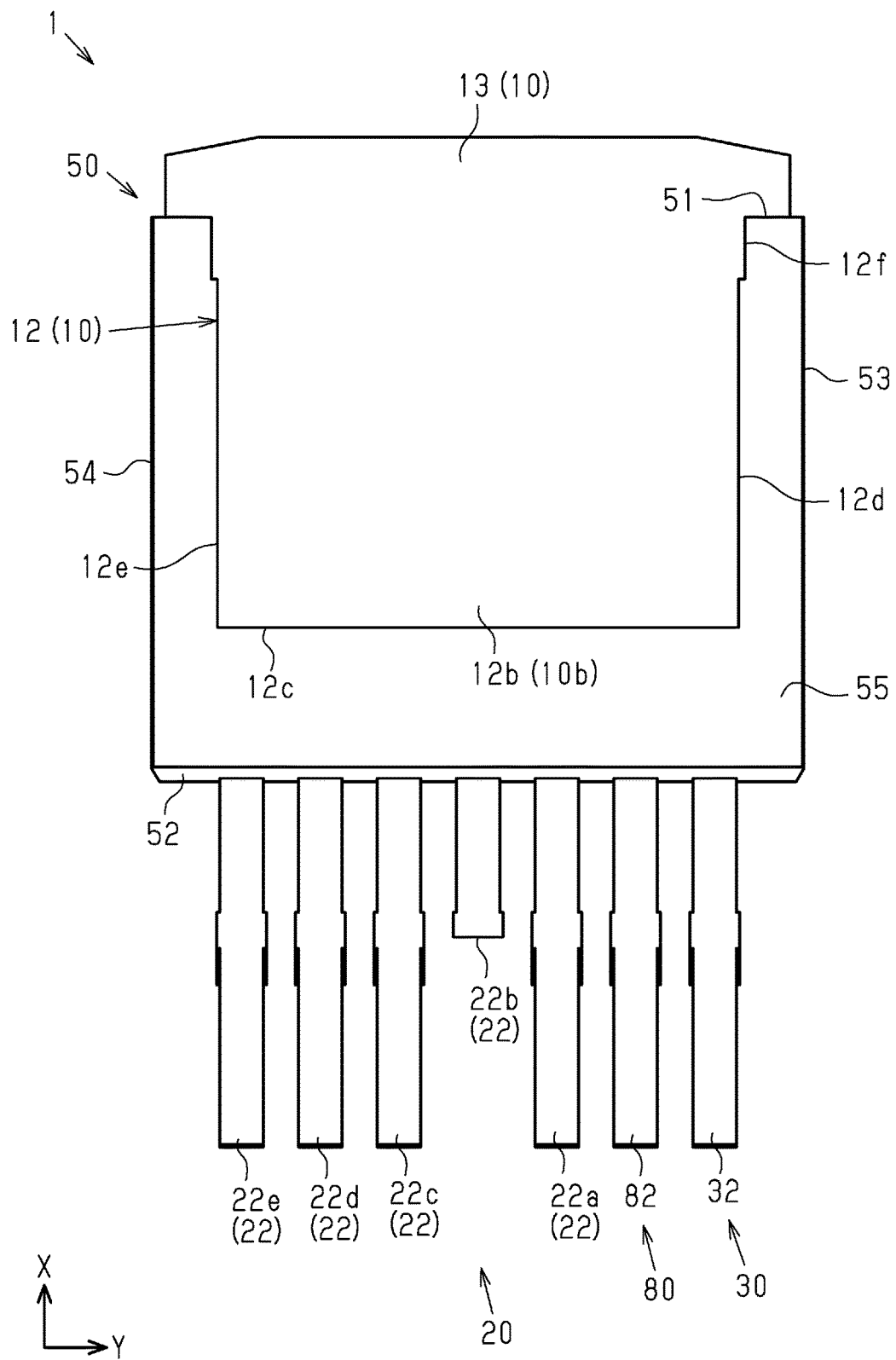
FIG. 14 is a rear view of the semiconductor device shown in FIG. 12.

As shown in FIG. 14, the rear surface 10b of the substrate 10 (the rear surface 12b of the inner body 12) is exposed from the encapsulation resin rear surface 55. Specifically, in the inner body 12, a portion of the first wide portion 12f and a portion of the rear surface 12b excluding the second wide portion 12g are exposed from the encapsulation resin rear surface 55. This improves the heat dissipation performance of the substrate 10. The rear surface 10b of the substrate 10 is flush with the encapsulation resin rear surface 55 of the encapsulation resin 50.

As shown in FIG. 13, in a plan view, the drive lead 20, the control lead 30, and the sense lead 80 are located closer to the second encapsulation resin side surface 52 of the encapsulation resin 50 than the substrate 10. In the present embodiment, in a plan view, an edge of each of the drive lead 20, the control lead 30, and the sense lead 80 located toward the first encapsulation resin side surface 51 overlaps an edge of the inner body 12 located toward the second encapsulation resin side surface 52. The drive lead 20, the control lead 30, and the sense lead 80 are spaced apart from each other in the lateral direction Y. The sense lead 80 is located between the drive lead 20 and the control lead 30 in the lateral direction Y.

The drive lead 20 includes a drive pad 21, drive terminals 22, and coupling portions 23 that couple the drive pad 21 to the drive terminals 22.

In a plan view, the drive pad 21 is rectangular so that a long-side direction conforms to the lateral direction Y and a short-side direction conforms to the longitudinal direction X. The first end 21a of the drive pad 21 is located closer to the third encapsulation resin side surface 53 than the central portion of the inner body 12 in the lateral direction Y. As viewed in the longitudinal direction X, the second end 21b of the drive pad 21 overlaps an end of the inner body 12 located toward the fourth encapsulation resin side surface 54. Thus, the dimension of the drive pad 21 in the lateral direction Y is greater than one-half of the dimension of the inner body 12 in the lateral direction Y. As shown in FIG. 12, the drive pad 21 is located closer to the encapsulation resin top surface 56 than the main surface 10a of the substrate 10 in the thickness-wise direction Z. Also, the drive pad 21 is located closer to the encapsulation resin top surface 56 than the semiconductor element 40 in the thickness-wise direction Z.

As shown in FIG. 13, in the present embodiment, the drive terminals 22 include five drive terminals, namely, the drive terminals 22a, 22b, 22c, 22d, and 22e. The coupling portions 23 include five coupling portions, namely, coupling portions 23a, 23b, 23c, 23d, and 23e. The drive terminals 22a to 22e are spaced apart from each other in the lateral direction Y. The drive terminals 22a to 22e are arranged so that the drive terminals 22a, 22b, 22c, 22d, and 22e are sequentially located from the first end 21a toward the second end 21b of the drive pad 21. The coupling portions 23a to 23e are spaced apart from each other in the lateral direction Y. The coupling portion 23a couples the drive pad 21 to the drive terminal 22a. The coupling portion 23b couples the drive pad 21 to the drive terminal 22b. The coupling portion 23c couples the drive pad 21 to the drive terminal 22c. The coupling portion 23d couples the drive pad 21 to the drive terminal 22d. The coupling portion 23e couples the drive pad 21 to the drive terminal 22e.

As shown in FIG. 13, the drive terminals 22a to 22e, the control terminal 32, and a sense terminal 82, which will be described later, are arranged at equal pitches. The drive terminal 22a is arranged to include a portion located closer to the third encapsulation resin side surface 53 than the first end 21a of the drive pad 21. The drive terminal 22a is located closer to the third encapsulation resin side surface 53 than the central portion of the inner body 12 in the lateral direction Y.

The drive terminal 22b is located at the same position as the central portion of the inner body 12 in the lateral direction Y Specifically, an imaginary line LV1 extending in the longitudinal direction X through a central portion of the drive terminal 22b in the lateral direction Y coincides with an imaginary line LV2 extending in the longitudinal direction X through the central portion of the inner body 12 in the lateral direction Y. The drive terminals 22c to 22e are located closer to the fourth encapsulation resin side surface 54 than the central portion of the inner body 12 in the lateral direction Y. In the present embodiment, the drive terminals 22d and 22e are arranged closer to the fourth encapsulation resin side surface 54 than the semiconductor element 40. The drive terminals 22a and 22c to 22e are identical in shape. The drive terminal 22b is shorter than the drive terminals 22a and 22c to 22e.

As viewed in the longitudinal direction X, the control lead 30 overlaps an end of the inner body 12 located toward the third encapsulation resin side surface 53. The control lead 30 is located closer to the third encapsulation resin side surface 53 than the semiconductor element 40.

As shown in FIG. 12, the control pad 31 is located closer to the encapsulation resin top surface 56 than the main surface 10a of the substrate 10 in the thickness-wise direction Z. Also, the control pad 31 is located closer to the encapsulation resin top surface 56 than the semiconductor element 40 in the thickness-wise direction Z. As shown in FIG. 13, in a plan view, the control pad 31 is rectangular so that a long-side direction conforms to the longitudinal direction X and a short-side direction conforms to the lateral direction Y. The dimension of the control pad 31 in the lateral direction Y is less than the dimension of the drive pad 21 in the lateral direction Y. This allows for an increase in the dimension of the drive pad 21 in the lateral direction Y. The control terminal 32 of the control lead 30 is configured to be a gate terminal. The control terminal 32 and the drive terminals 22a and 22c to 22e are identical in shape.

In the present embodiment, the sense lead 80 is configured to electrically connect the control electrode 43 (gate electrode) to the main surface drive electrode 41 (source electrode). In a plan view, the sense lead 80 is located closer to the third encapsulation resin side surface 53 than the semiconductor element 40. The sense lead 80 includes a sense pad 81, the sense terminal 82, and a coupling portion 83 that couples the sense pad 81 to the sense terminal 82.

The sense pad 81 is spaced apart from the semiconductor element 40 in the longitudinal direction X. The sense pad 81 is located between the substrate 10 and the second encapsulation resin side surface 52 in the longitudinal direction X. The sense pad 81 is located between the drive pad 21 and the control pad 31 in the lateral direction Y. In a plan view, the sense pad 81 is rectangular so that a long-side direction conforms to the longitudinal direction X and a short-side direction conforms to the lateral direction Y. The dimension of the sense pad 81 in the lateral direction Y is equal to the dimension of the control pad 31 in the lateral direction Y. That is, the dimension of the sense pad 81 in the lateral direction Y is less than the dimension of the drive pad 21 in the lateral direction Y. This allows for an increase in the dimension of the drive pad 21 in the lateral direction Y. As shown in FIG. 12, the sense pad 81 is located closer to the encapsulation resin top surface 56 than the main surface 10a of the substrate 10 in the thickness-wise direction Z. Also, the sense pad 81 is located closer to the encapsulation resin top surface 56 than the semiconductor element 40 in the thickness-wise direction Z. The dimension of the sense pad 81 in the lateral direction Y and the dimension of the control pad 31 in the lateral direction Y may be changed in any manner. In an example, the dimension of the sense pad 81 in the lateral direction Y may be less than the dimension of the control pad 31 in the lateral direction Y.

As shown in FIG. 13, the coupling portion 83 is continuous from an end of the sense pad 81 located toward the second encapsulation resin side surface 52 in the longitudinal direction X. The coupling portion 83 is arranged on an end of the sense pad 81 located toward the third encapsulation resin side surface 53 in the lateral direction Y. The sense terminal 82 projects from the second encapsulation resin side surface 52. The sense terminal 82, the drive terminals 22a and 22c to 22e, and the control terminal 32 are identical in shape.

In the same manner as the first embodiment, a SiC MOSFET is used as the semiconductor element 40. Also, as in the first embodiment, the semiconductor element 40 is an element capable of high-speed switching in response to a drive signal having a frequency between 1 kHz and a few hundred kHz, inclusive. Preferably, the semiconductor element 40 is an element capable of high-speed switching in response to a drive signal having a frequency between 1 kHz and 100 kHz, inclusive. In the present embodiment, the semiconductor element 40 performs high-speed switching in response to a drive signal having a frequency of 100 kHz. The shape and size of the semiconductor element 40 are similar to those of the semiconductor element 40 of the first embodiment.

The semiconductor element 40 is located on the inner body 12 at a position toward the second encapsulation resin side surface 52 in the longitudinal direction X. Specifically, in a plan view, the first distance D1 in the longitudinal direction X between the semiconductor element 40 and the edge of the first flange 19a of the inner body 12 located toward the second encapsulation resin side surface 52 is less than the second distance D2 in the longitudinal direction X between the semiconductor element 40 and the first wide portion 12f of the inner body 12.

The semiconductor element 40 is located on the central portion of the inner body 12 in the lateral direction Y. Specifically, the third distance D3 in the lateral direction Y between the semiconductor element 40 and the edge of the second flange 19b of the inner body 12 located toward the third encapsulation resin side surface 53 is equal to the fourth distance D4 in the lateral direction Y between the semiconductor element 40 and the edge of the third flange 19c of the inner body 12 located toward the fourth encapsulation resin side surface 54. When a difference between the third distance D3 and the fourth distance D4 is, for example, within 5% of the third distance D3, it is considered that the third distance D3 is equal to the fourth distance D4.

The semiconductor device 1 includes drive wires 60, a control wire 70, and a sense wire 90. In the present embodiment, the drive wires 60 include two drive wires, namely, a first drive wire 61 and a second drive wire 62. More specifically, the first drive wire 61 and the second drive wire 62 are configured to be a combination of the furthermost ones of the drive wires 60. The first drive wire 61 and the second drive wire 62 are spaced apart from each other in the lateral direction Y. The first drive wire 61 and the second drive wire 62 are ones of the drive wires 60 located at opposite ends in the lateral direction Y. The control wire 70, the first drive wire 61, and the second drive wire 62 are spaced apart from each other in the lateral direction Y The first drive wire 61 is located closer to the control wire 70 than the second drive wire 62.

The first drive wire 61 and the second drive wire 62 are formed of the same metal.

In the present embodiment, the first drive wire 61 and the second drive wire 62 contain aluminum. The first drive wire 61 and the second drive wire 62 have the same diameter. When a difference between the diameter of the first drive wire 61 and the diameter of the second drive wire 62 is, for example, within 5% of the diameter of the first drive wire 61, it is considered that the first drive wire 61 and the second drive wire 62 have the same diameter. In the present embodiment, the first drive wire 61, the second drive wire 62, and the control wire 70 have the same diameter. When a difference between the diameter of each of the first drive wire 61 and the second drive wire 62 and the diameter of the control wire 70 is, for example, within 5% of the diameter of the control wire 70, it is considered that the first drive wire 61, the second drive wire 62, and the control wire 70 have the same diameter. Each of the first drive wire 61 and the second drive wire 62 is connected to the main surface drive electrode 41 and the drive pad 21 by, for example, wire bonding.

In a plan view, the first drive wire 61 and the second drive wire 62 are connected to the main surface drive electrode 41 and the drive pad 21 so that the first drive wire 61 and the second drive wire 62 are separated by a greater distance at the drive pad 21 than at the main surface drive electrode 41. In a plan view, the distance between the first drive wire 61 and the second drive wire 62 increases from the main surface drive electrode 41 toward the drive pad 21. The configurations of the first drive wire 61 and the second drive wire 62 will be specifically described below.

Figure 15:
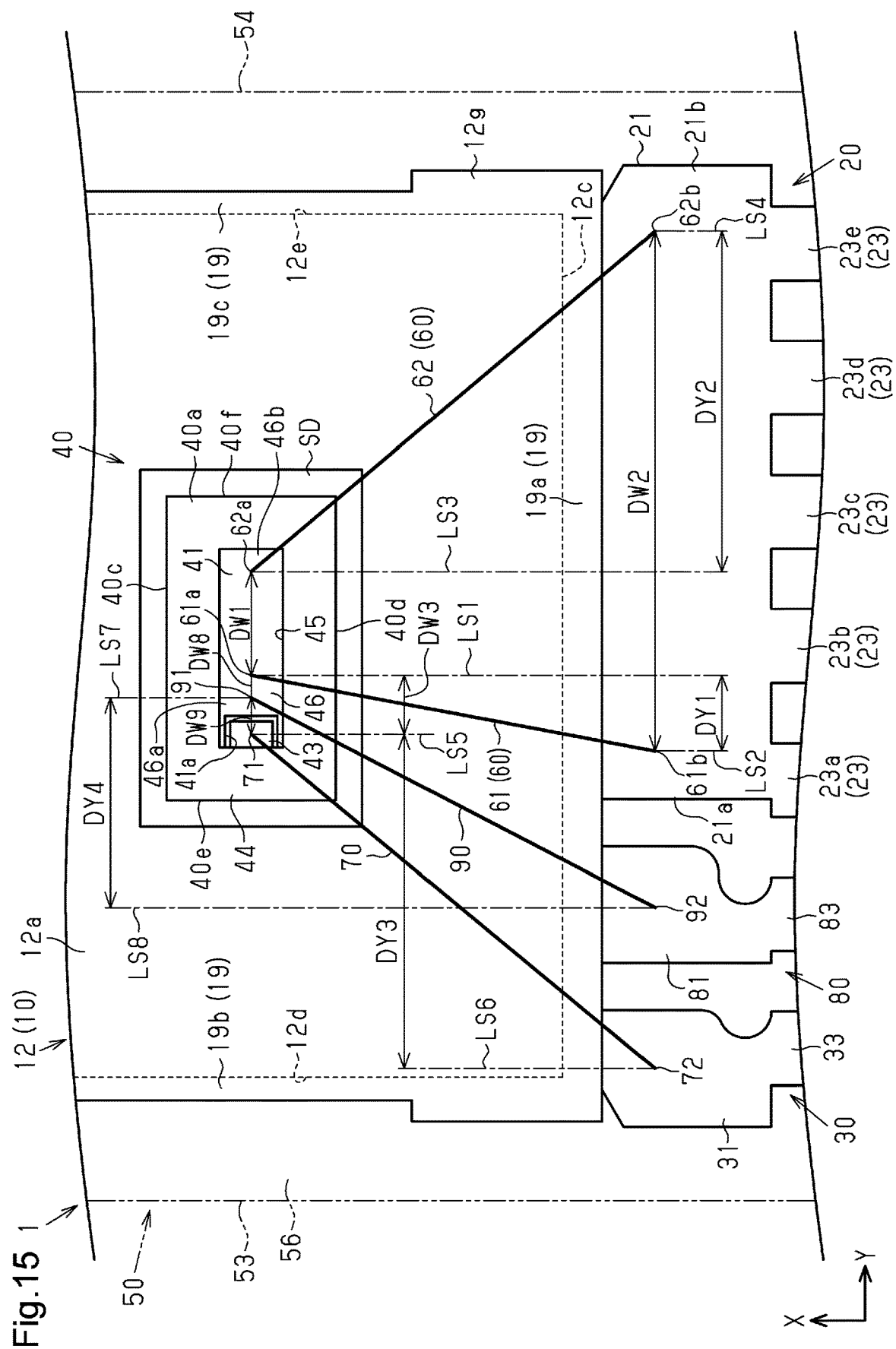
FIG. 15 is an enlarged view showing the semiconductor element shown in FIG. 13 and its surroundings.

As shown in FIG. 15, in a plan view, the distance DW2 between the drive pad end 61b of the first drive wire 61 and the drive pad end 62b of the second drive wire 62 is greater than the distance DW1 between the drive electrode end 61a of the first drive wire 61 and the drive electrode end 62a of the second drive wire 62. In the present embodiment, the drive pad end 61b is located closer to the third encapsulation resin side surface 53 than the drive electrode end 61a in the lateral direction Y. The drive pad end 62b is located closer to the fourth encapsulation resin side surface 54 than the drive electrode end 62a in the lateral direction Y. Thus, in a plan view, the inclination direction of the first drive wire 61 with respect to the longitudinal direction X is opposite to the inclination direction of the second drive wire 62 with respect to the longitudinal direction X.

An auxiliary line LS1 extends from the drive electrode end 61a in the longitudinal direction X. An auxiliary line LS2 extends from the drive pad end 61b in the longitudinal direction X. The distance between the auxiliary line LS1 and the auxiliary line LS2 in the lateral direction Y is referred to as a distance DY1. An auxiliary line LS3 extends from the drive electrode end 62a in the longitudinal direction X. An auxiliary line LS4 extends from the drive pad end 62b in the longitudinal direction X. The distance between the auxiliary line LS3 and the auxiliary line LS4 in the lateral direction Y is referred to as a distance DY2. In this case, the distance DY2 is greater than the distance DY1.

The drive electrode end 61a of the first drive wire 61 is connected to the main surface drive electrode 41 at a position closer to the first exposed end 46a than a central portion of the exposed region 46 in the lateral direction Y. In the present embodiment, the drive electrode end 61a is connected to a portion of the main surface drive electrode 41 located closer to the central portion of the exposed region 46 than the first exposed end 46a of the exposed region 46 in the lateral direction Y. In other words, the drive electrode end 61a is connected to a portion of the exposed region 46 separated from the control electrode 43, that is, a portion of the main surface drive electrode 41 separated from the bottom of the recess 41a. The drive electrode end 61a overlaps the coupling portion 23b of the drive lead 20 as viewed in the longitudinal direction X.

The drive pad end 61b of the first drive wire 61 is connected to the drive pad 21 at a position closer to the first end 21a than a central portion of the drive pad 21 in the lateral direction Y. In the present embodiment, the drive pad end 61b is connected to the first end 21a of the drive pad 21. The drive pad end 61b is connected to a portion of the drive pad 21 located closer to the third encapsulation resin side surface 53 than the coupling portion 23b in the lateral direction Y. In the present embodiment, the drive pad end 61b overlaps the coupling portion 23a of the drive lead 20 as viewed in the longitudinal direction X. In the longitudinal direction X, the drive pad end 61b is connected to a portion of the drive pad 21 located closer to the semiconductor element 40 than the central portion of the drive pad 21 in the longitudinal direction X.

The drive pad end 61b may be connected to the first end 21a of the drive pad 21 at the limit position toward the third encapsulation resin side surface 53 in the lateral direction Yin a region of the first end 21a where wire bonding is performable.

The drive electrode end 62a of the second drive wire 62 is connected to the main surface drive electrode 41 at a position closer to the second exposed end 46b than the central portion of the exposed region 46 in the lateral direction Y. In the present embodiment, the drive electrode end 62a is connected to the second exposed end 46b of the exposed region 46. In the present embodiment, as viewed in the longitudinal direction X, the drive electrode end 62a overlaps a portion between the coupling portion 23b and the coupling portion 23c in the lateral direction Y. In an example, the position of the drive electrode end 62a in relation to the exposed region 46 is set so that the drive electrode end 62a is located at the limit position toward the fourth side surface 40f in the lateral direction Y in a region of the second exposed end 46b of the exposed region 46 where wire bonding is performable. The drive electrode end 62a and the drive electrode end 61a of the first drive wire 61 are arranged at the same position in the longitudinal direction X. The state in which the drive electrode end 62a and the drive electrode end 61a are located at the same position in the longitudinal direction includes a state in which the drive electrode ends 61a and 62a overlap with each other in the longitudinal direction X and a state in which the drive electrode ends 61a and 62a partially overlap due to a manufacturing error caused by wire bonding. In other words, when a difference between the drive electrode ends 61a and 62a in the longitudinal direction X is an extent of a variation caused when performing wire bonding, it is considered that the drive electrode ends 61a and 62a are located at the same position in the longitudinal direction X.

The drive pad end 62b of the second drive wire 62 is connected to the drive pad 21 at a position closer to the second end 21b than the central portion of the drive pad 21 in the lateral direction Y. In the present embodiment, the drive pad end 62b is connected to the second end 21b of the drive pad 21. The drive pad end 62b is located closer to the fourth encapsulation resin side surface 54 than the semiconductor element 40. In the present embodiment, the drive pad end 62b overlaps the coupling portion 23e as viewed in the longitudinal direction X. The position of the drive pad end 62b in relation to the drive pad 21 may be set so that the drive pad end 62b is located at the limit position toward the fourth encapsulation resin side surface 54 in a region of the second end 21b of the drive pad 21 where wire bonding is performable. In the longitudinal direction X, the drive pad end 62b is connected to a portion of the drive pad 21 located closer to the semiconductor element 40 than the central portion of the drive pad 21 in the longitudinal direction X.

The control wire 70 connects the control electrode 43 of the semiconductor element 40 to the control pad 31. The control wire 70 is connected to the control electrode 43 and the control pad 31 by, for example, wire bonding. In the same manner as the first embodiment, the same material is used in the control wire 70 and the drive wires 60. The control wire 70, the first drive wire 61, and the second drive wire 62 have the same diameter. When a difference between the diameter of the control wire 70 and the diameter of the first drive wire 61 and the second drive wire 62 is, for example, within 5% of the control wire 70, it is considered that the control wire 70, the first drive wire 61, and the second drive wire 62 have the same diameter.

The control wire 70 includes a control electrode end 71 and a control pad end 72. The distance DW3 between the control electrode end 71 and the drive electrode end 61a of the first drive wire 61 is less than the distance DW1. The distance DY3 between the auxiliary line LS5 extending from the control electrode end 71 in the longitudinal direction X and the auxiliary line LS6 extending from the control pad end 72 in the longitudinal direction X is greater than the distance DY1 and slightly less than the distance DY2. The distance DY3 may be changed in any manner. In an example, the distance DY3 may be greater than or equal to the distance DY2.

The sense wire 90 connects the main surface drive electrode 41 of the semiconductor element 40 to the sense pad 81. The sense wire 90 is connected to the main surface drive electrode 41 and the sense pad 81 by, for example, wire bonding. The same material is used in the sense wire 90, the first drive wire 61, the second drive wire 62, and the control wire 70. The diameter of the sense wire 90 is, for example, the same as the diameter of the control wire 70. When a difference between the diameter of the sense wire 90 and the diameter of the control wire 70 is, for example, within 5% of the diameter of the sense wire 90, it is considered that the sense wire 90 and the control wire 70 have the same diameter.

The sense wire 90 includes a drive electrode end 91 and a sense pad end 92. The drive electrode end 91 is an end of the sense wire 90 connected to the main surface drive electrode 41. The sense pad end 92 is an end of the sense wire 90 connected to the sense pad 81. The sense pad end 92 is located closer to the third encapsulation resin side surface 53 than the drive electrode end 91 in the lateral direction Y.

The drive electrode end 91 is connected to a portion of the main surface drive electrode 41 between the drive electrode end 61a of the first drive wire 61 and the control electrode 43 in the lateral direction Y A distance DW8 between the drive electrode end 91 and the drive electrode end 61a of the first drive wire 61 is less than a distance DW9 between the drive electrode end 91 and the control electrode end 71 of the control wire 70.

An auxiliary line LS7 extends from the drive electrode end 91 in the longitudinal direction X. An auxiliary line LS8 extends from the sense pad end 92 in the longitudinal direction X. A distance DY4 between the auxiliary line LS7 and the auxiliary line LS8 is greater than the distance DY1 and less than the distance DY2. The distance DY4 is less than the distance DY3.

The semiconductor device 1 of the present embodiment has the following advantages in addition to advantages (1-1) to (1-7) of the first embodiment.

(2-1) The semiconductor device 1 includes the sense lead 80 and the sense wire 90 configured to electrically connect the main surface drive electrode 41 of the semiconductor element 40 (source electrode) and the control electrode 43 (gate electrode). In this configuration, the voltage of the control electrode 43 varies in accordance with variations in the voltage of the main surface drive electrode 41. This reduces variations in the source-gate voltage of the semiconductor element 40. Accordingly, variations in the threshold voltage of the semiconductor element 40 are limited.

(2-2) The semiconductor element 40 is located on the inner body 12 of the substrate 10 at a position toward the second encapsulation resin side surface 52. This configuration decreases the distance between the opening 45 of the semiconductor element 40 and the drive pad 21, thereby shortening the first drive wire 61 and the second drive wire 62. As a result, the inductance between the main surface drive electrode 41 and the drive pad 21 is reduced.

(2-3) The dimension of the drive pad 21 in the lateral direction Y is greater than the dimension of the semiconductor element 40 in the lateral direction Y. This configuration allows for a further increase in the distance between the drive pad end 61b of the first drive wire 61 and the drive pad end 62b of the second drive wire 62. Thus, the inductance between the main surface drive electrode 41 and the drive pad 21 is further reduced.

(2-4) The dimension of the drive pad 21 in the lateral direction Y is greater than one-half of the dimension of the inner body 12 of the substrate 10. This configuration allows for an increase in the distance DW2 between the drive pad end 61b of the first drive wire 61 and the drive pad end 62b of the second drive wire 62. As a result, the inductance between the main surface drive electrode 41 and the drive pad 21 is reduced.

(2-5) The semiconductor element 40 and the drive pad 21 are arranged so that the entire opening 45 of the semiconductor element 40 overlaps the drive pad 21 as viewed in the longitudinal direction X. This configuration allows the first drive wire 61 to be shortened while allowing for an increase in the distance between the first drive wire 61 and the second drive wire 62. As a result, the inductance between the main surface drive electrode 41 and the drive pad 21 is reduced.

(2-6) The same material is used in the drive wires 60, the control wire 70, and the sense wire 90. The drive wires 60, the control wire 70, and the sense wire 90 have the same diameter. In this configuration, the same wire may be used when performing a task for connecting the drive wires 60 to the main surface drive electrode 41 and the drive pad 21 and a task for connecting the control wire 70 to the control electrode 43 and the control pad 31, and a task for connecting the sense wire 90 to the main surface drive electrode 41 and the sense pad 81. This simplifies the process of the tasks.

Modified Examples of Second Embodiment

The semiconductor device 1 of the second embodiment may be modified, for example, as follows. The modified example described below may be combined with one another as long as there is no technical inconsistency. In the following modified examples, the same reference characters are given to those elements that are the same as the corresponding elements of the second embodiment. Such elements will not be described in detail.

Figure 16:
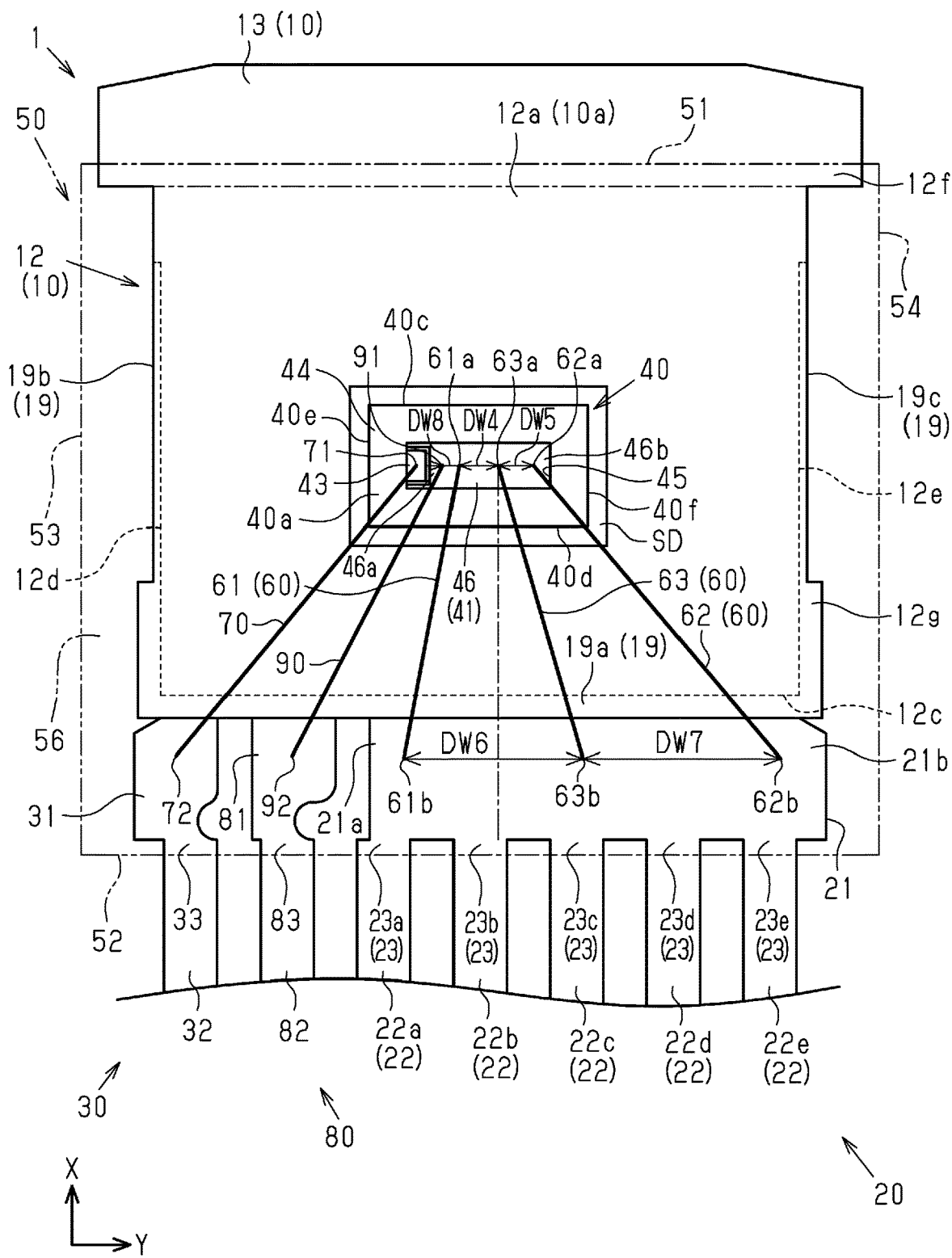
FIG. 16 is an enlarged view showing a semiconductor element and its surroundings in a modified example of the semiconductor device of the second embodiment.

The number of drive wires 60 is not limited to two and may be changed in any manner. In an example, as shown in FIG. 16, the drive wires 60 may include three drive wires, namely, the first drive wire 61, the second drive wire 62, and a third drive wire 63. The third drive wire 63 is arranged between the first drive wire 61 and the second drive wire 62. In this case, the first drive wire 61 and the second drive wire 62 are configured to be a combination of the furthermost ones of the drive wires 60.

More specifically, when three or more drive wires are used, the combination of the furthermost ones correspond to two drive wires that are located at the furthermost positions. For example, when three or more drive wires are arranged in the lateral direction Y, the combination of the furthermost ones is a combination of drive wires located at opposite ends in the lateral direction Y.

The third drive wire 63 includes a drive electrode end 63a and a drive pad end 63b. The drive electrode end 63a is an end of the third drive wire 63 connected to the main surface drive electrode 41. The drive pad end 63b is an end of the third drive wire 63 connected to the drive pad 21. In FIG. 16, the drive electrode end 63a overlaps the coupling portion 23b of the drive lead 20 as viewed in the longitudinal direction X. The drive pad end 63b overlaps the coupling portion 23c of the drive lead 20 as viewed in the longitudinal direction X. More specifically, the drive pad end 63b is located closer to the fourth encapsulation resin side surface 54 than the drive electrode end 63a.

In FIG. 16, the distance DW4 between the drive electrode end 63a and the drive electrode end 61a of the first drive wire 61 is less than the distance DW5 between the drive electrode end 63a and the drive electrode end 62a of the second drive wire 62. The distance DW4 and the distance DW5 are greater than the distance DW8 between the drive electrode end 91 and the drive electrode end 61a of the first drive wire 61. The position of the drive electrode end 63a in the lateral direction Y may be changed in any manner. In an example, the drive electrode end 63a may be connected to the main surface drive electrode 41 so that the distance DW4 is equal to the distance DW5.

In FIG. 16, the drive electrode end 61a of the first drive wire 61, the drive electrode end 62a of the second drive wire 62, and the drive electrode end 63a of the third drive wire 63 are located at the same position in the longitudinal direction X. The state in which the drive electrode ends 61a, 62a, and 63a are located at the same position in the longitudinal direction X includes a state in which the drive electrode ends 61a, 62a, and 63a overlap with each other in the longitudinal direction X and a state in which the drive electrode ends 61a, 62a, and 63a partially overlap due to a manufacturing error caused by wire bonding. In other words, when a difference between the drive electrode ends 61a, 62a, and 63a in the longitudinal direction X is an extent of a variation caused when performing wire bonding, it is considered that the drive electrode ends 61a, 62a, and 63a are located at the same position in the longitudinal direction X.

In the longitudinal direction X, the drive pad end 63b of the third drive wire 63 is connected to a portion of the drive pad 21 located closer to the semiconductor element 40 than the central portion of the drive pad 21 in the longitudinal direction X. A distance DW6 between the drive pad end 61b of the first drive wire 61 and the drive pad end 63b is greater than the distance DW4. A distance DW7 between the drive pad end 62b of the second drive wire 62 and the drive pad end 63b is greater than the distance DW5. In FIG. 16, the distance DW7 is greater than the distance DW6.

In a plan view, the first drive wire 61 and the third drive wire 63 are connected to the main surface drive electrode 41 and the drive pad 21 so that the first drive wire 61 and the third drive wire 63 are separated by a greater distance at the drive pad 21 than at the main surface drive electrode 41. In a plan view, the distance between the first drive wire 61 and the third drive wire 63 gradually increases from the main surface drive electrode 41 toward the drive pad 21. In a plan view, the third drive wire 63 and the second drive wire 62 are connected to the main surface drive electrode 41 and the drive pad 21 so that the third drive wire 63 and the second drive wire 62 are separated by a greater distance at the drive pad 21 than at the main surface drive electrode 41. In a plan view, the distance between the third drive wire 63 and the second drive wire 62 gradually increases from the main surface drive electrode 41 toward the drive pad 21.

Figure 17:
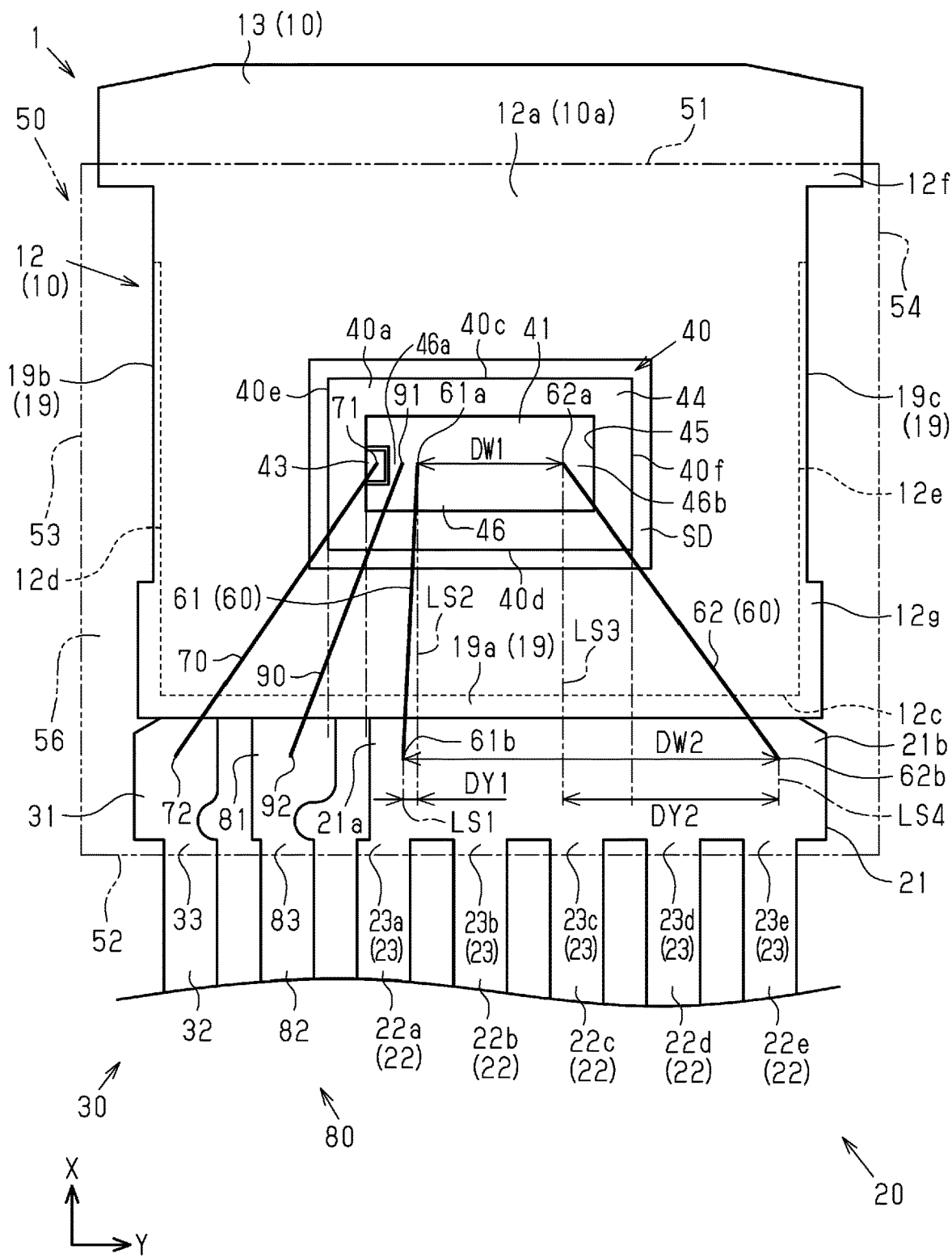
FIG. 17 is an enlarged view showing a semiconductor element and its surroundings in a modified example of the semiconductor device of the second embodiment.
Figure 19:
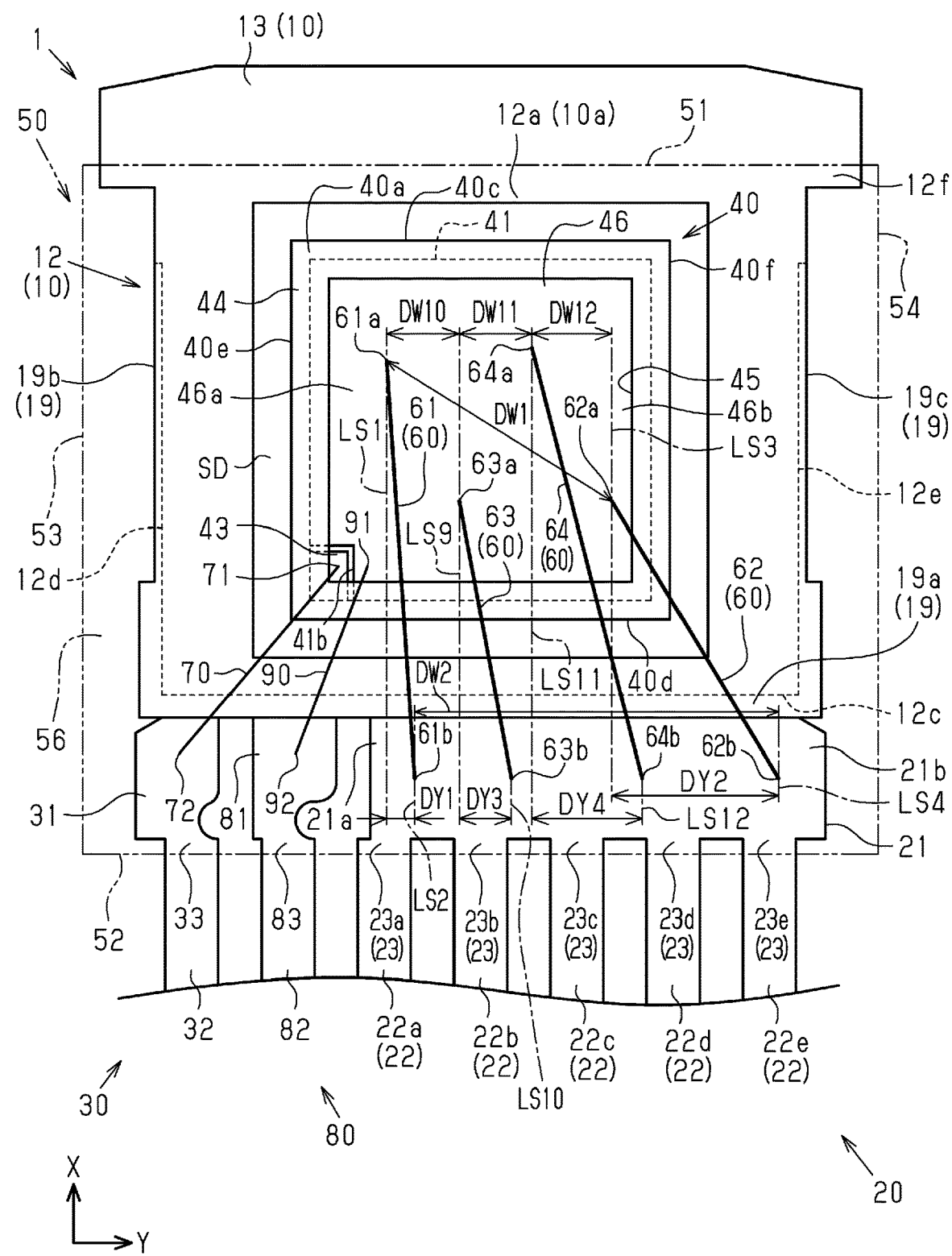
FIG. 19 is an enlarged view showing a semiconductor element and its surroundings in a modified example of the semiconductor device of the second embodiment.

The size of the semiconductor element 40 may be changed in any manner. In a first example, as shown in FIG. 17, the semiconductor element 40 may have a greater size than the semiconductor element 40 of the second embodiment. In a second example, as shown in FIG. 19, the semiconductor element 40 may have a greater size than the semiconductor element 40 shown in FIG. 17.

In the first example shown in FIG. 17, the semiconductor element 40 is greater in size in the longitudinal direction X and the lateral direction Y than the semiconductor element 40 of the second embodiment. In accordance with the increase in the size of the semiconductor element 40, the opening 45 formed in the front surface 40a may be increased in size in the longitudinal direction X and the lateral direction Y In FIG. 17, the dimension of the opening 45 in the lateral direction Y is less than in the dimension of the drive pad 21 in the lateral direction Y. The dimension of the drive pad 21 in the lateral direction Y is greater than the dimension of the semiconductor element 40 in the lateral direction Y. The opening 45 overlaps the first end 21a of the drive pad 21 as viewed in the longitudinal direction X. More specifically, the edge of the opening 45 located toward the third side surface 40e is located closer to the third encapsulation resin side surface 53 than the drive pad 21. The opening 45 also overlaps the coupling portion 23c of the drive lead 20 as viewed in the longitudinal direction X.

In FIG. 17, as viewed in the longitudinal direction X, the third side surface 40e of the semiconductor element 40 overlaps an end of the sense lead 80 located toward the fourth encapsulation resin side surface 54. As viewed in the longitudinal direction X, the fourth side surface 40f of the semiconductor element 40 overlaps the drive pad 21 between the coupling portion 23c and the coupling portion 23d in the lateral direction Y.

As in the second embodiment, the semiconductor device 1 includes the first drive wire 61 and the second drive wire 62 as the drive wires 60. In the same manner as the drive electrode end 61a of the second embodiment, the drive electrode end 61a of the first drive wire 61 is connected to a portion of the main surface drive electrode 41 separated from the control electrode 43 in the lateral direction Y. In the same manner as the drive pad end 61b of the second embodiment, the drive pad end 61b of the first drive wire 61 is connected to the first end 21a of the drive pad 21. In the same manner as the drive electrode end 62a of the second embodiment, the drive electrode end 62a of the second drive wire 62 is connected to an end of the opening 45 located toward the fourth side surface 40f of the semiconductor element 40 in the lateral direction Y. In the same manner as the drive pad end 62b of the second embodiment, the drive pad end 62b of the second drive wire 62 is connected to the second end 21b of the drive pad 21. The drive electrode end 61a and the drive electrode end 62a are located at the same position in the longitudinal direction X and arranged in the lateral direction Y. Each of the drive pad end 61b and the drive pad end 62b is connected to a portion of the drive pad 21 located closer to the semiconductor element 40 than the central portion of the drive pad 21 in the longitudinal direction X.

In FIG. 17, the distance DY1 in the lateral direction Y between the auxiliary line LS1 extending from the drive electrode end 61a in the longitudinal direction X and the auxiliary line LS2 extending from the drive pad end 61b in the longitudinal direction X is less than the distance DY2 in the lateral direction Y between the auxiliary line LS3 extending from the drive electrode end 62a in the longitudinal direction X and the auxiliary line LS4 extending from the drive pad end 62b in the longitudinal direction X. In a plan view, a distance DW2 between the drive pad end 61b and the drive pad end 62b is greater than a distance DW1 between the drive electrode end 61a and the drive electrode end 62a. Thus, in a plan view, the first drive wire 61 and the second drive wire 62 are connected to the main surface drive electrode 41 and the drive pad 21 so that the first drive wire 61 and the second drive wire 62 are separated by a greater distance at the drive pad 21 than at the main surface drive electrode 41. In a plan view, the distance between the first drive wire 61 and the second drive wire 62 gradually increases from the main surface drive electrode 41 toward the drive pad 21.

This configuration increases the distance between the first drive wire 61 and the second drive wire 62, thereby decreasing the inductance between the main surface drive electrode 41 (source electrode) and the drive terminal 22 of the drive lead 20 (source terminal).

Figure 18:
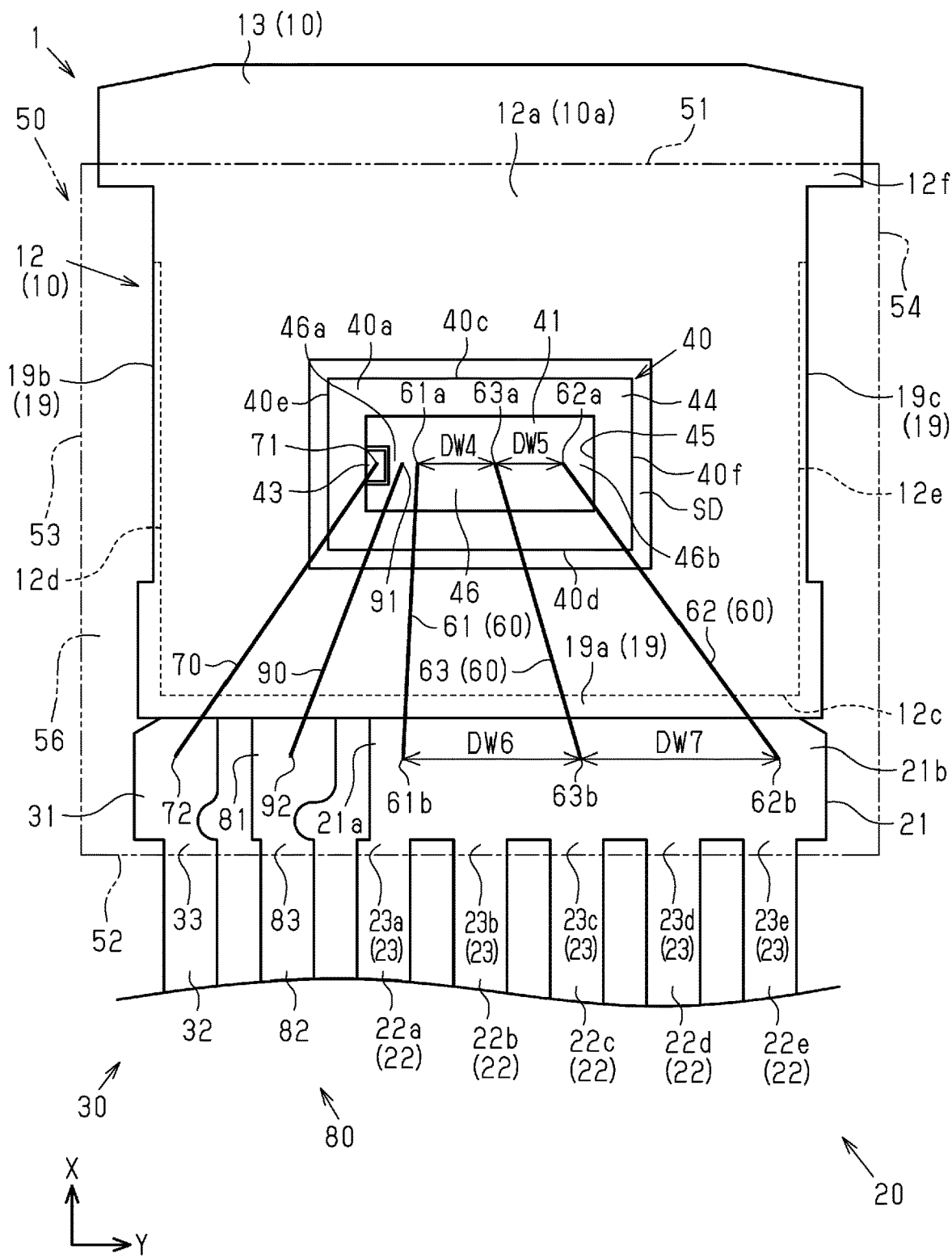
FIG. 18 is an enlarged view showing a semiconductor element and its surroundings in a modified example of the semiconductor device of the second embodiment.

In the modified example shown in FIG. 17, the number of drive wires 60 is not limited to two and may be changed in any manner. In an example, as shown in FIG. 18, the drive wires 60 may include three drive wires, namely, the first drive wire 61, the second drive wire 62, and a third drive wire 63. The third drive wire 63 is arranged between the first drive wire 61 and the second drive wire 62. In this case, the first drive wire 61 and the second drive wire 62 are configured to be a combination of the furthermost ones of the drive wires 60. The third drive wire 63 includes a drive electrode end 63a and a drive pad end 63b. The distance DW4 between the drive electrode end 63a and the drive electrode end 61a of the first drive wire 61 is greater than the distance DW5 between the drive electrode end 63a and the drive electrode end 62a of the second drive wire 62. The position of the drive electrode end 63a in relation to the main surface drive electrode 41 may be changed in any manner. In an example, the drive electrode end 63a may be connected to the main surface drive electrode 41 so that the distance DW4 is equal to the distance DW5.

In FIG. 18, the drive electrode end 61a of the first drive wire 61, the drive electrode end 62a of the second drive wire 62, and the drive electrode end 63a of the third drive wire 63 are located at the same position in the longitudinal direction X. The state in which the drive electrode ends 61a, 62a, and 63a are located at the same position in the longitudinal direction X includes a state in which the drive electrode ends 61a, 62a, and 63a overlap with each other in the longitudinal direction X and a state in which the drive electrode ends 61a, 62a, and 63a partially overlap due to a manufacturing error caused by wire bonding. In other words, when a difference between the drive electrode ends 61a, 62a, and 63a in the longitudinal direction X is an extent of a variation caused when performing wire bonding, it is considered that the drive electrode ends 61a, 62a, and 63a are located at the same position in the longitudinal direction X.

In the longitudinal direction X, the drive pad end 63b of the third drive wire 63 is arranged on a portion of the drive pad 21 located closer to the semiconductor element 40 than the central portion of the drive pad 21 in the longitudinal direction X. A distance DW6 between the drive pad end 61b of the first drive wire 61 and the drive pad end 63b is greater than the distance DW4. A distance DW7 between the drive pad end 62b of the second drive wire 62 and the drive pad end 63b is greater than the distance DW5. In FIG. 18, the distance DW7 is greater than the distance DW6.

In a plan view, the first drive wire 61 and the third drive wire 63 are connected to the main surface drive electrode 41 and the drive pad 21 so that the first drive wire 61 and the third drive wire 63 are separated by a greater distance at the drive pad 21 than at the main surface drive electrode 41. In a plan view, the distance between the first drive wire 61 and the third drive wire 63 gradually increases from the main surface drive electrode 41 toward the drive pad 21. In a plan view, the third drive wire 63 and the second drive wire 62 are connected to the main surface drive electrode 41 and the drive pad 21 so that the third drive wire 63 and the second drive wire 62 are separated by a greater distance at the drive pad 21 than at the main surface drive electrode 41. In a plan view, the distance between the third drive wire 63 and the second drive wire 62 gradually increases from the main surface drive electrode 41 toward the drive pad 21.

In a plan view, the inclination angle of the third drive wire 63 with respect to the longitudinal direction X may be changed in any manner. In an example, in a plan view, the inclination angle of the third drive wire 63 with respect to the longitudinal direction X may be equal to the inclination angle of the first drive wire 61 with respect to the longitudinal direction X or the inclination angle of the second drive wire 62 with respect to the longitudinal direction X.

In the second example shown in FIG. 19, the semiconductor element 40 is square in a plan view. The main surface drive electrode 41 (source electrode) formed on the front surface 40a of the semiconductor element 40 is substantially square in a plan view. A cutaway portion 41b is formed in an end of the semiconductor element 40 located at the second side surface 40d and the third side surface 40e. The control electrode 43 is formed in the cutaway portion 41b. The opening 45 formed in the passivation film 44 is square in a plan view. In the same manner as the second embodiment, the opening 45 exposes a portion of the main surface drive electrode 41 and a portion of the control electrode 43. The main surface drive electrode 41 includes the exposed region 46 exposed by the opening 45.

In the second example shown in FIG. 19, the semiconductor device 1 includes the first drive wire 61, the second drive wire 62, the third drive wire 63, and a fourth drive wire 64 as the drive wires 60. The third drive wire 63 and the fourth drive wire 64 are arranged between the first drive wire 61 and the second drive wire 62. In this case, the first drive wire 61 and the second drive wire 62 are configured to be a combination of the furthermost ones of the drive wires 60. The first drive wire 61, the second drive wire 62, the third drive wire 63, and the fourth drive wire 64 are spaced apart from each other in the lateral direction Y. In a plan view, the first drive wire 61 is located closer to the third side surface 40e of the semiconductor element 40 than the second drive wire 62, the third drive wire 63, and the fourth drive wire 64 in the lateral direction Y The second drive wire 62 is located closer to the fourth side surface 40f of the semiconductor element 40 than the first drive wire 61, the third drive wire 63, and the fourth drive wire 64 in the lateral direction Y. The third drive wire 63 is located closer to the third side surface 40e of the semiconductor element 40 than the fourth drive wire 64. As described above, the first drive wire 61 and the second drive wire 62, which are configured to be a combination of the furthermost ones of the drive wires 60, are the drive wires 60 that are located at opposite ends in the lateral direction Y.

The drive electrode end 61a of the first drive wire 61 is located closer to the third encapsulation resin side surface 53 than the drive pad end 61b of the first drive wire 61. Specifically, the drive electrode end 61a overlaps the coupling portion 23a of the drive lead 20 as viewed in the longitudinal direction X. As viewed in the longitudinal direction X, the drive pad end 61b overlaps the drive pad 21 between the coupling portion 23a and the coupling portion 23b.

The drive electrode end 62a of the second drive wire 62 is located closer to the third encapsulation resin side surface 53 than the drive pad end 62b of the second drive wire 62. Specifically, as viewed in the longitudinal direction X, the drive electrode end 62a overlaps the drive pad 21 between the coupling portion 23c and the coupling portion 23d. The drive pad end 62b overlaps the coupling portion 23e of the drive lead 20 as viewed in the longitudinal direction X.

The third drive wire 63 includes a drive electrode end 63a and a drive pad end 63b. The drive electrode end 63a is an end of the third drive wire 63 connected to the main surface drive electrode 41. The drive pad end 63b is an end of the third drive wire 63 connected to the drive pad 21. The drive electrode end 63a is arranged closer to the third encapsulation resin side surface 53 than the drive pad end 63b. Specifically, the drive electrode end 63a overlaps the coupling portion 23b of the drive lead 20 as viewed in the longitudinal direction X. The drive pad end 63b overlaps the drive pad 21 between the coupling portion 23b and the coupling portion 23c as viewed in the longitudinal direction X.

The fourth drive wire 64 includes a drive electrode end 64a and a drive pad end 64b. The drive electrode end 64a is an end of the fourth drive wire 64 connected to the main surface drive electrode 41. The drive pad end 64b is an end of the fourth drive wire 64 connected to the drive pad 21. The drive electrode end 64a is located closer to the third encapsulation resin side surface 53 than the drive pad end 64b. Specifically, as viewed in the longitudinal direction X, the drive electrode end 64a overlaps the drive pad 21 between the coupling portion 23b and the coupling portion 23c. The drive pad end 64b overlaps the drive pad 21 between the coupling portion 23c and the coupling portion 23d as viewed in the longitudinal direction X.

The drive electrode end 61a and the drive electrode end 63a are connected to the main surface drive electrode 41 at positions closer to the first exposed end 46a than the central portion of the exposed region 46 in the lateral direction Y. The drive electrode end 61a is connected to a position closer to the first exposed end 46a than the drive electrode end 63a in the lateral direction Y The drive electrode end 64a and the drive electrode end 62a are connected to the exposed region 46 at positions closer to the second exposed end 46b than the central portion of the exposed region 46 in the lateral direction Y. The drive electrode end 62a is connected to a position closer to the second exposed end 46b than the drive electrode end 64a.

The drive electrode end 61a of the first drive wire 61 and the drive electrode end 64a of the fourth drive wire 64 are located at positions different from the drive electrode end 62a of the second drive wire 62 and the drive electrode end 63a of the third drive wire 63 in the longitudinal direction X. Specifically, the drive electrode ends 61a and 64a are located closer to the first side surface 40c of the semiconductor element 40 than the drive electrode ends 62a and 63a. Thus, the first drive wire 61 and the fourth drive wire 64 are longer than the second drive wire 62 and the third drive wire 63. The drive electrode end 61a and the drive electrode end 64a are located at the same position in the longitudinal direction X and arranged in the lateral direction Y. The drive electrode end 62a and the drive electrode end 63a are located at the same position in the longitudinal direction X and arranged in the lateral direction Y. The state in which the drive electrode ends 61a and 64a are located at the same position in the longitudinal direction X includes a state in which the drive electrode ends 61a and 64a overlap with each other in the longitudinal direction X and a state in which the drive electrode ends 61a and 64a partially overlap due to manufacturing error caused by wire bonding. In other words, when a difference between the drive electrode ends 61a and 64a in the longitudinal direction X is an extent of a variation caused when performing wire bonding, it is considered that the drive electrode ends 61a and 64a are located at the same position in the longitudinal direction X. Also, the state in which the drive electrode ends 62a and 63a are located at the same position in the longitudinal direction X includes a state in which the drive electrode ends 62a and 63a overlap with each other in the longitudinal direction X and a state in which the drive electrode ends 62a and 63a partially overlap due to a manufacturing error caused by wire bonding. In other words, when a difference between the drive electrode ends 62a and 63a in the longitudinal direction X is an extent of a variation caused when performing wire bonding, it is considered that the drive electrode ends 62a and 63a are located at the same position in the longitudinal direction X.

The positions of the drive electrode ends 61a to 64a in the longitudinal direction X may be changed in any manner. In an example, the positions of the drive electrode ends 61a to 64a may differ from each other. The drive electrode ends 61a to 64a may be located at the same position and arranged in the lateral direction Y.

A distance DW10 between the auxiliary line LS1, which extends from the drive electrode end 61a in the longitudinal direction X, and an auxiliary line LS9 extending from the drive electrode end 63a in the longitudinal direction X is less than a distance DW11 between the auxiliary line LS9 and the auxiliary line LS11, which extends from the drive electrode end 64a in the longitudinal direction X. A distance DW12 in the lateral direction Y between the auxiliary line LS3, which extends from the drive electrode end 62a in the longitudinal direction X, and the auxiliary line LS11 is slightly less than the distance DW10. The positions of the drive electrode ends 61a to 64a in the lateral direction Y may be changed in any manner as long as the drive electrode end 61a is located closest to the third encapsulation resin side surface 53 and the drive electrode end 62a is located closest to the fourth encapsulation resin side surface 54 among the drive electrode ends 61a to 64a. In an example, the drive electrode ends 61a to 64a may be arranged so that the distance DW12 is equal to the distance DW10.

The distance DY1 in the lateral direction Y between the auxiliary line LS1 and the auxiliary line LS2, which extends from the drive pad end 61b in the longitudinal direction X, is less than the distance DY2 in the lateral direction Y between the auxiliary line LS3 and the auxiliary line LS4, which extends from the drive pad end 62b in the longitudinal direction X. The distance DY3 in the lateral direction Y between the auxiliary line LS9 and the auxiliary line LS10, which extends from the drive pad end 63b in the longitudinal direction X, is less than the distance DY4 in the lateral direction Y between the auxiliary line LS11 and the auxiliary line LS12, which extends from the drive pad end 64b in the longitudinal direction X. In FIG. 19, the distance DY1 is less than the distance DY3. The distance DY2 is greater than the distance DY4.

The drive electrode end 61a may be arranged at the limit position toward the fourth side surface 40f in a region where wire bonding is performable in an end of the opening 45 located toward the third side surface 40e of the semiconductor element 40 in the lateral direction Y. The drive pad end 61b may be arranged at the limit position toward the third encapsulation resin side surface 53 in a region of the first end 21a of the drive pad 21 where wire bonding is performable.

The drive electrode end 62a may be arranged at the limit position toward the fourth side surface 40f in a region where wire bonding is performable in an end of the opening 45 located toward the fourth side surface 40f of the semiconductor element 40 in the lateral direction Y. The drive pad end 62b may be arranged at the limit position toward the fourth encapsulation resin side surface 54 in a region of the second end 21b of the drive pad 21 where wire bonding is performable.

In a plan view, the first drive wire 61 and the second drive wire 62 are connected to the main surface drive electrode 41 and the drive pad 21 so that the first drive wire 61 and the second drive wire 62 are separated by a greater distance at the drive pad 21 than at the main surface drive electrode 41. In a plan view, the distance between the first drive wire 61 and the second drive wire 62 gradually increases from the main surface drive electrode 41 toward the drive pad 21. In a plan view, the first drive wire 61 and the third drive wire 63 are connected to the main surface drive electrode 41 and the drive pad 21 so that the first drive wire 61 and the third drive wire 63 are separated by a greater distance at the drive pad 21 than at the main surface drive electrode 41. In a plan view, the distance in the lateral direction Y between the first drive wire 61 and the third drive wire 63 gradually increases from the main surface drive electrode 41 toward the drive pad 21. In a plan view, the third drive wire 63 and the fourth drive wire 64 are connected to the main surface drive electrode 41 and the drive pad 21 so that the third drive wire 63 and the fourth drive wire 64 are separated by a greater distance at the drive pad 21 than at the main surface drive electrode 41. In a plan view, the distance in the lateral direction Y between the third drive wire 63 and the fourth drive wire 64 gradually increases from the main surface drive electrode 41 toward the drive pad 21. In a plan view, the fourth drive wire 64 and the second drive wire 62 are connected to the main surface drive electrode 41 and the drive pad 21 so that the fourth drive wire 64 and the second drive wire 62 are separated by a greater distance at the drive pad 21 than at the main surface drive electrode 41. In a plan view, the distance in the lateral direction Y between the fourth drive wire 64 and the second drive wire 62 gradually increases from the main surface drive electrode 41 toward the drive pad 21. In a plan view, the third drive wire 63 and the second drive wire 62 are connected to the main surface drive electrode 41 and the drive pad 21 so that the third drive wire 63 and the second drive wire 62 are separated by a greater distance at the drive pad 21 than at the main surface drive electrode 41. In a plan view, the distance in the lateral direction Y between the third drive wire 63 and the second drive wire 62 gradually increases from the main surface drive electrode 41 toward the drive pad 21.

The drive electrode end 91 of the sense wire 90 is connected to a portion of the main surface drive electrode 41 between the control electrode end 71 of the control wire 70 and the drive electrode end 61a of the first drive wire 61 in the lateral direction Y. The drive electrode end 91 is connected to an end of the main surface drive electrode 41 located toward the second side surface 40d. More specifically, the drive electrode end 91 is connected to a portion of the main surface drive electrode 41 located next to the control electrode 43 in the lateral direction Y. This configuration shortens the sense wire 90.

Figure 20:
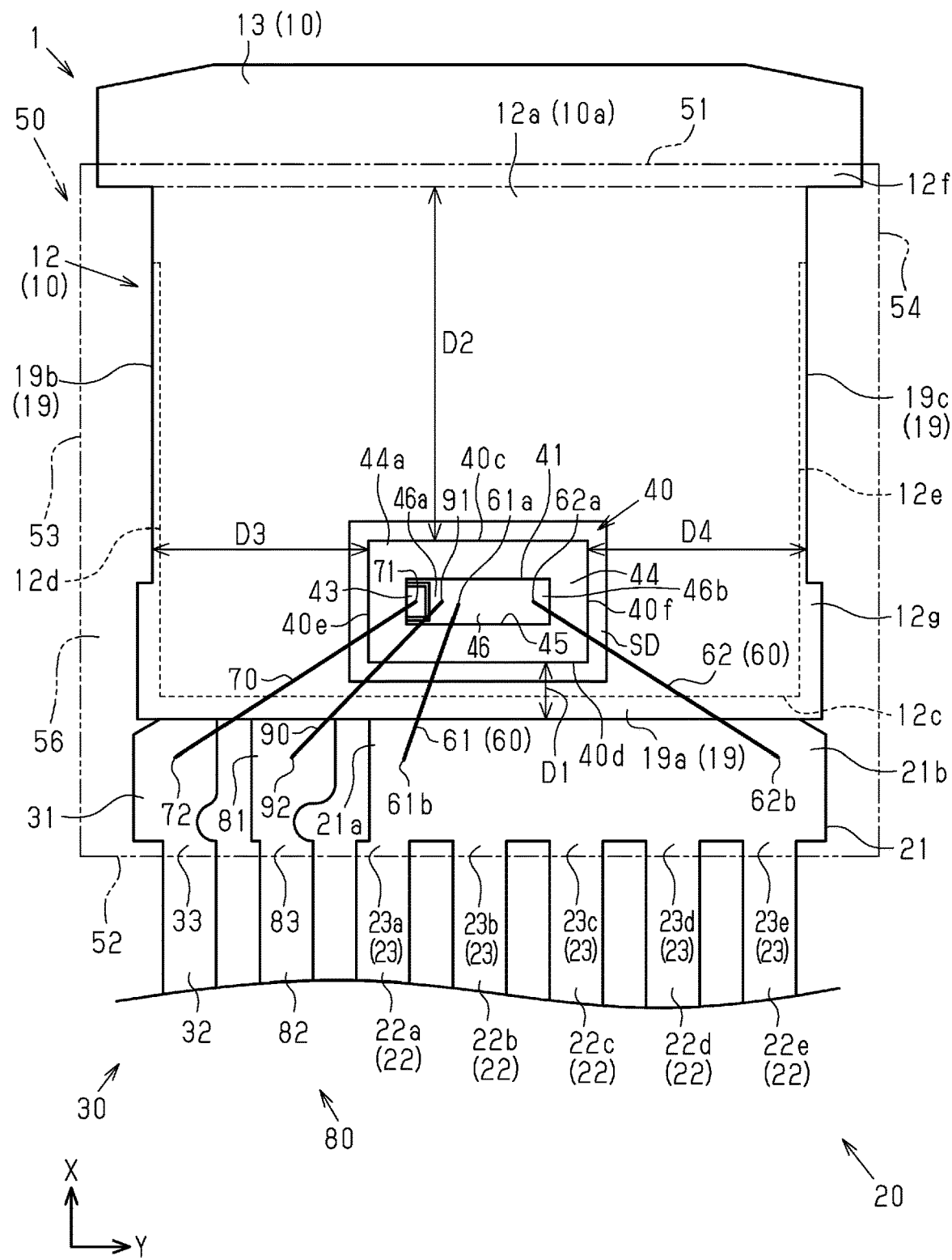
FIG. 20 is an enlarged view showing a semiconductor element and its surroundings in a modified example of the semiconductor device of the second embodiment.

The position of the semiconductor element 40 in relation to the inner body 12 may be changed in any manner. In a first example, as shown in FIG. 20, the semiconductor element 40 may be arranged on a portion of the inner body 12 located toward the second encapsulation resin side surface 52. Specifically, the first distance D1 in the longitudinal direction X between the semiconductor element 40 and the edge of the first flange 19a of the inner body 12 located toward the second encapsulation resin side surface 52 is less than one-half of the second distance D2 in the longitudinal direction X between the semiconductor element 40 and the first wide portion 12f of the inner body 12. The first distance D1 is less than one-third of the second distance D2. In FIG. 20, the first distance D1 is approximately one-sixth of the second distance D2.

In the lateral direction Y, the semiconductor element 40 is arranged on the central portion of the inner body 12. Specifically, the third distance D3 in the lateral direction Y between the semiconductor element 40 and the edge of the second flange 19b of the inner body 12 located toward the third encapsulation resin side surface 53 is equal to the fourth distance D4 in the lateral direction Y between the semiconductor element 40 and the edge of the third flange 19c of the inner body 12 located toward the fourth encapsulation resin side surface 54. When a difference between the third distance D3 and the fourth distance D4 is, for example, within 5% of the third distance D3, it is considered that the third distance D3 is equal to the fourth distance D4.

This configuration decreases the distance between the opening 45 of the semiconductor element 40 and the drive pad 21, thereby shortening the first drive wire 61 and the second drive wire 62. As a result, the inductance between the main surface drive electrode 41 (source electrode) and the drive terminal 22 of the drive lead 20 (source terminal) is further decreased. In addition, a decrease in the distance between the opening 45 of the semiconductor element 40 and the sense pad 81 shortens the sense wire 90, thereby decreasing the inductance of an electrical connection path of the main surface drive electrode 41 and the rear surface drive electrode 42.

Figure 21:
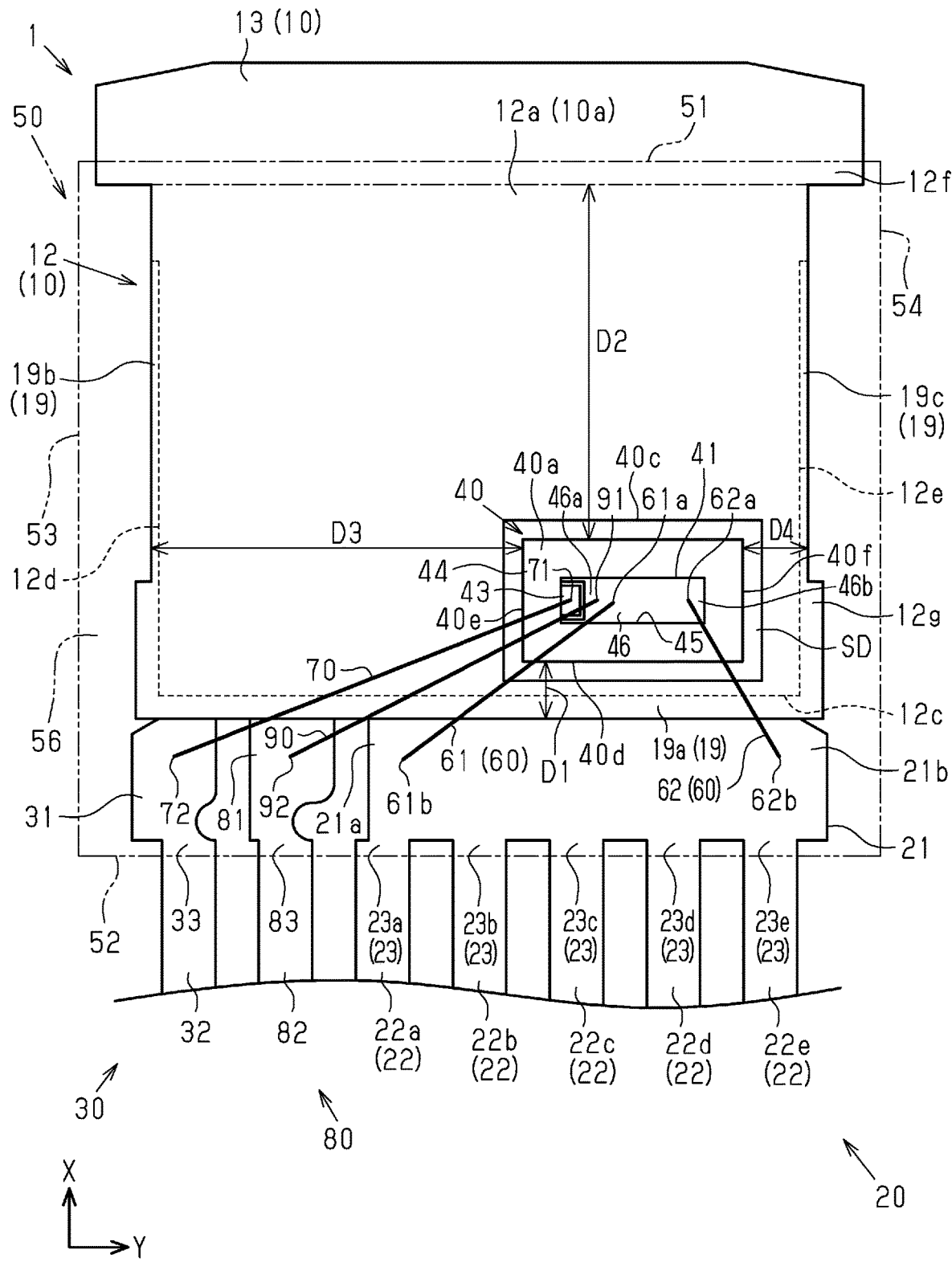
FIG. 21 is an enlarged view showing a semiconductor element and its surroundings in a modified example of the semiconductor device of the second embodiment.

In a second example, as shown in FIG. 21, the semiconductor element 40 may be arranged on a portion of the inner body 12 located toward the second encapsulation resin side surface 52 and toward the fourth encapsulation resin side surface 54. Specifically, the first distance D1 in the longitudinal direction X between the semiconductor element 40 and the edge of the first flange 19a of the inner body 12 located toward the second encapsulation resin side surface 52 is less than one-half of the second distance D2 between the semiconductor element 40 and the first wide portion 12f of the inner body 12. The first distance D1 is less than one-third of the second distance D2. In FIG. 20, the first distance D1 is approximately one-sixth of the second distance D2.

The semiconductor element 40 is arranged on a portion of the inner body 12 located toward the third side surface 12e in the lateral direction Y. Specifically, the third distance D3 in the lateral direction Y between the semiconductor element 40 and the edge of the second flange 19b of the inner body 12 located toward the third encapsulation resin side surface 53 is greater than the fourth distance D4 in the lateral direction Y between the semiconductor element 40 and the edge of the third flange 19c of the inner body 12 located toward the fourth encapsulation resin side surface 54. The fourth distance D4 is less than one-half of the third distance D3. The fourth distance D4 is less than one-third of the third distance D3. In FIG. 21, the fourth distance D4 is approximately one-sixth of the third distance D3.

This configuration further decreases the distance between the opening 45 of the semiconductor element 40 and the drive pad 21, thereby further shortening the first drive wire 61 and the second drive wire 62. As a result, the inductance between the main surface drive electrode 41 (source electrode) and the drive terminal 22 of the drive lead 20 (source terminal) is further decreased.

The material and diameter of the drive wires 60, the control wire 70, and the sense wire 90 may be changed in any manner. In an example, at least one of the drive wires 60, the control wire 70, and the sense wire 90 may have a diameter that is different from that of the others. At least one of the drive wires 60, the control wire 70, and the sense wire 90 may be formed of a material that is different from that of others.

The position of the sense pad 81 in the thickness-wise direction Z may be changed in any manner. The position of the sense pad 81 may be different from that of at least one of the drive pad 21 or the control pad 31 in the thickness-wise direction Z. In an example, the sense pad 81 and the semiconductor element 40 are located at the same position in the thickness-wise direction Z.

The first wide portion 12f may be omitted from the inner body 12 of the substrate 10. In this case, the projection 13 may be in contact with the first encapsulation resin side surface 51 of the encapsulation resin 50 in the longitudinal direction X.

The second wide portion 12g may be omitted from the inner body 12 of the substrate 10.

Third Embodiment

A third embodiment of a semiconductor device 1 will now be described with reference to FIGS. 22 to 31. The semiconductor device 1 of the present embodiment differs from the semiconductor device 1 of the first embodiment in that the substrate 10, the drive lead 20, the control lead 30, and the encapsulation resin 50 have different shapes. In the present embodiment, for the sake of convenience, the same reference characters are given to those elements that are the same as the corresponding elements of the first embodiment. Such elements may not be described in detail.

Figure 22:
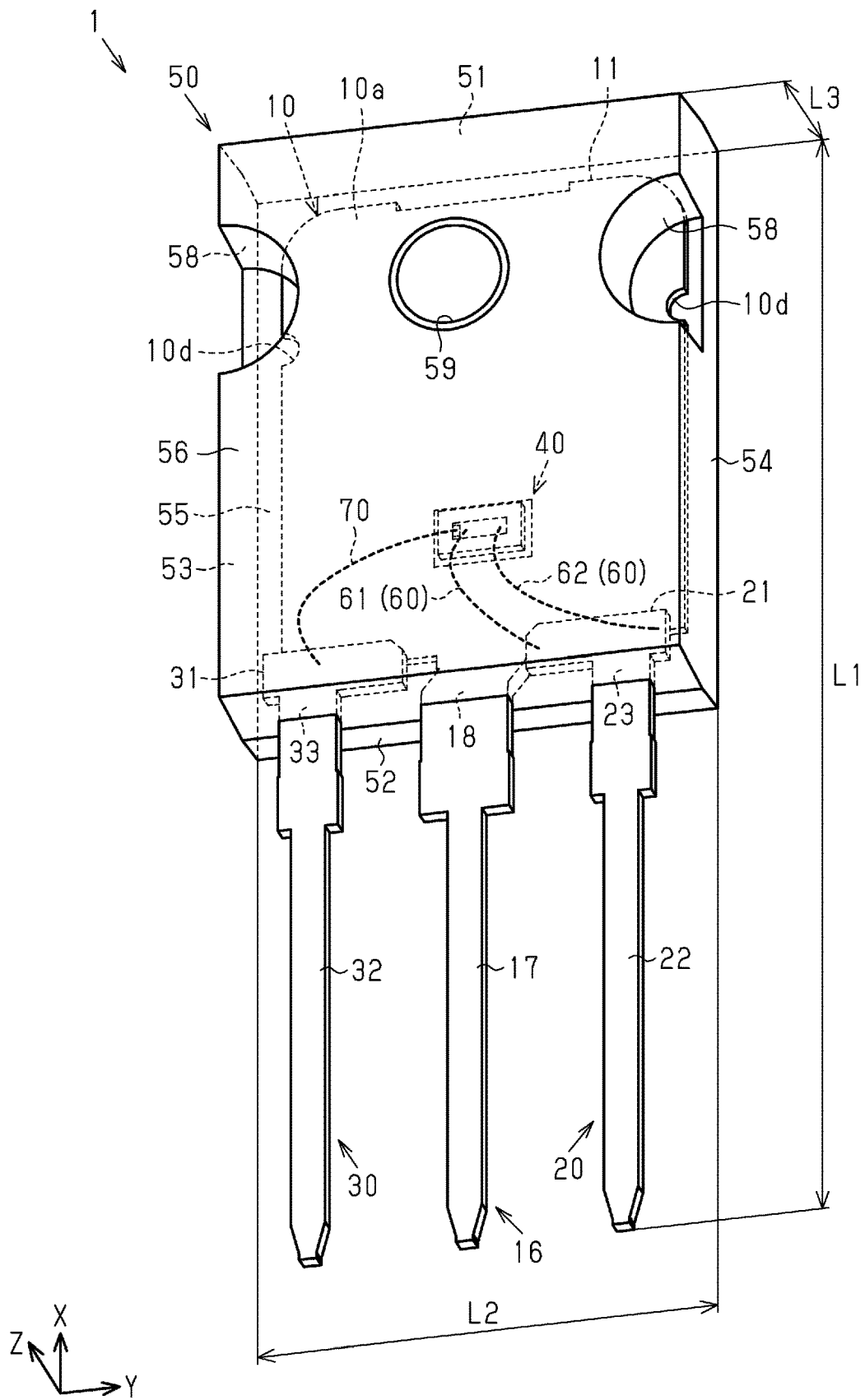
FIG. 22 is a perspective view showing a third embodiment of a semiconductor device.

As shown in FIG. 22, the semiconductor device 1 of the present embodiment is a package having a package outline standard (JEITA standard) of TO-247. Specifically, the semiconductor device 1 has a longitudinal dimension L1 that is 19.18 mm to 20.57 mm, a lateral dimension L2 that is 15.75 mm to 16.13 mm, and a thickness-wise dimension L3 that is 4.83 mm to 5.21 mm. The semiconductor device 1 is an SIP type. Thus, the semiconductor device 1 of the present embodiment is greater in size than the semiconductor device 1 of the first embodiment.

A shown in FIG. 22, the encapsulation resin 50 is flat. The encapsulation resin 50 is formed by molding. Each of the side surfaces 51 to 54 of the encapsulation resin 50 includes an inclined surface that is inclined with respect to the thickness-wise direction Z so that a draft slope is provided to facilitate removal of a mold when forming the encapsulation resin 50. Specifically, each of the side surfaces 51 to 54 includes a first inclined surface having a draft angle configured to facilitate removal of an upper mold and a second inclined surface having a draft angle configured to facilitate removal of a lower molds. The upper mold forms the encapsulation resin top surface 56 and a portion of each of the side surfaces 51 to 54 located toward the encapsulation resin top surface 56. The lower mold forms the encapsulation resin rear surface 55 and a portion of each of the side surfaces 51 to 54 located toward the encapsulation resin rear surface 55.

The encapsulation resin 50 includes opposite ends in the lateral direction Y including recesses 58. The recess 58 located at the third encapsulation resin side surface 53 of the encapsulation resin 50 is curved and recessed from the third encapsulation resin side surface 53 in the lateral direction Y. The recess 58 located at the fourth encapsulation resin side surface 54 of the encapsulation resin 50 is curved and recessed from the fourth encapsulation resin side surface 54 in the lateral direction Y. The recesses 58 extend from the encapsulation resin top surface 56 to the main surface 10a of the substrate 10 in the thickness-wise direction Z. That is, the main surface 10a of the substrate 10 is exposed by the recesses 58. The recesses 58 are located closer to the first encapsulation resin side surface 51 than the central portion of the encapsulation resin 50 in the longitudinal direction X.

A through hole 59 extends through a central portion of the encapsulation resin 50 in the lateral direction Y. The through hole 59 extends through the encapsulation resin 50 in the thickness-wise direction Z. The through hole 59 is located closer to the first encapsulation resin side surface 51 than the central portion of the encapsulation resin 50 in the longitudinal direction X. The through hole 59 is circular in a plan view. In the present embodiment, the through hole 59 and the recesses 58 are arranged at the same position in the longitudinal direction X. The semiconductor device 1 may be coupled to a circuit board or a heatsink (not shown) by inserting a bolt or a screw through the through hole 59.

Figure 23:
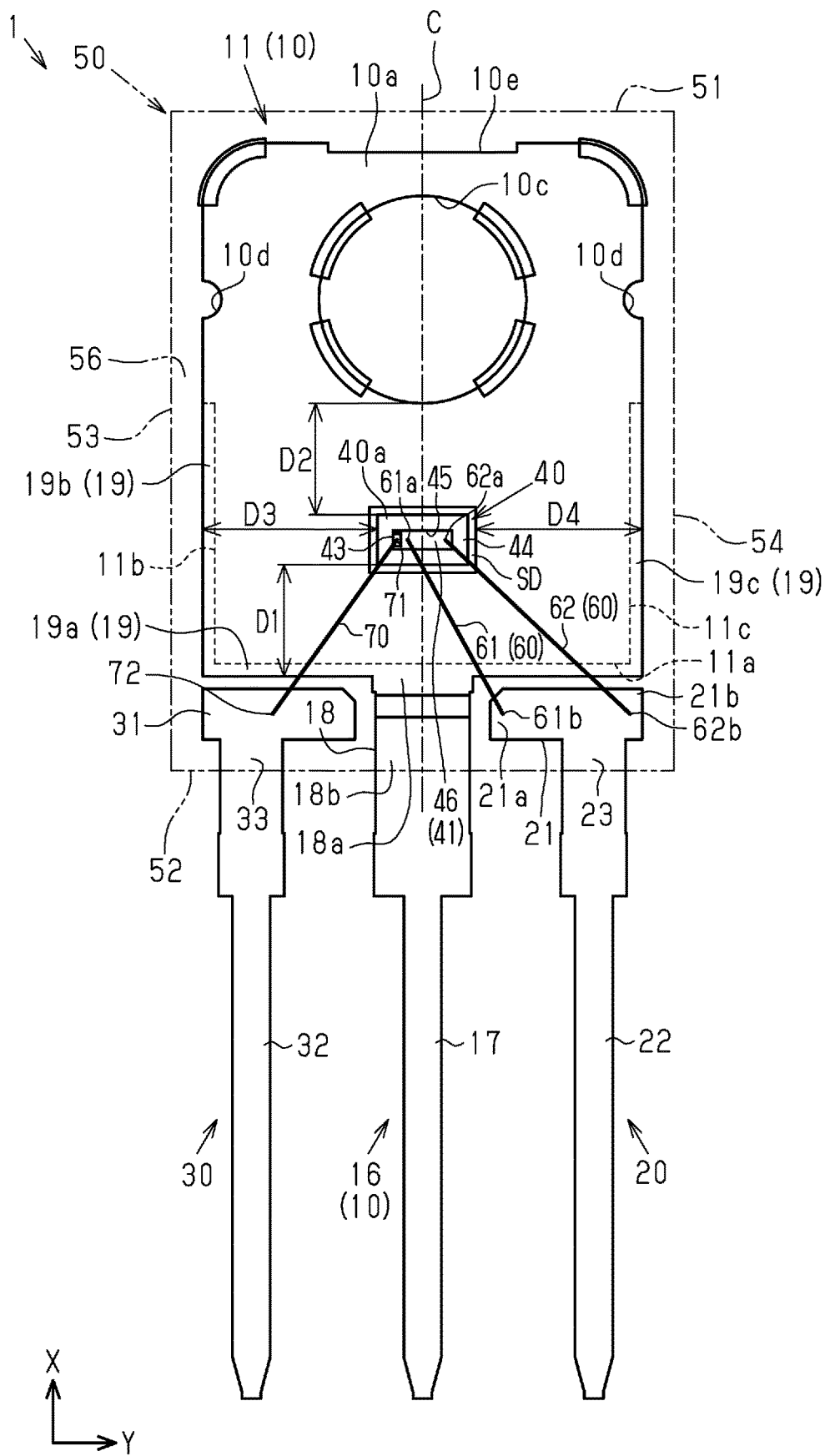
FIG. 23 is a plan view showing the internal structure of the semiconductor device shown in FIG. 22.

FIG. 23 is a diagram of the semiconductor device 1 viewed from the encapsulation resin top surface 56 in the thickness-wise direction Z. In FIG. 23, for the sake of convenience, the encapsulation resin 50 is indicated by a double-dashed line, and components in the encapsulation resin 50 are indicated by solid lines. As shown in FIG. 23, in a plan view, the encapsulation resin 50 is rectangular so that a long-side direction conforms to the longitudinal direction X and a short-side direction conforms to the lateral direction Y.

As shown in FIGS. 22 and 23, the substrate 10 includes the substrate body 11 located in the encapsulation resin 50 and the lead portion 16. The substrate 10 is formed of, for example, aluminum (Al) or copper (Cu).

A through hole 10*c* extends through the substrate body 11. The through hole 10*c* is located closer to the first encapsulation resin side surface 51 than a central portion of the substrate 10 in the longitudinal direction X. The through hole 10*c* is circular in a plan view. The through hole 10*c* is concentric with the through hole 59 in the encapsulation resin 50. The through hole 10*c* has a larger diameter than the through hole 59. The substrate body 11 includes two first recesses 10*d* that are semicircular in a plan view and a second recess 10*e* that is rectangular in a plan view. The two first recesses 10*d* are located closer to the first encapsulation resin side surface 51 than the central portion of the substrate 10 in the longitudinal direction X. The two first recesses 10*d* are exposed to the exterior by the recesses 58 in the encapsulation resin 50. The second recess 10*e* is arranged in an end of the substrate body 11 located toward the first encapsulation resin side surface 51.

The substrate body 11 includes flanges 19. The flanges 19 include a first flange 19*a*, a second flange 19*b*, and a third flange 19*c*. The first flange 19*a* projects from a first side surface 11*a* of the substrate body 11 toward the second encapsulation resin side surface 52. The second flange 19*b* projects from a second side surface 11*b* of the substrate body 11 toward the third encapsulation resin side surface 53 in a region of the substrate body 11 located toward the second encapsulation resin side surface 52 from the through hole 10*c* in the longitudinal direction X. The third flange 19*c* projects from a third side surface 11*c* of the substrate body 11 toward the fourth encapsulation resin side surface 54 in a region of the substrate body 11 located toward the second encapsulation resin side surface 52 from the through hole 10*c* in the longitudinal direction X.

Figure 24:
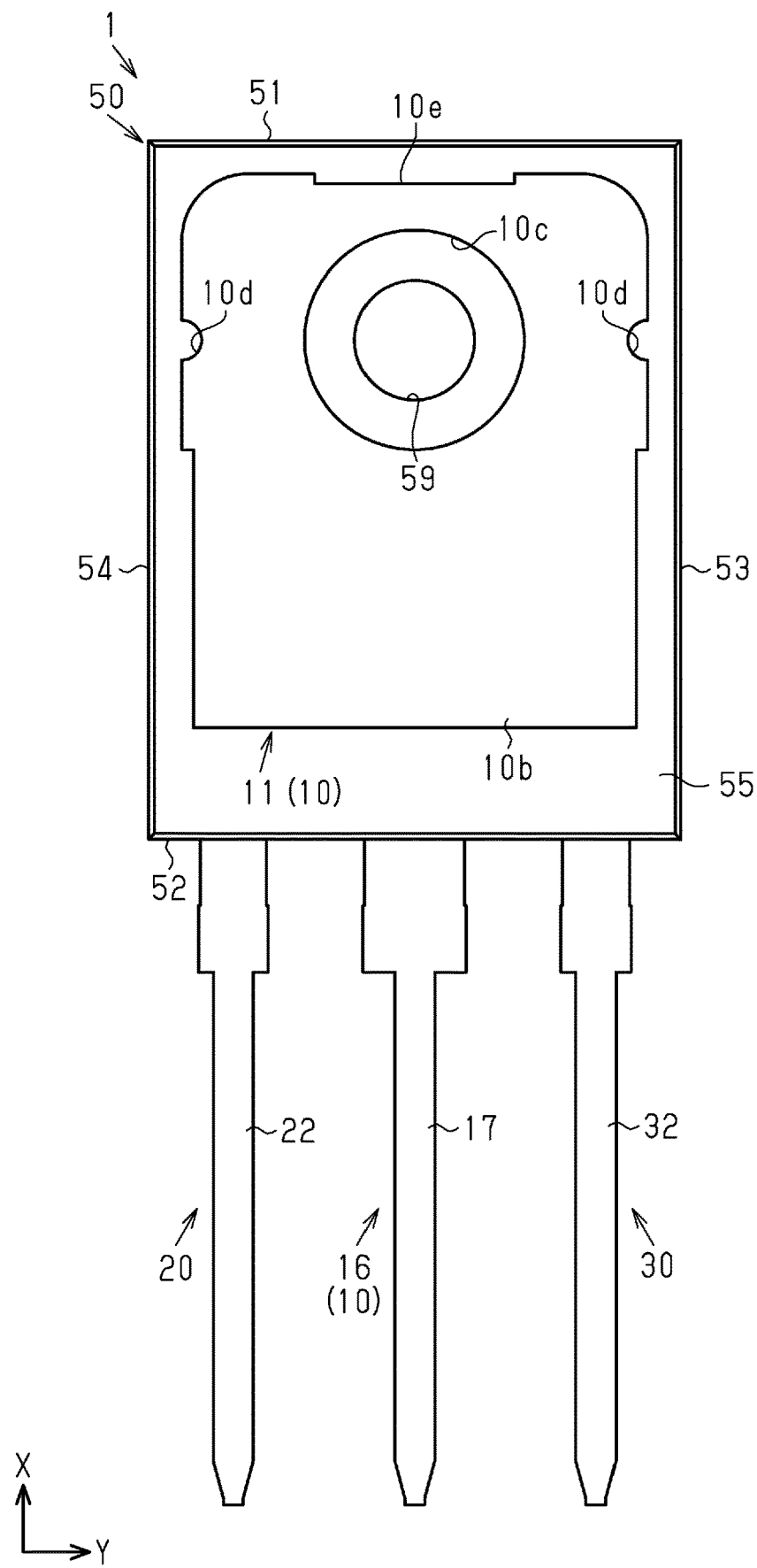
FIG. 24 is a rear view of the semiconductor device shown in FIG. 22.

As shown in FIG. 24, the rear surface 10*b* of the substrate 10 (rear surface of the substrate body 11) is exposed from the encapsulation resin rear surface 55. This improves the heat dissipation performance of the substrate 10. The substrate 10 is covered by the encapsulation resin 50 at peripheral sides of the through hole 10*c*.

As shown in FIG. 23, the lead portion 16 extends toward the second encapsulation resin side surface 52 from an end of the substrate body 11 located toward the first side surface 12*c* and projects from the second encapsulation resin side surface 52. The lead portion 16 may be divided into the terminal portion 17 projecting from the second encapsulation resin side surface 52 and a coupling portion 18 that couples the terminal portion 17 to the substrate body 11.

The coupling portion 18 is located on the central portion of the substrate body 11 in the lateral direction Y. The coupling portion 18 includes an inclined part 18*a*. The inclined part 18*a* is inclined toward the encapsulation resin top surface 56 as the inclined part 18*a* extends from the substrate body 11 toward the second encapsulation resin side surface 52. In the coupling portion 18, the intermediate portion 18*b* located between the inclined part 18*a* and the terminal portion 17 is located closer to the encapsulation resin top surface 56 than the substrate body 11. In a plan view, the intermediate portion 18*b* extends in the longitudinal direction X. The intermediate portion 18*b* includes a part that is in contact with the second encapsulation resin side surface 52. The part is located on a central portion of the second encapsulation resin side surface 52 in the lateral direction Y.

The terminal portion 17 projects from the central portion of the second encapsulation resin side surface 52 in the lateral direction Y. The terminal portion 17 and the intermediate portion 18*b* are located at the same position in the thickness-wise direction Z. That is, the terminal portion 17 is located closer to the encapsulation resin top surface 56 than the substrate body 11.

As shown in FIG. 23, in a plan view, the drive lead 20 and the control lead 30 are spaced apart from the substrate 10 in the longitudinal direction X and located closer to the second encapsulation resin side surface 52 of the encapsulation resin 50 than the substrate 10. The drive lead 20 and the control lead 30 are spaced apart from each other in the lateral direction Y. The lead portion 16 is located between the drive lead 20 and the control lead 30 in the lateral direction Y. In the present embodiment, in a plan view, the drive lead 20 and the control lead 30 are symmetrical about a centerline C extending in the longitudinal direction X from a central portion of the semiconductor device 1 in the longitudinal direction X. The shapes of the drive lead 20 and the control lead 30 in a plan view may be changed in any manner. In an example, the shape of the drive lead 20 in a plan view may differ from the shape of the control lead 30 in a plan view.

The drive pad 21 and the coupling portion 23 of the drive lead 20 are located between the substrate 10 and the second encapsulation resin side surface 52 in the longitudinal direction X. The drive pad 21 and the coupling portion 23 are located closer to the fourth encapsulation resin side surface 54 than the central portion of the encapsulation resin 50 in the lateral direction Y. The drive pad 21 is located closer to the fourth encapsulation resin side surface 54 than the semiconductor element 40. In a plan view, the drive pad 21 is rectangular so that a long-side direction conforms to the lateral direction Y and a short-side direction conforms to the longitudinal direction X. In the present embodiment, the dimension of the drive pad 21 in the lateral direction Y is greater than the dimension of the opening 45 in the lateral direction Y. The dimension of the drive pad 21 in the lateral direction Y is greater than the dimension of the semiconductor element 40 in the lateral direction Y. The drive pad 21 is located closer to the encapsulation resin top surface 56 than the substrate body 11 in the thickness-wise direction Z. Also, the drive pad 21 is located closer to the encapsulation resin top surface 56 than the semiconductor element 40 in the thickness-wise direction Z. In the present embodiment, the drive pad 21 and the intermediate portion 18*b* of the lead portion 16 are located at the same position in the thickness-wise direction Z.

The coupling portion 23 is continuous from an end of the drive pad 21 located toward the second encapsulation resin side surface 52. The coupling portion 23 is located closer to the fourth encapsulation resin side surface 54 than a central portion of the drive pad 21 in the lateral direction Y. The drive terminal 22 is configured to be a source terminal. The drive terminal 22 projects from the second encapsulation resin side surface 52.

The control pad 31 and the coupling portion 33 are located between the substrate 10 and the second encapsulation resin side surface 52 in the longitudinal direction X. The control pad 31 and the coupling portion 33 are located closer to the third encapsulation resin side surface 53 than a central portion of the encapsulation resin 50 in the lateral direction Y. The control pad 31 is located closer to the encapsulation resin top surface 56 than the substrate body 11 in the thickness-wise direction Z. Also, the control pad 31 is located closer to the encapsulation resin top surface 56 than the semiconductor element 40 in the thickness-wise direction Z. In the present embodiment, the control pad 31 and the intermediate portion 18b of the lead portion 16 are located at the same position in the thickness-wise direction Z.

The coupling portion 33 is continuous from an end of the control pad 31 located toward the second encapsulation resin side surface 52. The coupling portion 33 is located on the control pad 31 at a position toward the third encapsulation resin side surface 53 in the lateral direction Y. The control terminal 32 is configured to be a gate terminal. The control terminal 32 projects from the second encapsulation resin side surface 52.

In the same manner as the first embodiment, a SiC MOSFET is used as the semiconductor element 40. Also, as in the first embodiment, the semiconductor element 40 is an element capable of high-speed switching in response to a drive signal having a frequency between 1 kHz and a few hundred kHz, inclusive. Preferably, the semiconductor element 40 is an element capable of high-speed switching in response to a drive signal having a frequency between 1 kHz and 100 kHz, inclusive. In the present embodiment, the semiconductor element 40 performs high-speed switching in response to a drive signal having a frequency of 100 kHz. The shape and size of the semiconductor element 40 are similar to those of the semiconductor element 40 of the first embodiment.

The semiconductor element 40 is mounted on the substrate body 11 (the main surface 10a of the substrate 10) using the solder SD. As shown in FIG. 23, in the present embodiment, the semiconductor element 40 is located closer to the lead portion 16 than the central portion of the substrate body 11 in the longitudinal direction X. Specifically, a first distance D1 between the semiconductor element 40 and the edge of the first flange 19a of the substrate body 11 located toward the second encapsulation resin side surface 52 is less than a second distance D2 between the semiconductor element 40 and the edge of the through hole 10c of the substrate body 11 located toward the second encapsulation resin side surface 52.

The semiconductor element 40 is arranged on the central portion of the substrate body 11 in the lateral direction Y. Specifically, a third distance D3 between the semiconductor element 40 and the second side surface 11b of the substrate body 11 is equal to a fourth distance D4 between the semiconductor element 40 and the third side surface 11c of the substrate body 11. When a difference between the third distance D3 and the fourth distance D4 is, for example, within 5% of the third distance D3, it is considered that the third distance D3 is equal to the fourth distance D4.

The semiconductor device 1 includes drive wires 60 and a control wire 70. In the present embodiment, the drive wires 60 include two drive wires, namely, a first drive wire 61 and a second drive wire 62. More specifically, the first drive wire 61 and the second drive wire 62 are configured to be a combination of the furthermost ones of the drive wires 60. The first drive wire 61 is located closer to the control wire 70 than the second drive wire 62. The first drive wire 61 and the second drive wire 62 are spaced apart from each other and connect the main surface drive electrode 41 of the semiconductor element 40 to the drive pad 21. In a plan view, the first drive wire 61 and the second drive wire 62 are spaced apart from each other in the lateral direction Y. The first drive wire 61 and the second drive wire 62 are ones of the drive wires 60 located at opposite ends in the lateral direction Y.

The first drive wire 61 and the second drive wire 62 are formed of the same metal. In the present embodiment, the first drive wire 61 and the second drive wire 62 contain aluminum. The first drive wire 61 and the second drive wire 62 have the same diameter. When a difference between the diameter of the first drive wire 61 and the diameter of the second drive wire 62 is, for example, within 5% of the diameter of the first drive wire 61, it is considered that the first drive wire 61 and the second drive wire 62 have the same diameter. In the present embodiment, the first drive wire 61, the second drive wire 62, and the control wire 70 have the same diameter. When a difference between the diameter of each of the first drive wire 61 and the second drive wire 62 and the diameter of the control wire 70 is, for example, within 5% of the diameter of the control wire 70, it is considered that the first drive wire 61, the second drive wire 62, and the control wire 70 have the same diameter.

Each of the first drive wire 61 and the second drive wire 62 connects the main surface drive electrode 41 of the semiconductor element 40 and the drive pad 21. Each of the first drive wire 61 and the second drive wire 62 is connected to the main surface drive electrode 41 and the drive pad 21 by, for example, wire bonding.

In a plan view, the first drive wire 61 and the second drive wire 62 are connected to the main surface drive electrode 41 and the drive pad 21 so that the first drive wire 61 and the second drive wire 62 are separated by a greater distance at the drive pad 21 than at the main surface drive electrode 41. In a plan view, the distance between the first drive wire 61 and the second drive wire 62 increases from the main surface drive electrode 41 toward the drive pad 21. The configurations of the first drive wire 61 and the second drive wire 62 will be specifically described below.

Figure 25:
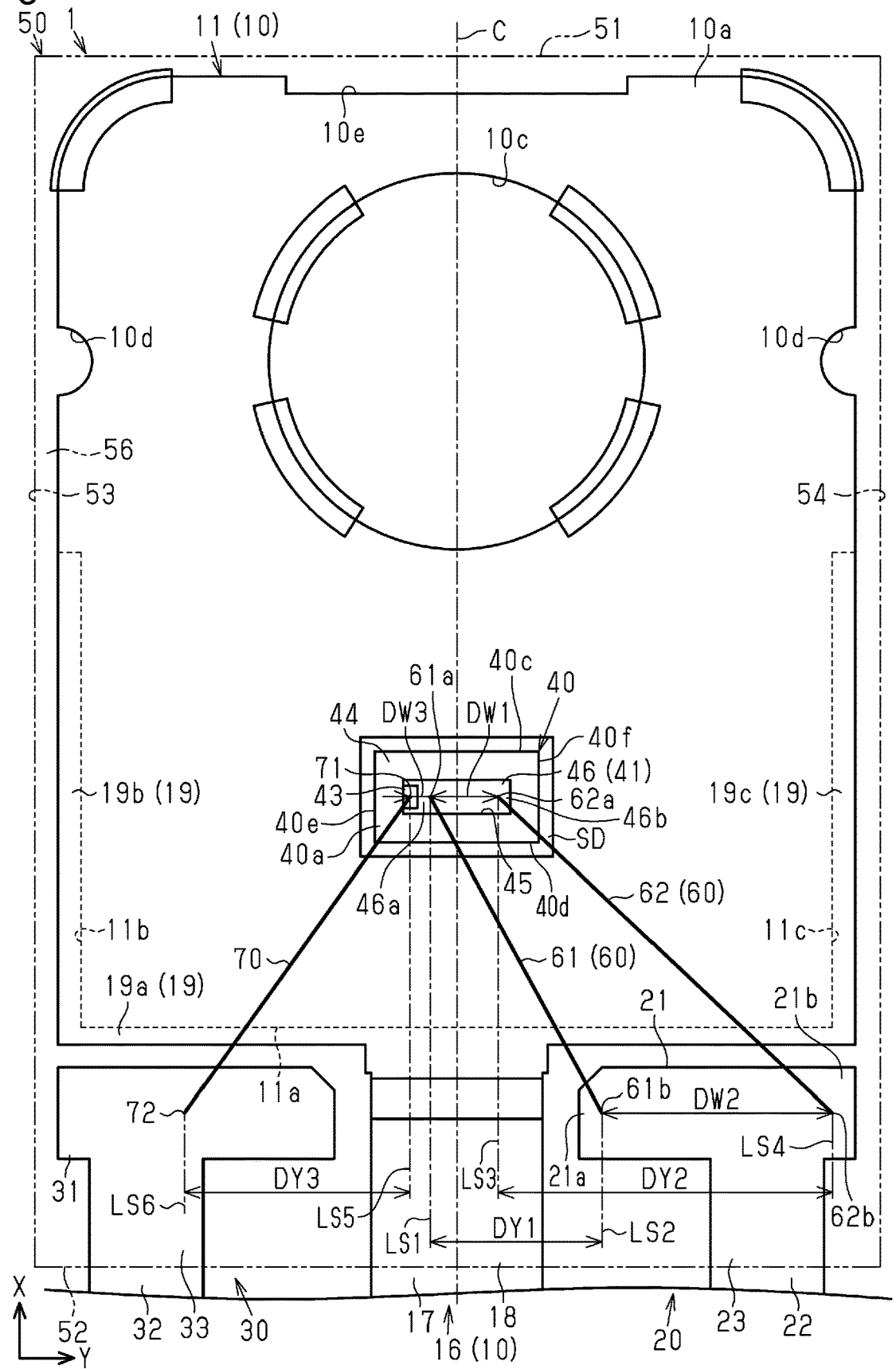
FIG. 25 is an enlarged view showing the semiconductor element shown in FIG. 23 and its surroundings.

As shown in FIG. 25, the drive electrode end 61a of the first drive wire 61 is located closer to the third encapsulation resin side surface 53 than the drive pad end 61b of the first drive wire 61. The drive electrode end 62a of the second drive wire 62 is located closer to the third encapsulation resin side surface 53 than the drive pad end 62b of the second drive wire 62. In a plan view, a distance DW2 between the drive pad end 61b and the drive pad end 62b is greater than a distance DW1 between the drive electrode end 61a and the drive electrode end 62a.

An auxiliary line LS1 extends from the drive electrode end 61a in the longitudinal direction X. An auxiliary line LS2 extends from the drive pad end 61b in the longitudinal direction X. The distance between the auxiliary line LS1 and the auxiliary line LS2 in the lateral direction Y is referred to as a distance DY1. An auxiliary line LS3 extends from the drive electrode end 62a in the longitudinal direction X. An auxiliary line LS4 extends from the drive pad end 62b in the longitudinal direction X. The distance between the auxiliary line LS3 and the auxiliary line LS4 in the lateral direction Y is referred to as a distance DY2. In this case, the distance DY2 is greater than the distance DY1.

The drive electrode end 61a of the first drive wire 61 is connected to the main surface drive electrode 41 at a position closer to the first exposed end 46a than a central portion of the exposed region 46 in the lateral direction Y. In the present embodiment, the drive electrode end 61*a* is connected to the first exposed end 46*a*. Specifically, the drive electrode end 61*a* is connected to a portion of the main surface drive electrode 41 located next to the control electrode 43 in the lateral direction Y, that is, a portion of the main surface drive electrode 41 defining the bottom of the recess 41*a* (refer to FIG. 2).

The drive pad end 61*b* of the first drive wire 61 is connected to the drive pad 21 at a position closer to the first end 21*a* than a central portion of the drive pad 21 in the lateral direction Y. In the present embodiment, the drive pad end 61*b* is connected to the first end 21*a* of the drive pad 21. In an example, the drive pad end 61*b* is arranged at the limit position toward the third encapsulation resin side surface 53 in a region of the first end 21*a* of the drive pad 21 where wire bonding is performable. In the longitudinal direction X, the drive pad end 61*b* is connected to a portion of the drive pad 21 located closer to the semiconductor element 40 than the central portion of the drive pad 21 in the longitudinal direction X.

The drive electrode end 62*a* of the second drive wire 62 is connected to the main surface drive electrode 41 at a position closer to the second exposed end 46*b* than the central portion of the exposed region 46 in the lateral direction Y. In the present embodiment, the drive electrode end 62*a* is connected to the second exposed end 46*b*. In an example, the drive electrode end 62*a* is arranged at the limit position toward the fourth side surface 40*f* in a region where wire bonding is performable in an end of the opening 45 located toward the fourth side surface 40*f* of the semiconductor element 40 in the lateral direction Y The drive electrode end 62*a* and the drive electrode end 61*a* of the first drive wire 61 are located at the same position in the longitudinal direction X. The state in which the drive electrode end 62*a* and the drive electrode end 61*a* are located at the same position in the longitudinal direction includes a state in which the drive electrode ends 61*a* and 62*a* overlap with each other in the longitudinal direction X and a state in which the drive electrode ends 61*a* and 62*a* partially overlap due to a manufacturing error caused by wire bonding. In other words, when a difference between the drive electrode ends 61*a* and 62*a* in the longitudinal direction X is an extent of a variation caused when performing wire bonding, it is considered that the drive electrode ends 61*a* and 62*a* are located at the same position in the longitudinal direction X.

The drive pad end 62*b* of the second drive wire 62 is connected to the drive pad 21 at a position closer to the second end 21*b* than the central portion of the drive pad 21 in the lateral direction Y. In the present embodiment, the drive pad end 62*b* is connected to the second end 21*b* of the drive pad 21. In an example, the drive pad end 62*b* is arranged at the limit position toward the fourth encapsulation resin side surface 54 in a region of the second end 21*b* of the drive pad 21 where wire bonding is performable. The drive pad end 62*b* is arranged on a portion of the drive pad 21 located closer to the semiconductor element 40 than the central portion of the drive pad 21 in the longitudinal direction X.

The control wire 70 connects the control electrode 43 of the semiconductor element 40 to the control pad 31. The control wire 70 is connected to the control electrode 43 and the control pad 31 by, for example, wire bonding. In the same manner as the first embodiment, the same material is used in the control wire 70, the first drive wire 61, and the second drive wire 62. The control wire 70, the first drive wire 61, and the second drive wire 62 have the same diameter. When a difference between the diameter of the control wire 70 and the diameter of the first drive wire 61 and the second drive wire 62 is, for example, within 5% of the diameter of the control wire 70, it is considered that the control wire 70, the first drive wire 61, and the second drive wire 62 have the same diameter. The control wire 70 includes a control electrode end 71 and a control pad end 72. The control electrode end 71 is located closer to the fourth encapsulation resin side surface 54 than the control pad end 72.

The distance DW3 between the control electrode end 71 and the drive electrode end 61*a* of the first drive wire 61 is less than the distance DW1. An auxiliary line LS5 extends from the control electrode end 71 in the longitudinal direction X. An auxiliary line LS6 extends from the control pad end 72 in the longitudinal direction X. A distance DY3 between the auxiliary line LS5 and the auxiliary line LS6 is greater than the distance DY1 and less than the distance DY2. The semiconductor device 1 of the present embodiment has the advantages (1-1) to (1-7) in the first embodiment.

Modified Examples of Third Embodiment

The semiconductor device 1 of the third embodiment may be modified, for example, as follows. The modified example described below may be combined with one another as long as there is no technical inconsistency. In the following modified examples, the same reference characters are given to those elements that are the same as the corresponding elements of the third embodiment. Such elements will not be described in detail.

Figure 26:
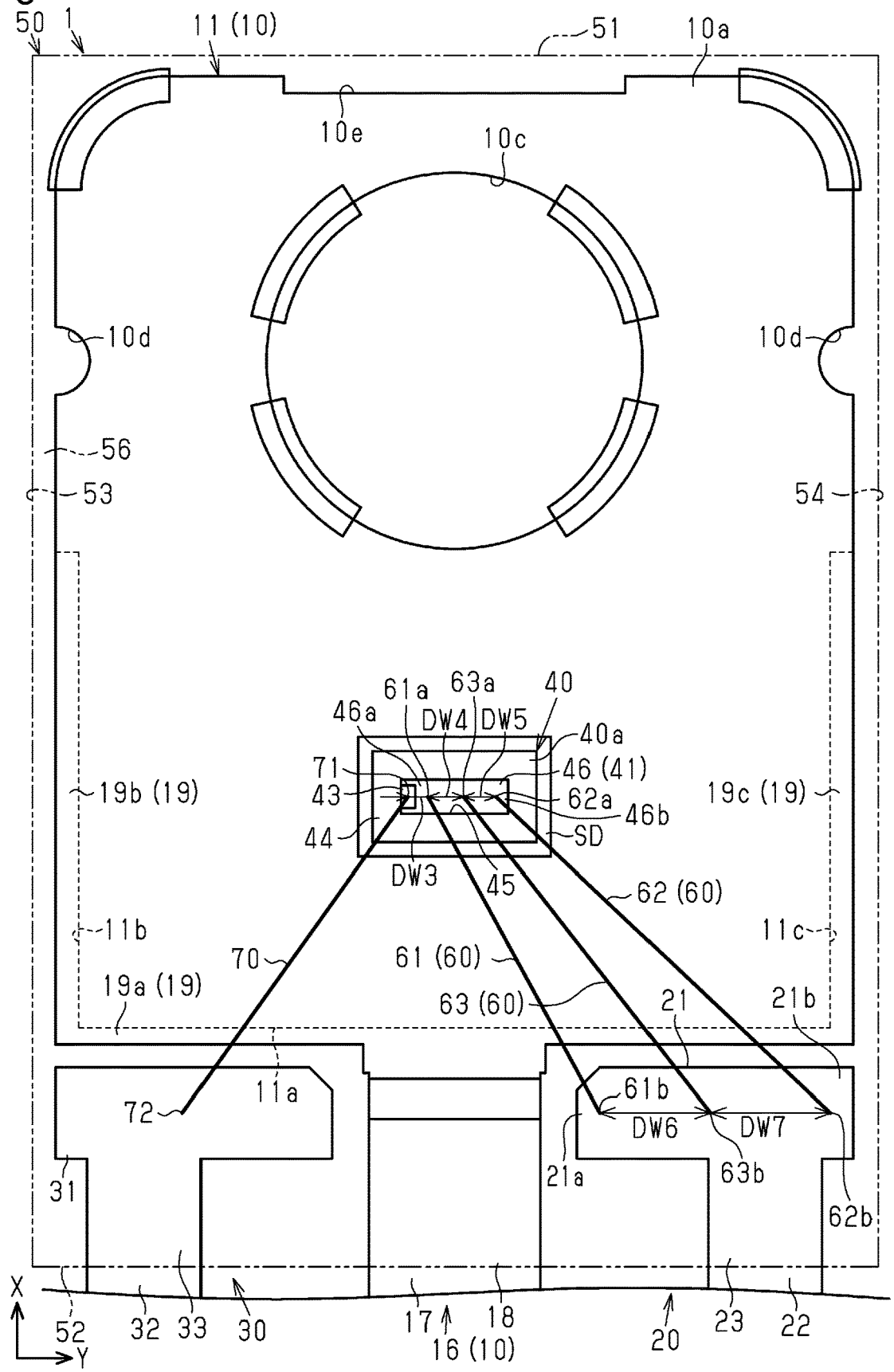
FIG. 26 is an enlarged view showing a semiconductor element and its surroundings in a modified example of the semiconductor device of the third embodiment.

The number of drive wires 60 is not limited to two and may be changed in any manner. In an example, as shown in FIG. 26, the drive wires 60 may include three drive wires, namely, the first drive wire 61, the second drive wire 62, and the third drive wire 63. The third drive wire 63 is arranged between the first drive wire 61 and the second drive wire 62. In this case, the first drive wire 61 and the second drive wire 62 are configured to be a combination of the furthermost ones of the drive wires 60. The first drive wire 61 and the second drive wire 62 are spaced apart from each other and connect the main surface drive electrode 41 of the semiconductor element 40 to the drive pad 21. In plan view, the first drive wire 61 and the second drive wire 62 are spaced apart from each other in the lateral direction Y As described above, the first drive wire 61 and the second drive wire 62, which are configured to be a combination of the furthermost ones of the drive wires 60, are the drive wires 60 that are located at opposite ends in the lateral direction Y.

The third drive wire 63 includes a drive electrode end 63*a* and a drive pad end 63*b*. The drive electrode end 63*a* is an end of the third drive wire 63 connected to the main surface drive electrode 41. The drive pad end 63*b* is an end of the third drive wire 63 connected to the drive pad 21. The drive pad end 63*b* is located closer to the fourth encapsulation resin side surface 54 than the drive electrode end 63*a*.

In FIG. 26, the distance DW4 between the drive electrode end 63*a* and the drive electrode end 61*a* of the first drive wire 61 is equal to the distance DW5 between the drive electrode end 63*a* and the drive electrode end 62*a* of the second drive wire 62. When a difference between the distance DW4 and the distance DW5 is, for example, within 5% of the distance DW4, it is considered that the distance DW4 is equal to the distance DW5. The distance DW4 and the distance DW5 are greater than the distance DW3 between the control electrode end 71 of the control wire 70 and the drive electrode end 61a of the first drive wire 61.

The position of the drive electrode end 63a in the lateral direction Y may be changed in any manner. In an example, the drive electrode end 63a may be connected to the main surface drive electrode 41 so that the distance DW4 differs from the distance DW5.

In FIG. 26, the drive electrode end 61a of the first drive wire 61, the drive electrode end 62a of the second drive wire 62, and the drive electrode end 63a of the third drive wire 63 are located at the same position in the longitudinal direction X. The state in which the drive electrode ends 61a, 62a, and 63a are located at the same position in the longitudinal direction X includes a state in which the drive electrode ends 61a, 62a, and 63a overlap with each other in the longitudinal direction X and a state in which the drive electrode ends 61a, 62a, and 63a partially overlap due to a manufacturing error caused by wire bonding. In other words, when a difference between the drive electrode ends 61a, 62a, and 63a in the longitudinal direction X is an extent of a variation caused when performing wire bonding, it is considered that the drive electrode ends 61a, 62a, and 63a are located at the same position in the longitudinal direction X.

In the longitudinal direction X, the drive pad end 63b of the third drive wire 63 is arranged on a portion of the drive pad 21 located closer to the semiconductor element 40 than the central portion of the drive pad 21 in the longitudinal direction X. A distance DW6 between the drive pad end 61b of the first drive wire 61 and the drive pad end 63b is greater than the distance DW4. A distance DW7 between the drive pad end 62b of the second drive wire 62 and the drive pad end 63b is greater than the distance DW5.

In a plan view, the first drive wire 61 and the third drive wire 63 are connected to the main surface drive electrode 41 and the drive pad 21 so that the first drive wire 61 and the third drive wire 63 are separated by a greater distance at the drive pad 21 than at the main surface drive electrode 41. In a plan view, the distance between the first drive wire 61 and the third drive wire 63 gradually increases from the main surface drive electrode 41 toward the drive pad 21. In a plan view, the third drive wire 63 and the second drive wire 62 are connected to the main surface drive electrode 41 and the drive pad 21 so that the third drive wire 63 and the second drive wire 62 are separated by a greater distance at the drive pad 21 than at the main surface drive electrode 41. In a plan view, the distance between the third drive wire 63 and the second drive wire 62 gradually increases from the main surface drive electrode 41 toward the drive pad 21.

Figure 27:
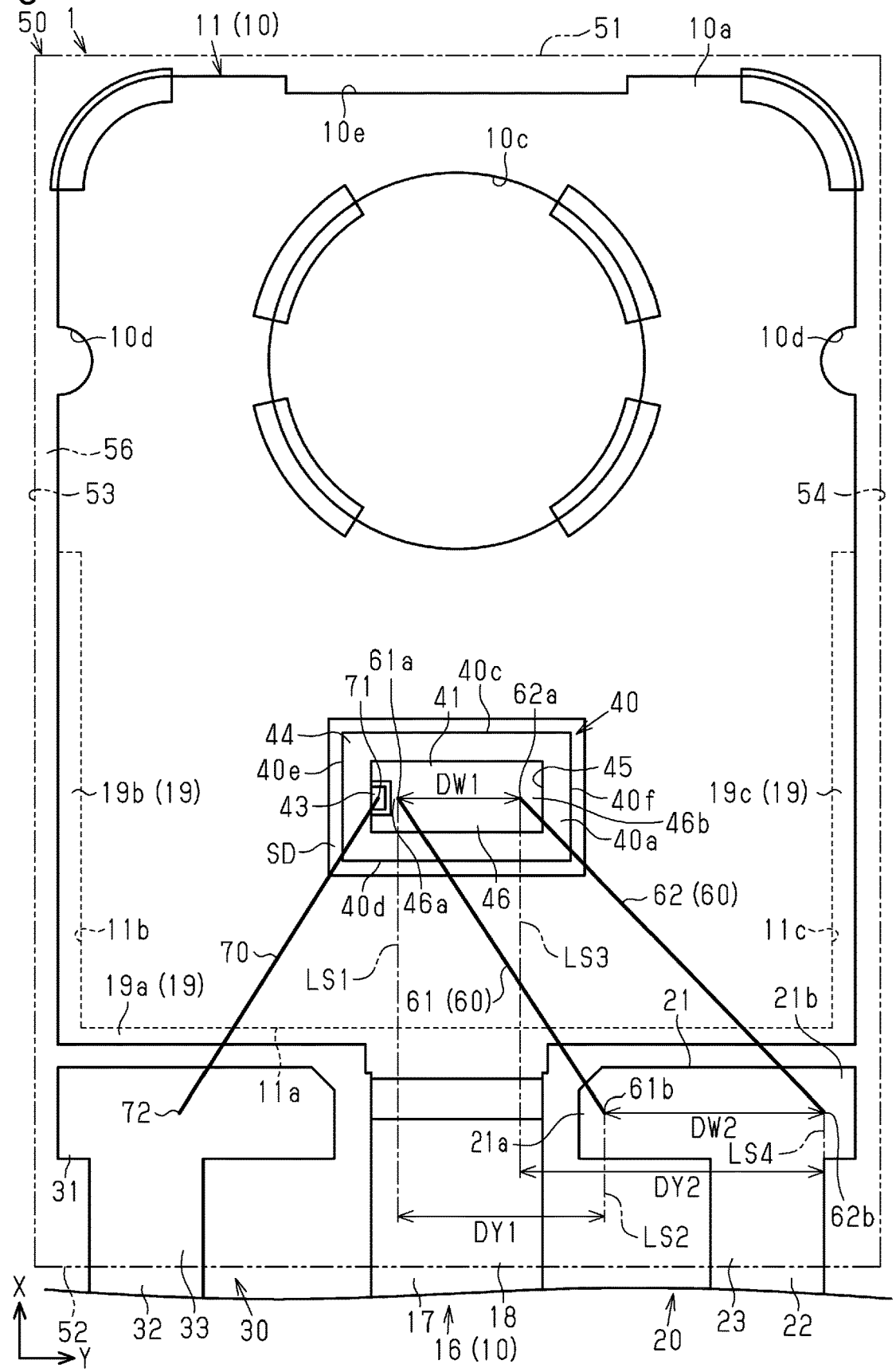
FIG. 27 is an enlarged view showing a semiconductor element and its surroundings in a modified example of the semiconductor device of the third embodiment.
Figure 29:
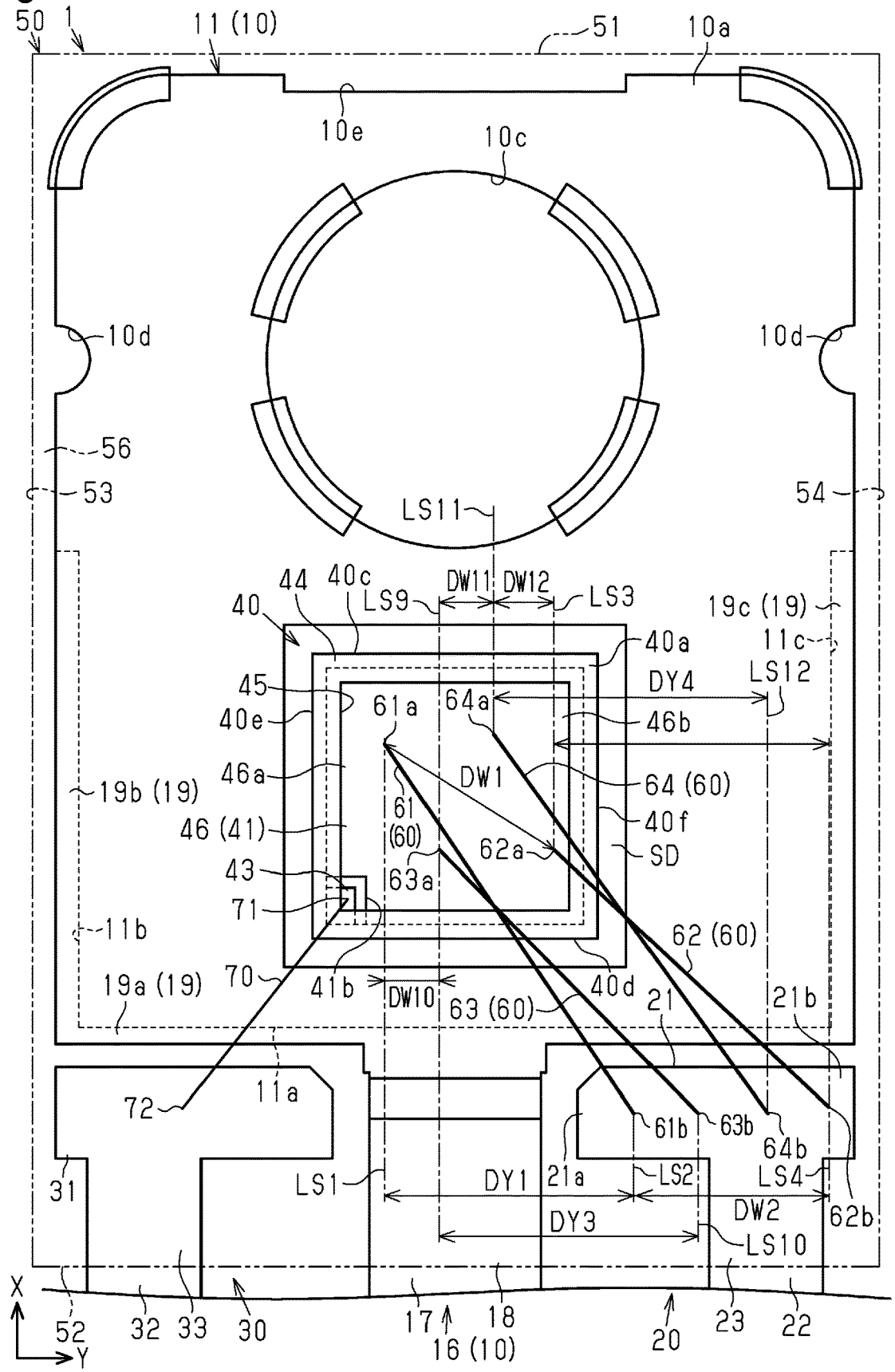
FIG. 29 is an enlarged view showing a semiconductor element and its surroundings in a modified example of the semiconductor device of the third embodiment.

The size of the semiconductor element 40 may be changed in any manner. In a first example, as shown in FIG. 27, the semiconductor element 40 may have a greater size than the semiconductor element 40 of the third embodiment. In a second example, as shown in FIG. 29, the semiconductor element 40 may have a greater size than the semiconductor element 40 shown in FIG. 27.

In the first example shown in FIG. 27, the semiconductor element 40 is greater in size in the longitudinal direction X and the lateral direction Y than the semiconductor element 40 of the third embodiment. In accordance with the increase in the size of the semiconductor element 40, the opening 45 formed in the front surface 40a may be increased in size in the longitudinal direction X and the lateral direction Y In FIG. 27, the dimension of the opening 45 in the lateral direction Y is less than the dimension of the drive pad 21 in the lateral direction Y. The dimension of the drive pad 21 in the lateral direction Y is greater than the dimension of the semiconductor element 40 in the lateral direction Y.

As in the third embodiment, the semiconductor device 1 includes the first drive wire 61 and the second drive wire 62 as the drive wires 60. In the same manner as the drive electrode end 61a of the third embodiment, the drive electrode end 61a of the first drive wire 61 is connected to the first exposed end 46a of the exposed region 46. In the same manner as the drive pad end 61b of the third embodiment, the drive pad end 61b of the first drive wire 61 is connected to the first end 21a of the drive pad 21. In the same manner as the drive electrode end 62a of the third embodiment, the drive electrode end 62a of the second drive wire 62 is connected to an end of the opening 45 located toward the fourth side surface 40f of the semiconductor element 40 in the lateral direction Y In the same manner as the drive pad end 62b of the third embodiment, the drive pad end 62b of the second drive wire 62 is connected to the second end 21b of the drive pad 21. Also, as in the third embodiment, the drive electrode end 61a and the drive electrode end 62a are located at the same position in the longitudinal direction X and arranged in the lateral direction Y. Each of the drive pad end 61b and the drive pad end 62b is connected to a portion of the drive pad 21 located closer to the semiconductor element 40 than the central portion of the drive pad 21 in the longitudinal direction X.

In a plan view, the distance DW2 between the drive pad end 61b and the drive pad end 62b is greater than the distance DW1 in the lateral direction Y between the drive electrode end 61a and the drive electrode end 62a. In FIG. 27, the distance DY1 in the lateral direction Y between the auxiliary line LS1 extending from the drive electrode end 61a in the longitudinal direction X and the auxiliary line LS2 extending from the drive pad end 61b in the longitudinal direction X is less than the distance DY2 in the lateral direction Y between the auxiliary line LS3 extending from the drive electrode end 62a in the longitudinal direction X and the auxiliary line LS4 extending from the drive pad end 62b in the longitudinal direction X. Thus, in a plan view, the first drive wire 61 and the second drive wire 62 are connected to the main surface drive electrode 41 and the drive pad 21 so that the first drive wire 61 and the second drive wire 62 are separated by a greater distance at the drive pad 21 than at the main surface drive electrode 41. In a plan view, the distance between the first drive wire 61 and the second drive wire 62 gradually increases from the main surface drive electrode 41 toward the drive pad 21.

This configuration increases the distance between the first drive wire 61 and the second drive wire 62, thereby decreasing the inductance between the main surface drive electrode 41 (source electrode) and the drive terminal 22 of the drive lead 20 (source terminal).

Figure 28:
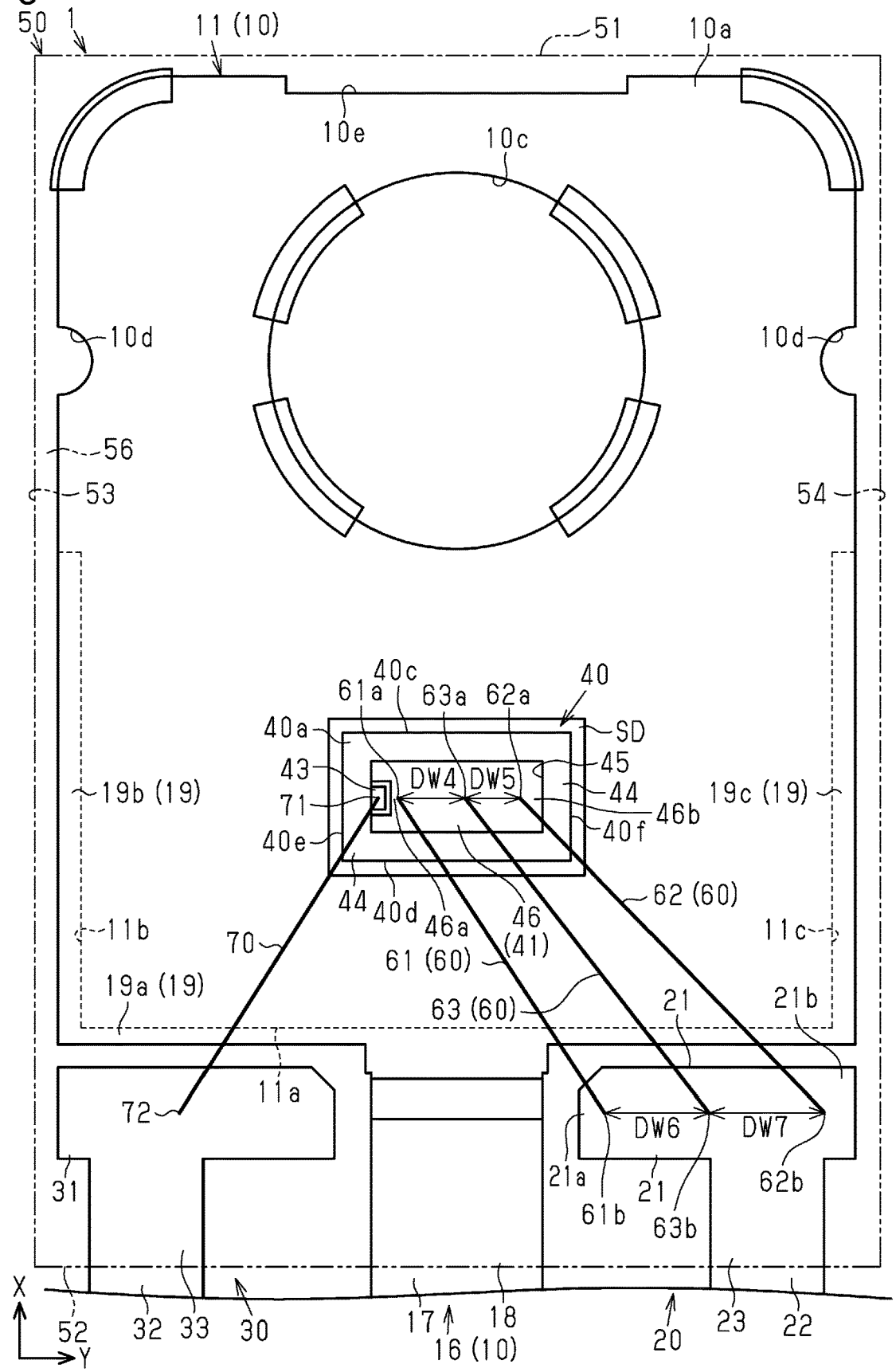
FIG. 28 is an enlarged view showing a semiconductor element and its surroundings in a modified example of the semiconductor device of the third embodiment.

In the modified example shown in FIG. 27, the number of drive wires 60 is not limited to two and may be changed in any manner. In an example, as shown in FIG. 28, the drive wires 60 may include three drive wires, namely, the first drive wire 61, the second drive wire 62, and the third drive wire 63. The third drive wire 63 is arranged between the first drive wire 61 and the second drive wire 62. In this case, the first drive wire 61 and the second drive wire 62 are configured to be a combination of the furthermost ones of the drive wires 60. The first drive wire 61 and the second drive wire 62 are spaced apart from each other and connect the main surface drive electrode 41 of the semiconductor element 40 to the drive pad 21. In a plan view, the first drive wire 61 and the second drive wire 62 are spaced apart from each other in the lateral direction Y. The first drive wire 61 and the second drive wire 62 are ones of the drive wires 60 located at opposite ends in the lateral direction Y.

The third drive wire 63 includes a drive electrode end 63a and a drive pad end 63b. The distance DW4 between the drive electrode end 63a and the drive electrode end 61a of the first drive wire 61 is equal to the distance DW5 between the drive electrode end 63a and the drive electrode end 62a of the second drive wire 62. When a difference between the distance DW4 and the distance DW5 is, for example, within 5% of the distance DW4, it is considered that the distance DW4 is equal to the distance DW5.

The position of the drive electrode end 63a in relation to the main surface drive electrode 41 may be changed in any manner. In an example, the drive electrode end 63a may be connected to the main surface drive electrode 41 so that the distance DW4 differs from the distance DW5.

In FIG. 28, the drive electrode end 61a of the first drive wire 61, the drive electrode end 62a of the second drive wire 62, and the drive electrode end 63a of the third drive wire 63 are located at the same position in the longitudinal direction X. The state in which the drive electrode ends 61a, 62a, and 63a are located at the same position in the longitudinal direction X includes a state in which the drive electrode ends 61a, 62a, and 63a overlap with each other in the longitudinal direction X and a state in which the drive electrode ends 61a, 62a, and 63a partially overlap due to a manufacturing error caused by wire bonding. In other words, when a difference between the drive electrode ends 61a, 62a, and 63a in the longitudinal direction X is an extent of a variation caused when performing wire bonding, it is considered that the drive electrode ends 61a, 62a, and 63a are located at the same position in the longitudinal direction X.

The drive pad end 63b of the third drive wire 63 is arranged on a portion of the drive pad 21 located closer to the semiconductor element 40 than the central portion of the drive pad 21 in the longitudinal direction X. A distance DW6 between the drive pad end 61b of the first drive wire 61 and the drive pad end 63b is greater than the distance DW4. A distance DW7 between the drive pad end 62b of the second drive wire 62 and the drive pad end 63b is greater than the distance DW5.

In a plan view, the first drive wire 61 and the third drive wire 63 are connected to the main surface drive electrode 41 and the drive pad 21 so that the first drive wire 61 and the third drive wire 63 are separated by a greater distance at the drive pad 21 than at the main surface drive electrode 41. In a plan view, the distance between the first drive wire 61 and the third drive wire 63 gradually increases from the main surface drive electrode 41 toward the drive pad 21. In a plan view, the third drive wire 63 and the second drive wire 62 are connected to the main surface drive electrode 41 and the drive pad 21 so that the third drive wire 63 and the second drive wire 62 are separated by a greater distance at the drive pad 21 than at the main surface drive electrode 41. In a plan view, the distance between the third drive wire 63 and the second drive wire 62 gradually increases from the main surface drive electrode 41 toward the drive pad 21.

In a plan view, the inclination angle of the third drive wire 63 with respect to the longitudinal direction X may be changed in any manner. In an example, the inclination angle of the third drive wire 63 with respect to the longitudinal direction X may be equal to the inclination angle of the first drive wire 61 with respect to the longitudinal direction X or the inclination angle of the second drive wire 62 with respect to the longitudinal direction X.

In the second example shown in FIG. 29, the semiconductor element 40 is square in a plan view. The main surface drive electrode 41 (source electrode) formed on the front surface 40a of the semiconductor element 40 includes the cutaway portion 41b located in the end of the semiconductor element 40 located at the second side surface 40d and the third side surface 40e. The control electrode 43 is formed in the cutaway portion 41b.

In the second example shown in FIG. 29, the semiconductor device 1 includes the first drive wire 61, the second drive wire 62, the third drive wire 63, and the fourth drive wire 64 as the drive wires 60. The third drive wire 63 and the fourth drive wire 64 are arranged between the first drive wire 61 and the second drive wire 62. In this case, the first drive wire 61 and the second drive wire 62 are configured to be a combination of the furthermost ones of the drive wires 60. The first drive wire 61 and the second drive wire 62 are ones of the drive wires 60 located at opposite ends in the lateral direction Y. The drive wires 61 to 64 overlap with each other as viewed in the longitudinal direction X. In a plan view, the first drive wire 61 intersects with the third drive wire 63. The fourth drive wire 64 intersects with the second drive wire 62.

The drive electrode end 61a of the first drive wire 61 is located closer to the third encapsulation resin side surface 53 than the drive pad end 61b of the first drive wire 61. The drive electrode end 62a of the second drive wire 62 is located closer to the third encapsulation resin side surface 53 than the drive pad end 62b of the second drive wire 62.

The third drive wire 63 includes a drive electrode end 63a and a drive pad end 63b. The drive electrode end 63a is an end of the third drive wire 63 connected to the main surface drive electrode 41. The drive pad end 63b is an end of the third drive wire 63 connected to the drive pad 21. The fourth drive wire 64 includes a drive electrode end 64a and a drive pad end 63b. The drive electrode end 64a is an end of the fourth drive wire 64 connected to the main surface drive electrode 41. The drive pad end 64b is an end of the fourth drive wire 64 connected to the drive pad 21.

The drive electrode end 61a of the first drive wire 61 is located closer to the third side surface 40e than the drive electrode ends 61b to 61d of the drive wires 62 to 64. The drive electrode end 63a of the third drive wire 63 is arranged closer to the third side surface 40e than the drive electrode end 64a of the fourth drive wire 64 and the drive electrode end 62a of the second drive wire 62. The drive electrode end 64a is arranged closer to the third side surface 40e than the drive electrode end 62a. The drive electrode end 61a and the drive electrode end 63a are connected to the main surface drive electrode 41 at positions closer to the first exposed end 46a than the central portion of the exposed region 46 in the lateral direction Y. The drive electrode end 61a is connected to a position closer to the first exposed end 46a than the drive electrode end 63a in the lateral direction Y The drive electrode end 64a and the drive electrode end 62a are connected to the exposed region 46 at positions closer to the second exposed end 46b than the central portion of the exposed region 46 in the lateral direction Y. The drive electrode end 62a is connected to a position closer to the second exposed end 46b than the drive electrode end 64a.

The drive electrode end 61a of the first drive wire 61 and the drive electrode end 64a of the fourth drive wire 64 are located at positions different from the drive electrode end 62a of the second drive wire 62 and the drive electrode end 63a of the third drive wire 63 in the longitudinal direction X. The drive electrode end 61a and the drive electrode end 64a are located at the same position in the longitudinal direction X. The drive electrode end 62a and the drive electrode end 63a are located at the same position in the longitudinal direction X. Specifically, the drive electrode ends 61a and 64a are located closer to the first side surface 40c of the semiconductor element 40 than the drive electrode ends 62a and 63a. Thus, the first drive wire 61 and the fourth drive wire 64 are longer than the second drive wire 62 and the third drive wire 63. The state in which the drive electrode ends 61a and 64a are located at the same position in the longitudinal direction X includes a state in which the drive electrode ends 61a and 64a overlap with each other in the longitudinal direction X and a state in which the drive electrode ends 61a and 64a partially overlap due to manufacturing error caused by wire bonding. In other words, when a difference between the drive electrode ends 61a and 64a in the longitudinal direction X is an extent of a variation caused when performing wire bonding, it is considered that the drive electrode ends 61a and 64a are located at the same position in the longitudinal direction X. Also, the state in which the drive electrode ends 62a and 63a are located at the same position in the longitudinal direction X includes a state in which the drive electrode ends 62a and 63a overlap each other in the longitudinal direction X and a state in which the drive electrode ends 62a and 63a partially overlap due to a manufacturing error caused by wire bonding. In other words, when a difference between the drive electrode ends 62a and 63a in the longitudinal direction X is an extent of a variation caused when performing wire bonding, it is considered that the drive electrode ends 62a and 63a are located at the same position in the longitudinal direction X.

The positions of the drive electrode ends 61a to 64a in the longitudinal direction X may be changed in any manner. In an example, the positions of the drive electrode ends 61a to 64a may differ from each other. The drive electrode ends 61a to 64a may be located at the same position and arranged in the lateral direction Y.

The drive pad end 61b of the first drive wire 61 is arranged closer to the third encapsulation resin side surface 53 than the drive pad ends 62b to 64b of the drive wires 62 to 64. The drive pad end 63b of the third drive wire 63 is arranged closer to the third encapsulation resin side surface 53 than the drive pad end 64b of the fourth drive wire 64 and the drive pad end 62b of the second drive wire 62. The drive pad end 64b is arranged closer to the third encapsulation resin side surface 53 than the drive pad end 62b. The drive pad end 61b and the drive pad end 63b are connected to the drive pad 21 at positions closer to the first end 21a than the central portion of the drive pad 21 in the lateral direction Y. The drive pad end 61b is connected to a position closer to the first end 21a than the drive pad end 63b. The drive pad end 64b and the drive pad end 62b are connected to the drive pad 21 at positions closer to the second end 21b than the central portion of the drive pad 21 in the lateral direction Y. The drive pad end 62b is connected to a position closer to the second end 21b than the drive pad end 62b.

The distance DW10 in the lateral direction Y between the auxiliary line LS1, which extends from the drive electrode end 61a in the longitudinal direction X, and an auxiliary line LS9 extending from the drive electrode end 63a in the longitudinal direction X is less than the distance DW11 in the lateral direction Y between the auxiliary line LS9 and the auxiliary line LS11, which extends from the drive electrode end 64a in the longitudinal direction X. A distance DW12 in the lateral direction Y between the auxiliary line LS3, which extends from the drive electrode end 62a in the longitudinal direction X, and the auxiliary line LS11 is slightly less than the distance DW10. The positions of the drive electrode ends 61a to 64a in the lateral direction Y may be changed in any manner as long as the drive electrode end 61a is located closest to the third encapsulation resin side surface 53 and the drive electrode end 62a is located closest to the fourth encapsulation resin side surface 54 among the drive electrode ends 61a to 64a. In an example, the drive electrode ends 61a to 64a may be arranged so that the distance DW12 is equal to the distance DW10.

The distance DY1 in the lateral direction Y between the auxiliary line LS1 and the auxiliary line LS2, which extends from the drive pad end 61b in the longitudinal direction X, is less than the distance DY2 in the lateral direction Y between the auxiliary line LS3 and the auxiliary line LS4, which extends from the drive pad end 62b in the longitudinal direction X. The distance DY3 in the lateral direction Y between the auxiliary line LS9 and the auxiliary line LS10, which extends from the drive pad end 63b in the longitudinal direction X, is less than the distance DY4 in the lateral direction Y between the auxiliary line LS11 and the auxiliary line LS12, which extends from the drive pad end 64b in the longitudinal direction X. In FIG. 29, the distance DY1 is less than the distance DY3. The distance DY2 is greater than the distance DY4.

The drive electrode end 61a may be arranged at the limit position toward the fourth side surface 40f in the lateral direction Y in a region of the first exposed end 46a of the exposed region 46 of the main surface drive electrode 41 where wire bonding is performable. The drive pad end 61b may be arranged at the limit position toward the third encapsulation resin side surface 53 in a region of the first end 21a of the drive pad 21 where wire bonding is performable.

Also, the drive electrode end 62a may be arranged at the limit position toward the fourth side surface 40f in the lateral direction Y in a region of the second exposed end 46b of the exposed region 46 of the main surface drive electrode 41 where wire bonding is performable. The drive pad end 62b may be arranged at the limit position toward the fourth encapsulation resin side surface 54 in a region of the second end 21b of the drive pad 21 where wire bonding is performable.

In a plan view, the first drive wire 61 and the second drive wire 62 are connected to the main surface drive electrode 41 and the drive pad 21 so that the first drive wire 61 and the second drive wire 62 are separated by a greater distance at the drive pad 21 than at the main surface drive electrode 41. In a plan view, the distance in the lateral direction Y between the first drive wire 61 and the second drive wire 62 gradually increases from the main surface drive electrode 41 toward the drive pad 21.

Figure 30:
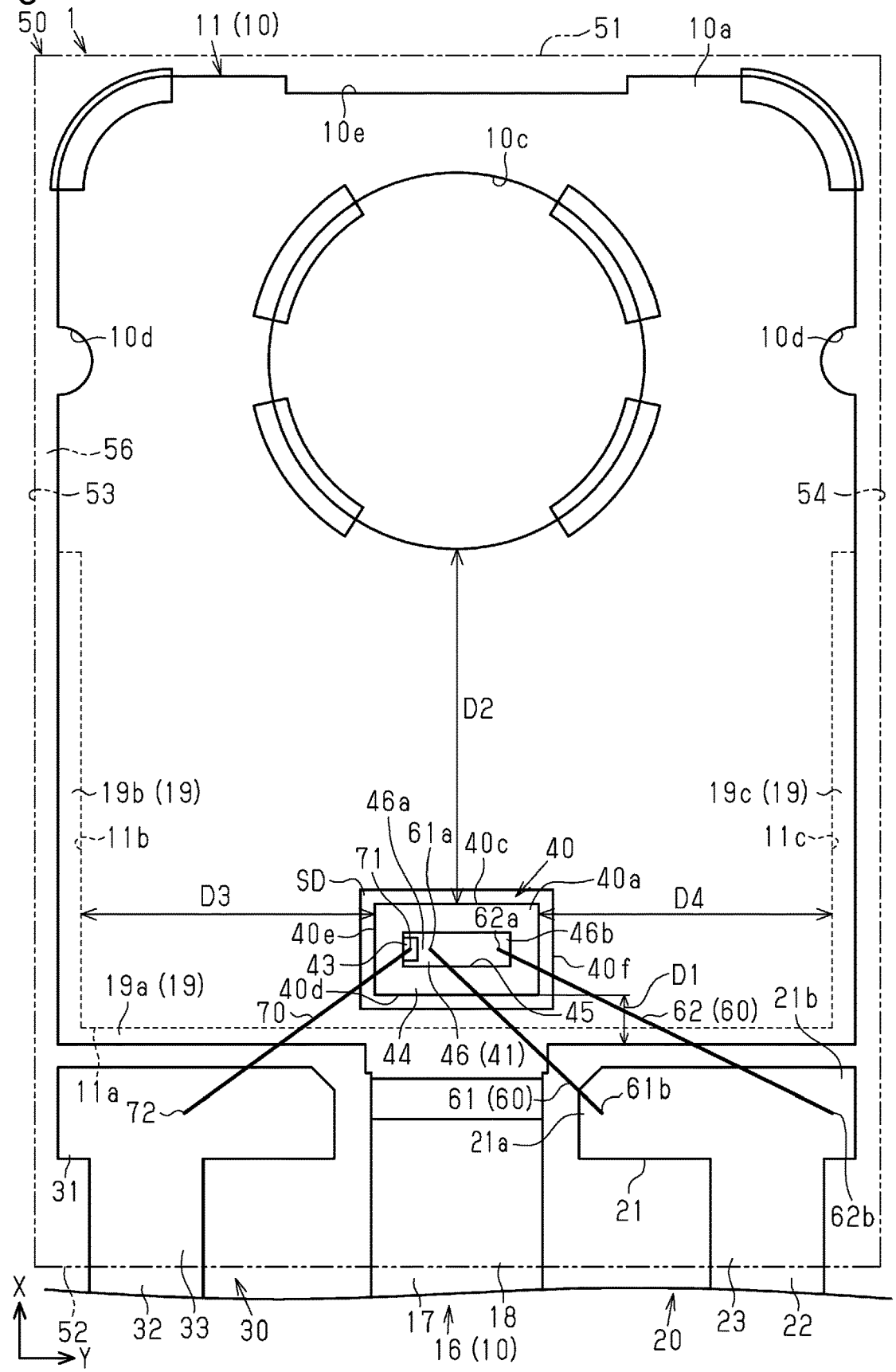
FIG. 30 is an enlarged view showing a semiconductor element and its surroundings in a modified example of the semiconductor device of the third embodiment.

The position of the semiconductor element 40 in relation to the substrate body 11 may be changed in any manner. In a first example, as shown in FIG. 30, the semiconductor element 40 may be arranged on a portion of the substrate body 11 located toward the second encapsulation resin side surface 52. Specifically, the first distance D1 in the longitudinal direction X between the semiconductor element 40 and the edge of the first flange 19a of the substrate body 11 located toward the second encapsulation resin side surface 52 is less than one-half of the second distance D2 in the longitudinal direction X between the semiconductor element 40 and the edge of the through hole 10c of the substrate body 11 located toward the second encapsulation resin side surface 52. The first distance D1 is less than one-third of the second distance D2. In FIG. 30, the first distance D1 is approximately one-seventh of the second distance D2.

The semiconductor element 40 is arranged on the central portion of the substrate body 11 in the lateral direction Y. Specifically, the third distance D3 in the lateral direction Y between the semiconductor element 40 and the edge of the second flange 19b of the substrate body 11 located toward the third encapsulation resin side surface 53 is equal to the fourth distance D4 in the lateral direction Y between the semiconductor element 40 and the edge of the third flange 19c of the substrate body 11 located toward the fourth encapsulation resin side surface 54.

This configuration decreases the distance between the opening 45 of the semiconductor element 40 and the drive pad 21, thereby shortening the first drive wire 61 and the second drive wire 62. As a result, the inductance between the main surface drive electrode 41 (source electrode) and the drive terminal 22 of the drive lead 20 (source terminal) is further decreased.

Figure 31:
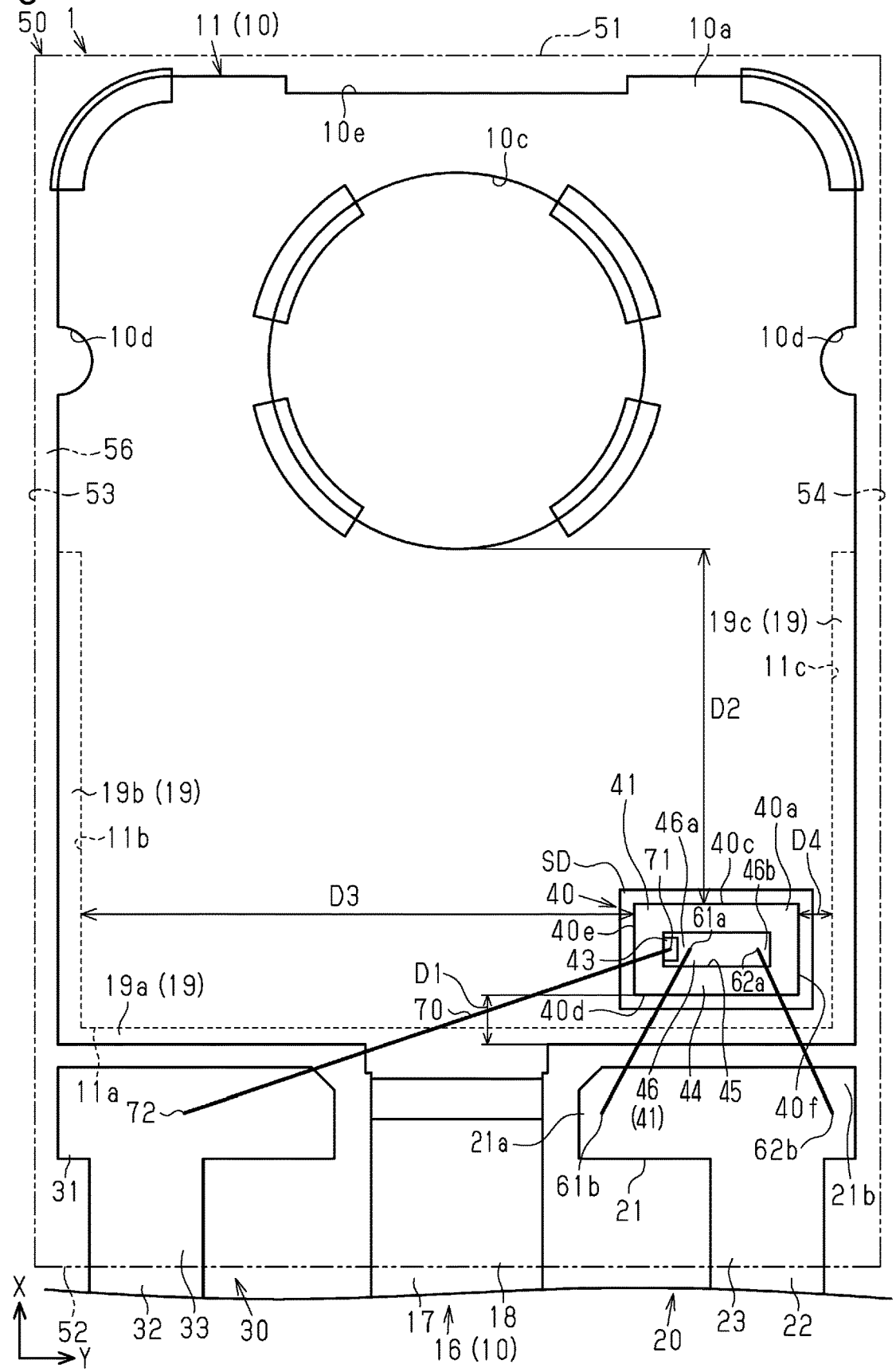
FIG. 31 is an enlarged view showing a semiconductor element and its surroundings in a modified example of the semiconductor device of the third embodiment.

In a second example, as shown in FIG. 31, the semiconductor element 40 may be arranged on a portion of the substrate body 11 located toward the second encapsulation resin side surface 52 and toward the fourth encapsulation resin side surface 54. Specifically, the first distance D1 in the longitudinal direction X between the semiconductor element 40 and the edge of the first flange 19a of the substrate body 11 located toward the second encapsulation resin side surface 52 is less than one-half of the second distance D2 in the longitudinal direction X between the semiconductor element 40 and the edge of the through hole 10c of the substrate body 11 located toward the second encapsulation resin side surface 52. The first distance D1 is less than one-third of the second distance D2. In FIG. 31, the first distance D1 is approximately one-seventh of the second distance D2. The third distance D3 in the lateral direction Y between the semiconductor element 40 and the edge of the second flange 19b of the substrate body 11 located toward the third encapsulation resin side surface 53 is greater than the fourth distance D4 in the lateral direction Y between the semiconductor element 40 and the edge of the third flange 19c of the substrate body 11 located toward the fourth encapsulation resin side surface 54. The fourth distance D4 is less than one-half of the third distance D3. The fourth distance D4 is less than one-third of the third distance D3. In FIG. 31, the fourth distance D4 is approximately one-tenth of the third distance D3.

This configuration further decreases the distance between the semiconductor element 40 and the drive pad 21, thereby further shortening the first drive wire 61 and the second drive wire 62. As a result, the inductance between the main surface drive electrode 41 (source electrode) and the drive terminal 22 of the drive lead 20 (source terminal) is further decreased.

In the third embodiment, the lead portion 16 may be omitted from the substrate 10 of the semiconductor device 3. In this case, the drive pad 21 and the control pad 31 are located next to each other in the lateral direction Y. The drive pad 21 may be increased in size in the lateral direction Y by an amount corresponding to the lead portion 16 that is omitted. This configuration increases the distance DW2 between the drive pad end 61b of the first drive wire 61 and the drive pad end 62b of the second drive wire 62, thereby decreasing the inductance between the main surface drive electrode 41 and the drive pad 21.

Fourth Embodiment

A fourth embodiment of a semiconductor device 1 will now be described with reference to FIG. 32. The semiconductor device 1 of the present embodiment mainly differs from the semiconductor device 1 of the first embodiment in that a Schottky diode is mounted instead of a MOSFET as the semiconductor element 40 and that a first drive lead 20C and a second drive lead 20D are arranged instead of the drive lead 20 and the control lead 30. In the present embodiment, for the sake of convenience, the same reference characters are given to those elements that are the same as the corresponding elements of the first embodiment. Such elements may not be described in detail.

Figure 32:
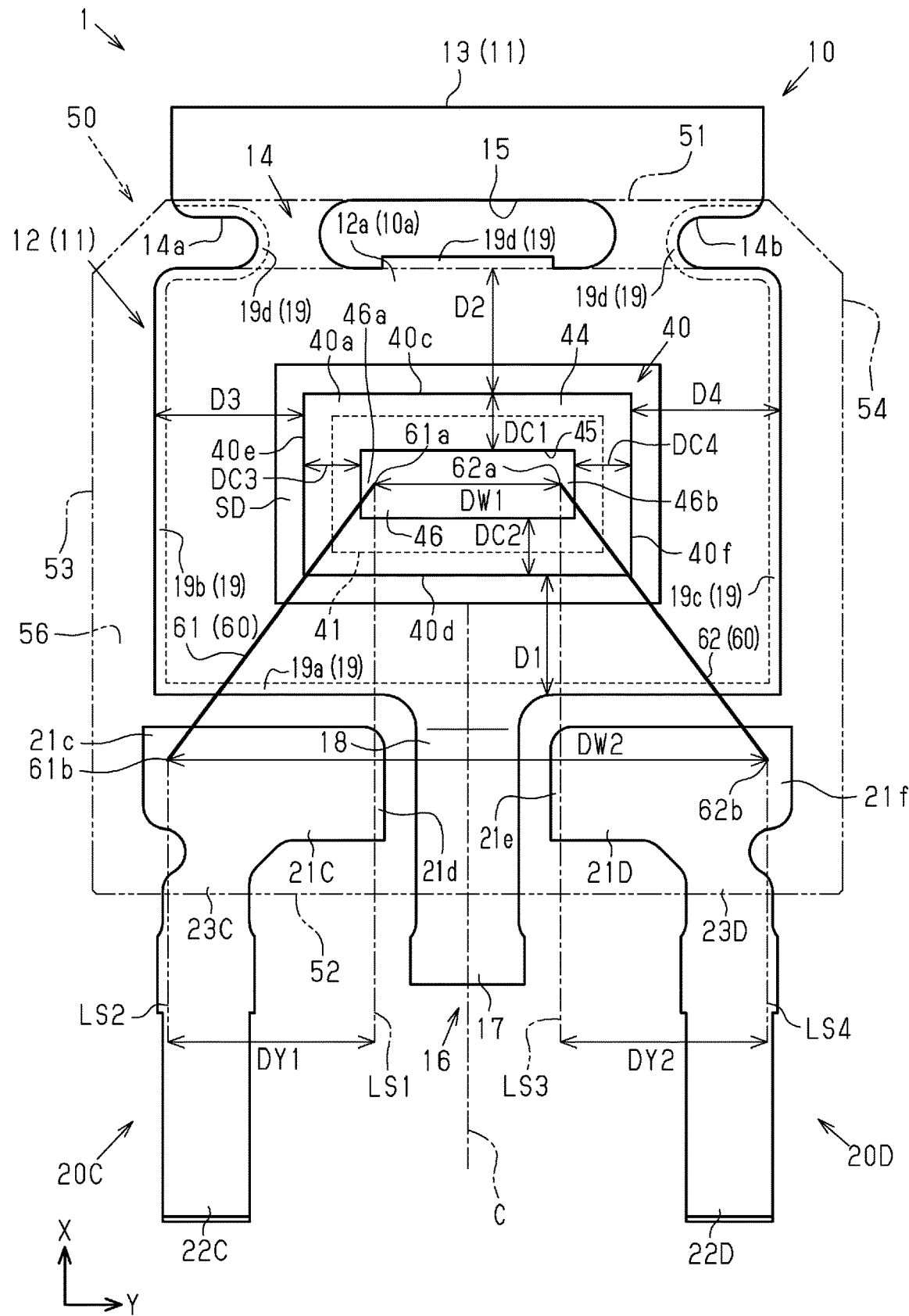
FIG. 32 is a plan view showing the internal structure of a fourth embodiment of a semiconductor device.

As shown in FIG. 32, in a plan view, the first drive lead 20C and the second drive lead 20D are spaced apart from the substrate 10 in the longitudinal direction X and located closer to the second encapsulation resin side surface 52 of the encapsulation resin 50 than the substrate 10. The first drive lead 20C and the second drive lead 20D are spaced apart from each other in the lateral direction Y. The lead portion 16 is located between the first drive lead 20C and the second drive lead 20D in the lateral direction Y. In a plan view, the first drive lead 20C and the second drive lead 20D are symmetrical about the centerline C extending in the longitudinal direction X from the central portion of the semiconductor device 1 in the longitudinal direction X. In the description hereafter, each component of the first drive lead 20C and the second drive lead 20D will be denoted by reference numerals followed by the Roman letter C or D.

The first drive lead 20C is arranged closer to the third encapsulation resin side surface 53 than the lead portion 16. The first drive lead 20C includes a first drive pad 21C, a first drive terminal 22C, and a first coupling portion 23C that couples the first drive pad 21C to the first drive terminal 22C. The first drive pad 21C and the first coupling portion 23C are located between the substrate 10 and the second encapsulation resin side surface 52 in the longitudinal direction X. The first drive pad 21C and the first coupling portion 23C are located closer to the third encapsulation resin side surface 53 than the central portion of the encapsulation resin 50 in the lateral direction Y. The first drive terminal 22C is configured to be an anode terminal.

In a plan view, the first drive pad 21C is rectangular so that a long-side direction conforms to the lateral direction Y and a short-side direction conforms to the longitudinal direction X. The first drive pad 21C includes a first end 21c and a second end 21d that are opposite ends in the lateral direction Y. The first end 21c is an end of the first drive pad 21C located toward the third encapsulation resin side surface 53. The second end 21d is an end of the first drive pad 21C located toward the fourth encapsulation resin side surface 54.

The second drive lead 20D is located closer to the fourth encapsulation resin side surface 54 than the lead portion 16. The second drive lead 20D includes a second drive pad 21D, a second drive terminal 22D, and a second coupling portion 23D that couples the second drive pad 21D to the second drive terminal 22D. The second drive pad 21D and the second coupling portion 23D are located between the substrate 10 and the second encapsulation resin side surface 52 in the longitudinal direction X. The second drive pad 21D and the second coupling portion 23D are located closer to the fourth encapsulation resin side surface 54 than the central portion of the encapsulation resin 50 in the lateral direction Y. The second drive terminal 22D is configured to be an anode terminal.

The second drive pad 21D includes a first end 21e and a second end 21f that are opposite ends in the lateral direction Y. The first end 21e is an end of the second drive pad 21D located toward the third encapsulation resin side surface 53. The second end 21f is an end of the second drive pad 21D located toward the fourth encapsulation resin side surface 54.

The first drive pad 21C and the second drive pad 21D are located closer to the encapsulation resin top surface 56 than the main surface 10a of the substrate 10 in the thicknesswise direction Z. The first drive pad 21C and the second drive pad 21D are located closer to the encapsulation resin top surface 56 than the front surface 40a of the semiconductor element 40 in the thickness-wise direction Z.

The semiconductor element 40 contains SiC. In the present embodiment, a Schottky diode is used as the semiconductor element 40. The semiconductor element 40 is flat. Specifically, in a plan view, the semiconductor element 40 is rectangular so that a long-side direction conforms to the lateral direction Y and a short-side direction conforms to the longitudinal direction X. In the present embodiment, the semiconductor element 40 is located on a central portion of the inner body 12. Specifically, in a plan view, a first distance D1 between the semiconductor element 40 and an edge of the first flange 19a of the inner body 12 located toward the second encapsulation resin side surface 52 is equal to a second distance D2 between the semiconductor element 40 and the narrow portion 14 of the inner body 12. Also, a third distance D3 between the semiconductor element 40 and an edge of the second flange 19b of the inner body 12 located toward the third encapsulation resin side surface 53 is equal to a fourth distance D4 between the semiconductor element 40 and an edge of the third flange 19c of the inner body 12 located toward the fourth encapsulation resin side surface 54. When a difference between the first distance D1 and the second distance D2 is, for example, within 5% of the first distance D1, it is considered that the first distance D1 is equal to the second distance D2. Also, when a difference between the third distance D3 and the fourth distance D4 is, for example, within 5% of the third distance D3, it is considered that the third distance D3 is equal to the fourth distance D4.

The semiconductor element 40 includes a rear surface facing the side opposite to the front surface 40a in the thickness-wise direction Z. The main surface drive electrode 41 is formed on the front surface 40a, and a rear surface drive electrode (not shown) is formed on the rear surface of the semiconductor element 40. The main surface drive electrode 41 is configured to be an anode electrode. The rear surface drive electrode is configured to be a cathode electrode.

The passivation film 44 is formed on the main surface drive electrode 41 of the semiconductor element 40 as an insulation film. The passivation film 44 includes the opening 45. The opening 45 exposes the main surface drive electrode 41.

In plan view, the opening 45 is rectangular so that a long-side direction conforms to the lateral direction Y and a short-side direction conforms to the longitudinal direction X. The dimension of the opening 45 in the lateral direction Y is less than the dimension of the first drive pad 21C in the lateral direction Y and the dimension of the second drive pad 21D in the lateral direction Y. In other words, the dimension of the first drive pad 21C in the lateral direction Y and the dimension of the second drive pad 21D in the lateral direction Y are greater than the dimension of the opening 45 in the lateral direction Y.

The opening 45 is arranged in a central portion of the front surface 40a of the semiconductor element 40 in the longitudinal direction X. Specifically, a first distance DC1 between the opening 45 and the first side surface 40c of the semiconductor element 40, a second distance DC2 between the opening 45 and the second side surface 40d of the semiconductor element 40, a third distance DC3 between the opening 45 and the third side surface 40e of the semiconductor element 40, and a fourth distance DC4 between the opening 45 and the fourth side surface 40f of the semiconductor element 40 are equal to each other. When the largest one of differences between the first distance DC1, the second distance DC2, the third distance DC3, and the fourth distance DC4 is, for example, within 5% of the first distance DC1, it is considered that the first distance DC1, the second distance DC2, the third distance DC3, and the fourth distance DC4 are equal to each other.

The main surface drive electrode 41 includes an exposed region 46 exposed by the opening 45. The exposed region 46 includes a first exposed end 46a and a second exposed end 46b that are opposite ends in the lateral direction Y. The first exposed end 46a is an end of the exposed region 46 located toward the third side surface 40e of the semiconductor element 40. The second exposed end 46b is an end of the exposed region 46 located toward the fourth side surface 40f of the semiconductor element 40.

The semiconductor device 1 includes drive wires 60. In the present embodiment, the drive wires 60 include two drive wires, namely, a first drive wire 61 and a second drive wire 62. More specifically, the first drive wire 61 and the second drive wire 62 are configured to be a combination of the furthermost ones of the drive wires 60. The first drive wire 61 is located closer to the control wire 70 than the second drive wire 62. The first drive wire 61 and the second drive wire 62 are spaced apart from each other and connect the main surface drive electrode 41 of the semiconductor element 40 to the drive pad 21. In a plan view, the first drive wire 61 and the second drive wire 62 are spaced apart from each other in the lateral direction Y. The first drive wire 61 and the second drive wire 62 are ones of the drive wires 60 located at opposite ends in the lateral direction Y.

The first drive wire 61 and the second drive wire 62 are formed of the same metal. In the present embodiment, the first drive wire 61 and the second drive wire 62 contain aluminum. The first drive wire 61 and the second drive wire 62 have the same diameter. When a difference between the diameter of the first drive wire 61 and the diameter of the second drive wire 62 is, for example, within 5% of the diameter of the first drive wire 61, it is considered that the first drive wire 61 and the second drive wire 62 have the same diameter.

The first drive wire 61 connects the main surface drive electrode 41 of the semiconductor element 40 to the first drive pad 21C. The second drive wire 62 connects the main surface drive electrode 41 to the second drive pad 21D. The first drive wire 61 and the second drive wire 62 are connected to the main surface drive electrode 41 and the respective drive pads 21C and 21D by, for example, wire bonding.

In a plan view, the first drive wire 61 and the second drive wire 62 are connected to the main surface drive electrode 41 and the drive pad 21 so that the first drive wire 61 and the second drive wire 62 are separated by a greater distance at the drive pad 21 than at the main surface drive electrode 41. In a plan view, the distance between the first drive wire 61 and the second drive wire 62 increases from the main surface drive electrode 41 toward the drive pad 21. The configurations of the first drive wire 61 and the second drive wire 62 will be specifically described below.

The drive electrode end 61a of the first drive wire 61 is located closer to the fourth encapsulation resin side surface 54 than the drive pad end 61b of the first drive wire 61. The drive electrode end 62a of the second drive wire 62 is located closer to the third encapsulation resin side surface 53 than the drive pad end 62b of the second drive wire 62. In a plan view, a distance DW2 between the drive pad end 61b and the drive pad end 62b is greater than a distance DW1 between the drive electrode end 61a and the drive electrode end 62a.

The distance DY1 in the lateral direction Y between the auxiliary line LS1, which extends from the drive electrode end 61a in the longitudinal direction X, and the auxiliary line LS2, which extends from the drive pad end 61b in the longitudinal direction X, is equal to the distance DY2 in the lateral direction Y between the auxiliary line LS3, which extends from the drive electrode end 62a in the longitudinal direction X, and the auxiliary line LS4, which extends from the drive pad end 62b in the longitudinal direction X. When a difference between the distance DY1 and the distance DY2 is, for example, within 5% of the distance DY1, it is considered that the distance DY1 is equal to the distance DY2.

The drive electrode end 61a of the first drive wire 61 is connected to the main surface drive electrode 41 at a position closer to the first exposed end 46a than a central portion of the exposed region 46 in the lateral direction Y. In the present embodiment, the drive electrode end 61a is connected to the first exposed end 46a. In an example, the drive electrode end 61a is arranged at the limit position toward the third side surface 40e in a region of the first exposed end 46a of the exposed region 46 of the main surface drive electrode 41 where wire bonding is performable.

The drive pad end 61b of the first drive wire 61 is connected to the first drive pad 21C at a position located closer to the first end 21c than the central portion in the lateral direction Y. In the present embodiment, the drive pad end 61b is connected to the first end 21c of the first drive pad 21C. In an example, the drive pad end 61b is arranged at the limit position toward the third encapsulation resin side surface 53 in a region of the first end 21c of the first drive pad 21C where wire bonding is performable. In the longitudinal direction X, the drive pad end 61b is connected to a portion of the first drive pad 21C located closer to the semiconductor element 40 than a central portion of the first drive pad 21C in the longitudinal direction X.

The drive electrode end 62a of the second drive wire 62 is connected to the main surface drive electrode 41 at a position closer to the second exposed end 46b than the central portion of the exposed region 46 in the lateral direction Y. In the present embodiment, the drive electrode end 62a is connected to the second exposed end 46b. In an example, the drive electrode end 62a is arranged at the limit position toward the fourth side surface 40f in a region where wire bonding is performable in an end of the opening 45 located toward the fourth side surface 40f of the semiconductor element 40 in the lateral direction Y The drive electrode end 62a and the drive electrode end 61a of the first drive wire 61 are located at the same position in the longitudinal direction X and arranged in the lateral direction Y. The state in which the drive electrode end 62a and the drive electrode end 61a are located at the same position in the longitudinal direction includes a state in which the drive electrode ends 61a and 62a overlap with each other in the longitudinal direction X and a state in which the drive electrode ends 61a and 62a partially overlap due to a manufacturing error caused by wire bonding. In other words, when a difference between the drive electrode ends 61a and 62a in the longitudinal direction X is an extent of a variation caused when performing wire bonding, it is considered that the drive electrode ends 61a and 62a are located at the same position in the longitudinal direction X.

The drive pad end 62b of the second drive wire 62 is connected to the second drive pad 21D at a position closer to the second end 21f than a central portion of the second drive pad 21D in the lateral direction Y. In the present embodiment, the drive pad end 62b is connected to the second end 21f of the second drive pad 21D. In an example, the drive pad end 62b is arranged at the limit position toward the fourth encapsulation resin side surface 54 in a region of the second end 21f of the second drive pad 21D where wire bonding is performable. In the longitudinal direction X, the drive pad end 62b is connected to a portion of the drive pad 21 located closer to the semiconductor element 40 than the central portion of the drive pad 21 in the longitudinal direction X.

The semiconductor device 1 of the present embodiment has the following advantages in addition to (1-1), (1-5), and (1-7) of the first embodiment.

(4-1) The first drive pad 21C of the first drive lead 20C is spaced apart from the second drive pad 21D of the second drive lead 20D in the lateral direction Y. This configuration allows for an increase in the distance DW2 between the drive pad end 61b of the first drive wire 61 and the drive pad end 62b of the second drive wire 62. As a result, the inductance between the main surface drive electrode 41 and the drive pad 21 is reduced.

(4-2) The drive pad end 61b is connected to the first end 21e of the first drive pad 21C. The drive pad end 62b is connected to the second end 21f of the second drive pad 21D. This configuration further increases the distance DW2 between the drive pad end 61b and the drive pad end 62b. Thus, the inductance between the main surface drive electrode 41 and the drive pad 21 is further reduced.

Modified Examples of Fourth Embodiment

The semiconductor device 1 of the fourth embodiment may be modified, for example, as follows. The modified example described below may be combined with one another as long as there is no technical inconsistency. In the following modified examples, the same reference characters are given to those elements that are the same as the corresponding elements of the fourth embodiment. Such elements will not be described in detail.

Figure 33:
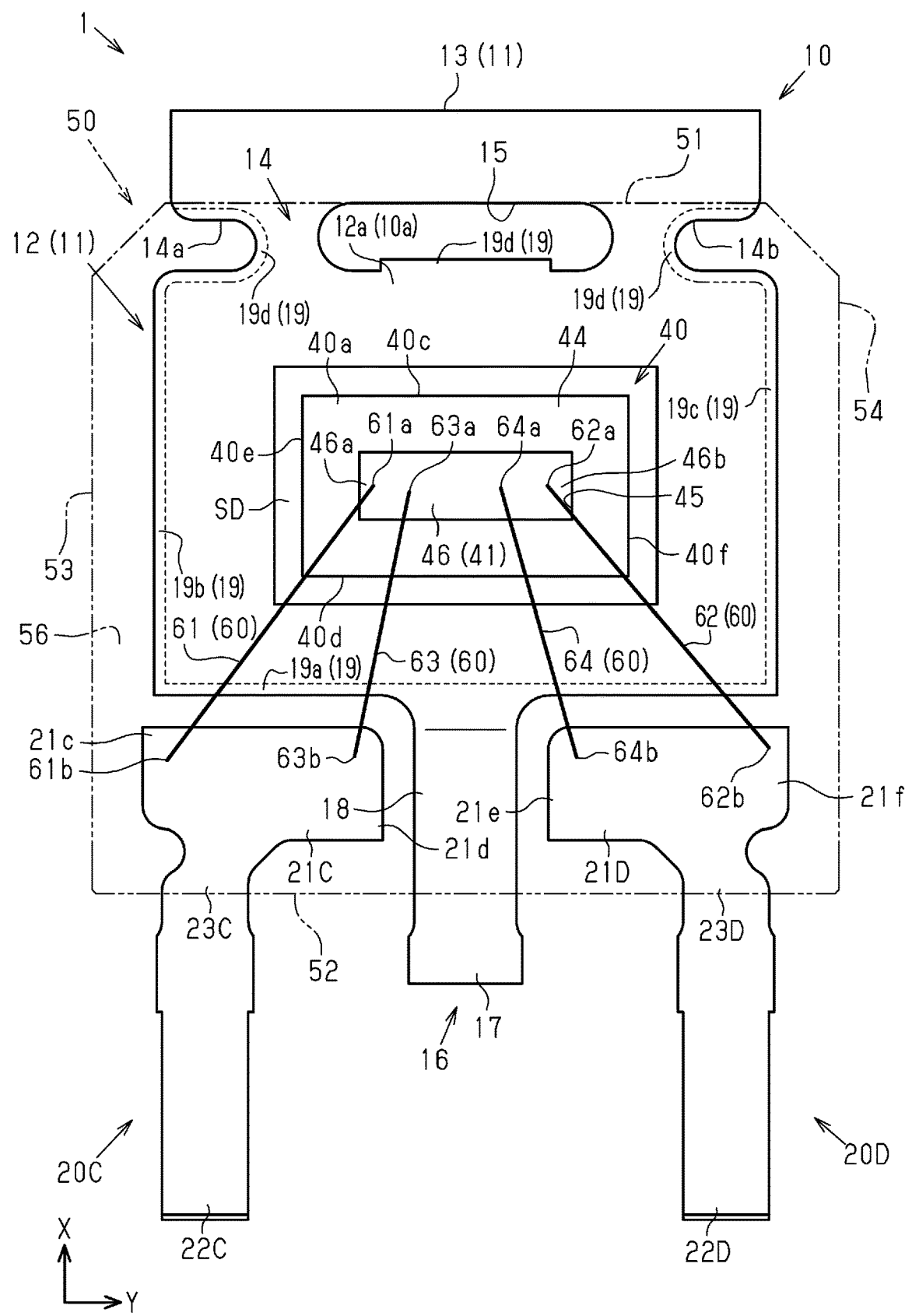
FIG. 33 is an enlarged view showing a semiconductor element and its surroundings in a modified example of the semiconductor device of the fourth embodiment.

The number of drive wires 60 is not limited to two and may be changed in any manner. In an example, as shown in FIG. 33, the drive wires 60 may include four drive wires, namely, the first drive wire 61, the second drive wire 62, the third drive wire 63, and the fourth drive wire 64. The third drive wire 63 and the fourth drive wire 64 are arranged between the first drive wire 61 and the second drive wire 62. In this case, the first drive wire 61 and the second drive wire 62 are configured to be a combination of the furthermost ones of the drive wires 60. The first drive wire 61, the second drive wire 62, the third drive wire 63, and the fourth drive wire 64 are spaced apart from each other in the lateral direction Y. As described above, the first drive wire 61 and the second drive wire 62, which are configured to be a combination of the furthermost ones of the drive wires 60, are the drive wires 60 that are located at opposite ends in the lateral direction Y.

The third drive wire 63 includes a drive electrode end 63a and a drive pad end 63b. The drive electrode end 63a is an end of the third drive wire 63 connected to the main surface drive electrode 41. The drive pad end 63b is an end of the third drive wire 63 connected to the first drive pad 21C. The drive pad end 63b is located closer to the third encapsulation resin side surface 53 than the drive electrode end 63a. The fourth drive wire 64 includes a drive electrode end 64*a* and a drive pad end 64*b*. The drive electrode end 64*a* is an end of the fourth drive wire 64 connected to the main surface drive electrode 41. The drive pad end 64*b* is an end of the fourth drive wire 64 connected to the second drive pad 21D. The drive pad end 64*b* is located closer to the fourth encapsulation resin side surface 54 than the drive electrode end 64*a*. In FIG. 33, the drive pad end 63*b* is connected to the second end 21*d* of the first drive pad 21C. The drive pad end 64*b* is connected to the first end 21*e* of the second drive pad 21D.

In FIG. 33, the drive electrode end 61*a* of the first drive wire 61, the drive electrode end 62*a* of the second drive wire 62, the drive electrode end 63*a* of the third drive wire 63, and the drive electrode end 64*a* of the fourth drive wire 64 are located at the same position in the longitudinal direction X and arranged in the lateral direction Y. The state in which the drive electrode end 61*a*, the drive electrode end 62*a*, the drive electrode end 63*a*, and the drive electrode end 64*a* are located at the same position in the longitudinal direction X includes a state in which the drive electrode ends 61*a*, 62*a*, 63*a*, and 64*a* overlap with each other in the longitudinal direction X and a state in which the drive electrode ends 61*a*, 62*a*, 63*a*, and 64*a* partially overlap due to a manufacturing error caused by wire bonding. In other words, when a difference between the drive electrode ends 61*a*, 62*a*, 63*a*, and 64*a* in the longitudinal direction X is an extent of a variation caused when performing wire bonding, it is considered that the drive electrode ends 61*a*, 62*a*, 63*a*, and 64*a* are located at the same position in the longitudinal direction X.

In a plan view, the first drive wire 61 and the third drive wire 63 are connected to the main surface drive electrode 41 and the first drive pad 21C so that the first drive wire 61 and the third drive wire 63 are separated by a greater distance at the first drive pad 21C than at the main surface drive electrode 41. In a plan view, the distance between the first drive wire 61 and the third drive wire 63 gradually increases from the main surface drive electrode 41 toward the drive pad 21. In a plan view, the fourth drive wire 64 and the second drive wire 62 are connected to the main surface drive electrode 41 and the second drive pad 21D so that the fourth drive wire 64 and the second drive wire 62 are separated by a greater distance at the second drive pad 21D than at the main surface drive electrode 41. In a plan view, the distance between the fourth drive wire 64 and the second drive wire 62 gradually increases from the main surface drive electrode 41 toward the drive pad 21. The third drive wire 63 and the fourth drive wire 64 are connected to the main surface drive electrode 41, the first drive pad 21C, and the second drive pad 21D so that the third drive wire 63 and the fourth drive wire 64 are separated by a greater distance at the first drive pad 21C and the second drive pad 21D than at the main surface drive electrode 41. In a plan view, the distance between the third drive wire 63 and the fourth drive wire 64 gradually increases from the main surface drive electrode 41 toward the first drive pad 21C and the second drive pad 21D.

The size of the semiconductor element 40 may be changed in any manner. The semiconductor element 40 may be increased in size in at least one of the longitudinal direction X and the lateral direction Y from the semiconductor element 40 of the fourth embodiment.

The position of the semiconductor element 40 on the substrate 10 may be changed in any manner.

In a first example, the semiconductor element 40 may be arranged on a portion of the inner body 12 located toward the second encapsulation resin side surface 52. Specifically, the first distance D1 in the longitudinal direction X between the semiconductor element 40 and the edge of the first flange 19*a* of the inner 12 located toward the second encapsulation resin side surface 52 is less than the second distance D2 in the longitudinal direction X between the semiconductor element 40 and the narrow portion 14 of the inner body 12.

This configuration decreases the distance between the opening 45 of the semiconductor element 40 and the drive pad 21, thereby shortening the first drive wire 61 and the second drive wire 62. As a result, the inductance between the main surface drive electrode 41 (source electrode) and the drive terminal 22 of the drive lead 20 (source terminal) is further decreased.

In a second example, the semiconductor element 40 may be arranged on a portion of the inner body 12 located toward the second encapsulation resin side surface 52 and toward the fourth encapsulation resin side surface 54. Specifically, the first distance D1 in the longitudinal direction X between the semiconductor element 40 and the edge of the first flange 19*a* of the inner 12 located toward the second encapsulation resin side surface 52 is less than the second distance D2 in the longitudinal direction X between the semiconductor element 40 and the narrow portion 14 of the inner body 12. The third distance D3 in the lateral direction Y between the semiconductor element 40 and the edge of the second flange 19*b* of the inner body 12 located toward the third encapsulation resin side surface 53 is greater than the fourth distance D4 in the lateral direction Y between the semiconductor element 40 and the edge of the third flange 19*c* of the inner body 12 located toward the fourth encapsulation resin side surface 54.

This configuration further decreases the distance between the semiconductor element 40 and the drive pad 21, thereby further shortening the first drive wire 61 and the second drive wire 62. As a result, the inductance between the main surface drive electrode 41 (source electrode) and the drive terminal 22 of the drive lead 20 (source terminal) is further decreased.

Modified Examples of Each Embodiment

The semiconductor device 1 of the embodiments described above may be modified, for example, as follows.

In the embodiment, the positions of the drive pad 21 and the control pad 31 in the thickness-wise direction Z may be changed in any manner. In an example, at least one of the drive pad 21 and the control pad 31 may be located at the same position as the semiconductor element 40 in the thickness-wise direction Z. In an example, at least one of the drive pad 21 and the control pad 31 may be located at the same position as the substrate 10 in the thickness-wise direction Z.

In the embodiment, the positions of the drive pad 21 and the control pad 31 in a plan view may be changed in any manner. In an example, the position of at least one of the drive pad 21 and the control pad 31 may differ from that of the substrate 10 in the lateral direction Y. More specifically, at least one of the drive pad 21 or the control pad 31 may be located toward the third encapsulation resin side surface 53 or the fourth encapsulation resin side surface 54 of the encapsulation resin 50 from the substrate 10. Thus, the position of at least one of the drive pad 21 or the control pad 31 may differ from that of the semiconductor element 40 in the lateral direction Y.

In each embodiment, the flanges 19 may be omitted from the substrate 10.

In the embodiments, the drive wires 60 and the control wire 70 may be formed of different metals. In an example, the drive wires 60 are formed of aluminum, and the control wire 70 is formed of gold (Au).

In the embodiments, the diameter of each drive wire 60 may differ from the diameter of the control wire 70. In an example, the diameter of the drive wire 60 is larger than the diameter of the control wire 70.

In the embodiments, the diameter of each drive wire 60 is not limited to 125 μm to 250 μm and may be changed in any manner. In an example, the diameter of the drive wire 60 is 250 μm to 400 μm.

Figure 34:
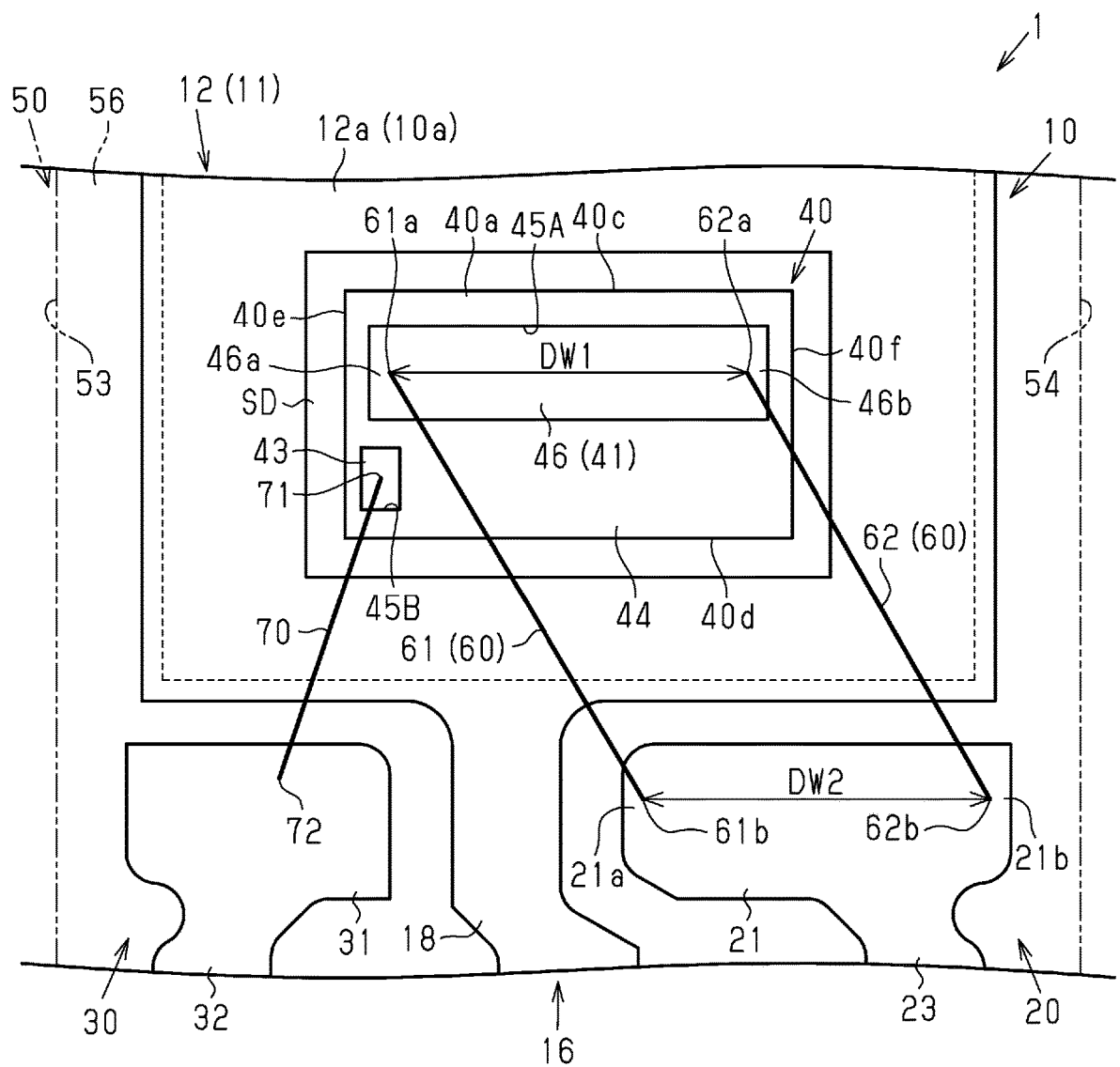
FIG. 34 is an enlarged view showing a semiconductor element and its surroundings in a modified example of the semiconductor device of each embodiment.

In the embodiments, the semiconductor element 40 is configured so that the main surface drive electrode 41 and the control electrode 43 are exposed by the single rectangular opening 45 in a plan view. However, the number of openings 45 is not limited to one. For example, as shown in FIG. 34, the front surface 40a of the semiconductor element 40 may include a first opening 45A that exposes the main surface drive electrode 41 and a second opening 45B that exposes the control electrode 43. In a plan view, the first opening 45A is rectangular so that a long-side direction conforms to the lateral direction Y and a short-side direction conforms to the longitudinal direction X. In a plan view, the second opening 45B is rectangular so that a long-side direction conforms to the longitudinal direction X and a short-side direction conforms to the lateral direction Y. The first opening 45A is located toward the first side surface 40c of the semiconductor element 40 in the longitudinal direction X. The first opening 45A is formed in a large portion of the front surface 40a of the semiconductor element 40 in the lateral direction Y. The second opening 45B is formed in an end of the semiconductor element 40 located at the second side surface 40d and the third side surface 40e.

The main surface drive electrode 41 includes the exposed region 46 exposed by the first opening 45A. The exposed region 46 includes a first exposed end 46a and a second exposed end 46b that are opposite ends in the lateral direction Y. The first exposed end 46a is an end of the exposed region 46 located toward the third side surface 40e of the semiconductor element 40. The second exposed end 46b is an end of the exposed region 46 located toward the fourth side surface 40f of the semiconductor element 40.

The first drive wire 61 and the second drive wire 62 are connected to the exposed region 46 of the main surface drive electrode 41 and the drive pad 21 of the drive lead 20. In FIG. 34, in a plan view, the first drive wire 61 is parallel to the second drive wire 62. In a plan view, the distance between the first drive wire 61 and the second drive wire 62 may gradually increase from the main surface drive electrode 41 toward the drive pad 21 or may gradually decrease from the main surface drive electrode 41 toward the drive pad 21.

In a plan view, the distance DW2 between the drive pad end 61b and the drive pad end 62b is equal to the distance DW1 between the drive electrode end 61a and the drive electrode end 62a. When a difference between the distance DW1 and the distance DW2 is, for example, within 5% of the distance DW2, it is considered that the distance DW2 is equal to the distance DW1.

The drive electrode end 61a of the first drive wire 61 is located closer to the first exposed end 46a than a central portion of the exposed region 46 in the lateral direction Y. In FIG. 34, the drive electrode end 61a is connected to the first exposed end 46a of the exposed region 46. In an example, the drive electrode end 61a is arranged at the limit position toward the third side surface 40e in a region of the first exposed end 46a of the exposed region 46 where wire bonding is performable.

The drive pad end 61b of the first drive wire 61 is connected to the drive pad 21 at a position closer to the first end 21a than a central portion of the drive pad 21 in the lateral direction Y. In FIG. 34, the drive pad end 61b is connected to the first end 21a of the drive pad 21. In an example, the drive pad end 61b is arranged at the limit position toward the third encapsulation resin side surface 53 in a region of the first end 21a of the drive pad 21 where wire bonding is performable. In the longitudinal direction X, the drive pad end 61b is connected to a portion of the drive pad 21 located closer to the semiconductor element 40 than the central portion of the drive pad 21 in the longitudinal direction X. The drive pad end 61b is located closer to the fourth encapsulation resin side surface 54 than the drive electrode end 61a.

The drive electrode end 62a of the second drive wire 62 is located closer to the exposed region 46 than a central portion of the second exposed end 46b in the lateral direction Y. In FIG. 34, the drive electrode end 62a is connected to the second exposed end 46b of the exposed region 46. In an example, the drive electrode end 62a is arranged at the limit position toward the fourth side surface 40f in a region of the second exposed end 46b of the exposed region 46 where wire bonding is performable. The drive electrode end 62a and the drive electrode end 61a of the first drive wire 61 are located at the same position in the longitudinal direction X and arranged in the lateral direction Y. The state in which the drive electrode end 62a and the drive electrode end 61a are located at the same position in the longitudinal direction includes a state in which the drive electrode ends 61a and 62a overlap with each other in the longitudinal direction X and a state in which the drive electrode ends 61a and 62a partially overlap due to a manufacturing error caused by wire bonding. In other words, when a difference between the drive electrode ends 61a and 62a in the longitudinal direction X is an extent of a variation caused when performing wire bonding, it is considered that the drive electrode ends 61a and 62a are located at the same position in the longitudinal direction X.

The drive pad end 62b of the second drive wire 62 is connected to the drive pad 21 at a position closer to the second end 21b than the central portion of the drive pad 21 in the lateral direction Y. In FIG. 34, the drive pad end 62b is connected to the second end 21b of the drive pad 21. In an example, the drive pad end 62b is arranged at the limit position toward the fourth encapsulation resin side surface 54 in a region of the second end 21b of the drive pad 21 where wire bonding is performable. In the longitudinal direction X, the drive pad end 62b is connected to a portion of the drive pad 21 located closer to the semiconductor element 40 than the central portion of the drive pad 21 in the longitudinal direction X. The drive pad end 62b is located closer to the fourth encapsulation resin side surface 54 than the drive electrode end 62a. In FIG. 34, the drive pad end 62b and the drive pad end 61b are located at the same position in the longitudinal direction X and arranged in the lateral direction Y. The state in which the drive pad end 62b and the drive pad end 61b are located at the same position in the longitudinal direction X includes a state in which the drive pad ends 61b and 62b overlap with each other in the longitudinal direction X and a state in which the drive pad ends 61b and 62b partially overlap due to a manufacturing error caused by wire bonding. In other words, a difference between the drive pad ends 61b and 62b in the longitudinal direction X is an extent of a variation caused when performing wire bonding, it is considered that the drive pad ends 61b and 62b are located at the same position in the longitudinal direction X.

This configuration increases the distance DW1 between the drive electrode end 61a of the first drive wire 61 and the drive electrode end 62a of the second drive wire 62, thereby decreasing the inductance between the main surface drive electrode 41 and the drive pad 21.

In the semiconductor device 1 of the modified example shown in FIG. 34, the positional relationship between the first opening 45A and the second opening 45B may be reversed in the longitudinal direction X. That is, the first opening 45A may be formed at a side closer to the second side surface 40d of the semiconductor element 40 than the second opening 45B. This configuration decreases the distance between the first opening 45A and the drive pad 21, thereby shortening the first drive wire 61 and the second drive wire 62. As a result, the inductance between the main surface drive electrode 41 (source electrode) and the drive terminal 22 of the drive lead 20 (source terminal) is further decreased.

CLAUSES

The technical aspects will be described below based on the embodiments and the modified examples described above.

Clause 1. A semiconductor device including: a substrate including a main surface; a semiconductor element mounted on the main surface, the semiconductor element including a front surface that faces in a same direction as the main surface and a drive electrode formed on the front surface and containing SiC; a drive pad; and drive wires spaced apart from each other and connecting the drive electrode to the drive pad, in which the drive wires include a first drive wire and a second drive wire configured to be a combination of furthermost ones of the drive wires, and the first drive wire and the second drive wire are connected to the drive electrode and the drive pad so that the first drive wire and the second drive wire are located closer to each other at the drive pad than at the drive electrode as viewed in a first direction that is perpendicular to the main surface.

Clause 2. The semiconductor device according to clause 1, in which when a direction orthogonal to the first direction is a second direction, and a direction orthogonal to the first direction and the second direction is a third direction, the semiconductor element and the drive pad are located at different positions in at least the second direction, the drive wires are spaced apart from each other in the third direction, and the first drive wire and the second drive wire are ones of the drive wires located at opposite ends in the third direction.

Clause 3. The semiconductor device according to clause 1 or 2, further including: an insulation film formed on the drive electrode; and an opening formed in a portion of the insulation film to expose the drive electrode, in which the opening is rectangular so that a short-side direction conforms to the second direction and a long-side direction conforms to the third direction as viewed in the first direction, and the opening is greater than the drive pad in dimension in the third direction.

Clause 4. The semiconductor device according to any one of clauses 1 to 4, further including: an insulation film formed on the drive electrode, and an opening formed in a portion of the insulation film to expose the drive electrode, in which the opening is rectangular so that a short-side direction conforms to the second direction and a long-side direction conforms to the third direction as viewed in the first direction, the drive electrode includes an exposed region exposed by the opening, the exposed region includes a first exposed end and a second exposed end that are opposite ends in the third direction, the first drive wire is connected to a portion of the exposed region located closer to the first exposed end than a central portion of the exposed region in the third direction, and the second drive wire is connected to a portion of the exposed region located closer to the second exposed end than the central portion of the exposed region in the third direction.

Clause 5. The semiconductor device according to any one of clauses 2 to 4 in which each of the first drive wire and the second drive wire includes a drive electrode end connected to the drive electrode and a drive pad end connected to the drive pad, the drive pad includes a first end and a second end that are opposite ends in the third direction, the drive pad end of the first drive wire is connected to a portion of the drive pad located closer to the first end than a central portion of the drive pad in the third direction, and the drive pad end of the second drive wire is connected to a portion of the drive pad located closer to the second end than the central portion of the drive pad in the third direction.

Clause 6. The semiconductor device according to clause 5, in which the drive pad end of the first drive wire is connected to the first end, and the drive pad end of the second drive wire is connected to the second end.

Clause 7. A semiconductor device including: a substrate including a main surface; a semiconductor element mounted on the main surface, the semiconductor element including a front surface that faces in a same direction as the main surface and a drive electrode formed on the front surface and containing SiC; a drive pad; and drive wires spaced apart from each other and connecting the drive electrode to the drive pad, in which the drive wires include a first drive wire and a second drive wire configured to be a combination of furthermost ones of the drive wires, each of the first drive wire and the second drive wire includes a drive electrode end connected to the drive electrode and a drive pad end connected to the drive pad, when a direction perpendicular to the main surface is a first direction, a direction orthogonal to the first direction is a second direction, and a direction orthogonal to the first direction and the second direction is a third direction, the semiconductor element and the drive pad are located at different positions in at least the second direction, the first drive wire and the second drive wire are spaced apart from each other in the third direction, the drive pad includes a first end and a second end that are opposite ends in the third direction, the drive pad end of the first drive wire is connected to a portion of the drive pad located closer to the first end than a central portion of the drive pad in the third direction, the drive pad end of the second drive wire is connected to a portion of the drive pad located closer to the second end than the central portion of the drive pad in the third direction.

Clause 8. The semiconductor device according to clause 7, in which the drive pad end of the first drive wire is connected to the first end, and the drive pad end of the second drive wire is connected to the second end.

Clause 9. The semiconductor device according to clause 7 or 8, further including: an insulation film formed on the drive electrode; and an opening formed in a portion of the insulation film to expose the drive electrode, in which the opening is rectangular so that a short-side direction conforms to the second direction and a long-side direction conforms to the third direction as viewed in the first direction, and the drive pad is greater than the opening in dimension in the third direction.

Clause 10. The semiconductor device according to clause 9, in which the drive pad is greater than the semiconductor element in dimension in the third direction.

Clause 11. The semiconductor device according to clause 7 or 8, in which the drive pad is greater than one-half of the substrate in dimension in the third direction.

Clause 12. The semiconductor device according to clause 7 or 8, in which the drive pad includes a first drive pad and a second drive pad, the drive pad end of the first drive wire is connected to the first drive pad, the drive pad end of the second drive wire is connected to the second drive pad, and the first drive pad and the second drive pad are spaced apart from each other in the third direction.

Fifth Embodiment

A fifth embodiment of a semiconductor device will now be described with reference to FIGS. 35 to 45.

Figure 35:
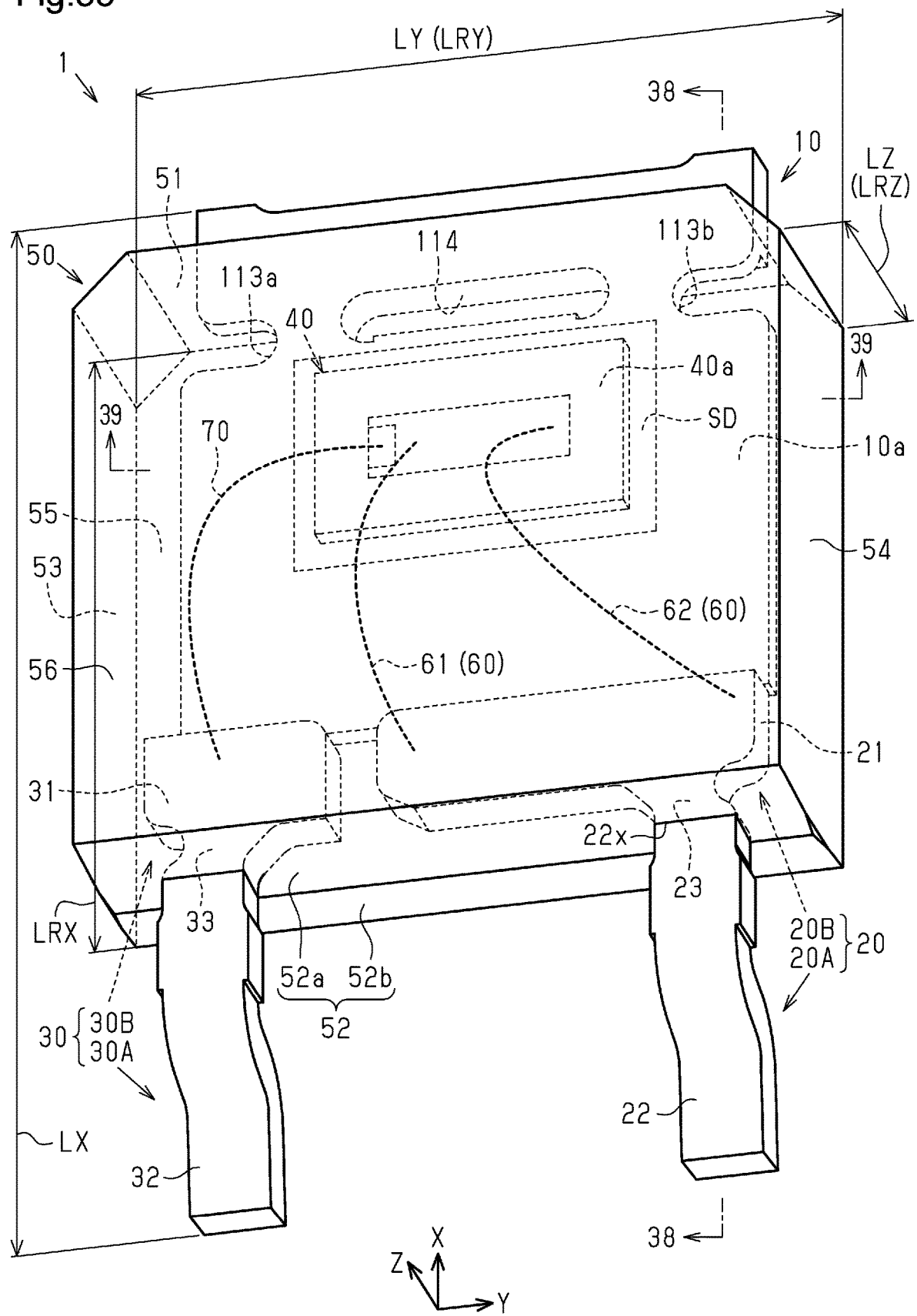
FIG. 35 is a perspective view showing a fifth embodiment of a semiconductor device.

As shown in FIG. 35, a semiconductor device 1 includes a substrate 10, a drive lead 20, a control lead 30, a semiconductor element 40 mounted on a main surface 10a of the substrate 10, and an encapsulation resin 50 encapsulating the semiconductor element 40. In the present embodiment, the substrate 10, the drive lead 20, and the control lead 30 are formed by stamping the same metal base material. The drive lead 20 includes an outer lead 20A projecting from a first side surface of the encapsulation resin 50 and an inner lead 20B arranged in the encapsulation resin 50 and electrically connected to the outer lead 20A. In the present embodiment, the outer lead 20A and the inner lead 20B are integrated with each other as a single component. The control lead 30 includes an outer lead 30A projecting from the first side surface of the encapsulation resin 50 and an inner lead 30B arranged in the encapsulation resin 50 and electrically connected to the outer lead 30A. In the present embodiment, the outer lead 30A and the inner lead 30B are integrated with each other as a single component. Preferably, the semiconductor device 1 has a lateral dimension LY that is less than or equal to 10 mm. The semiconductor device 1 of the present embodiment is a package having a package outline standard (JEITA standard) of TO-252. More specifically, the semiconductor device 1 has a longitudinal dimension LX that is 9.5 mm to 10.50 mm, the lateral dimension LY that is 6.4 mm to 6.8 mm, and a thickness-wise dimension LZ that is 2.1 mm to 2.3 mm. The lateral dimension LY and the thickness-wise dimension LZ correspond to a lateral dimension LRY and a thickness-wise dimension LRZ of the encapsulation resin 50. The encapsulation resin 50 has a longitudinal dimension LRX that is 6.0 mm to 6.4 mm. The semiconductor device 1 is a single inline package (SIP) type so that the outer lead 20A of the drive lead 20 and the outer lead 30A of the control lead 30 extend from one of the surfaces of the encapsulation resin 50.

As shown in FIG. 35, the encapsulation resin 50 is rectangular-box-shaped. The encapsulation resin 50 is an electrically-insulative synthetic resin. In an example, the encapsulation resin 50 is epoxy resin. The encapsulation resin 50 includes six surfaces, namely, a first encapsulation resin side surface 51, a second encapsulation resin side surface 52, a third encapsulation resin side surface 53, a fourth encapsulation resin side surface 54, an encapsulation resin rear surface 55, and an encapsulation resin top surface 56. The drive terminal 22 of the drive lead 20 and the control terminal 32 of the control lead 30, which will be described later, project from the second encapsulation resin side surface 52. In the present embodiment, the second encapsulation resin side surface 52 is an example of a first side surface of an encapsulation resin. The first encapsulation resin side surface 51 and the second encapsulation resin side surface 52 are separated from each other and face in opposite directions. In the present embodiment, the first encapsulation resin side surface 51 is an example of a second side surface of the encapsulation resin. The third encapsulation resin side surface 53 and the fourth encapsulation resin side surface 54 are separated from each other and face in opposite directions. The encapsulation resin rear surface 55 and the encapsulation resin top surface 56 are separated from each other and face in opposite directions. The encapsulation resin top surface 56 and the main surface 10a of the substrate 10 face in the same direction. The encapsulation resin rear surface 55 and the rear surface 10b of the substrate 10 (refer to FIG. 37) face in the same direction. In the description hereafter, the direction in which the encapsulation resin rear surface 55 and the encapsulation resin top surface 56 are arranged is referred to as a thickness-wise direction Z. The direction in which the first encapsulation resin side surface 51 and the second encapsulation resin side surface 52 are arranged is referred to as a longitudinal direction X. The direction in which the third encapsulation resin side surface 53 and the fourth encapsulation resin side surface 54 are arranged is referred to as a lateral direction Y. The longitudinal direction X and the lateral direction Y are orthogonal to the thickness-wise direction Z. The longitudinal direction X is orthogonal to the lateral direction Y. The thickness-wise direction Z corresponds to a first direction. The longitudinal direction X corresponds to a second direction. The lateral direction Y corresponds to a third direction.

Figure 38:
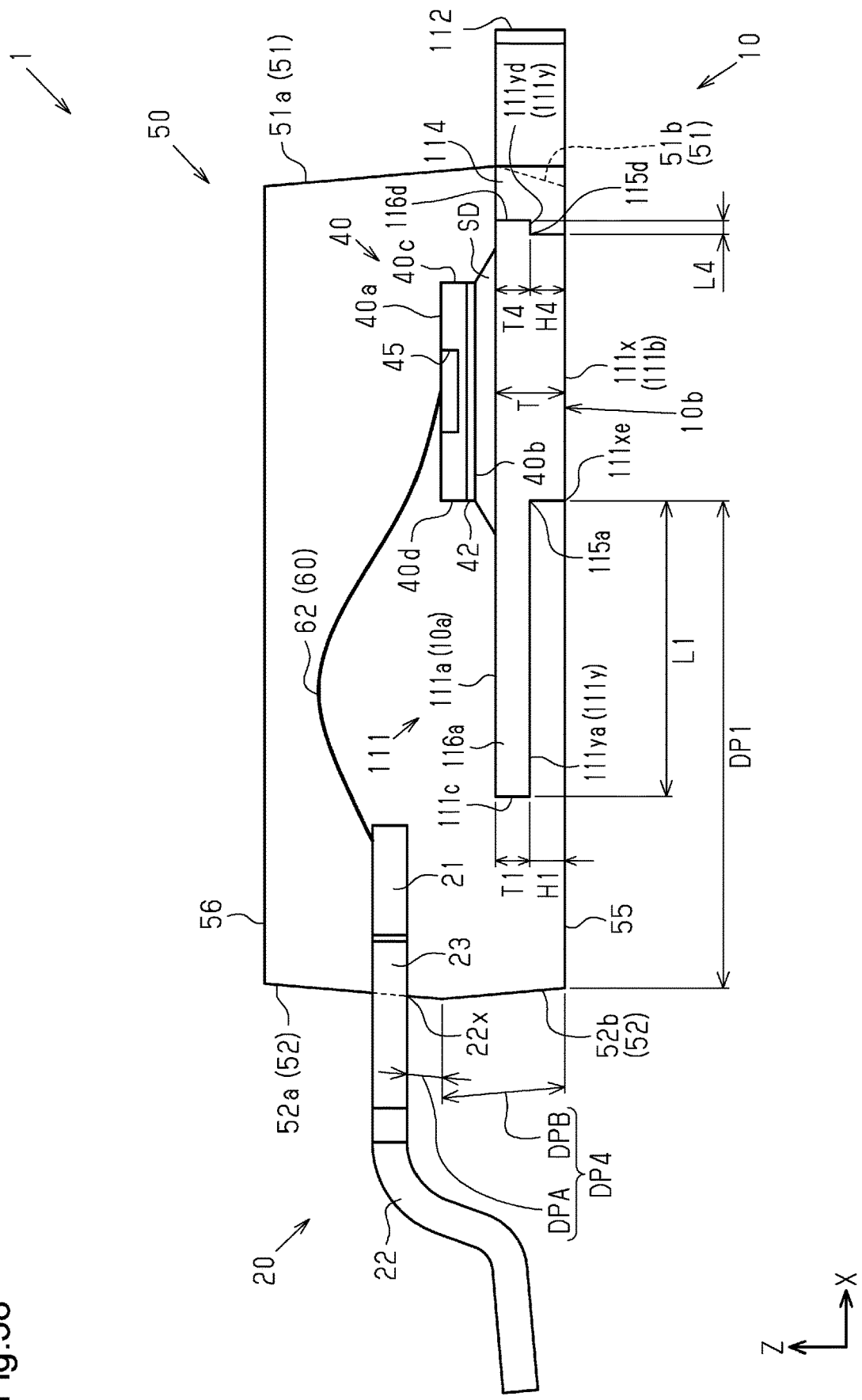
FIG. 38 is a schematic cross-sectional view taken along line 38-38 in FIG. 35.
Figure 39:
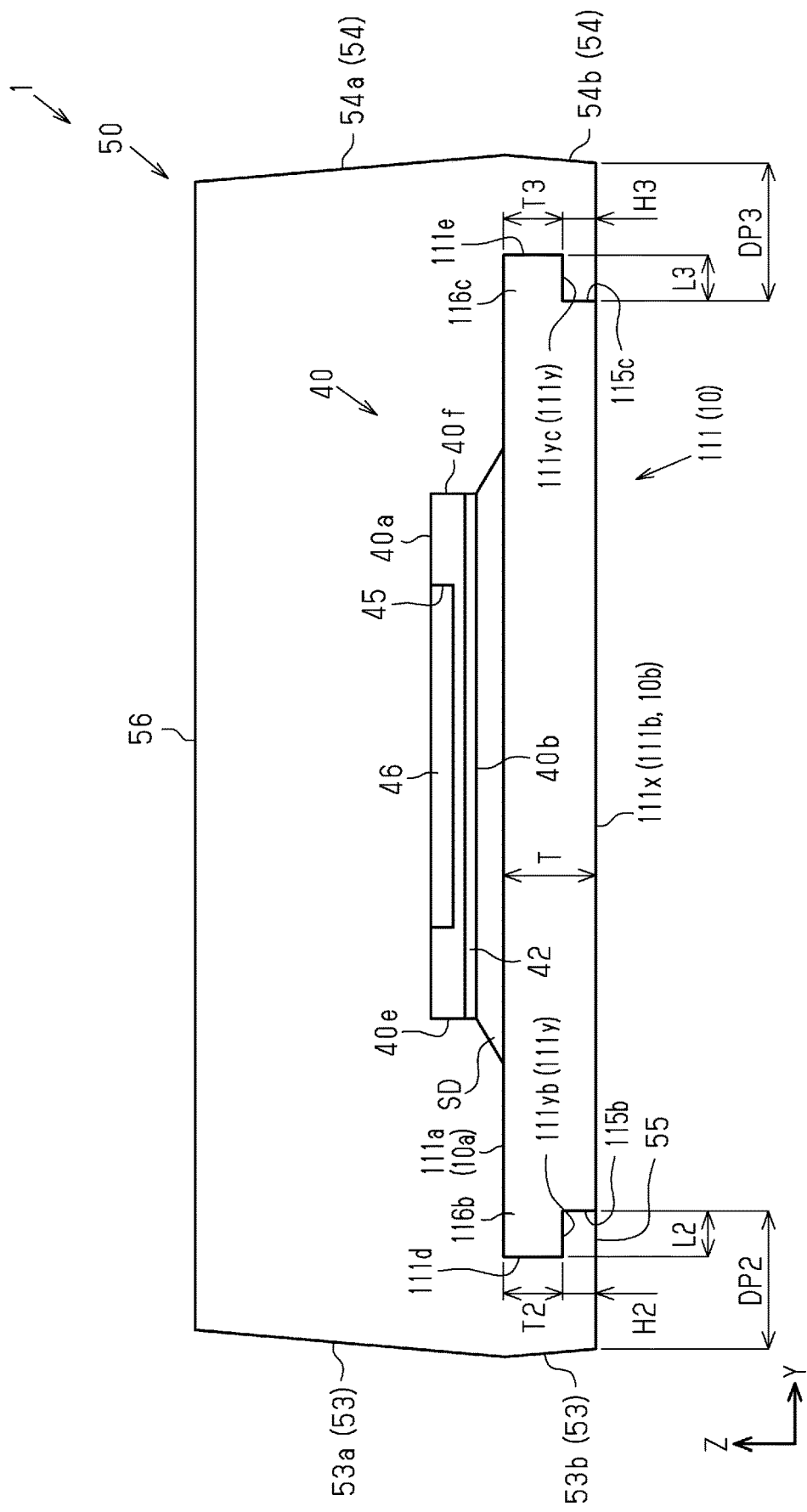
FIG. 39 is a schematic cross-sectional view taken along line 39-39 in FIG. 35.

The encapsulation resin 50 is formed by molding. Each of the side surfaces 51 to 54 of the encapsulation resin 50 includes an inclined surface that is inclined with respect to the thickness-wise direction Z so that a draft slope is provided to facilitate removal of a mold when forming the encapsulation resin 50. Specifically, each of the side surfaces 51 to 54 includes a first inclined surface having a draft angle configured to facilitate removal of an upper mold and a second inclined surface having a draft angle configured to facilitate removal of a lower mold. The upper mold forms the encapsulation resin top surface 56 and a portion of each of the side surfaces 51 to 54 located toward the encapsulation resin top surface 56. The lower mold forms the encapsulation resin rear surface 55 and a portion of each of the side surfaces 51 to 54 located toward the encapsulation resin rear surface 55. In an example, as shown in FIGS. 38 and 39, the first encapsulation resin side surface 51 includes a first inclined surface 51a and a second inclined surface 51b. The first inclined surface 51a is inclined toward the second encapsulation resin side surface 52 at positions closer to the encapsulation resin top surface 56. The second inclined surface 51b is inclined toward the second encapsulation resin side surface 52 as the second inclined surface 51b extends toward the encapsulation resin rear surface 55. The first inclined surface 51a is longer than the second inclined surface 51b. The second encapsulation resin side surface 52 includes a first inclined surface 52a and a second inclined surface 52b. The first inclined surface 52a is inclined toward the first encapsulation resin side surface 51 as the first inclined surface 52a extends toward the encapsulation resin top surface 56. The second inclined surface 52b is inclined toward the first encapsulation resin side surface 51 as the second inclined surface 52b extends toward the encapsulation resin rear surface 55. The first inclined surface 52a is longer than the second inclined surface 52b. The second inclined surface 52b extends over the substrate 10 toward the encapsulation resin top surface 56. The third encapsulation resin side surface 53 includes a first inclined surface 53a and a second inclined surface 53b. The first inclined surface 53a is inclined toward the fourth encapsulation resin side surface 54 at positions closer to the encapsulation resin top surface 56. The second inclined surface 53b is inclined toward the fourth encapsulation resin side surface 54 at positions closer the encapsulation resin rear surface 55. The first inclined surface 53a is longer than the second inclined surface 53b. The fourth encapsulation resin side surface 54 includes a first inclined surface 54a and a second inclined surface 54b. The first inclined surface 54a is inclined toward the third encapsulation resin side surface 53 at positions closer to the encapsulation resin top surface 56. The second inclined surface 54b is inclined toward the third encapsulation resin side surface 53 at positions closer to the encapsulation resin rear surface 55.

The length of the first inclined surface 51a and the length of the second inclined surface 51b may be changed in any manner. The length of the first inclined surface 52a and the length of the second inclined surface 52b may be changed in any manner. The length of the first inclined surface 53a and the length of the second inclined surface 53b may be changed in any manner. The length of the first inclined surface 54a and the length of the second inclined surface 54b may be changed in any manner.

Figure 36:
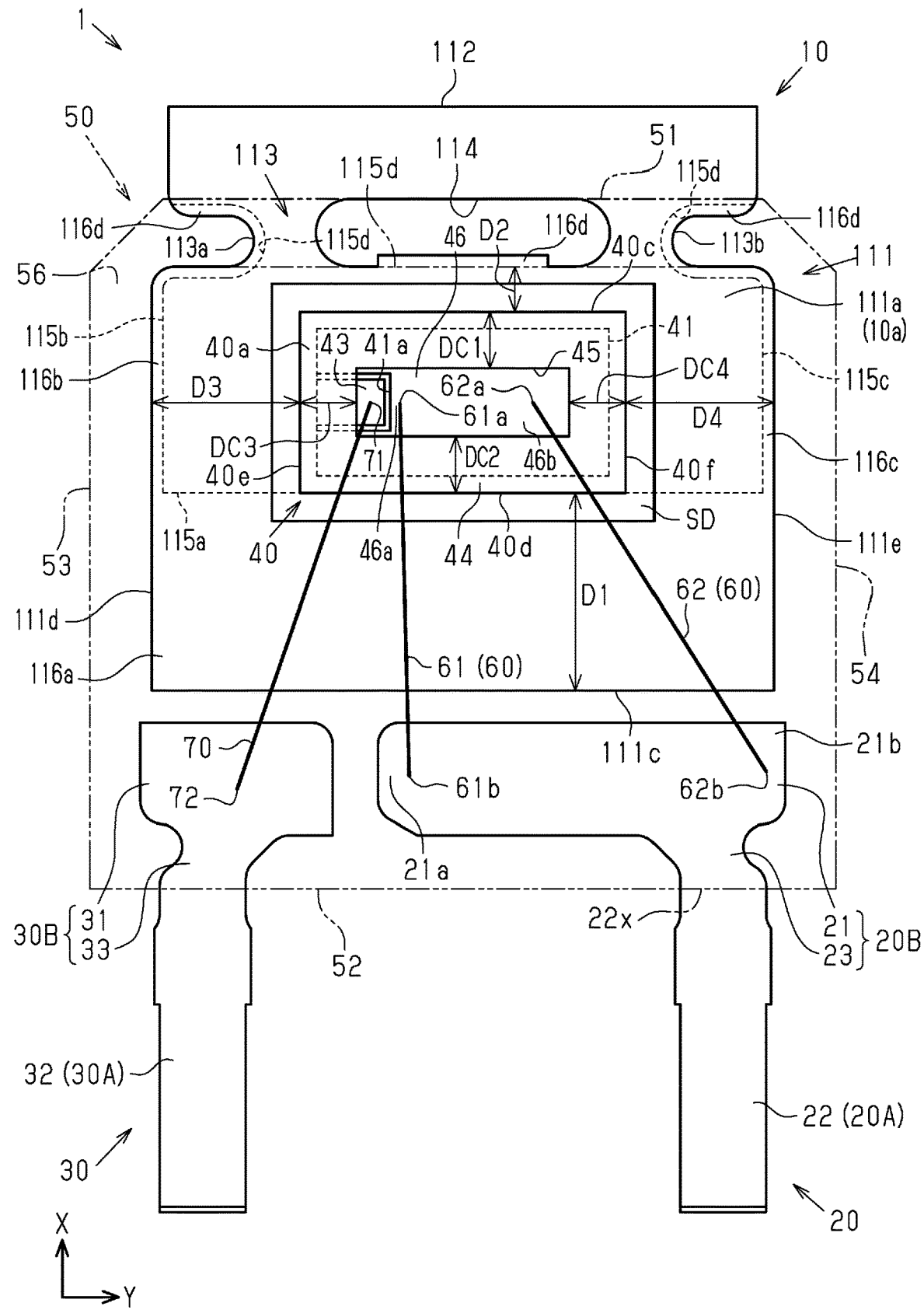
FIG. 36 is a plan view showing the internal structure of the semiconductor device shown in FIG. 35.

FIG. 36 is a diagram of the semiconductor device 1 viewed from the encapsulation resin top surface 56 in the thickness-wise direction Z. In FIG. 36, for the sake of convenience, the encapsulation resin 50 is indicated by a double-dashed line, and components in the encapsulation resin 50 are indicated by solid lines.

As shown in FIG. 36, when the semiconductor device 1 is viewed from the encapsulation resin top surface 56 in the thickness-wise direction Z (hereafter, referred to as "plan view"), the encapsulation resin 50 is rectangular so that a long-side direction conforms to the longitudinal direction X and a short-side direction conforms to the lateral direction Y. The first encapsulation resin side surface 51 and the second encapsulation resin side surface 52 are side surfaces extending in the lateral direction Y, and the third encapsulation resin side surface 53 and the fourth encapsulation resin side surface 54 are side surfaces extending in the longitudinal direction X.

Figure 37:
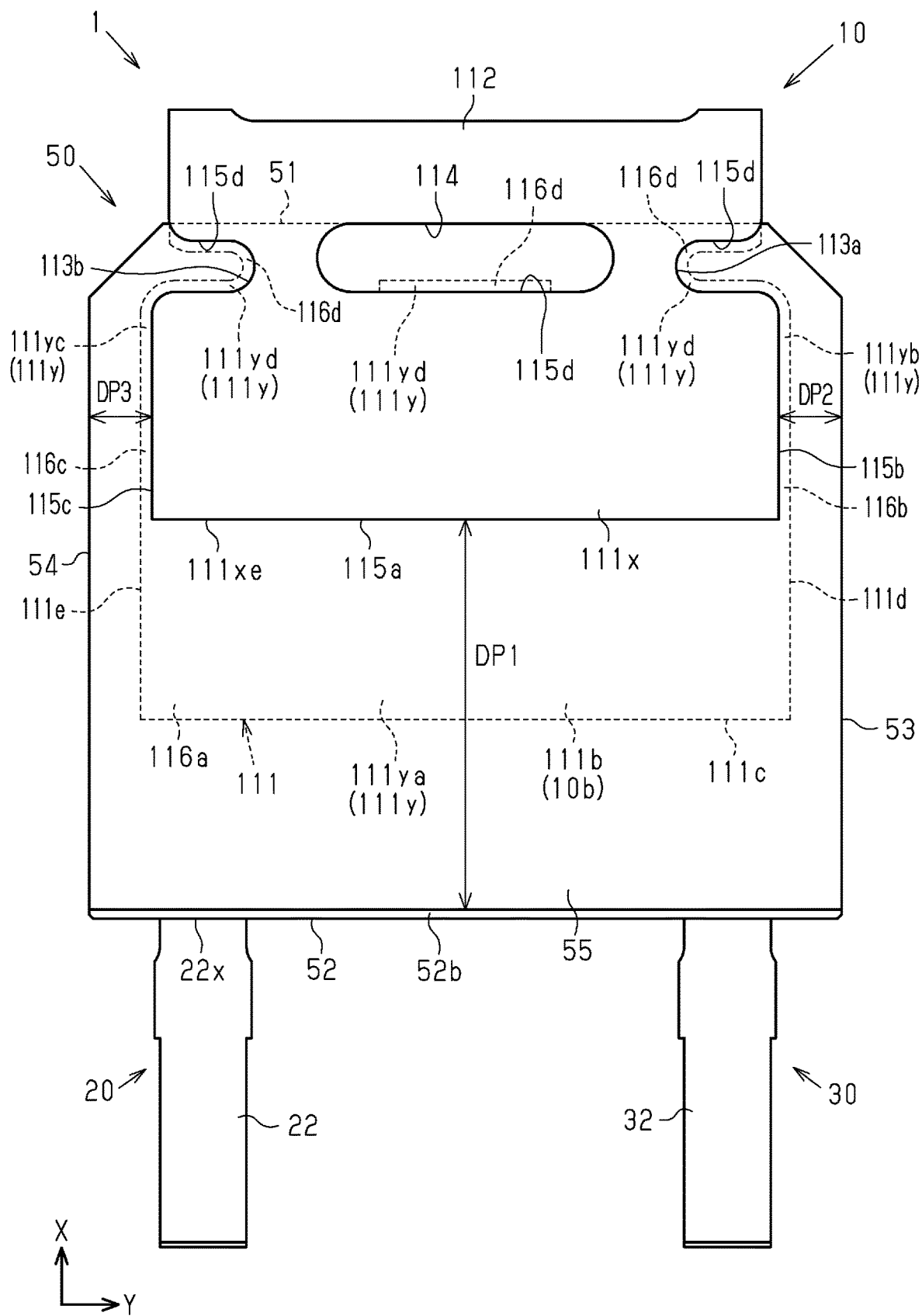
FIG. 37 is a rear view of the semiconductor device shown in FIG. 35.

The substrate 10 includes the main surface 10a and a rear surface 10b that face opposite sides in the thickness-wise direction Z (refer to FIG. 37). The main surface 10a and the encapsulation resin top surface 56 face in the same direction. The rear surface 10b and the encapsulation resin rear surface 55 (refer to FIG. 37) face in the same direction. The substrate 10 is formed of, for example, aluminum (Al) or copper (Cu).

The substrate 10 may be divided into an inner body 111 covered by the encapsulation resin 50 and a projection 112 projecting from the encapsulation resin 50. The inner body 111 and the projection 112 are located next to each other in the longitudinal direction X. The projection 112 projects from the first encapsulation resin side surface 51 in the longitudinal direction X. In the present embodiment, the dimension of the projection 112 in the lateral direction Y is less than the dimension of the inner body 111 in the lateral direction Y. The dimension of the projection 112 in the lateral direction Y may be changed in any manner. In an example, the dimension of the projection 112 in the lateral direction Y may be equal to the dimension of the inner body 111 in the lateral direction Y.

In a plan view, the inner body 111 is arranged so that the center of the inner body 111 in the longitudinal direction X is located closer to the first encapsulation resin side surface 51 than the center of the encapsulation resin 50 in the longitudinal direction X. The inner body 111 includes a main surface 111a, a rear surface 111b (refer to FIG. 37), a first side surface 111c, a second side surface 111d, and a third side surface 111e. The main surface 111a and the rear surface 111b face opposite sides in the thickness-wise direction Z. The main surface 111a is configured to be the main surface 10a of the substrate 10. The rear surface 111b is configured to be the rear surface 10b of the substrate 10. Thus, the main surface 111a faces the encapsulation resin top surface 56, and the rear surface 111b faces the encapsulation resin rear surface 55. The first side surface 111c faces the second encapsulation resin side surface 52. The second side surface 111d faces the third encapsulation resin side surface 53. The third side surface 111e faces the fourth encapsulation resin side surface 54. The first side surface 111c extends in the lateral direction Y. The second side surface 111d and the third side surface 111e are spaced apart and opposed to each other in the lateral direction Y The second side surface 111d and the third side surface 111e extend in the longitudinal direction X.

The inner body 111 includes a narrow portion 113 on an end located toward the projection 112. The narrow portion 113 is defined by a curved recess 113a that is recessed from the second side surface 111d toward the fourth encapsulation resin side surface 54 in the lateral direction Y and a curved recess 113b that is recessed from the third side surface 111e toward the third encapsulation resin side surface 53 in the lateral direction Y. The dimension of the narrow portion 113 in the lateral direction Y is less than the dimension of the portion of the inner body 111 excluding the narrow portion 113 in the lateral direction Y. The dimension of the narrow portion 113 in the lateral direction Y is less than the dimension of the projection 112 in the lateral direction Y. The narrow portion 113 is arranged next to the first encapsulation resin side surface 51 of the encapsulation resin 50 in the longitudinal direction X. The narrow portion 113 includes a through hole 114 extending through the narrow portion 113 in the thickness-wise direction Z. In a plan view, the through hole 114 has the shape of an elongated circle, the longitudinal direction of which conforms to the lateral direction Y.

As shown in FIG. 37, a portion of the rear surface 111b of the inner body 111 is exposed from the encapsulation resin rear surface 55. The rear surface 111b of the inner body 111 includes a surface exposed from the encapsulation resin rear surface 55 defining an exposed surface 111x. The exposed surface 111x is a portion of the rear surface 111b of the inner body 111 located toward the first encapsulation resin side surface 51. The exposed surface 111x has an edge 111xe located toward the second encapsulation resin side surface 52. The edge 111xe is arranged closer to the first encapsulation resin side surface 51 than a central portion of the encapsulation resin 50 in the longitudinal direction X. In the present embodiment, the edge 111xe of the exposed surface 111x extends in the lateral direction Y. The exposed surface 111x is flush with the encapsulation resin rear surface 55. The portion of the rear surface 111b of the inner body 111 excluding the exposed surface 111x defines a non-exposed surface 111y, which is not exposed from the encapsulation resin rear surface 55.

As shown in FIG. 36, in a plan view, the drive lead 20 and the control lead 30 are spaced apart from the substrate 10 in the longitudinal direction X and located closer to the second encapsulation resin side surface 52 of the encapsulation resin 50 than the substrate 10. The drive lead 20 and the control lead 30 are spaced apart from each other in the lateral direction Y.

The drive lead 20 includes a drive pad 21, a drive terminal 22, and a coupling portion 23 that couples the drive pad 21 to the drive terminal 22. The drive pad 21 and the coupling portion 23 are configured to be the inner lead 20B. The drive terminal 22 is configured to be the outer lead 20A. The drive pad 21 and the coupling portion 23 are located between the substrate 10 and the second encapsulation resin side surface 52 in the longitudinal direction X. More specifically, in the longitudinal direction X, the drive pad 21 and the coupling portion 23 are arranged closer to the second encapsulation resin side surface 52 than a central portion of the encapsulation resin 50 in the longitudinal direction X. The drive pad 21 includes a central portion in the lateral direction Y arranged closer to the fourth encapsulation resin side surface 54 than the central portion of the encapsulation resin 50 in the lateral direction Y. The coupling portion 23 is located in the lateral direction Y closer to the fourth encapsulation resin side surface 54 than the central portion of the encapsulation resin 50 in the lateral direction Y.

In a plan view, the drive pad 21 is rectangular so that a long-side direction conforms to the lateral direction Y and a short-side direction conforms to the longitudinal direction X. The dimension of the drive pad 21 in the lateral direction Y is greater than the dimension of the semiconductor element 40 in the lateral direction Y. In the present embodiment, the dimension of the drive pad 21 in the lateral direction Y is greater than one-half of the dimension of the inner body 111 in the lateral direction Y.

The drive pad 21 includes the first end 21a and the second end 21b as the ends in the lateral direction Y. The first end 21a is an end of the drive pad 21 located toward the third encapsulation resin side surface 53. In the present embodiment, the first end 21a is arranged closer to the third encapsulation resin side surface 53 than the central portion of the inner body 111 in the lateral direction Y. The second end 21b is an end of the drive pad 21 located toward the fourth encapsulation resin side surface 54. The second end 21b is located closer to the fourth encapsulation resin side surface 54 than the third side surface 111e of the inner body 111. As shown in FIG. 38, the drive pad 21 is located closer to the encapsulation resin top surface 56 than the main surface 111a of the inner body 111 in the thickness-wise direction Z. Also, the drive pad 21 is located closer to the encapsulation resin top surface 56 than a front surface 40a of the semiconductor element 40 in the thickness-wise direction Z.

As shown in FIG. 36, the coupling portion 23 is continuous from an end of the drive pad 21 located toward the second encapsulation resin side surface 52. The coupling portion 23 is located closer to the fourth encapsulation resin side surface 54 than a central portion of the drive pad 21 in the lateral direction Y. The drive terminal 22 is configured to be a source terminal. As shown in FIG. 38, the drive terminal 22 projects from the first inclined surface 52a of the second encapsulation resin side surface 52. More specifically, the drive terminal 22 includes a terminal base end 22x, which is an end of the drive terminal 22 located toward the second encapsulation resin side surface 52. The terminal base end 22x projects from the first inclined surface 52a. The terminal base end 22x, the drive pad 21, and the coupling portion 23 are arranged at the same position in the thickness-wise direction Z.

As shown in FIG. 36, the control lead 30 includes a control pad 31, a control terminal 32, and a coupling portion 33 that couples the control pad 31 to the control terminal 32. The control pad 31 and the coupling portion 33 are configured to be the inner lead 30B. The control terminal 32 is configured to be the outer lead 30A. The control pad 31 and the coupling portion 33 are located between the substrate 10 and the second encapsulation resin side surface 52 in the longitudinal direction X. The control pad 31 and the coupling portion 33 are located closer to the third encapsulation resin side surface 53 than the center of the encapsulation resin 50 in the lateral direction Y.

In a plan view, the control pad 31 is rectangular so that a long-side direction conforms to the lateral direction Y and a short-side direction conforms to the longitudinal direction X. The dimension of the control pad 31 in the lateral direction Y is less than the dimension of the drive pad 21 in the lateral direction Y. This allows for an increase in the dimension of the drive pad 21 in the lateral direction Y. As shown in FIG. 35, the control pad 31 is located closer to the encapsulation resin top surface 56 than the main surface 111a of the inner body 111 in the thickness-wise direction Z. Also, the control pad 31 is located closer to the encapsulation resin top surface 56 than the front surface 40a of the semiconductor element 40 in the thickness-wise direction Z.

As shown in FIG. 36, the coupling portion 33 is continuous from an end of the control pad 31 located toward the second encapsulation resin side surface 52. The coupling portion 33 is located on the control pad 31 at a position toward the third encapsulation resin side surface 53 in the lateral direction Y. The control terminal 32 is configured to be a gate terminal. As shown in FIG. 35, the control terminal 32 projects from the first inclined surface 52a of the second encapsulation resin side surface 52.

As shown in FIGS. 38 and 39, the semiconductor element 40 is mounted on the main surface 111a of the inner body 111 using the solder SD. As shown in FIG. 36, the semiconductor element 40 may be located on a portion of the inner body 111 located toward the first encapsulation resin side surface 51. More specifically, in a plan view, the first distance D1 between the semiconductor element 40 and the first side surface 111c of the inner body 111 is greater than the second distance D2 between the semiconductor element 40 and the narrow portion 113 of the inner body 111. In an example, the semiconductor element 40 is located on a portion of the inner body 111 adjacent to the narrow portion 113 in the longitudinal direction X. In the present embodiment, the semiconductor element 40 is located on a portion of the inner body 111 adjacent to the narrow portion 113 in the longitudinal direction X.

The semiconductor element 40 is located on a central portion of the inner body 111 in the lateral direction Y. Specifically, the third distance D3 between the semiconductor element 40 and the second side surface 111d of the inner body 111 is equal to the fourth distance D4 between the semiconductor element 40 and the third side surface 111e of the inner body 111. When a difference between the third distance D3 and the fourth distance D4 is, for example, within 5% of the third distance D3, it is considered that the third distance D3 is equal to the fourth distance D4. In the present embodiment, the first distance D1 is greater than the third distance D3 and the fourth distance D4. The second distance D2 is less than the third distance D3 and the fourth distance D4.

The semiconductor element 40 contains silicon carbide (SiC). In the present embodiment, a SiC metal-oxide-semiconductor field-effect transistor (MOSFET) is used as the semiconductor element 40. The semiconductor element 40 (SiC MOSFT) is an element capable of high-speed switching in response to a drive signal having a frequency between 1 kHz and a few hundred kHz, inclusive. Preferably, the semiconductor element 40 is an element capable of high-speed switching in response to a drive signal having a frequency between 1 kHz and 100 kHz, inclusive. In the present embodiment, the semiconductor element 40 performs high-speed switching in response to a drive signal having a frequency of 100 kHz.

The semiconductor element 40 is flat. Specifically, in a plan view, the semiconductor element 40 is rectangular so that a long-side direction conforms to the lateral direction Y and a short-side direction conforms to the longitudinal direction X. In the present embodiment, the dimension of the semiconductor element 40 in the lateral direction Y is 3 mm. The dimension of the semiconductor element 40 in the lateral direction Y includes an error of 5% of 3 mm (±0.15 mm).

As shown in FIGS. 36, 38, and 39, the semiconductor element 40 includes the front surface 40a, a rear surface 40b, a first side surface 40c, a second side surface 40d, a third side surface 40e, and a fourth side surface 40f. The front surface 40a and the rear surface 40b face opposite sides in the thickness-wise direction Z. The front surface 40a faces the encapsulation resin top surface 56. That is, the front surface 40a and the main surface 10a of the substrate 10 face in the same direction. The rear surface 40b faces the encapsulation resin rear surface 55. The rear surface 40b is opposed to the main surface 111a of the inner body 111. The first side surface 40c faces the first encapsulation resin side surface 51. The second side surface 40d faces the second encapsulation resin side surface 52. The third side surface 40e faces the third encapsulation resin side surface 53. The fourth side surface 40f faces the fourth encapsulation resin side surface 54.

The front surface 40a includes a main surface drive electrode 41 and a control electrode 43. The rear surface 40b includes the rear surface drive electrode 42. In the present embodiment, the main surface drive electrode 41 is configured to be a source electrode, and the rear surface drive electrode 42 is configured to be a drain electrode. The control electrode 43 is configured to be a gate electrode. The rear surface drive electrode 42 is electrically connected to the inner body 111 by the solder SD.

The main surface drive electrode 41 is formed on a large portion of the front surface 40a. In a plan view, the main surface drive electrode 41 is rectangular so that a short-side direction conforms to the longitudinal direction X and a long-side direction conforms to the lateral direction Y. The main surface drive electrode 41 includes a recess 41a that is open toward the third encapsulation resin side surface 53. The recess 41a is formed in an end of the main surface drive electrode 41 located toward the third encapsulation resin side surface 53 at a center in the longitudinal direction X. The control electrode 43 is formed in the recess 41a.

The semiconductor element 40 includes a passivation film 44 that is an insulation film formed on the main surface drive electrode 41 and the control electrode 43. The passivation film 44 includes an opening 45 that exposes a portion of the main surface drive electrode 41 and a portion of the control electrode 43.

In a plan view, the opening 45 is rectangular so that a long-side direction conforms to the lateral direction Y and a short-side direction conforms to the longitudinal direction X. The dimension of the opening 45 in the lateral direction Y is less than the dimension of the drive pad 21 in the lateral direction Y. In other words, the dimension of the drive pad 21 in the lateral direction Y is greater than the dimension of the opening 45 in the lateral direction Y.

The opening 45 is arranged in a central portion of the front surface 40a of the semiconductor element 40 in the longitudinal direction X. Specifically, a first distance DC1 between the opening 45 and the first side surface 40c of the semiconductor element 40, a second distance DC2 between the opening 45 and the second side surface 40d of the semiconductor element 40, a third distance DC3 between the opening 45 and the third side surface 40e of the semiconductor element 40, and a fourth distance DC4 between the opening 45 and the fourth side surface 40f of the semiconductor element 40 are equal to each other. When the largest one of differences between the first distance DC1, the second distance DC2, the third distance DC3, and the fourth distance DC4 is, for example, within 5% of the first distance DC1, it is considered that the first distance DC1, the second distance DC2, the third distance DC3, and the fourth distance DC4 are equal to each other.

The main surface drive electrode 41 includes an exposed region 46 exposed by the opening 45. The exposed region 46 includes a first exposed end 46a and a second exposed end 46b that are opposite ends in the lateral direction Y. The first exposed end 46a is an end of the exposed region 46 located toward the third side surface 40e of the semiconductor element 40. The second exposed end 46b is an end of the exposed region 46 located toward the fourth side surface 40f of the semiconductor element 40.

The semiconductor device 1 includes drive wires 60 and a control wire 70. In the present embodiment, the drive wires 60 include two drive wires, namely, a first drive wire 61 and a second drive wire 62. More specifically, the first drive wire 61 and the second drive wire 62 are configured to be a combination of the furthermost ones of the drive wires 60. The first drive wire 61 is located closer to the control wire 70 than the second drive wire 62.

The first drive wire 61 and the second drive wire 62 are formed of the same metal. In the present embodiment, the first drive wire 61 and the second drive wire 62 contain aluminum. The first drive wire 61 and the second drive wire 62 have the same diameter. When a difference between the diameter of the first drive wire 61 and the diameter of the second drive wire 62 is, for example, within 5% of the diameter of the first drive wire 61, it is considered that the first drive wire 61 and the second drive wire 62 have the same diameter. In the present embodiment, the first drive wire 61, the second drive wire 62, and the control wire 70 have the same diameter. When a difference between the diameter of each of the first drive wire 61 and the second drive wire 62 and the diameter of the control wire 70 is, for example, within 5% of the diameter of the control wire 70, it is considered that the first drive wire 61, the second drive wire 62, and the control wire 70 have the same diameter. In an example, the diameter of each of the first drive wire 61, the second drive wire 62, and the control wire 70 is 125 µm to 250 µm. In the present embodiment, the diameter of each of the first drive wire 61, the second drive wire 62, and the control wire 70 is 125 µm.

Each of the first drive wire 61 and the second drive wire 62 connects the main surface drive electrode 41 of the semiconductor element 40 and the drive pad 21. Each of the first drive wire 61 and the second drive wire 62 is connected to the main surface drive electrode 41 and the drive pad 21 by, for example, wire bonding. In a plan view, the first drive wire 61 and the second drive wire 62 are spaced apart from each other in the lateral direction Y. The first drive wire 61 and the second drive wire 62 are ones of the drive wires 60 located at opposite ends in the lateral direction Y.

In a plan view, the first drive wire 61 and the second drive wire 62 are connected to the main surface drive electrode 41 and the drive pad 21 so that the first drive wire 61 and the second drive wire 62 are separated by a greater distance at the drive pad 21 than at the main surface drive electrode 41. In a plan view, the distance between the first drive wire 61 and the second drive wire 62 increases from the main surface drive electrode 41 toward the drive pad 21. The configurations of the first drive wire 61 and the second drive wire 62 will be specifically described below.

Figure 40:
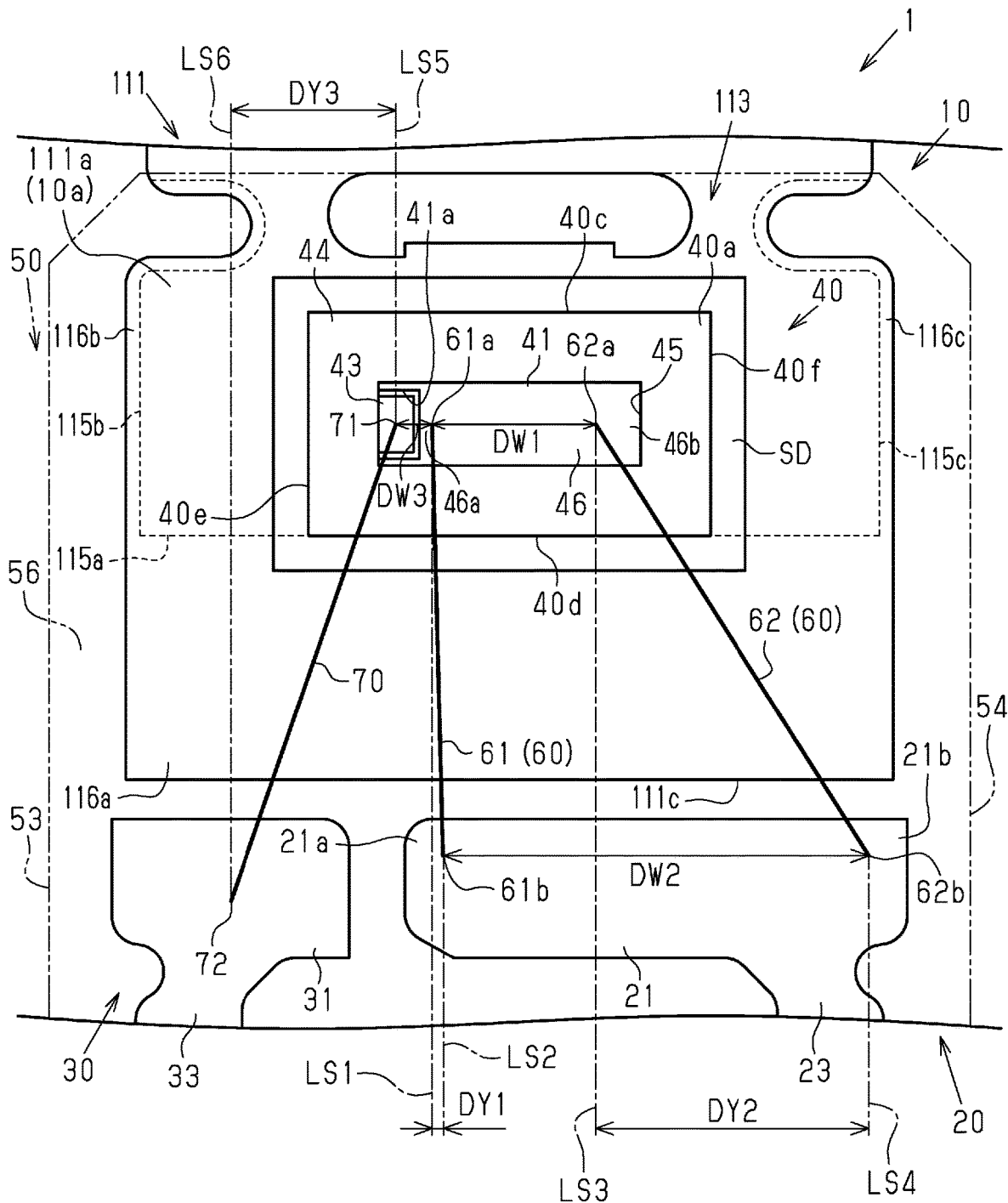
FIG. 40 is an enlarged view showing the semiconductor element shown in FIG. 36 and its surroundings.

As shown in FIG. 40, the first drive wire 61 includes a drive electrode end 61a and a drive pad end 61b. The second drive wire 62 includes a drive electrode end 62a and a drive pad end 62b. In a plan view, a distance DW2 between the drive pad end 61b and the drive pad end 62b is greater than a distance DW1 between the drive electrode end 61a and the drive electrode end 62a. In a plan view, the distance DW1 is the minimum distance between the first drive wire 61 and the second drive wire 62, and the distance DW2 is the maximum distance between the first drive wire 61 and the second drive wire 62.

An auxiliary line LS1 extends from the drive electrode end 61a in the longitudinal direction X. An auxiliary line LS2 extends from the drive pad end 61b in the longitudinal direction X. The distance between the auxiliary line LS1 and the auxiliary line LS2 in the lateral direction Y is referred to as a distance DY1. An auxiliary line LS3 extends from the drive electrode end 62a in the longitudinal direction X. An auxiliary line LS4 extends from the drive pad end 62b in the longitudinal direction X. The distance between the auxiliary line LS3 and the auxiliary line LS4 in the lateral direction Y is referred to as a distance DY2. In this case, the distance DY2 is greater than the distance DY1.

The drive electrode end 61a of the first drive wire 61 is connected to the main surface drive electrode 41 at a position closer to the first exposed end 46a than a central portion of the exposed region 46 in the lateral direction Y. In the present embodiment, the drive electrode end 61a is connected to the first exposed end 46a. Specifically, the drive electrode end 61a is connected to a portion of the main surface drive electrode 41 located next to the control electrode 43 in the lateral direction Y, that is, a portion of the main surface drive electrode 41 defining the bottom of the recess 41a.

The drive pad end 61b of the first drive wire 61 is connected to the drive pad 21 at a position closer to the first end 21a than a central portion of the drive pad 21 in the lateral direction Y. In the present embodiment, the drive pad end 61b is connected to the first end 21a of the drive pad 21. In an example, the drive pad end 61b is arranged at the limit position toward the third encapsulation resin side surface 53 in a region of the first end 21a of the drive pad 21 where wire bonding is performable. Specifically, the position of the drive pad end 61b in relation to the first end 21a in the lateral direction Y is set so that a capillary of a wire bonding device that supplies the first drive wire 61 is located at an edge of the first end 21a of the drive pad 21 located toward the third encapsulation resin side surface 53. In the longitudinal direction X, the drive pad end 61b is arranged on a portion of the drive pad 21 located closer to the semiconductor element 40 than a central portion of the drive pad 21 in the longitudinal direction X. The drive pad end 61b is located closer to the fourth encapsulation resin side surface 54 than the drive electrode end 61a.

The drive electrode end 62a of the second drive wire 62 is connected to the main surface drive electrode 41 at a position closer to the second exposed end 46b than the central portion of the exposed region 46 in the lateral direction Y. In the present embodiment, the drive electrode end 62a is connected to the second exposed end 46b. In an example, the drive electrode end 62a is arranged at the limit position toward the fourth side surface 40f in a region where wire bonding is performable in an end of the opening 45 located toward the fourth side surface 40f of the semiconductor element 40 in the lateral direction Y Specifically, the position of the drive electrode end 62a in relation to the second exposed end 46b of the exposed region 46 in the lateral direction Y is set so that a capillary of the wire bonding device that supplies the second drive wire 62 is located at an edge of the exposed region 46 located toward the fourth side surface 40f. The drive electrode end 62a and the drive electrode end 61a of the first drive wire 61 are located at the same position in the longitudinal direction X and arranged in the lateral direction Y. The state in which the drive electrode end 62a and the drive electrode end 61a are located at the same position includes a state in which the drive electrode ends 61a and 62a overlap with each other in the longitudinal direction X and a state in which the drive electrode ends 61a and 62a partially overlap due to a manufacturing error caused by wire bonding. In other words, when a difference between the drive electrode ends 61a and 62a in the longitudinal direction X is an extent of a variation caused when performing wire bonding, it is considered that the drive electrode ends 61a and 62a are located at the same position in the longitudinal direction X.

The drive pad end 62b of the second drive wire 62 is connected to the drive pad 21 at a position closer to the second end 21b than the central portion of the drive pad 21 in the lateral direction Y. In the present embodiment, the drive pad end 62b is connected to the second end 21b of the drive pad 21. In an example, the drive pad end 62b is arranged at the limit position toward the fourth encapsulation resin side surface 54 in a region of the second end 21b of the drive pad 21 where wire bonding is performable. Specifically, the position of the drive pad end 62b in relation to the second end 21b in the lateral direction Y is set so that a capillary of the wire bonding device that supplies the second drive wire 62 is located at an edge of the second end 21b of the drive pad 21 located toward the fourth encapsulation resin side surface 54. In the longitudinal direction X, the drive pad end 62b is arranged on a portion of the drive pad 21 located closer to the semiconductor element 40 than the central portion of the drive pad 21 in the longitudinal direction X. The drive pad end 62b is located closer to the fourth encapsulation resin side surface 54 than the drive electrode end 62a. The drive pad end 62b is located closer to the fourth encapsulation resin side surface 54 than the semiconductor element 40 in the lateral direction Y. In the present embodiment, the drive pad end 62b and the drive pad end 61b are located at the same position in the longitudinal direction X and arranged in the lateral direction Y. The state in which the drive pad end 62b and the drive pad end 61b are located at the same position in the longitudinal direction X includes a state in which the drive pad ends 61b and 62b overlap with each other in the longitudinal direction X and a state in which the drive pad ends 61b and 62b partially overlap due to a manufacturing error caused by wire bonding. In other words, a difference between the drive pad ends 61b and 62b in the longitudinal direction X is an extent of a variation caused when performing wire bonding, it is considered that the drive pad ends 61b and 62b are located at the same position in the longitudinal direction X.

The control wire 70 connects the control electrode 43 of the semiconductor element 40 to the control pad 31. The control wire 70 is connected to the control electrode 43 and the control pad 31 by, for example, wire bonding. The same material is used in the control wire 70 and the drive wires 60. The control wire 70 includes a control electrode end 71 and a control pad end 72. The control electrode end 71 is an end of the control wire 70 connected to the control electrode 43. The control pad end 72 is an end of the control wire 70 connected to the control pad 31. In the control electrode end 71, a distance DW3 between the control electrode end 71 of the control wire 70 and the drive electrode end 61a of the first drive wire 61 is less than the distance DW1. An auxiliary line LS5 extends from the control electrode end 71 in the longitudinal direction X. An auxiliary line LS6 extends from the control pad end 72 in the longitudinal direction X. A distance DY3 between the auxiliary line LS5 and the auxiliary line LS6 is greater than the distance DY1 and less than the distance DY2. The distance DY3 may be changed in any manner. In an example, the distance DY3 is less than or equal to the distance DY1.

The extension structure of the creepage distance between a drain terminal (the rear surface 10b of the substrate 10) and a source terminal (the drive terminal 22) of the semiconductor device 1 will now be described.

As shown in FIGS. 36 and 38, the rear surface 10b of the substrate 10 (the rear surface 111b of the inner body 111) includes an indent 115a in a portion located toward the second encapsulation resin side surface 52. The indent 115a is formed by recessing from the rear surface 111b toward the main surface 111a of the inner body 111 in a stepped manner. The indent 115a extends in the longitudinal direction X from the first side surface 111c of the inner body 111 to a position closer to the second encapsulation resin side surface 52 than the central portion of the inner body 111 in the longitudinal direction X. In the present embodiment, the indent 115a is formed so that an edge of the indent 115a located toward the first encapsulation resin side surface 51 and the second side surface 40d of the semiconductor element 40 are located at the same position in the longitudinal direction X. In other words, the semiconductor element 40 is mounted on the main surface 111a of the inner body 111 so that the edge of the indent 115a located toward the first encapsulation resin side surface 51 and the second side surface 40d of the semiconductor element 40 are located at the same position in the longitudinal direction X. In the present embodiment, the edge of the indent 115a located toward the first encapsulation resin side surface 51 conforms to the edge 111xe of the exposed surface 111x. In the present embodiment, the indent 115a extends in the entire portion of the rear surface 111b of the inner body 111 located toward the second encapsulation resin side surface 52 in the lateral direction Y.

The indent 115a has a depth H1 that is less than or equal to one-half of the thickness of the substrate 10 (thickness T of the inner body 111). In the present embodiment, the depth H1 is equal to one-third of the thickness T of the inner body 111. When a difference between the depth H1 and one-third of the thickness T is, for example, within 5% of the depth H1, it is considered that the depth H1 is equal to one-third of the thickness T. In the present embodiment, the depth H1 is 0.9 mm. The encapsulation resin 50 is partially located in the indent 115a.

As shown in FIG. 39, an indent 115b is arranged in a portion of the rear surface 111b of the inner body 111 located closer to the first encapsulation resin side surface 51 than the indent 115a at an end located toward the third encapsulation resin side surface 53. In the portion of the rear surface 111b of the inner body 111 located closer to the first encapsulation resin side surface 51 than the indent 115a, an indent 115c is arranged at an end located toward the fourth encapsulation resin side surface 54. Each of the indents 115b and 115c is formed by recessing from the rear surface 111b toward the main surface 111a of the inner body 111 in a stepped manner. As shown in FIG. 36, the indent 115b extends in the lateral direction Y from the second side surface 111d of the inner body 111 to a position closer to the third encapsulation resin side surface 53 than one-half of the third distance D3. The indent 115c extends in the lateral direction Y from the third side surface 111e of the inner body 111 to a position closer to the fourth encapsulation resin side surface 54 than one-half of the fourth distance D4. As described above, the third distance D3 is a distance between the semiconductor element 40 and the second side surface 111d of the inner body 111, and the fourth distance D4 is a distance between the semiconductor element 40 and the third side surface 111e of the inner body 111. The indent 115b is continuous with an end of the indent 115a located toward the second side surface 111d in the lateral direction Y The indent 115c is continuous with an end of the indent 115a located toward the third side surface 111e in the lateral direction Y.

The indent 115b has a depth H2 that is equal to a depth H3 of the indent 115c. When a difference between the depth H2 and the depth H3 is, for example, within 5% of the depth H2, it is considered that the depth H2 is equal to the depth H3. The depths H2 and H3 are less than or equal to one-half of the thickness T of the inner body 111. In the present embodiment, the depths H2 and H3 are one-third of the thickness T. That is, the depths H2 and H3 are equal to the depth H1. In the present embodiment, each of the depths H2 and H3 is 0.9 mm. The encapsulation resin 50 is partially received in the indents 115b and 115c.

As shown in FIGS. 36 and 38, the recesses 113a and 113b of the inner body 111 and a portion of the through hole 114 include indents 115d. The indents 115d of the recesses 113a and 113b are formed along the recesses 113a and 113b. The indent 115d of the through hole 114 is formed in an inner wall surface of the through hole 114 at the second encapsulation resin side surface 52 and a central portion in the lateral direction Y. The indents 115d have a depth H4 that is equal to the depths H2 and H3 of the indents 115b and 115c. When a difference between the depth H4 and the depth H2 and a difference between the depth H4 and the depth H3 are, for example, within 5% of the depth H4, it is considered that the depth H4 is equal to the depths H2 and H3. The encapsulation resin 50 is partially received in each indent 115d.

The indents 115a, 115b, 115c, and 115d are formed by stamping (punching) the substrate 10. Thus, the indents 115a, 115b, 115c, and 115d are simultaneously formed in one step.

As shown in FIG. 36, the inner body 111 includes a portion between the indent 115a and the main surface 111a in the thickness-wise direction Z defining a first thin portion 116a, a portion between the indent 115b and the main surface 111a in the thickness-wise direction Z defining a second thin portion 116b, a portion between the indent 115c and the main surface 111a in the thickness-wise direction Z defining a third thin portion 116c, and a portion between the indent 115d and the main surface 111a in the thickness-wise direction Z defining a fourth thin portion 116d. As shown in FIGS. 38 and 39, since the depths H1, H2, H3, and H4 of the indents 115a, 115b, 115c, and 115d are equal to each other, the thickness T1 of the first thin portion 116a, the thickness T2 of the second thin portion 116b, the thickness T3 of the third thin portion 116c, and the thickness T4 of the fourth thin portion 116d are equal to each other. When the largest difference of the thicknesses T1, T2, T3, and T4 is, for example, within 5% of the thickness T1, it is considered that the thicknesses T1, T2, T3, and T4 are equal to each other.

The first thin portion 116a has a dimension L1 in the longitudinal direction X that is greater than a dimension L2 of the second thin portion 116b in the lateral direction Y and a dimension L3 of the third thin portion 116c in the lateral direction Y. The dimension L1 is greater than a dimension L4 of the fourth thin portion 116d. The dimension L1 is greater than or equal to twice the dimensions L2, L3, and L4. Preferably, the dimension L1 is greater than or equal to three times the dimensions L2, L3, and L4. In the present embodiment, the dimension L1 is approximately ten times the dimensions L2, L3, and L4. In the present embodiment, the dimensions L2, L3, and L4 are equal to each other. When the largest difference of the dimensions L2, L3, and L4 is, for example, within 5% of the dimension L2, it is considered that the dimensions L2, L3, and L4 are equal to each other.

As shown in FIGS. 38 and 39, the non-exposed surface 111y of the rear surface 111b of the inner body 111 includes a first non-exposed surface 111ya that faces the same side as the exposed surface 111x in the first thin portion 116a, a second non-exposed surface 111yb that faces the same side as the exposed surface 111x in the second thin portion 116b, a third non-exposed surface 111yc that faces the same side as the exposed surface 111x in the third thin portion 116c, and a fourth non-exposed surface 111yd that faces the same side as the exposed surface 111x in the fourth thin portion 116d.

As shown in FIG. 37, a distance DP1 refers to the shortest distance from the second encapsulation resin side surface 52 to the rear surface 10b of the substrate 10 (the exposed surface 111x of the inner body 111) in the longitudinal direction X. A distance DP2 refers to the shortest distance from the third encapsulation resin side surface 53 to the rear surface 10b of the substrate 10 (the exposed surface 111x of the inner body 111) in the lateral direction Y. A distance DP3 refers to the shortest distance from the fourth encapsulation resin side surface 54 to the rear surface 10b of the substrate 10 (the exposed surface 111x of the inner body 111) in the lateral direction Y. In this case, the distance DP1 is greater than the distance DP2 and the distance DP3. Preferably, the distance DP1 is greater than or equal to twice the distance DP2 and the distance DP3. More preferably, the distance DP1 is greater than or equal to three times the distance DP2 and the distance DP3. More preferably, the distance DP1 is greater than or equal to four times the distance DP2 and the distance DP3. Further preferably, the distance DP1 is greater than or equal to five times the distance DP2 and the distance DP3. In the present embodiment, the distance DP1 is approximately six times the distance DP2 and the distance DP3.

As shown in FIG. 38, the terminal base end 22x of the drive terminal 22, which is in contact with the second encapsulation resin side surface 52, and the drive pad 21 and the coupling portion 23 of the drive lead 20 are arranged at the same position in the thickness-wise direction Z. That is, the terminal base end 22x is located closer to the encapsulation resin top surface 56 than the main surface 10a of the substrate 10 in the thickness-wise direction Z. Also, the terminal base end 22x is located closer to the encapsulation resin top surface 56 than the front surface 40a of the semiconductor element 40 in the thickness-wise direction Z.

In the present embodiment, in the thickness-wise direction Z, the terminal base end 22x is located closer to the encapsulation resin top surface 56 than the central portion of the encapsulation resin 50 in the thickness-wise direction Z.

A creepage distance DP between the drain terminal (the rear surface 10b of the substrate 10) and the source terminal (the drive terminal 22) of the semiconductor device 1 is specified by the sum of the distance DP1 and a distance DP4 from the drive terminal 22 to the encapsulation resin rear surface 55 along the second encapsulation resin side surface 52. The distance DP4 is the sum of a distance DPA, which extends along the second inclined surface 52b from the terminal base end 22x to the edge of the second inclined surface 52b located toward the first inclined surface 52a, and a distance DPB, which extends along the first inclined surface 52a from the edge of the first inclined surface 52a located toward the second inclined surface 52b to the edge of the encapsulation resin rear surface 55 located toward the second inclined surface 52b, (DP4=DPA+DPB).

In the present embodiment, the drive terminal 22 is located closer to the encapsulation resin top surface 56 than the front surface 40a of the semiconductor element 40. Thus, the distance DP4 is longer than that obtained in a configuration in which the drive terminal 22 and the substrate 10 are located at the same position in the thickness-wise direction Z. Also, the first thin portion 116a is longer than the second thin portion 116b and the third thin portion 116c. Thus, the distance DP1 is longer than that obtained in a configuration in which the first thin portion 116a is shorter than or equal to the second thin portion 116b and the third thin portion 116c.

The operation of the present embodiment will now be described.

Figure 41:
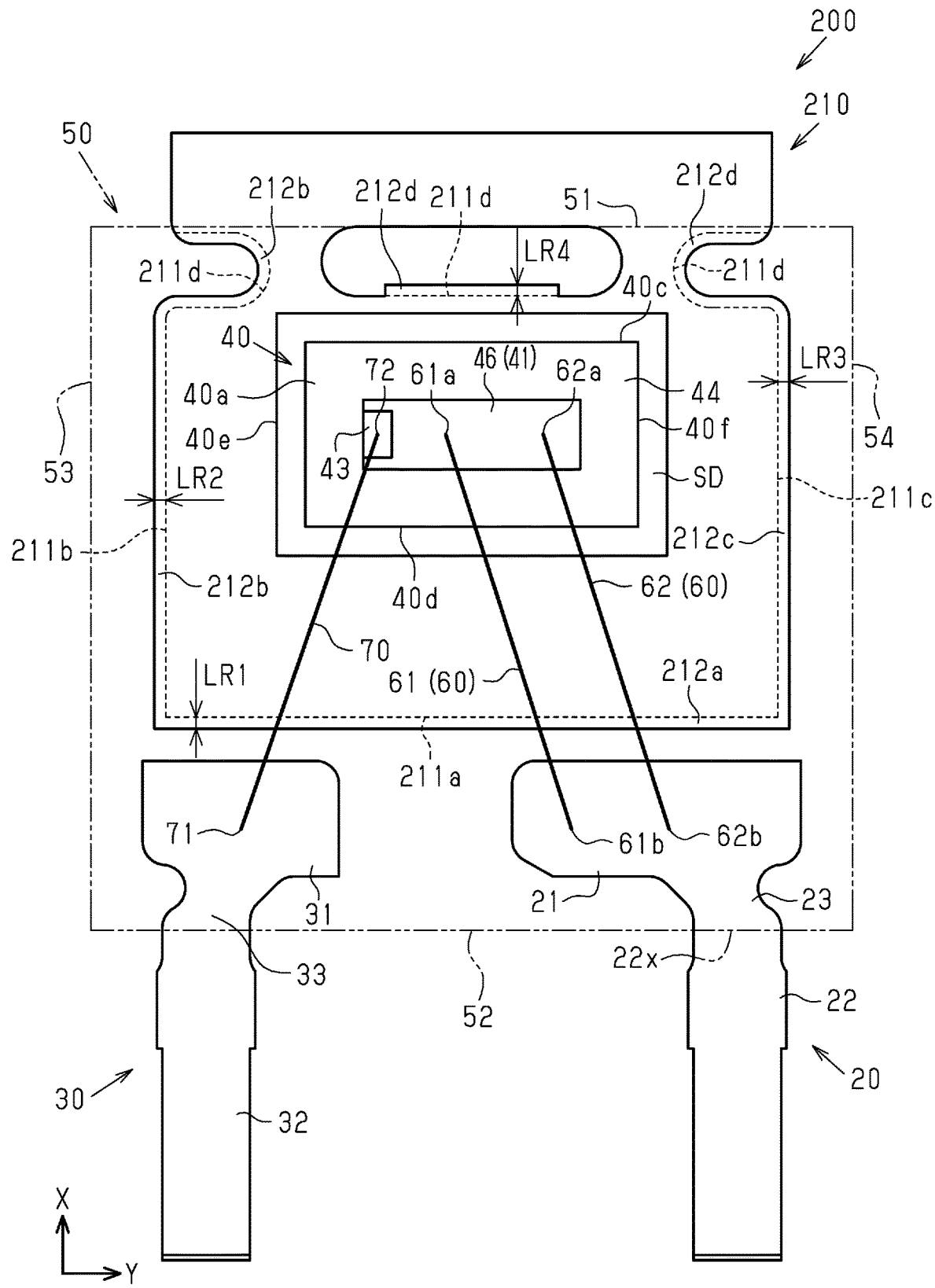
FIG. 41 is a plan view showing a comparative example of a semiconductor device.
Figure 42:
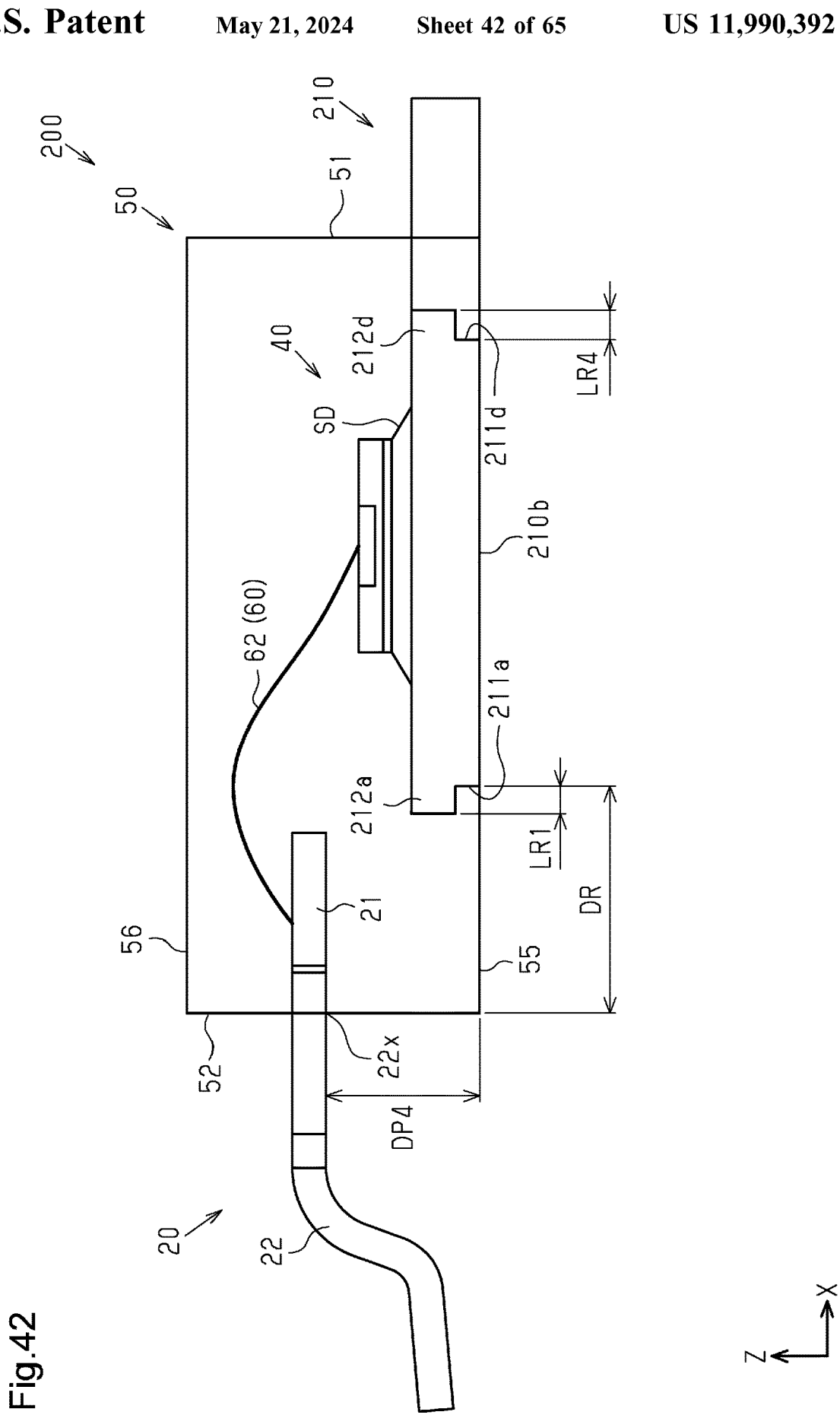
FIG. 42 is a schematic cross-sectional view of FIG. 41.

FIGS. 41 and 42 show configurations of a comparative example of a semiconductor device 200. The semiconductor device 200 of the comparative example differs from the semiconductor device 1 of the present embodiment mainly in the shape of a substrate 210. In the semiconductor device 200 of the comparative example, the same reference characters are given to those components except the substrate 210 that correspond to the components of the semiconductor device 1 of the present embodiment regardless of shapes that may slightly differ from the components of the semiconductor device 1. Such components will not be described in detail.

The substrate 210 includes indents 211a, 211b, 211c, and 211d in the same manner as the substrate 10 of the present embodiment. More specifically, the substrate 210 includes a first thin portion 212a formed by the indent 211a, a second thin portion 212b formed by the indent 211b, a third thin portion 212c formed by the indent 211c, and a fourth thin portion 212d formed by the indent 211d. A dimension LR1 of the first thin portion 212a, a dimension LR2 of the second thin portion 212b, a dimension LR3 of the third thin portion 212c, and a dimension LR4 of the fourth thin portion 212d are equal to each other, which differs from the substrate 10 of the present embodiment.

The semiconductor device 200 of the comparative example has a distance DR in the longitudinal direction X from the second encapsulation resin side surface 52 to a rear surface 210b of the substrate 210 that is less than the distance DP1 (refer to FIG. 37). That is, the creepage distance DP of the semiconductor device 1 of the present embodiment is longer than a creepage distance DPR of the semiconductor device 200 of the comparative example. As a result, the semiconductor device 1 of the present embodiment obtains a higher voltage resistance than the semiconductor device 200 of the comparative example. The voltage resistance refers to a voltage at which the drive terminal and the rear surface of the substrate short-circuit. The creepage distance DPR is specified by the sum of the distance DP4 and the distance DR.

The semiconductor device 1 of the present embodiment has the following advantages.

(1-1) The rear surface 111b of the inner body 111 is exposed from the encapsulation resin rear surface 55. The indent 115a is formed in the rear surface 111b of the inner body 111 at a portion located toward the second encapsulation resin side surface 52. The encapsulation resin 50 is partially received in the indent 115a. Thus, the distance DP1, that is, the shortest distance from the second encapsulation resin side surface 52 of the encapsulation resin 50 to the rear surface 111b of the inner body 111, is greater than the distance DP2, that is, the shortest distance from the third encapsulation resin side surface 53 to the rear surface 111b of the inner body 111, and the distance DP3, that is, the shortest distance from the fourth encapsulation resin side surface 54 to the rear surface 111b of the inner body 111. This increases the creepage distance DP between the portion of the encapsulation resin 50 from which the drive terminal 22 projects to the rear surface 10b of the substrate 10. As a result, the dielectric strength of the semiconductor device 1 is improved.

To obtain the distance DP1 that is greater than the distance DP2 and the distance DP3, the dimension of the inner body 111 from the first side surface 111c to the first encapsulation resin side surface 51 in the longitudinal direction X may be decreased. However, such a configuration reduces the volume of the inner body 111 and lowers the performance of the substrate 10 that dissipates heat from the semiconductor element 40.

In this regard, in the present embodiment, the indent 115a is formed in the rear surface 111b of the inner body 111 at a portion toward the second encapsulation resin side surface 52 to form the first thin portion 116a. This limits the reduction in the volume of the inner body 111 and the lowering of the performance of the substrate 10 that dissipates heat from the semiconductor element 40.

(1-2) The edge (the edge 111xe) of the rear surface 111b of the inner body 111 (the exposed surface 111x) exposed from the encapsulation resin rear surface 55 of the encapsulation resin 50 and located toward the second encapsulation resin side surface 52 is arranged in the longitudinal direction X closer to the first encapsulation resin side surface 51 than the center of the encapsulation resin 50 in the longitudinal direction X. This configuration increases the distance DP1, thereby improving the dielectric strength of the semiconductor device 1.

(1-3) The semiconductor element 40 is arranged on a portion of the main surface 10a of the substrate 10 located closer to the first encapsulation resin side surface 51 than the indent 115a. In this configuration, the portion of the substrate 10 located directly below the semiconductor element 40 is not thinned by the indent 115a and effectively dissipates heat from the semiconductor element 40.

(1-4) The first side surface 40c of the semiconductor element 40 is located on the main surface 10a of the substrate 10 at a position closer to the first encapsulation resin side surface 51 than the center of the encapsulation resin 50 in the longitudinal direction X. In this configuration, the indent 115a is formed at a position further toward the first encapsulation resin side surface 51 in the longitudinal direction X. Thus, the edge (the edge 111xe) of the rear surface 111b of the inner body 111 (the exposed surface 111x) exposed from the encapsulation resin rear surface 55 of the encapsulation resin 50 and located toward the second encapsulation resin side surface 52 may be formed at a position further toward the first encapsulation resin side surface 51. This increases the distance DP1, thereby improving the dielectric strength of the semiconductor device 1.

(1-5) The indent 115a has a depth H1 that is less than or equal to one-half of the thickness of the substrate 10 (thickness T of the inner body 111). This configuration limits the reduction in the volume of the inner body 111 and the lowering of the performance of the substrate 10 that dissipates heat from the semiconductor element 40.

(1-6) The depth H1 of the indent 115a is less than or equal to one-third of the thickness of the substrate 10 (thickness T of the inner body 111). This configuration further limits the reduction in the volume of the inner body 111 and the lowering of the performance of the substrate 10 that dissipates heat from the semiconductor element 40.

(1-7) The substrate 10 includes the first thin portion 116a formed by the indent 115a, the second thin portion 116b formed by the indent 115b, and the third thin portion 116c formed by the indent 115c. In this configuration, the indents 115a, 115b, 115c partially receive the encapsulation resin 50, thereby limiting separation of the substrate 10 from the encapsulation resin 50.

(1-8) The terminal base end 22x of the drive terminal 22, which is in contact with the second encapsulation resin side surface 52, is located closer to the encapsulation resin top surface 56 than the main surface 10a of the substrate 10 in the thickness-wise direction Z. This configuration increases the distance DP4 from the terminal base end 22x to the encapsulation resin rear surface 55, thereby improving the dielectric strength of the semiconductor device 1.

(1-9) The terminal base end 22x of the drive terminal 22, which is in contact with the second encapsulation resin side surface 52, is located closer to the encapsulation resin top surface 56 than the front surface 40a of the semiconductor element 40 in the thickness-wise direction Z. This configuration further increases the distance DP4 from the terminal base end 22x to the encapsulation resin rear surface 55, thereby further improving the dielectric strength of the semiconductor device 1.

(1-10) The terminal base end 22x of the drive terminal 22, which is in contact with the second encapsulation resin side surface 52, is located in the thickness-wise direction Z closer to the encapsulation resin top surface 56 than the center of the encapsulation resin 50 in the thickness-wise direction Z. This configuration increases the distance DP4 from the terminal base end 22x to the encapsulation resin rear surface 55, thereby improving the dielectric strength of the semiconductor device 1.

(1-11) In a semiconductor device including a semiconductor element containing SiC, even an inductance on the order of a nanohenry (nH) greatly affects the property of the semiconductor device. There is a need for a configuration that reduces the inductance of the semiconductor device.

In the semiconductor device, an inductance contained between a source electrode and a source terminal decreases as the width of a conductor connecting the source electrode and the source terminal increases in a plan view. When the conductor includes drive wires, the width of the conductor in a plan view is specified by the distance between two drive wires configured to be a combination of the furthermost ones of the drive wires.

The two drive wires configured to be a combination of the furthermost ones of the drive wires indicate that when two drive wires 60 are used as in the present embodiment, the two drive wires 61 and 62 are configured to be a combination of the furthermost ones of the drive wires 60.

In the present embodiment, in a plan view, the first drive wire 61 and the second drive wire 62 are connected to the main surface drive electrode 41 and the drive pad 21 so that the fourth drive wire 64 and the second drive wire 62 are separated by a greater distance at the drive pad 21 than at the main surface drive electrode 41. Specifically, the distance DW2 between the drive pad end 61b and the drive pad end 62b is greater than the distance DW1 between the drive electrode end 61a and the drive electrode end 62a. This configuration increases the width of the conductor in a plan view as compared to a configuration in which the first drive wire 61 is parallel to the second drive wire 62 in a plan view. As a result, the distance between the first drive wire 61 and the second drive wire 62 is increased, thereby decreasing the inductance between the main surface drive electrode 41 and the drive pad 21. The present embodiment obtains a result such that the inductance is decreased by 5 to 7 (nH) as compared to a configuration in which the first drive wire 61 and the second drive wire 62 are separated by the distance DW1 and parallel to each other in a plan view. The distance DW1 is the distance between the drive electrode end 61a of the first drive wire 61 and the drive electrode end 62a of the second drive wire 62.

(1-12) The dimension of the drive pad 21 in the lateral direction Y is greater than the dimension of the opening 45 in the lateral direction Y. This configuration allows for an increase in the distance DW2 between the drive pad end 61b of the first drive wire 61 and the drive pad end 62b of the second drive wire 62. As a result, the inductance between the main surface drive electrode 41 and the drive pad 21 is reduced.

(1-13) The drive pad end 61b of the first drive wire 61 is connected to the first end 21a of the drive pad 21. The drive pad end 62b of the second drive wire 62 is connected to the second end 21b of the drive pad 21. This configuration increases the distance DW2 between the drive pad end 61b and the drive pad end 62b. As a result, the distance between the first drive wire 61 and the second drive wire 62 is increased, thereby decreasing the inductance between the main surface drive electrode 41 and the drive pad 21.

(1-14) The drive electrode end 61a of the first drive wire 61 is connected to the first exposed end 46a of the exposed region 46 of the main surface drive electrode 41. The drive electrode end 62a of the second drive wire 62 is connected to the second exposed end 46b of the exposed region 46. This configuration increases the distance DW1 between the drive electrode end 61a and the drive electrode end 62a. As a result, the distance between the first drive wire 61 and the second drive wire 62 is increased, thereby decreasing the inductance between the main surface drive electrode 41 and the drive pad 21.

(1-15) Each of the drive pad end 61b of the first drive wire 61 and the drive pad end 62b of the second drive wire 62 is connected to a portion of the drive pad 21 located closer to the semiconductor element 40 than the central portion of the drive pad 21 in the longitudinal direction X. This configuration shortens the first drive wire 61 and the second drive wire 62, thereby further decreasing the inductance between the main surface drive electrode 41 (source electrode) and the drive terminal 22 of the drive lead 20 (source terminal).

(1-16) The same material is used in the first drive wire 61 and the second drive wire 62. The first drive wire 61 and the second drive wire 62 have the same diameter. In this configuration, the same wire may be used when performing a task for connecting the drive wires 61 and 62 to the main surface drive electrode 41 and the drive pad 21. This simplifies the process of the task.

(1-17) The same material is used in the drive wires 60 and the control wire 70. The drive wires 60 and the control wire 70 have the same diameter. In this configuration, the same wire may be used when performing tasks for connecting the drive wires 60 to the main surface drive electrode 41 and the drive pad 21 and a task for connecting the control wire 70 to the control electrode 43 and the control pad 31. This simplifies the process of the tasks.

(1-18) The drive lead 20 and the substrate 10 are formed, for example, by stamping the same metal plate. This configuration simplifies the stamping steps of the drive lead 20 and the substrate 10 as compared to a configuration in which the drive lead 20 and the substrate 10 are formed by separate metal plates.

(1-19) The drive lead 20, the control lead 30, and the substrate 10 are formed, for example, by stamping the same metal plate. This configuration simplifies the stamping steps of the drive lead 20, the control lead 30, and the substrate 10 as compared to a configuration in which the drive lead 20, the control lead 30, and the substrate 10 are formed by separate metal plates.

Modified Examples of Fifth Embodiment

The semiconductor device 1 of the fifth embodiment may be modified, for example, as follows. The modified example described below may be combined with one another as long as there is no technical inconsistency. In the following modified examples, the same reference characters are given to those elements that are the same as the corresponding elements of the fifth embodiment. Such elements will not be described in detail.

Figure 43:
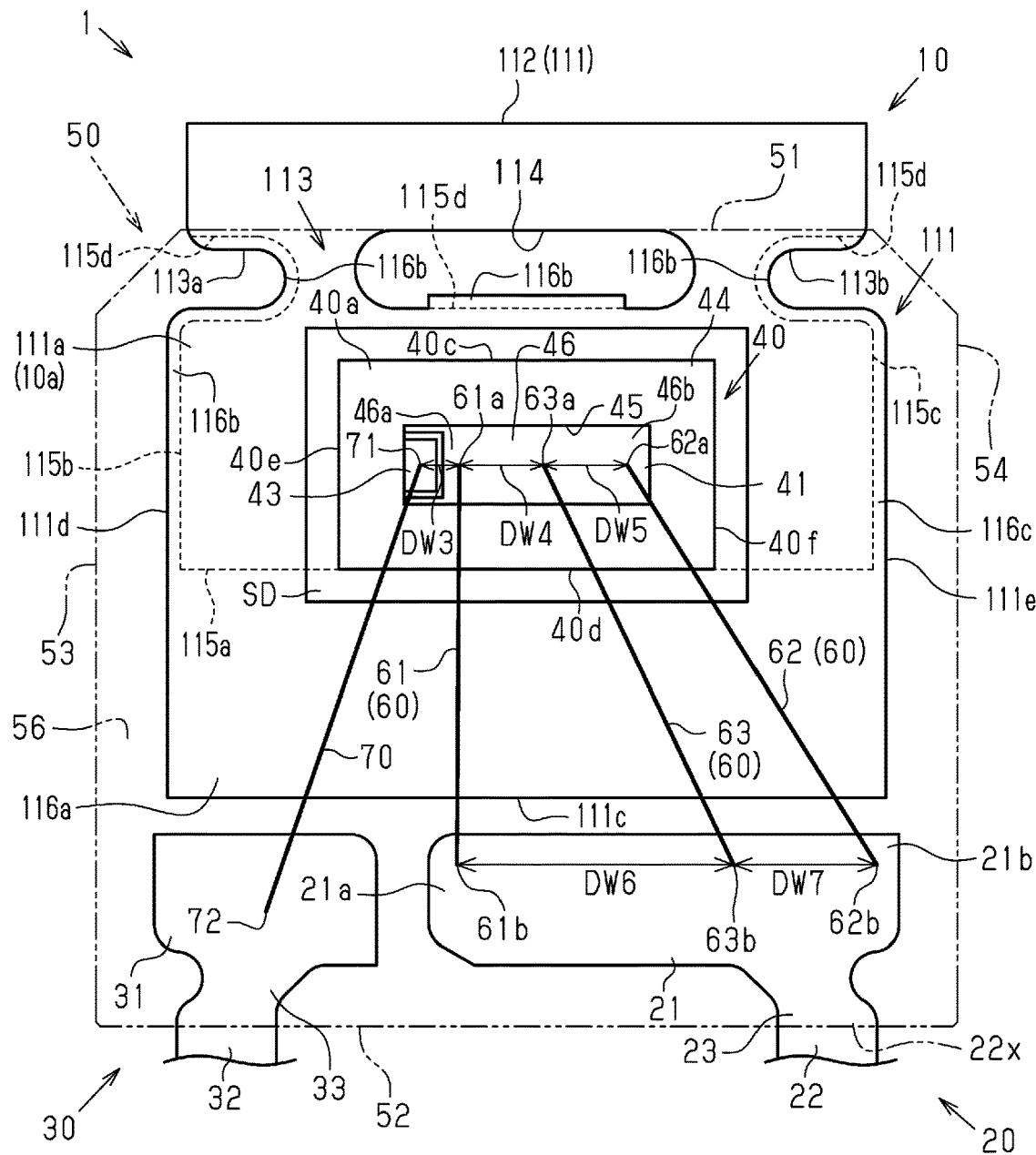
FIG. 43 is an enlarged view showing a semiconductor element and its surroundings in a modified example of the semiconductor device of the fifth embodiment.

The number of drive wires 60 is not limited to two and may be changed in any manner. In an example, as shown in FIG. 43, the drive wires 60 may include three drive wires, namely, the first drive wire 61, the second drive wire 62, and the third drive wire 63. The third drive wire 63 is arranged between the first drive wire 61 and the second drive wire 62. In this case, the first drive wire 61 and the second drive wire 62 are configured to be a combination of the furthermost ones of the drive wires 60.

More specifically, when three or more drive wires are used, the combination of the furthermost ones correspond to two drive wires that are located at the furthermost positions. For example, when three or more drive wires are arranged in the lateral direction Y, the combination of the furthermost ones is a combination of drive wires located at opposite ends in the lateral direction Y.

The third drive wire 63 includes a drive electrode end 63a and a drive pad end 63b. The drive electrode end 63a is an end of the third drive wire 63 connected to the main surface drive electrode 41. The drive pad end 63b is an end of the third drive wire 63 connected to the drive pad 21. A distance DW4 between the drive electrode end 63a and the drive electrode end 61a of the first drive wire 61 is equal to a distance DW5 between the drive electrode end 63a and the drive electrode end 62a of the second drive wire 62. When a difference between the distance DW4 and the distance DW5 is, for example, within 5% of the distance DW4, it is considered that the distance DW4 is equal to the distance DW5. In FIG. 43, the distances DW4 and DW5 are greater than the distance DW3 between the drive electrode end 61a of the first drive wire 61 and the control electrode end 71 of the control wire 70.

In FIG. 43, the drive electrode end 61a of the first drive wire 61, the drive electrode end 62a of the second drive wire 62, and the drive electrode end 63a of the third drive wire 63 are located at the same position in the longitudinal direction X and arranged in the lateral direction Y. The state in which the drive electrode ends 61a, 62a, and 63a are located at the same position in the longitudinal direction X includes a state in which the drive electrode ends 61a, 62a, and 63a overlap with each other in the longitudinal direction X and a state in which the drive electrode ends 61a, 62a, and 63a partially overlap due to a manufacturing error caused by wire bonding. In other words, when a difference between the drive electrode ends 61a, 62a, and 63a in the longitudinal direction X is an extent of a variation caused when performing wire bonding, it is considered that the drive electrode ends 61a, 62a, and 63a are located at the same position in the longitudinal direction X.

In the longitudinal direction X, the drive pad end 63b of the third drive wire 63 is arranged on a portion of the drive pad 21 located closer to the semiconductor element 40 than the central portion of the drive pad 21 in the longitudinal direction X. A distance DW6 between the drive pad end 61b of the first drive wire 61 and the drive pad end 63b is greater than the distance DW4. A distance DW7 between the drive pad end 62b of the second drive wire 62 and the drive pad end 63b is greater than the distance DW5. In FIG. 43, the distance DW6 is greater than the distance DW7.

The first drive wire 61 and the third drive wire 63 are connected to the main surface drive electrode 41 and the drive pad 21 so that the first drive wire 61 and the third drive wire 63 are separated by a greater distance at the drive pad 21 than at the main surface drive electrode 41. In a plan view, the distance between the first drive wire 61 and the third drive wire 63 gradually increases from the main surface drive electrode 41 toward the drive pad 21. The third drive wire 63 and the second drive wire 62 are connected to the main surface drive electrode 41 and the drive pad 21 so that the third drive wire 63 and the second drive wire 62 are separated by a greater distance at the drive pad 21 than at the main surface drive electrode 41. In a plan view, the distance between the third drive wire 63 and the second drive wire 62 gradually increases from the main surface drive electrode 41 toward the drive pad 21. The position of the drive pad end 63b in relation to the drive pad 21 may be changed in any manner. In an example, the drive pad end 63b may be connected to the drive pad 21 so that the distance DW6 is less than or equal to the distance DW7.

Figure 44:
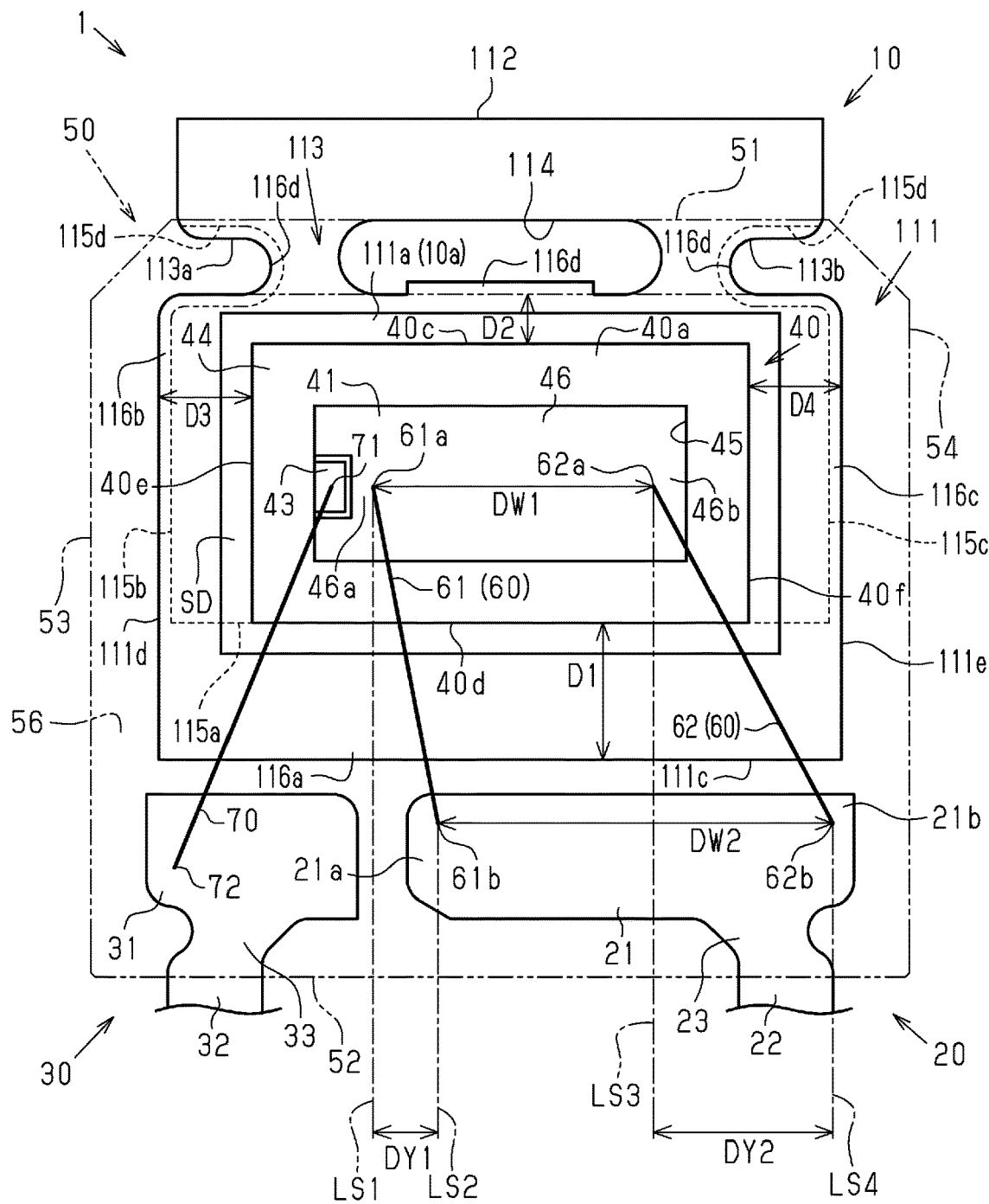
FIG. 44 is an enlarged view showing a semiconductor element and its surroundings in a modified example of the semiconductor device of the fifth embodiment.

The size of the semiconductor element 40 may be changed in any manner. In an example, as shown in FIG. 44, the semiconductor element 40 may have a greater size than the semiconductor element 40 of the first embodiment. In FIG. 44, the semiconductor element 40 is greater in size in the longitudinal direction X and the lateral direction Y than the semiconductor element 40 of the fifth embodiment. In accordance with the increase in size of the semiconductor element 40, the main surface drive electrode 41 and the opening 45 formed on the front surface 40a may be increased in size in the longitudinal direction X and the lateral direction Y In FIG. 44, the dimension of the opening 45 in the lateral direction Y is greater than in the dimension of the drive pad 21 in the lateral direction Y.

The semiconductor element 40 may be arranged on a portion of the inner body 111 located toward the first encapsulation resin side surface 51. More specifically, in a plan view, the first distance D1 between the semiconductor element 40 and the first side surface 111c of the inner body 111 is greater than the second distance D2 between the semiconductor element 40 and the narrow portion 113 of the inner body 111. In an example, the semiconductor element 40 is located on a portion of the inner body 111 adjacent to the narrow portion 113 in the longitudinal direction X. In the present embodiment, the semiconductor element 40 is located on a portion of the inner body 111 adjacent to the narrow portion 113 in the longitudinal direction X.

The semiconductor element 40 is located on a central portion of the inner body 111 in the lateral direction Y. Specifically, the third distance D3 between the semiconductor element 40 and the second side surface 111d of the inner body 111 is equal to the fourth distance D4 between the semiconductor element 40 and the third side surface 111e of the inner body 111. When a difference between the third distance D3 and the fourth distance D4 is, for example, within 5% of the third distance D3, it is considered that the third distance D3 is equal to the fourth distance D4. In the present embodiment, the first distance D1 is greater than the third distance D3 and the fourth distance D4. The second distance D2 is less than the third distance D3 and the fourth distance D4.

As in the fifth embodiment, the semiconductor device 1 includes the first drive wire 61 and the second drive wire 62 as the drive wires 60. In the same manner as the drive electrode end 61a of the fifth embodiment, the drive electrode end 61a of the first drive wire 61 is connected to the first exposed end 46a of the exposed region 46 of the main surface drive electrode 41. In the same manner as the drive pad end 61b of the fifth embodiment, the drive pad end 61b of the first drive wire 61 is connected to the first end 21a of the drive pad 21. In the same manner as the drive electrode end 62a of the fifth embodiment, the drive electrode end 62a of the second drive wire 62 is connected to the second exposed end 46b of the exposed region 46 of the main surface drive electrode 41. In the same manner as the drive pad end 62b of the fifth embodiment, the drive pad end 62b of the second drive wire 62 is connected to the second end 21b of the drive pad 21. Also, as in the fifth embodiment, the drive electrode end 61a and the drive electrode end 62a are located at the same position in the longitudinal direction X and arranged in the lateral direction Y. In the longitudinal direction X, each of the drive pad end 61b and the drive pad end 62b is connected to a portion of the drive pad 21 located closer to the semiconductor element 40 than the central portion of the drive pad 21 in the longitudinal direction X.

In a plan view, a distance DW2 between the drive pad end 61b and the drive pad end 62b is greater than a distance DW1 between the drive electrode end 61a and the drive electrode end 62a. In FIG. 44, the distance DY1 in the lateral direction Y between the auxiliary line LS1 extending from the drive electrode end 61a in the longitudinal direction X and the auxiliary line LS2 extending from the drive pad end 61b in the longitudinal direction X is less than the distance DY2 in the lateral direction Y between the auxiliary line LS3 extending from the drive electrode end 62a in the longitudinal direction X and the auxiliary line LS4 extending from the drive pad end 62b in the longitudinal direction X. In a plan view, the first drive wire 61 and the second drive wire 62 are connected to the main surface drive electrode 41 and the drive pad 21 so that the first drive wire 61 and the third drive wire 63 are separated by a greater distance at the drive pad 21 than at the main surface drive electrode 41. In a plan view, the distance between the first drive wire 61 and the second drive wire 62 gradually increases from the main surface drive electrode 41 toward the drive pad 21.

This configuration increases the distance between the first drive wire 61 and the second drive wire 62, thereby decreasing the inductance between the main surface drive electrode 41 (source electrode) and the drive terminal 22 of the drive lead 20 (source terminal).

The relationship between the distance DW1 and the distance DW2 may be changed in any manner. In an example, the distance DW1 may be equal to the distance DW2. In this case, in a plan view, the first drive wire 61 is parallel to the second drive wire 62. The distance DW1 may be greater than the distance DW2. In this case, the first drive wire 61 and the third drive wire 63 are connected to the main surface drive electrode 41 and the drive pad 21 so that the first drive wire 61 and the third drive wire 63 are located closer to each other at the drive pad 21 than at the main surface drive electrode 41. In a plan view, the distance between the first drive wire 61 and the third drive wire 63 gradually decreases from the main surface drive electrode 41 toward the drive pad 21.

Figure 45:
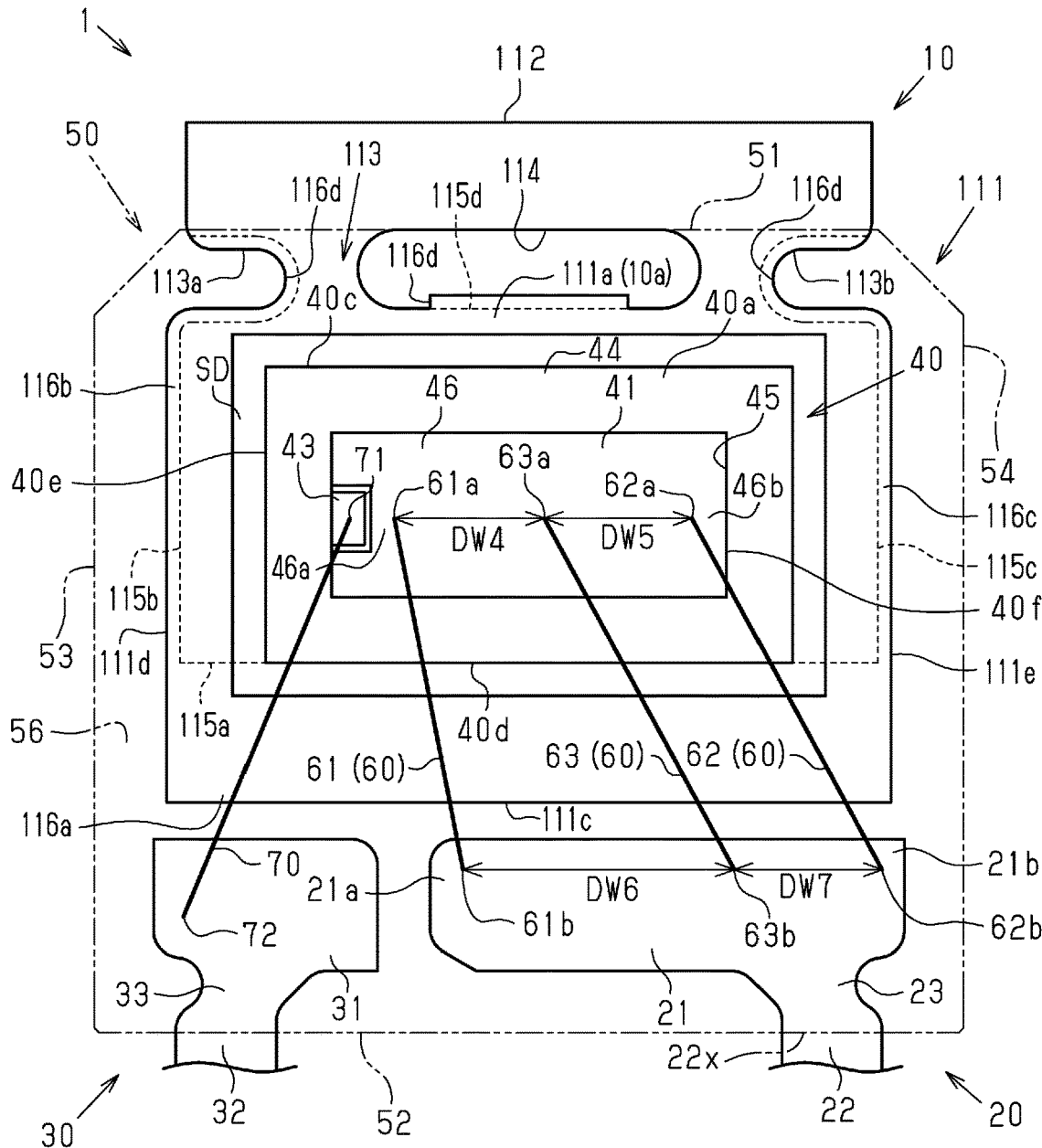
FIG. 45 is an enlarged view showing a semiconductor element and its surroundings in a modified example of the semiconductor device of the fifth embodiment.

In the modified example shown in FIG. 44, the number of drive wires 60 is not limited to two and may be changed in any manner. In an example, as shown in FIG. 45, the drive wires 60 may include three drive wires, namely, the first drive wire 61, the second drive wire 62, and the third drive wire 63. The third drive wire 63 is arranged between the first drive wire 61 and the second drive wire 62. In this case, the first drive wire 61 and the second drive wire 62 are configured to be the combination of the furthermost ones of the drive wires 60. The third drive wire 63 includes a drive electrode end 63a and a drive pad end 63b. A distance DW4 between the drive electrode end 63a and the drive electrode end 61a of the first drive wire 61 is equal to a distance DW5 between the drive electrode end 63a and the drive electrode end 62a of the second drive wire 62. When a difference between the distance DW4 and the distance DW5 is, for example, within 5% of the distance DW4, it is considered that the distance DW4 is equal to the distance DW5.

As in the semiconductor device 1 shown in FIG. 43, in FIG. 45, the drive electrode end 61a of the first drive wire 61, the drive electrode end 62a of the second drive wire 62, and the drive electrode end 63a of the third drive wire 63 are located at the same position in the longitudinal direction X and arranged.

In the longitudinal direction X, the drive pad end 63b of the third drive wire 63 is arranged on a portion of the drive pad 21 located closer to the semiconductor element 40 than the central portion of the drive pad 21 in the longitudinal direction X. A distance DW6 between the drive pad end 61b of the first drive wire 61 and the drive pad end 63b is greater than the distance DW4. The distance DW7 between the drive pad end 62b of the second drive wire 62 and the drive pad end 63b is equal to the distance DW5. When a difference between the distance DW7 and the distance DW5 is, for example, within 5% of the distance DW7, it is considered that the distance DW7 is equal to the distance DW5.

In a plan view, the first drive wire 61 and the third drive wire 63 are connected to the main surface drive electrode 41 and the drive pad 21 so that the first drive wire 61 and the third drive wire 63 are separated by a greater distance at the drive pad 21 than at the main surface drive electrode 41. In a plan view, the distance between the first drive wire 61 and the third drive wire 63 gradually increases from the main surface drive electrode 41 toward the drive pad 21. The third drive wire 63 is parallel to the second drive wire 62.

The indents 115a, 115b, 115c, and 115d and the depths H1, H2, H3, and H4 may be changed in any manner. In an example, at least one of the depths H1, H2, H3, and H4 of the indents 115a, 115b, 115c, and 115d may be greater than or equal to one-third of the thickness T of the substrate 10 and less than the thickness T. This configuration allows a portion of the encapsulation resin 50 to be readily received in the at least one of the indents 115a, 115b, 115c, and 115d. As a result, the formation of the encapsulation resin 50 is improved, thereby improving the throughput yield of the semiconductor device 1. In an example, at least one of the depths H1, H2, H3, and H4 of the indents 115a, 115b, 115c, and 115d may be greater than or equal to one-third of the thickness T of the substrate 10 and less than or equal to one-half of the thickness T. This configuration improves both the throughput yield of the semiconductor device 1 and the heat dissipation performance of the inner body 111.

The depth H1 of the indent 115a may differ from the depths H2, H3, and H4 of the indents 115b and 115c, and 115d. In an example, the depth H1 is less than the depths H2, H3, and H4. In this configuration, the thickness T1 of the first thin portion 116a is greater than each of the thickness T2 of the second thin portion 116b, the thickness T3 of the third thin portion 116c, and the thickness T4 of the fourth thin portion 116d. Thus, the volume of the inner body 111 is increased as compared to a configuration in which the thicknesses T1, T2, T3, and T4 are equal to each other. As a result, the heat dissipation performance of the inner body 111 is improved. In an example, the depth H1 is greater than the depths H2, H3, and H4. This configuration allows a portion of the encapsulation resin 50 to be readily received in the indent 115a. As a result, the formation of the encapsulation resin 50 is improved, thereby improving the throughput yield of the semiconductor device 1.

At least one of the indents 115b and 115c may be omitted. At least one of the indent 115d formed in the recess 113a, the indent 115d formed in the recess 113b, and the indent 115d formed in the through hole 114 may be omitted.

At least one of the substrate 10, the drive pad 21, and the control pad 31 may be formed by a separate metal plate. For example, the substrate 10 and the drive pad 21 may be formed from the same metal plate, and the control pad 31 may be formed from a separate metal plate.

Sixth Embodiment

A sixth embodiment of a semiconductor device 1 will now be described with reference to FIGS. 46 to 58. The semiconductor device 1 of the present embodiment differs from the semiconductor device 1 of the fifth embodiment in that the substrate 10, the drive lead 20, the control lead 30, and the encapsulation resin 50 have different shapes and that a sense lead 80 is added. In the present embodiment, for the sake of convenience, the same reference characters are given to those elements that are the same as the corresponding elements of the fifth embodiment. Such elements may not be described in detail.

Figure 46:
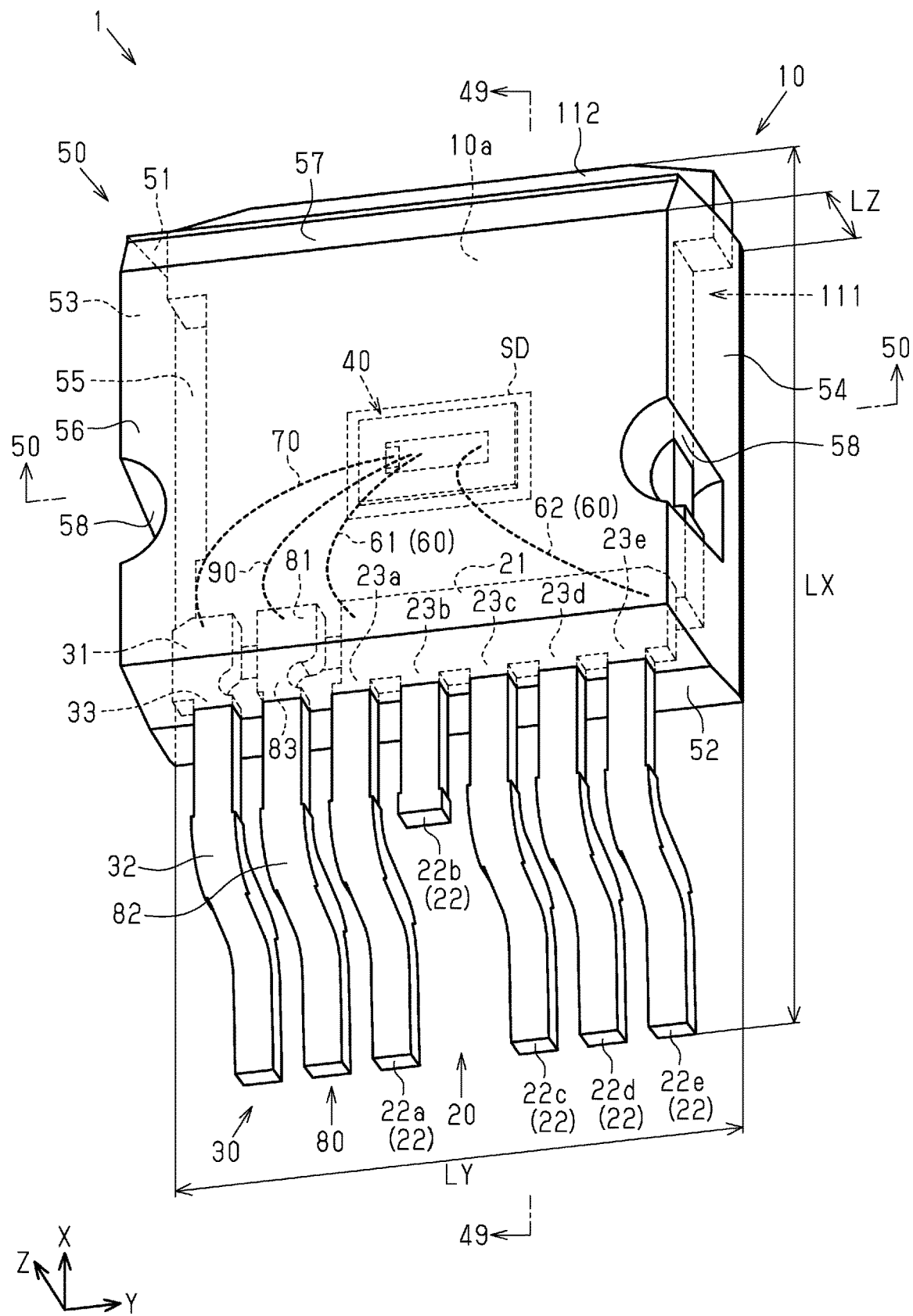
FIG. 46 is a perspective view showing a fifth embodiment of a semiconductor device.

As shown in FIG. 46, the semiconductor device 1 of the present embodiment is a package having a package outline standard (JEITA standard) of TO-263. More specifically, the semiconductor device 1 has a longitudinal dimension LX that is 14.7 mm to 15.5 mm, a lateral dimension LY that is 10.06 mm to 10.26 mm, and a thickness-wise dimension LZ that is 4.40 mm to 4.70 mm. The semiconductor device 1 is an SIP type. Thus, the semiconductor device 1 of the present embodiment is greater in size than the semiconductor device 1 of the fifth embodiment.

Figure 49:
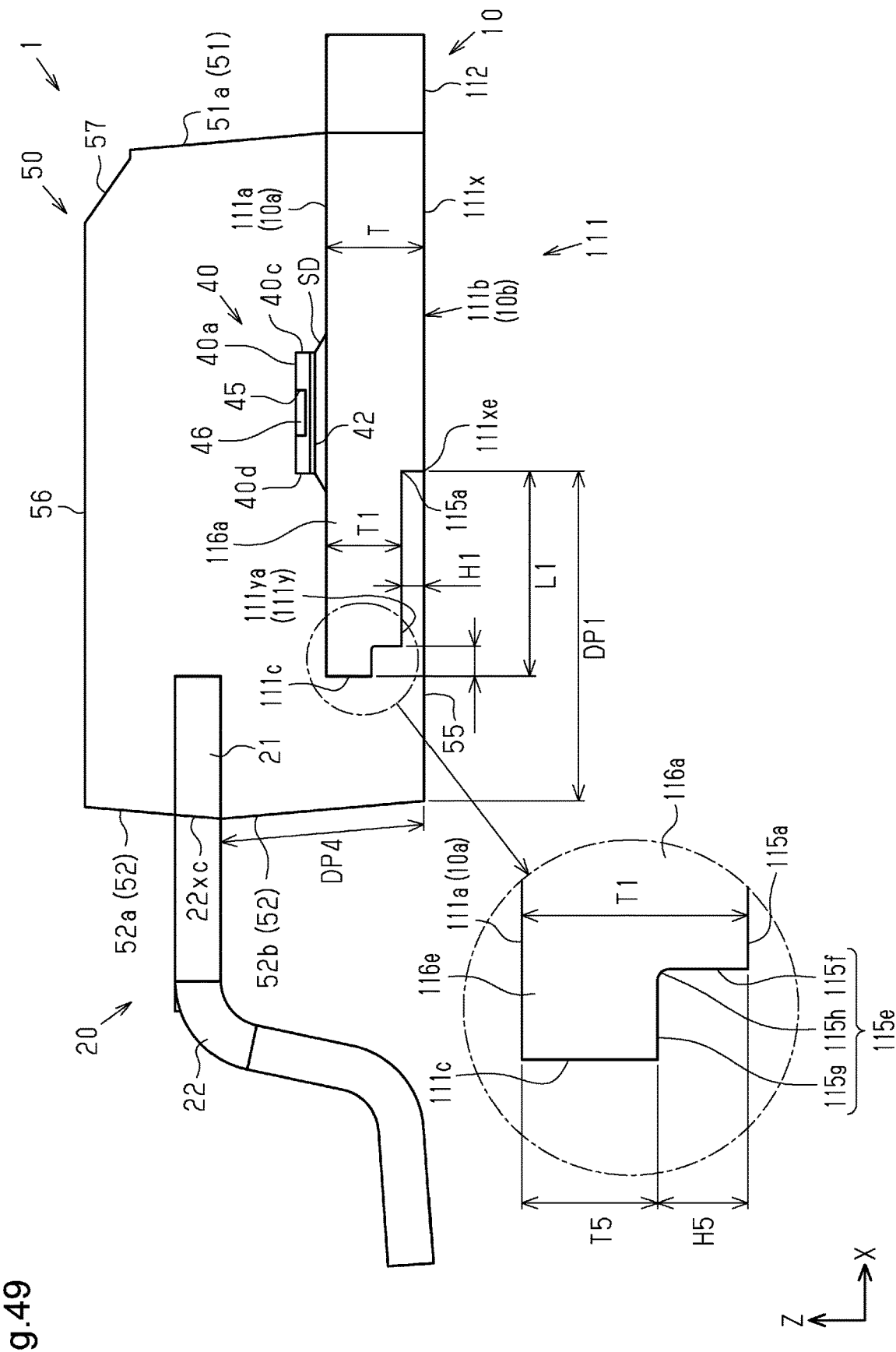
FIG. 49 is a schematic cross-sectional view taken along line 49-49 in FIG. 46.
Figure 50:
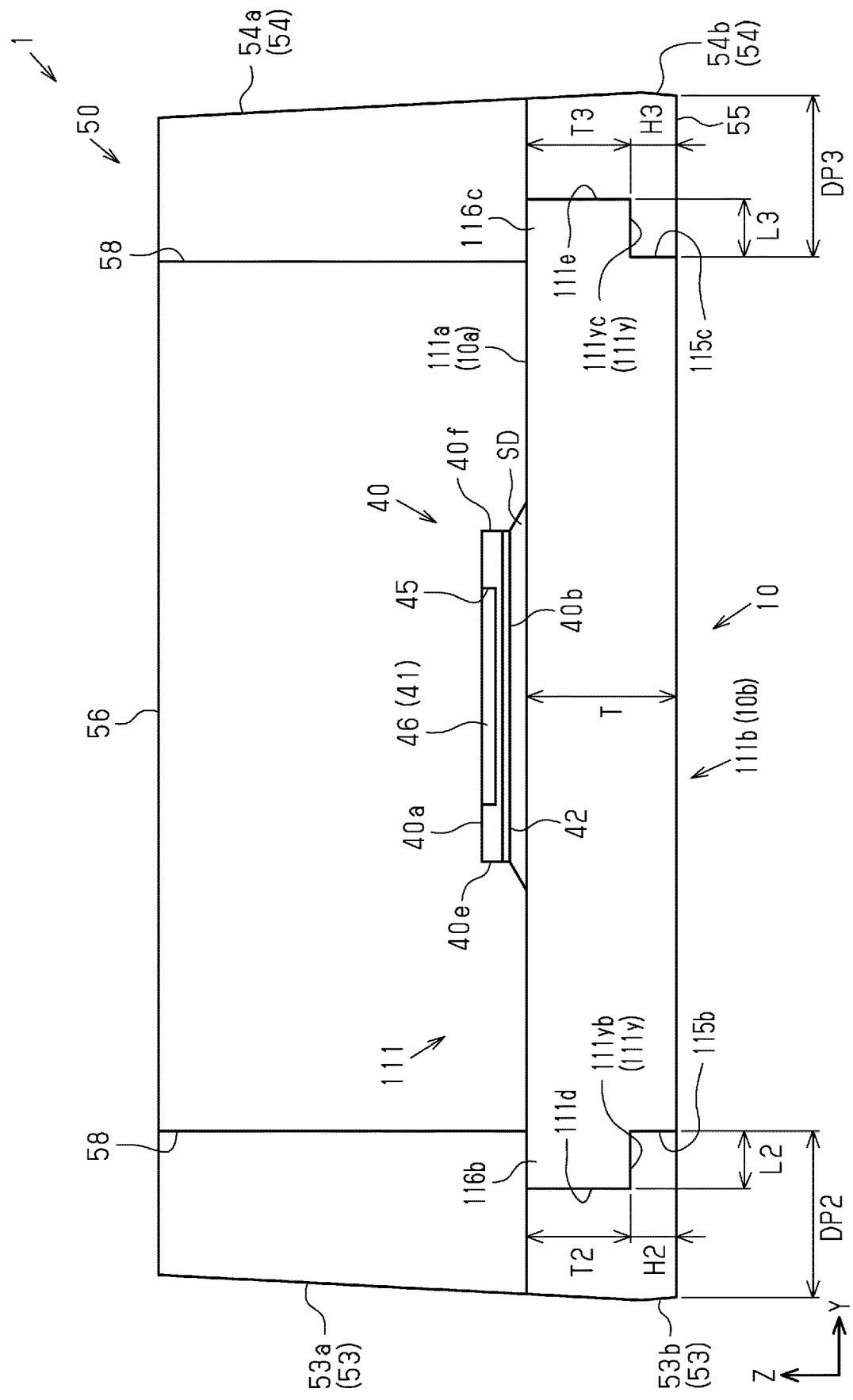
FIG. 50 is a schematic cross-sectional view taken along line 50-50 in FIG. 46.

As shown in FIG. 46, the encapsulation resin 50 is rectangular-box-shaped. The encapsulation resin 50 is formed by molding. Each of the encapsulation resin side surfaces 51 to 54 of the encapsulation resin 50 includes an inclined surface that is inclined with respect to the thicknesswise direction Z so that a draft slope is provided to facilitate removal of a mold when forming the encapsulation resin 50. Specifically, the first encapsulation resin side surface 51 includes a first inclined surface having a draft angle configured to facilitate removal of an upper mold, and each of the encapsulation resin side surfaces 52 to 54 includes a first inclined surface having a draft angle configured to facilitate removal of the upper mold and a second inclined surface having a draft angle configured to facilitate removal of a lower mold. The upper mold forms the encapsulation resin top surface 56 and a portion of each of the side surfaces 51 to 54 located toward the encapsulation resin top surface 56. The lower mold forms the encapsulation resin rear surface 55 and a portion of each of the side surfaces 51 to 54 located toward the encapsulation resin rear surface 55. In an example, as shown in FIGS. 49 and 50, the first encapsulation resin side surface 51 includes the first inclined surface 51a. The first inclined surface 51a is inclined toward the second encapsulation resin side surface 52 at positions closer to the encapsulation resin top surface 56. The first inclined surface 51a extends from the encapsulation resin top surface 56 to the main surface 10a of the substrate 10. The second encapsulation resin side surface 52 includes a first inclined surface 52a and a second inclined surface 52b. The first inclined surface 52a is inclined toward the first encapsulation resin side surface 51 as the first inclined surface 52a extends toward the encapsulation resin top surface 56. The second inclined surface 52b is inclined toward the first encapsulation resin side surface 51 as the second inclined surface 52b extends toward the encapsulation resin rear surface 55. The first inclined surface 52a is shorter than the second inclined surface 52b. The second inclined surface 52b extends over the substrate 10 toward the encapsulation resin top surface 56. The second inclined surface 52b extends toward the encapsulation resin top surface 56 beyond the front surface 40a of the semiconductor element 40. In other words, the first inclined surface 52a is located closer to the encapsulation resin top surface 56 than the front surface 40a of the semiconductor element 40. The third encapsulation resin side surface 53 includes a first inclined surface 53a and a second inclined surface 53b. The first inclined surface 53a is inclined toward the fourth encapsulation resin side surface 54 at positions closer to the encapsulation resin top surface 56. The second inclined surface 53b is inclined toward the fourth encapsulation resin side surface 54 at positions closer the encapsulation resin rear surface 55. The first inclined surface 53a is longer than the second inclined surface 53b. The fourth encapsulation resin side surface 54 includes a first inclined surface 54a and a second inclined surface 54b. The first inclined surface 54a is inclined toward the third encapsulation resin side surface 53 at positions closer to the encapsulation resin top surface 56. The second inclined surface 54b is inclined toward the third encapsulation resin side surface 53 at positions closer to the encapsulation resin rear surface 55. The first inclined surface 54a is longer than the second inclined surface 53b.

The length of the first inclined surface 51a may be changed in any manner. The length of the first inclined surface 52a and the length of the second inclined surface 52b may be changed in any manner. The length of the first inclined surface 53a and the length of the second inclined surface 53b may be changed in any manner. The length of the first inclined surface 54a and the length of the second inclined surface 54b may be changed in any manner.

An inclined surface 57 is formed between the first encapsulation resin side surface 51 and the encapsulation resin top surface 56 and has a greater inclination angle than the draft slope.

As shown in FIGS. 46 and 50, the encapsulation resin 50 includes opposite ends in the lateral direction Y including the recesses 58. The recess 58 located at the third encapsulation resin side surface 53 of the encapsulation resin 50 is curved and recessed from the third encapsulation resin side surface 53 in the lateral direction Y. The recess 58 located at the fourth encapsulation resin side surface 54 of the encapsulation resin 50 is curved and recessed from the fourth encapsulation resin side surface 54 in the lateral direction Y. The recesses 58 extend from the encapsulation resin top surface 56 to the main surface 10a of the substrate 10. That is, the main surface 10a of the substrate 10 is partially exposed by the recesses 58. The recesses 58 are located closer to the second encapsulation resin side surface 52 than the central portion of the encapsulation resin 50 in the longitudinal direction X.

Figure 47:
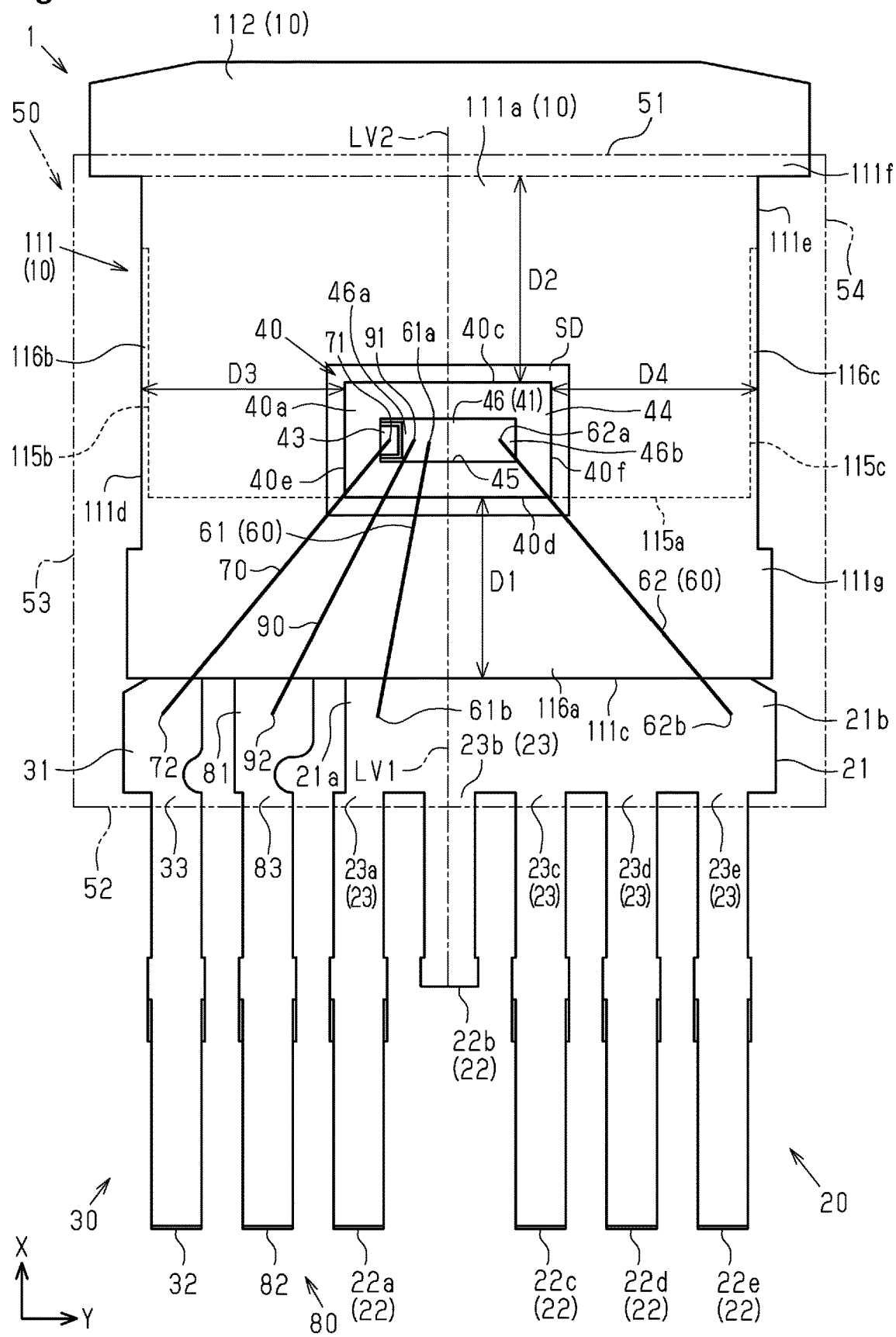
FIG. 47 is a plan view showing the internal structure of the semiconductor device shown in FIG. 46.

FIG. 47 is a diagram of the semiconductor device 1 viewed from the encapsulation resin top surface 56 in the thickness-wise direction Z. In FIG. 47, for the sake of convenience, the encapsulation resin 50 is indicated by a double-dashed line, and components in the encapsulation resin 50 are indicated by solid lines. As shown in FIG. 47, in a plan view, the encapsulation resin 50 is rectangular so that a long-side direction conforms to the lateral direction Y and a short-side direction conforms to the longitudinal direction X.

As shown in FIGS. 46 and 47, the substrate 10 may be divided into the inner body 111 located in the encapsulation resin 50 and the projection 112 projecting from the encapsulation resin 50. The inner body 111 and the projection 112 are located next to each other in the longitudinal direction X. The substrate 10 is formed of, for example, aluminum (Al) or copper (Cu).

The inner body 111 includes a first wide portion 111f on an end located toward the projection 112. The dimension of the first wide portion 111f in the lateral direction Y is greater than the dimension of the portion of the inner body 111 excluding the first wide portion 111f in the lateral direction Y. The first wide portion 111f is located next to the first encapsulation resin side surface 51 of the encapsulation resin 50 in the longitudinal direction X.

The inner body 111 includes a second wide portion 111g on an end located toward the second encapsulation resin side surface 52. The dimension of the second wide portion 111g in the lateral direction Y is greater than the dimension of the portion of the inner body 111 excluding the first wide portion 111f in the lateral direction Y The dimension of the second wide portion 111g in the lateral direction Y is less than the dimension of the first wide portion 111f in the lateral direction Y.

The projection 112 projects from the first encapsulation resin side surface 51 in the longitudinal direction X. In the present embodiment, the dimension of the projection 112 in the lateral direction Y is equal to the dimension of the first wide portion 111f of the inner body 111 in the lateral direction Y. The dimension of the projection 112 in the lateral direction Y may be changed in any manner. In an example, the dimension of the projection 112 in the lateral direction Y may be less than the dimension of the first wide portion 111f of the inner body 111 in the lateral direction Y.

Figure 48:
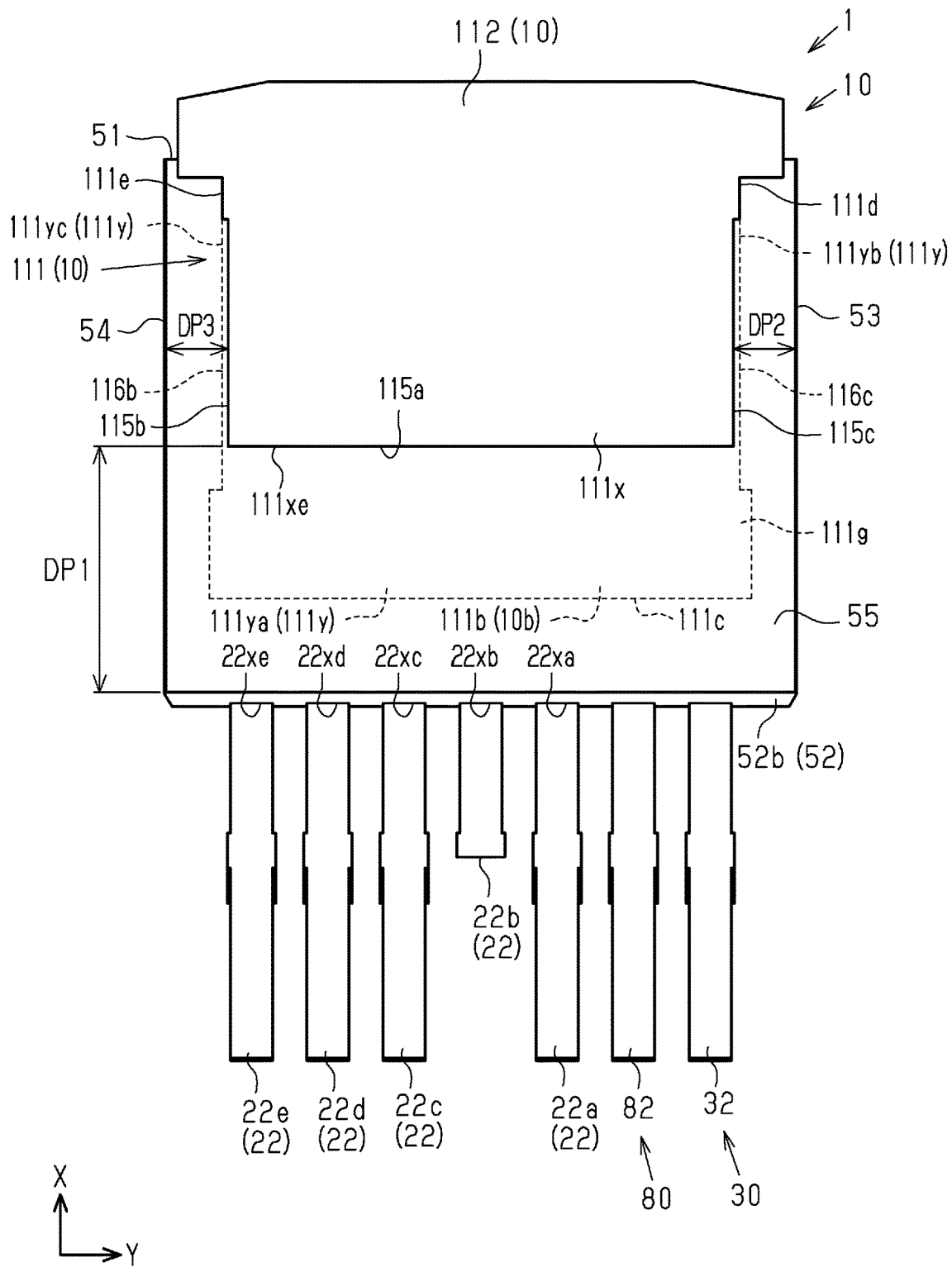
FIG. 48 is a rear view of the semiconductor device shown in FIG. 46.

As shown in FIG. 48, a portion of the rear surface 111b of the inner body 111 is exposed from the encapsulation resin rear surface 55. The rear surface 111b of the inner body 111 includes a surface exposed from the encapsulation resin rear surface 55 defining an exposed surface 111x. The exposed surface 111x is a portion of the rear surface 111b of the inner body 111 located toward the first encapsulation resin side surface 51. The exposed surface 111x has an edge 111xe located toward the second encapsulation resin side surface 52. The edge 111xe is arranged closer to the second encapsulation resin side surface 52 than a central portion of the encapsulation resin 50 in the longitudinal direction X. In the present embodiment, the edge 111xe of the exposed surface 111x extends in the lateral direction Y. The exposed surface 111x is flush with the encapsulation resin rear surface 55. The portion of the rear surface 111b of the inner body 111 excluding the exposed surface 111x defines a non-exposed surface 111y, which is not exposed from the encapsulation resin rear surface 55.

As shown in FIG. 47, in a plan view, the drive lead 20, the control lead 30, and the sense lead 80 are located closer to the second encapsulation resin side surface 52 of the encapsulation resin 50 than the substrate 10. In the present embodiment, in a plan view, an edge of each of the drive lead 20, the control lead 30, and the sense lead 80 located toward the first encapsulation resin side surface 51 overlaps an edge of the inner body 111 located toward the second encapsulation resin side surface 52. The drive lead 20, the control lead 30, and the sense lead 80 are spaced apart from each other in the lateral direction Y. The sense lead 80 is located between the drive lead 20 and the control lead 30 in the lateral direction Y. In the present embodiment, the substrate 10, the drive lead 20, the control lead 80, and the sense lead 80 are formed by stamping the same metal base material.

The drive lead 20 includes a drive pad 21, drive terminals 22, and coupling portions 23 that couple the drive pad 21 to the drive terminals 22.

In a plan view, the drive pad 21 is rectangular so that a long-side direction conforms to the lateral direction Y and a short-side direction conforms to the longitudinal direction X. The first end 21a of the drive pad 21 is located closer to the third encapsulation resin side surface 53 than the central portion of the inner body 111 in the lateral direction Y. As viewed in the longitudinal direction X, the second end 21b of the drive pad 21 overlaps an end of the inner body 111 located toward the fourth encapsulation resin side surface 54. Thus, the dimension of the drive pad 21 in the lateral direction Y is greater than one-half of the dimension of the inner body 111 in the lateral direction Y. As shown in FIG. 49, the drive pad 21 is located closer to the encapsulation resin top surface 56 than the main surface 10a of the substrate 10 in the thickness-wise direction Z. Also, the drive pad 21 is located closer to the encapsulation resin top surface 56 than the semiconductor element 40 in the thickness-wise direction Z.

As shown in FIG. 47, in the present embodiment, the drive terminals 22 include five drive terminals, namely, the drive terminals 22a, 22b, 22c, 22d, and 22e. The coupling portions 23 include five coupling portions, namely, coupling portions 23a, 23b, 23c, 23d, and 23e. The drive terminals 22a to 22e are spaced apart from each other in the lateral direction Y. The drive terminals 22a to 22e are arranged so that the drive terminals 22a, 22b, 22c, 22d, and 22e are sequentially located from the first end 21a toward the second end 21b of the drive pad 21. The coupling portions 23a to 23e are spaced apart from each other in the lateral direction Y. The coupling portion 23a couples the drive pad 21 to the drive terminal 22a. The coupling portion 23b couples the drive pad 21 to the drive terminal 22b. The coupling portion 23c couples the drive pad 21 to the drive terminal 22c. The coupling portion 23d couples the drive pad 21 to the drive terminal 22d. The coupling portion 23e couples the drive pad 21 to the drive terminal 22e.

The drive terminals 22a to 22e, the control terminal 32, and the sense terminal 82, which will be described later, are arranged at equal pitches. The drive terminal 22a is arranged to include a portion located closer to the third encapsulation resin side surface 53 than the first end 21a of the drive pad 21. The drive terminal 22a is located closer to the third encapsulation resin side surface 53 than the central portion of the inner body 111 in the lateral direction Y.

The drive terminal 22b is located at the same position as the central portion of the inner body 111 in the lateral direction Y. Specifically, an imaginary line LV1 extending in the longitudinal direction X through a central portion of the drive terminal 22b in the lateral direction Y coincides with an imaginary line LV2 extending in the longitudinal direction X through the central portion of the inner body 111 in the lateral direction Y. The drive terminals 22c to 22e are located closer to the fourth encapsulation resin side surface 54 than the central portion of the inner body 111 in the lateral direction Y. In the present embodiment, the drive terminals 22d and 22e are arranged closer to the fourth encapsulation resin side surface 54 than the semiconductor element 40. The drive terminals 22a and 22c to 22e are identical in shape. The drive terminal 22b is shorter than the drive terminals 22a and 22c to 22e.

As shown in FIG. 48, the drive terminal 22a includes a part that is in contact with the second encapsulation resin side surface 52 defining a terminal base end 22xa, the drive terminal 22b includes a part that is in contact with the second encapsulation resin side surface 52 defining a terminal base end 22xb, the drive terminal 22c includes a part that is in contact with the second encapsulation resin side surface 52 defining a terminal base end 22xc, the drive terminal 22d includes a part that is in contact with the second encapsulation resin side surface 52 defining a terminal base end 22xd, and the drive terminal 22e includes a part that is in contact with the second encapsulation resin side surface 52 defining a terminal base end 22xe. The terminal base end 22xa to 22xe are located at the same position in the thickness-wise direction Z and spaced apart from each other in the lateral direction Y. In an example, as shown in FIG. 49, the terminal base end 22xc is in contact with the first inclined surface 52a of the second encapsulation resin side surface 52. In the same manner as the terminal base end 22xc, the terminal base ends 22xa, 22xb, 22xd, and 22xe are in contact with the first inclined surface 52a.

As shown in FIG. 47, as viewed in the longitudinal direction X, the control lead 30 overlaps an end of the inner body 111 located toward the third encapsulation resin side surface 53. The control lead 30 is located closer to the third encapsulation resin side surface 53 than the semiconductor element 40.

As shown in FIG. 46, the control pad 31 is located closer to the encapsulation resin top surface 56 than the main surface 10a of the substrate 10 in the thickness-wise direction Z. Also, the control pad 31 is located closer to the encapsulation resin top surface 56 than the semiconductor element 40 in the thickness-wise direction Z. As shown in FIG. 47, in a plan view, the control pad 31 is rectangular so that a long-side direction conforms to the longitudinal direction X and a short-side direction conforms to the lateral direction Y. The dimension of the control pad 31 in the lateral direction Y is less than the dimension of the drive pad 21 in the lateral direction Y. This allows for an increase in the dimension of the drive pad 21 in the lateral direction Y.

The control terminal 32 of the control lead 30 is configured to be a gate terminal. The control terminal 32 and the drive terminals 22a and 22c to 22e are identical in shape.

In the present embodiment, the sense lead 80 is configured to electrically connect the control electrode 43 (gate electrode) to the main surface drive electrode 41 (source electrode). In a plan view, the sense lead 80 is located closer to the third encapsulation resin side surface 53 than the semiconductor element 40. The sense lead 80 includes a sense pad 81, the sense terminal 82, and a coupling portion 83 that couples the sense pad 81 to the sense terminal 82.

The sense pad 81 is spaced apart from the semiconductor element 40 in the longitudinal direction X. The sense pad 81 is located between the substrate 10 and the second encapsulation resin side surface 52 in the longitudinal direction X. The sense pad 81 is located between the drive pad 21 and the control pad 31 in the lateral direction Y. In a plan view, the sense pad 81 is rectangular so that a long-side direction conforms to the longitudinal direction X and a short-side direction conforms to the lateral direction Y. The dimension of the sense pad 81 in the lateral direction Y is equal to the dimension of the control pad 31 in the lateral direction Y. That is, the dimension of the sense pad 81 in the lateral direction Y is less than the dimension of the drive pad 21 in the lateral direction Y. This allows for an increase in the dimension of the drive pad 21 in the lateral direction Y. As shown in FIG. 46, the sense pad 81 is located closer to the encapsulation resin top surface 56 than the main surface 10a of the substrate 10 in the thickness-wise direction Z. Also, the sense pad 81 is located closer to the encapsulation resin top surface 56 than the semiconductor element 40 in the thickness-wise direction Z. The dimension of the sense pad 81 in the lateral direction Y and the dimension of the control pad 31 in the lateral direction Y may be changed in any manner. In an example, the dimension of the sense pad 81 in the lateral direction Y may be less than the dimension of the control pad 31 in the lateral direction Y.

As shown in FIG. 47, the coupling portion 83 is continuous from an end of the sense pad 81 located toward the second encapsulation resin side surface 52 in the longitudinal direction X. The coupling portion 83 is arranged on an end of the sense pad 81 located toward the third encapsulation resin side surface 53 in the lateral direction Y. The sense terminal 82 projects from the second encapsulation resin side surface 52. The sense terminal 82, the drive terminals 22a and 22c to 22e, and the control terminal 32 are identical in shape.

In the same manner as the fifth embodiment, a SiC MOSFET is used as the semiconductor element 40. Also, as in the fifth embodiment, the semiconductor element 40 is an element capable of high-speed switching in response to a drive signal having a frequency between 5 kHz and a few hundred kHz, inclusive. Preferably, the semiconductor element 40 is an element capable of high-speed switching in response to a drive signal having a frequency between 1 kHz and 100 kHz, inclusive. In the present embodiment, the semiconductor element 40 performs high-speed switching in response to a drive signal having a frequency of 100 kHz. The shape and size of the semiconductor element 40 are similar to those of the semiconductor element 40 of the fifth embodiment.

As shown in FIG. 47, the semiconductor element 40 is located on the inner body 111 at a position toward the second encapsulation resin side surface 52 in the longitudinal direction X. Specifically, in a plan view, the first distance D1 in the longitudinal direction X between the semiconductor element 40 and the first side surface 111c of the inner body 111 is less than the second distance D2 in the longitudinal direction X between the semiconductor element 40 and the first wide portion 111f of the inner body 111.

The semiconductor element 40 is located on the central portion of the inner body 111 in the lateral direction Y. Specifically, the third distance D3 in the lateral direction Y between the semiconductor element 40 and the second side surface 111d of the inner body 111 is equal to the fourth distance D4 in the lateral direction Y between the semiconductor element 40 and the third side surface 111e of the inner body 111. When a difference between the third distance D3 and the fourth distance D4 is, for example, within 5% of the third distance D3, it is considered that the third distance D3 is equal to the fourth distance D4.

The semiconductor device 1 includes drive wires 60, a control wire 70, and a sense wire 90. In the present embodiment, the drive wires 60 include two drive wires, namely, a first drive wire 61 and a second drive wire 62. More specifically, the first drive wire 61 and the second drive wire 62 are configured to be a combination of the furthermost ones of the drive wires 60. The first drive wire 61 and the second drive wire 62 are spaced apart from each other in the lateral direction Y. The first drive wire 61 and the second drive wire 62 are ones of the drive wires 60 located at opposite ends in the lateral direction Y. The control wire 70, the first drive wire 61, and the second drive wire 62 are spaced apart from each other in the lateral direction Y The first drive wire 61 is located closer to the control wire 70 than the second drive wire 62.

The first drive wire 61 and the second drive wire 62 are formed of the same metal. In the present embodiment, the first drive wire 61 and the second drive wire 62 contain aluminum. The first drive wire 61 and the second drive wire 62 have the same diameter. When a difference between the diameter of the first drive wire 61 and the diameter of the second drive wire 62 is, for example, within 5% of the diameter of the first drive wire 61, it is considered that the first drive wire 61 and the second drive wire 62 have the same diameter. In the present embodiment, the first drive wire 61, the second drive wire 62, and the control wire 70 have the same diameter. When a difference between the diameter of each of the first drive wire 61 and the second drive wire 62 and the diameter of the control wire 70 is, for example, within 5% of the diameter of the control wire 70, it is considered that the first drive wire 61, the second drive wire 62, and the control wire 70 have the same diameter. Each of the first drive wire 61 and the second drive wire 62 is connected to the main surface drive electrode 41 and the drive pad 21 by, for example, wire bonding.

In a plan view, the first drive wire 61 and the second drive wire 62 are connected to the main surface drive electrode 41 and the drive pad 21 so that the first drive wire 61 and the second drive wire 62 are separated by a greater distance at the drive pad 21 than at the main surface drive electrode 41. In a plan view, the distance between the first drive wire 61 and the second drive wire 62 gradually increases from the main surface drive electrode 41 toward the drive pad 21. The configurations of the first drive wire 61 and the second drive wire 62 will be specifically described below.

Figure 51:
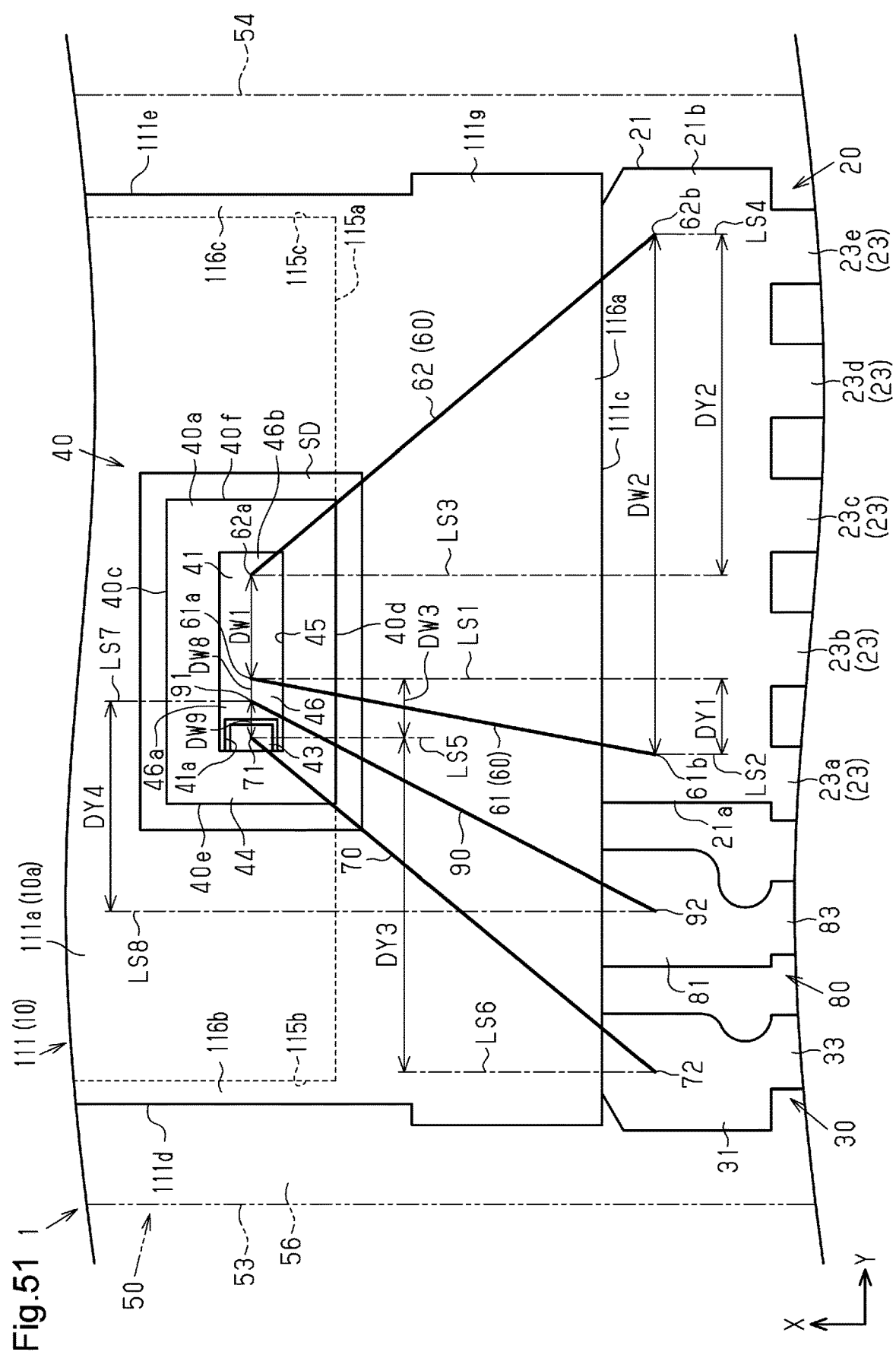
FIG. 51 is an enlarged view showing the semiconductor element shown in FIG. 47 and its surroundings.

As shown in FIG. 51, in a plan view, the distance DW2 between the drive pad end 61b of the first drive wire 61 and the drive pad end 62b of the second drive wire 62 is greater than the distance DW1 between the drive electrode end 61a of the first drive wire 61 and the drive electrode end 62a of the second drive wire 62. In the present embodiment, the drive pad end 61b is located closer to the third encapsulation resin side surface 53 than the drive electrode end 61a in the lateral direction Y. The drive pad end 62b is located closer to the fourth encapsulation resin side surface 54 than the drive electrode end 62a in the lateral direction Y. Thus, in a plan view, the inclination direction of the first drive wire 61 with respect to the longitudinal direction X is opposite to the inclination direction of the second drive wire 62 with respect to the longitudinal direction X.

An auxiliary line LS1 extends from the drive electrode end 61a in the longitudinal direction X. An auxiliary line LS2 extends from the drive pad end 61b in the longitudinal direction X. The distance between the auxiliary line LS1 and the auxiliary line LS2 in the lateral direction Y is referred to as a distance DY1. An auxiliary line LS3 extends from the drive electrode end 62a in the longitudinal direction X. An auxiliary line LS4 extends from the drive pad end 62b in the longitudinal direction X. The distance between the auxiliary line LS3 and the auxiliary line LS4 in the lateral direction Y is referred to as a distance DY2. In this case, the distance DY2 is greater than the distance DY1.

The drive electrode end 61a of the first drive wire 61 is connected to the main surface drive electrode 41 at a position closer to the first exposed end 46a than a central portion of the exposed region 46 in the lateral direction Y. In the present embodiment, the drive electrode end 61a is connected to a portion of the main surface drive electrode 41 located closer to the central portion of the exposed region 46 than the first exposed end 46a of the exposed region 46 in the lateral direction Y. In other words, the drive electrode end 61a is connected to a portion of the exposed region 46 separated from the control electrode 43, that is, a portion of the main surface drive electrode 41 separated from the bottom of the recess 41a. The drive electrode end 61a overlaps the coupling portion 23b of the drive lead 20 as viewed in the longitudinal direction X.

The drive pad end 61b of the first drive wire 61 is connected to the drive pad 21 at a position closer to the first end 21a than a central portion of the drive pad 21 in the lateral direction Y. In the present embodiment, the drive pad end 61b is connected to the first end 21a of the drive pad 21. The drive pad end 61b is connected to a portion of the drive pad 21 located closer to the third encapsulation resin side surface 53 than the coupling portion 23b in the lateral direction Y. In the present embodiment, the drive pad end 61b overlaps the coupling portion 23a of the drive lead 20 as viewed in the longitudinal direction X. In the longitudinal direction X, the drive pad end 61b is connected to a portion of the drive pad 21 located closer to the semiconductor element 40 than the central portion of the drive pad 21 in the longitudinal direction X.

The drive pad end 61b may be connected to the first end 21a of the drive pad 21 at the limit position toward the third encapsulation resin side surface 53 in the lateral direction Y in a region of the first end 21a where wire bonding is performable.

The drive electrode end 62a of the second drive wire 62 is connected to the main surface drive electrode 41 at a position closer to the second exposed end 46b than the central portion of the exposed region 46 in the lateral direction Y. In the present embodiment, the drive electrode end 62a is connected to the second exposed end 46b of the exposed region 46. In the present embodiment, as viewed in the longitudinal direction X, the drive electrode end 62a overlaps a portion between the coupling portion 23b and the coupling portion 23c in the lateral direction Y. In an example, the position of the drive electrode end 62a in relation to the exposed region 46 is set so that the drive electrode end 62a is located at the limit position toward the fourth side surface 40f in the lateral direction Y in a region of the second exposed end 46b of the exposed region 46 where wire bonding is performable. The drive electrode end 62a and the drive electrode end 61a of the first drive wire 61 are arranged at the same position in the longitudinal direction X. The state in which the drive electrode end 62a and the drive electrode end 61a are located at the same position in the longitudinal direction includes a state in which the drive electrode ends 61a and 62a overlap with each other in the longitudinal direction X and a state in which the drive electrode ends 61a and 62a partially overlap due to a manufacturing error caused by wire bonding. In other words, when a difference between the drive electrode ends 61a and 62a in the longitudinal direction X is an extent of a variation caused when performing wire bonding, it is considered that the drive electrode ends 61a and 62a are located at the same position in the longitudinal direction X.

The drive pad end 62b of the second drive wire 62 is connected to the drive pad 21 at a position closer to the second end 21b than the central portion of the drive pad 21 in the lateral direction Y. The drive pad end 62b is located closer to the fourth encapsulation resin side surface 54 than the semiconductor element 40. In the present embodiment, the drive pad end 62b is connected to the second end 21b of the drive pad 21. In the present embodiment, the drive pad end 62b overlaps the coupling portion 23e as viewed in the longitudinal direction X. The position of the drive pad end 62b in relation to the drive pad 21 may be set so that the drive pad end 62b is located at the limit position toward the fourth encapsulation resin side surface 54 in a region of the second end 21b of the drive pad 21 where wire bonding is performable. In the longitudinal direction X, the drive pad end 62b is connected to a portion of the drive pad 21 located closer to the semiconductor element 40 than the central portion of the drive pad 21 in the longitudinal direction X.

The control wire 70 connects the control electrode 43 of the semiconductor element 40 to the control pad 31. The control wire 70 is connected to the control electrode 43 and the control pad 31 by, for example, wire bonding. In the same manner as the fifth embodiment, the same material is used in the control wire 70 and the drive wires 60. The control wire 70, the first drive wire 61, and the second drive wire 62 have the same diameter. When a difference between the diameter of the control wire 70 and the diameter of the first drive wire 61 and the second drive wire 62 is, for example, within 5% of the control wire 70, it is considered that the control wire 70, the first drive wire 61, and the second drive wire 62 have the same diameter.

The control wire 70 includes a control electrode end 71 and a control pad end 72. The distance DW3 between the control electrode end 71 and the drive electrode end 61a of the first drive wire 61 is less than the distance DW1. The distance DY3 between the auxiliary line LS5 extending from the control electrode end 71 in the longitudinal direction X and the auxiliary line LS6 extending from the control pad end 72 in the longitudinal direction X is greater than the distance DY1 and slightly less than the distance DY2. The distance DY3 may be changed in any manner. In an example, the distance DY3 may be greater than or equal to the distance DY2.

The sense wire 90 connects the main surface drive electrode 41 of the semiconductor element 40 to the sense pad 81. The sense wire 90 is connected to the main surface drive electrode 41 and the sense pad 81 by, for example, wire bonding. The same material is used in the sense wire 90, the first drive wire 61, the second drive wire 62, and the control wire 70. The diameter of the sense wire 90 is, for example, the same as the diameter of the control wire 70. When a difference between the diameter of the sense wire 90 and the diameter of the control wire 70 is, for example, within 5% of the diameter of the sense wire 90, it is considered that the sense wire 90 and the control wire 70 have the same diameter.

The sense wire 90 includes a drive electrode end 91 and a sense pad end 92. The drive electrode end 91 is an end of the sense wire 90 connected to the main surface drive electrode 41. The sense pad end 92 is an end of the sense wire 90 connected to the sense pad 81. The sense pad end 92 is located closer to the third encapsulation resin side surface 53 than the drive electrode end 91 in the lateral direction Y.

The drive electrode end 91 is connected to a portion of the main surface drive electrode 41 between the drive electrode end 61*a* of the first drive wire 61 and the control electrode 43 in the lateral direction Y A distance DW8 between the drive electrode end 91 and the drive electrode end 61*a* of the first drive wire 61 is less than a distance DW9 between the drive electrode end 91 and the control electrode end 71 of the control wire 70.

An auxiliary line LS7 extends from the drive electrode end 91 in the longitudinal direction X. An auxiliary line LS8 extends from the sense pad end 92 in the longitudinal direction X. A distance DY4 between the auxiliary line LS7 and the auxiliary line LS8 is greater than the distance DY1 and less than the distance DY2. The distance DY4 is less than the distance DY3.

The extension structure of the creepage distance between a drain terminal (the rear surface 10*b* of the substrate 10) and a source terminal (the drive terminal 22) of the semiconductor device 1 will now be described.

As shown in FIGS. 47 to 49, the rear surface 10*b* of the substrate 10 (the rear surface 111*b* of the inner body 111) includes an indent 115*a* in a portion located toward the second encapsulation resin side surface 52. The indent 115*a* is formed by recessing from the rear surface 111*b* toward the main surface 111*a* of the inner body 111 in a stepped manner. The indent 115*a* extends in the longitudinal direction X from the first side surface 111*c* of the inner body 111 to a position closer to the second encapsulation resin side surface 52 than the central portion of the inner body 111 in the longitudinal direction X. The edge of the indent 115*a* located toward the first encapsulation resin side surface 51 conforms to the edge 111*xe* of the exposed surface 111*x*. In the present embodiment, the indent 115*a* is formed so that the edge of the indent 115*a* located toward the first encapsulation resin side surface 51 (the edge 111*xe* of the exposed surface 111*x*) and the second side surface 40*d* of the semiconductor element 40 are located at the same position in the longitudinal direction X. In other words, the semiconductor element 40 is mounted on the main surface 111*a* of the inner body 111 so that the edge of the indent 115*a* located toward the first encapsulation resin side surface 51 (the edge 111*xe* of the exposed surface 111*x*) and the second side surface 40*d* of the semiconductor element 40 are located at the same position in the longitudinal direction X. In the present embodiment, the indent 115*a* extends in the entire portion of the rear surface 111*b* of the inner body 111 located toward the second encapsulation resin side surface 52 in the lateral direction Y.

The indent 115*a* has a depth H1 that is less than or equal to one-half of the thickness of the substrate 10 (thickness T of the inner body 111). Preferably, the depth H1 is less than or equal to one-third of the thickness T of the inner body 111. In the present embodiment, the depth H1 is less than or equal to one-fourth of the thickness T of the inner body 111. The encapsulation resin 50 is partially received in the indent 115*a*.

As shown in FIGS. 47 and 50, an indent 115*b* is arranged in a portion of the rear surface 111*b* of the inner body 111 located closer to the first encapsulation resin side surface 51 than the indent 115*a* at an end located toward the third encapsulation resin side surface 53. In the portion of the rear surface 111*b* of the inner body 111 located closer to the first encapsulation resin side surface 51 than the indent 115*a*, an indent 115*c* is arranged at an end located toward the fourth encapsulation resin side surface 54. Each of the indents 115*b* and 115*c* is formed by recessing from the rear surface 111*b* toward the main surface 111*a* of the inner body 111 in a stepped manner. The indent 115*b* extends in the lateral direction Y from the second side surface 111*d* of the inner body 111 to a position closer to the third encapsulation resin side surface 53 than one-half of the third distance D3. The indent 115*c* extends in the lateral direction Y from the third side surface 111*e* of the inner body 111 to a position closer to the fourth encapsulation resin side surface 54 than one-half of the fourth distance D4. As described above, the third distance D3 is a distance between the semiconductor element 40 and the second side surface 111*d* of the inner body 111, and the fourth distance D4 is a distance between the semiconductor element 40 and the third side surface 111*e* of the inner body 111. The indent 115*b* is continuous with an end of the indent 115*a* located toward the second side surface 111*d* in the lateral direction Y The indent 115*c* is continuous with an end of the indent 115*a* located toward the third side surface 111*e* in the lateral direction Y.

The indent 115*b* has a depth H2 that is equal to a depth H3 of the indent 115*c*. When a difference between the depth H2 and the depth H3 is, for example, within 5% of the depth H2, it is considered that the depth H2 is equal to the depth H3. The depths H2 and H3 are less than or equal to one-half of the thickness T of the inner body 111. Preferably, each of the depths H2 and H3 is less than or equal to one-third of the thickness T of the inner body 111. In the present embodiment, each of the depths H2 and H3 is less than or equal to one-fourth of the thickness T of the inner body 111. The depths H2 and H3 are equal to the depth H1. The encapsulation resin 50 is partially received in the indents 115*b* and 115*c*.

As shown in FIG. 47, the inner body 111 includes a portion between the indent 115*a* and the main surface 111*a* in the thickness-wise direction Z defining a first thin portion 116*a*, a portion between the indent 115*b* and the main surface 111*a* in the thickness-wise direction Z defining a second thin portion 116*b*, and a portion between the indent 115*c* and the main surface 111*a* in the thickness-wise direction Z defining a third thin portion 116*c*. As shown in FIGS. 49 and 50, since the depths H1, H2, and H3 of the indents 115*a*, 115*b*, and 115*c* are equal to each other, the thickness T1 of the first thin portion 116*a*, the thickness T2 of the second thin portion 116*b*, and the thickness T3 of the third thin portion 116*c* are equal to each other. When the largest difference of the thicknesses T1, T2, and T3 is, for example, within 5% of the thickness T1, it is considered that the thicknesses T1, T2, and T3 are equal to each other.

The first thin portion 116*a* has a dimension L1 in the longitudinal direction X that is greater than a dimension L2 of the second thin portion 116*b* in the lateral direction Y and a dimension L3 of the third thin portion 116*c* in the lateral direction Y. The dimension L1 is greater than or equal to twice the dimensions L2 and L3. Preferably, the dimension L1 is greater than or equal to three times the dimensions L2 and L3. In the present embodiment, the dimension L1 is approximately ten times the dimensions L2 and L3.

The non-exposed surface 111y of the rear surface 111b of the inner body 111 includes a first non-exposed surface 111ya that faces the same side as the exposed surface 111x in the first thin portion 116a, a second non-exposed surface 111yb that faces the same side as the exposed surface 111x in the second thin portion 116b, and a third non-exposed surface 111yc that faces the same side as the exposed surface 111x in the third thin portion 116c.

As shown in FIG. 49, an indent 115e is formed in an end of the first thin portion 116a located toward the second encapsulation resin side surface 52. The indent 115e extends in the entire portion of the inner body 111 in the lateral direction Y. In the cross-sectional view shown in FIG. 49, the indent 115e includes a first surface 115f extending in the thickness-wise direction Z and a second surface 115g located closer to the first side surface 111c than the first surface 115f and extending in the longitudinal direction X. The first surface 115f and the second surface 115g are connected by a portion including a curved surface 115h.

The indent 115e has a depth H5 that is, for example, greater than the depth H1 of the indent 115a. The indent 115d forms a fifth thin portion 116e in the first thin portion 116a. The fifth thin portion 116e extends between the second surface 115g of the indent 115e and the main surface 111a in the thickness-wise direction Z. In the present embodiment, the thickness T5 of the fifth thin portion 116e is greater than or equal to one-half of the thickness T1 of the first thin portion 116a.

The depth H5 may be changed in any manner. In an example, the depth H5 may be equal to the depth H1. When a difference between the depth H5 and the depth H1 is, for example, within 5% of the depth H1, it is considered that the depth H5 is equal to the depth H1.

The indents 115a, 115b, 115c, and 115e are formed by stamping (punching) the substrate 10. Thus, the indents 115a, 115b, 115c, and 115e are simultaneously formed in one step.

As shown in FIG. 48, a distance DP1 refers to the shortest distance from the second encapsulation resin side surface 52 to the rear surface 10b of the substrate 10 (the rear surface 111b of the inner body 111) in the longitudinal direction X. A distance DP2 refers to the shortest distance from the third encapsulation resin side surface 53 to the rear surface 10b of the substrate 10 (the rear surface 111b of the inner body 111) in the lateral direction Y. A distance DP3 refers to the shortest distance from the fourth encapsulation resin side surface 54 to the rear surface 10b of the substrate 10 (the rear surface 111b of the inner body 111) in the lateral direction Y. In this case, the distance DP1 is greater than the distance DP2 and the distance DP3. Preferably, the distance DP1 is greater than or equal to twice the distance DP2 and the distance DP3. More preferably, the distance DP1 is greater than or equal to three times the distance DP2 and the distance DP3. In the present embodiment, the distance DP1 is approximately four times the distance DP2 and the distance DP3.

The creepage distance DP between the drain terminal (the rear surface 10b of the substrate 10) and the source terminal (the drive terminals 22a to 22e) of the semiconductor device 1 is the shorter one of the distances along the second encapsulation resin side surface 52 and the encapsulation resin rear surface 55 of the encapsulation resin 50 from the drive terminals 22a to 22e to the edge 111xe of the exposed surface 111x.

In the present embodiment, the terminal base ends 22xa to 22xe of the drive terminals 22a to 22e, which are in contact with the second encapsulation resin side surface 52, the drive pad 21 of the drive lead 20, and the coupling portions 23a to 23e are located at the same position in the thickness-wise direction Z. That is, the terminal base ends 22xa to 22xe are located closer to the encapsulation resin top surface 56 than the main surface 10a of the substrate 10 in the thickness-wise direction Z. Also, the terminal base ends 22xa to 22xe are located closer to the encapsulation resin top surface 56 than the front surface 40a of the semiconductor element 40 in the thickness-wise direction Z. In the present embodiment, in the thickness-wise direction Z, the terminal base ends 22xa to 22xe are located closer to the encapsulation resin top surface 56 than the central portion of the encapsulation resin 50 in the thickness-wise direction Z. In addition, the edge 111xe of the exposed surface 111x extends in the lateral direction Y. As described above, the creepage distances DP of the drive terminals 22a to 22e from the drive terminal to the edge 111xe of the exposed surface 111x are equal to each other and are specified, for example, by the sum of the distance DP1 and the distance DP4 extending from the drive terminal 22a to the encapsulation resin rear surface 55 along the second encapsulation resin side surface 52.

In the present embodiment, the terminal base ends 22xa to 22xe of the drive terminals 22a to 22e are located closer to the encapsulation resin top surface 56 than the front surface 40a of the semiconductor element 40. Thus, the distance DP4 is longer than that obtained in a configuration in which the terminal base ends 22xa to 22xe and the substrate 10 are located at the same position in the thickness-wise direction Z. Also, the dimension L1 of the first thin portion 116a is greater than the dimension L2 of the second thin portion 116b and the dimension L3 of the third thin portion 116c. Thus, the distance DP1 is longer than that obtained in a configuration in which the dimension L1 of the first thin portion 116a is less than or equal to the dimension L2 of the second thin portion 116b and the dimension L3 of the third thin portion 116c.

The semiconductor device 1 of the present embodiment has the following advantages in addition to advantages (1-1) and (1-5) to (1-19) of the fifth embodiment.

(2-1) The semiconductor device 1 includes the sense lead 80 and the sense wire 90 configured to electrically connect the main surface drive electrode 41 of the semiconductor element 40 (source electrode) and the control electrode 43 (gate electrode). In this configuration, the voltage of the control electrode 43 varies in accordance with variations in the voltage of the main surface drive electrode 41. This reduces variations in the source-gate voltage of the semiconductor element 40. Accordingly, variations in the threshold voltage of the semiconductor element 40 are limited.

(2-2) The semiconductor element 40 is located on the inner body 111 of the substrate 10 at a position toward the second encapsulation resin side surface 52. This configuration decreases the distance between the opening 45 of the semiconductor element 40 and the drive pad 21, thereby shortening the first drive wire 61 and the second drive wire 62. As a result, the inductance between the main surface drive electrode 41 and the drive pad 21 is reduced.

(2-3) The dimension of the drive pad 21 in the lateral direction Y is greater than the dimension of the semiconductor element 40 in the lateral direction Y. This configuration allows for a further increase in the distance between the drive pad end 61b of the first drive wire 61 and the drive pad end 62b of the second drive wire 62. Thus, the inductance between the main surface drive electrode 41 and the drive pad 21 is further reduced.

(2-4) The semiconductor element 40 and the drive pad 21 are arranged so that the entire opening 45 of the semiconductor element 40 overlaps the drive pad 21 as viewed in the longitudinal direction X. This configuration allows the first drive wire 61 to be shortened while allowing for an increase in the distance between the first drive wire 61 and the second drive wire 62. As a result, the inductance between the main surface drive electrode 41 and the drive pad 21 is reduced.

(2-5) The same material is used in the drive wires 60, the control wire 70, and the sense wire 90. The drive wires 60, the control wire 70, and the sense wire 90 have the same diameter. In this configuration, the same wire may be used when performing a task for connecting the drive wires 60 to the main surface drive electrode 41 and the drive pad 21 and a task for connecting the control wire 70 to the control electrode 43 and the control pad 31, and a task for connecting the sense wire 90 to the main surface drive electrode 41 and the sense pad 81. This simplifies the process of the tasks.

(2-6) The drive lead 20, the control lead 30, the sense pad 81, and the substrate 10 are formed, for example, by stamping the same metal plate. This configuration simplifies the stamping steps of the drive lead 20, the control lead 30, the sense pad 81, and the substrate 10 as compared to a configuration in which the drive lead 20, the control lead 30, the sense pad 81, and the substrate 10 are formed by separate metal plates.

Modified Examples of Sixth Embodiment

The semiconductor device 1 of the sixth embodiment may be modified, for example, as follows. The modified example described below may be combined with one another as long as there is no technical inconsistency. In the modified examples, the same reference characters are given to those elements that are the same as the corresponding elements of the sixth embodiment. Such elements will not be described in detail.

Figure 52:
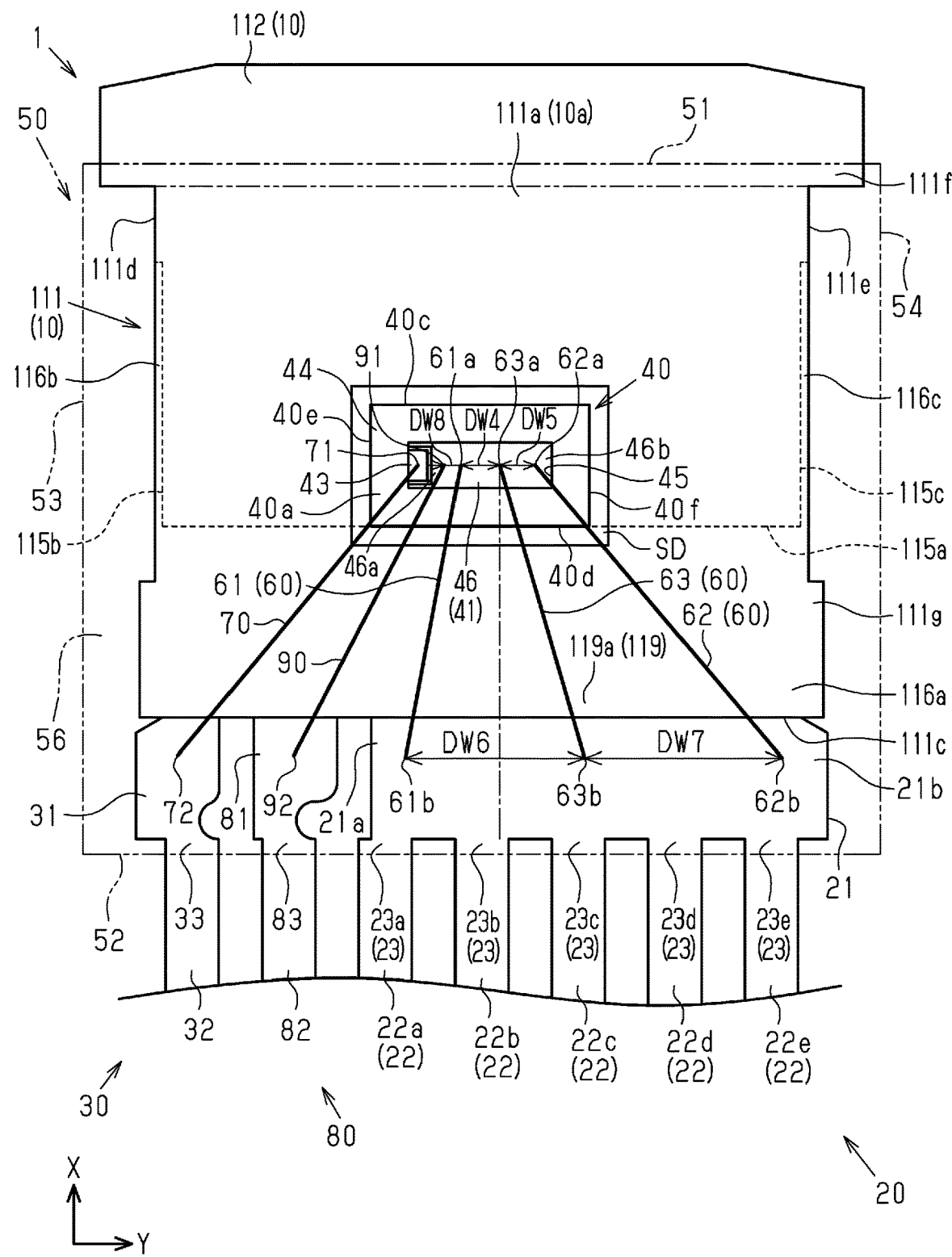
FIG. 52 is an enlarged view showing a semiconductor element and its surroundings in a modified example of the semiconductor device of the sixth embodiment.

The number of drive wires 60 is not limited to two and may be changed in any manner. In an example, as shown in FIG. 52, the drive wires 60 may include three drive wires, namely, the first drive wire 61, the second drive wire 62, and the third drive wire 63. The third drive wire 63 is arranged between the first drive wire 61 and the second drive wire 62. In this case, the first drive wire 61 and the second drive wire 62 are configured to be a combination of the furthermost ones of the drive wires 60.

More specifically, when three or more drive wires are used, the combination of the furthermost ones correspond to two drive wires that are located at the furthermost positions. For example, when three or more drive wires are arranged in the lateral direction Y, the combination of the furthermost ones is a combination of drive wires located at opposite ends in the lateral direction Y.

The third drive wire 63 includes a drive electrode end 63a and a drive pad end 63b. The drive electrode end 63a is an end of the third drive wire 63 connected to the main surface drive electrode 41. The drive pad end 63b is an end of the third drive wire 63 connected to the drive pad 21. In FIG. 52, the drive electrode end 63a overlaps the coupling portion 23b of the drive lead 20 as viewed in the longitudinal direction X. The drive pad end 63b overlaps the coupling portion 23c of the drive lead 20 as viewed in the longitudinal direction X. More specifically, the drive pad end 63b is located closer to the fourth encapsulation resin side surface 54 than the drive electrode end 63a.

In FIG. 52, the distance DW4 between the drive electrode end 63a and the drive electrode end 61a of the first drive wire 61 is less than the distance DW5 between the drive electrode end 63a and the drive electrode end 62a of the second drive wire 62. The distance DW4 and the distance DW5 are greater than the distance DW8 between the drive electrode end 91 and the drive electrode end 61a of the first drive wire 61. The position of the drive electrode end 63a in the lateral direction Y may be changed in any manner. In an example, the drive electrode end 63a may be connected to the main surface drive electrode 41 so that the distance DW4 is equal to the distance DW5.

In FIG. 52, the drive electrode end 61a of the first drive wire 61, the drive electrode end 62a of the second drive wire 62, and the drive electrode end 63a of the third drive wire 63 are located at the same position in the longitudinal direction X. The state in which the drive electrode ends 61a, 62a, and 63a are located at the same position in the longitudinal direction X includes a state in which the drive electrode ends 61a, 62a, and 63a overlap with each other in the longitudinal direction X and a state in which the drive electrode ends 61a, 62a, and 63a partially overlap due to a manufacturing error caused by wire bonding. In other words, when a difference between the drive electrode ends 61a, 62a, and 63a in the longitudinal direction X is an extent of a variation caused when performing wire bonding, it is considered that the drive electrode ends 61a, 62a, and 63a are located at the same position in the longitudinal direction X.

In the longitudinal direction X, the drive pad end 63b of the third drive wire 63 is connected to a portion of the drive pad 21 located closer to the semiconductor element 40 than the central portion of the drive pad 21 in the longitudinal direction X. A distance DW6 between the drive pad end 61b of the first drive wire 61 and the drive pad end 63b is greater than the distance DW4. A distance DW7 between the drive pad end 62b of the second drive wire 62 and the drive pad end 63b is greater than the distance DW5. In FIG. 52, the distance DW7 is greater than the distance DW6.

In a plan view, the first drive wire 61 and the third drive wire 63 are connected to the main surface drive electrode 41 and the drive pad 21 so that the first drive wire 61 and the third drive wire 63 are separated by a greater distance at the drive pad 21 than at the main surface drive electrode 41. In a plan view, the distance between the first drive wire 61 and the third drive wire 63 gradually increases from the main surface drive electrode 41 toward the drive pad 21. In a plan view, the third drive wire 63 and the second drive wire 62 are connected to the main surface drive electrode 41 and the drive pad 21 so that the third drive wire 63 and the second drive wire 62 are separated by a greater distance at the drive pad 21 than at the main surface drive electrode 41. In a plan view, the distance between the third drive wire 63 and the second drive wire 62 gradually increases from the main surface drive electrode 41 toward the drive pad 21.

Figure 53:
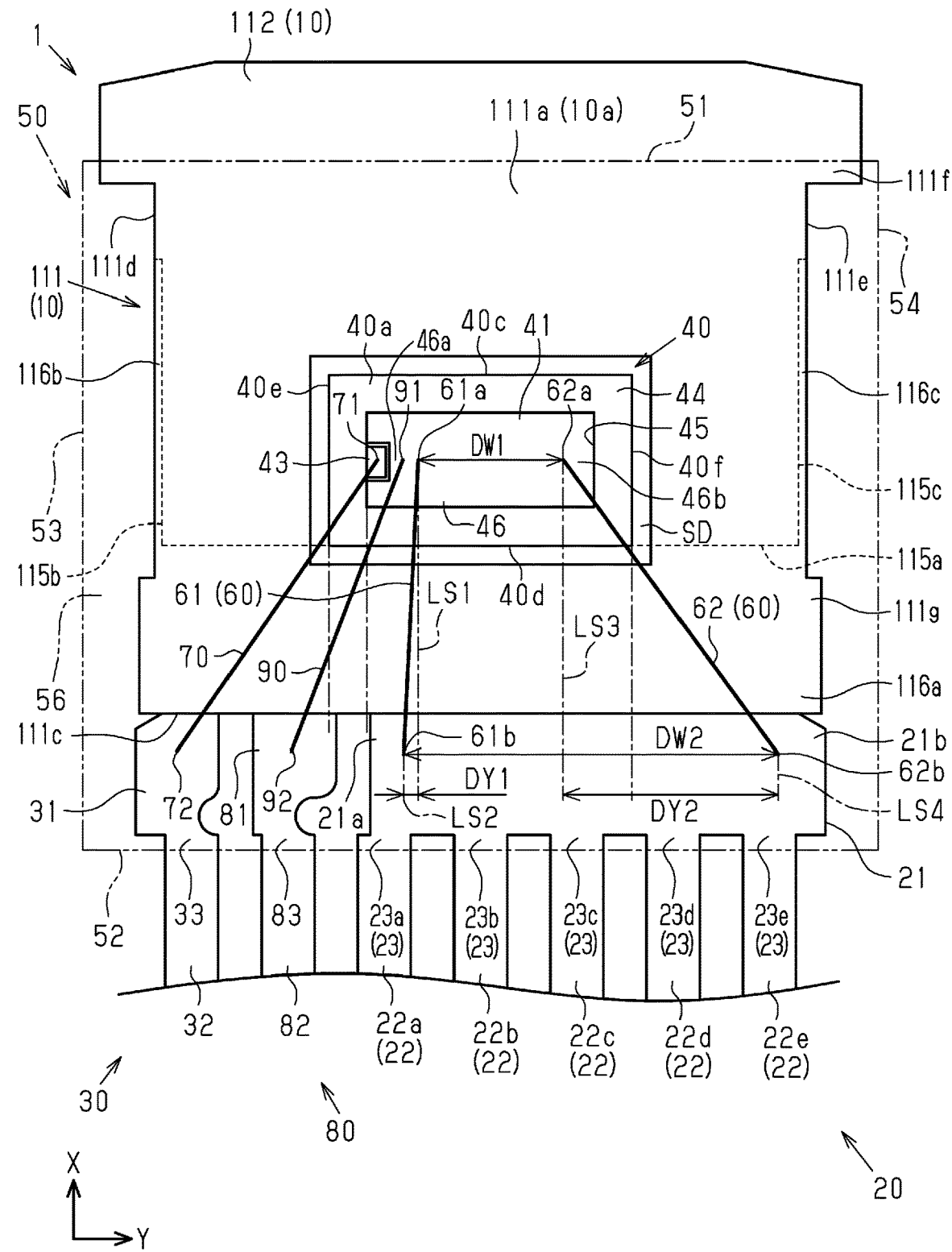
FIG. 53 is an enlarged view showing a semiconductor element and its surroundings in a modified example of the semiconductor device of the sixth embodiment.
Figure 55:
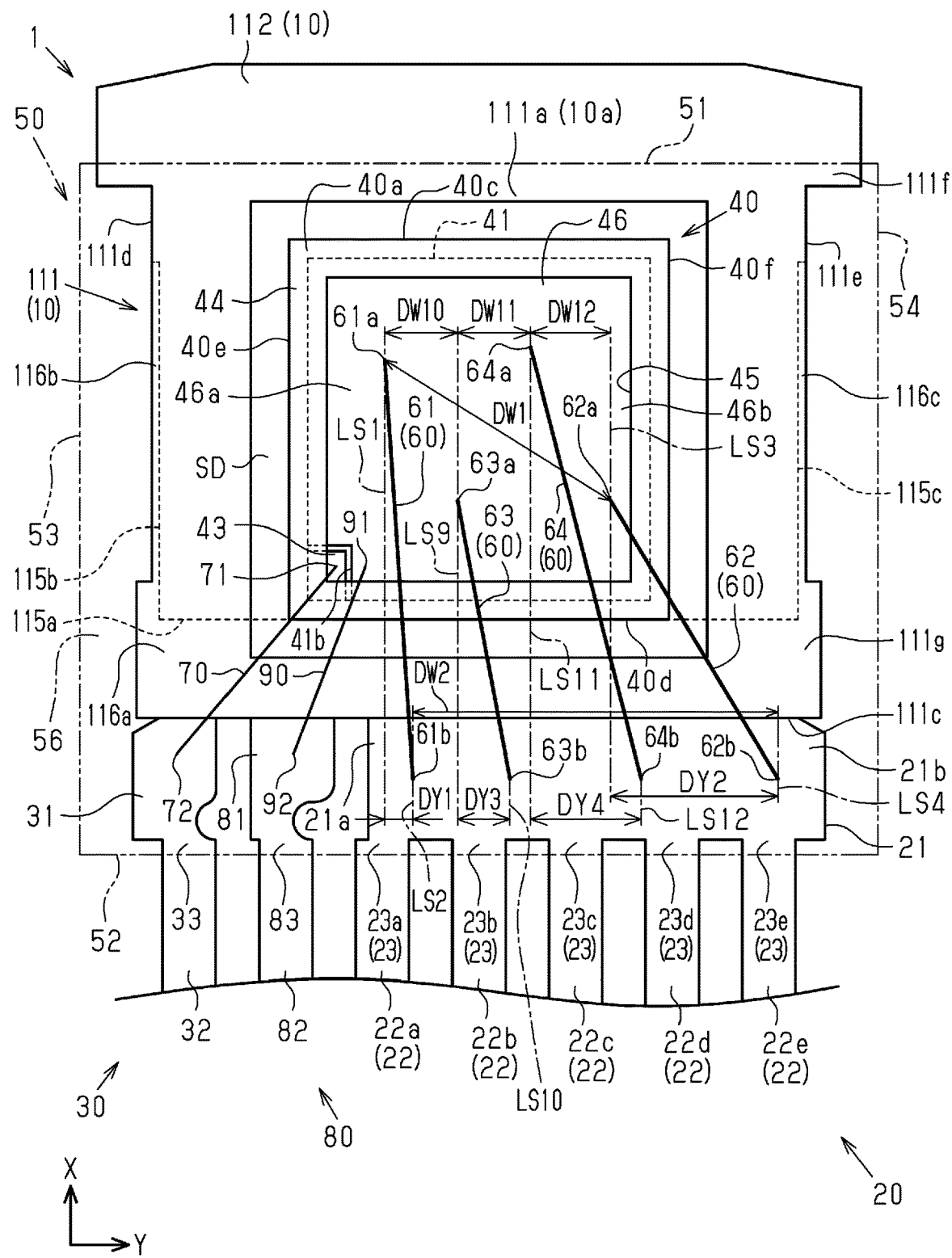
FIG. 55 is an enlarged view showing a semiconductor element and its surroundings in a modified example of the semiconductor device of the sixth embodiment.

The size of the semiconductor element 40 may be changed in any manner. In a first example, as shown in FIG. 53, the semiconductor element 40 may have a greater size than the semiconductor element 40 of the third embodiment. In a second example, as shown in FIG. 55, the semiconductor element 40 may have a greater size than the semiconductor element 40 shown in FIG. 53.

In the first example shown in FIG. 53, the semiconductor element 40 is greater in size in the longitudinal direction X and the lateral direction Y than the semiconductor element 40 of the sixth embodiment. In accordance with the increase in the size of the semiconductor element 40, the opening 45 formed in the front surface 40a may be increased in size in the longitudinal direction X and the lateral direction Y In FIG. 53, the dimension of the opening 45 in the lateral direction Y is less than in the dimension of the drive pad 21 in the lateral direction Y. The dimension of the drive pad 21 in the lateral direction Y is greater than the dimension of the semiconductor element 40 in the lateral direction Y. The opening 45 overlaps the first end 21*a* of the drive pad 21 as viewed in the longitudinal direction X. More specifically, the edge of the opening 45 located toward the third side surface 40*e* is located closer to the third encapsulation resin side surface 53 than the drive pad 21. The opening 45 also overlaps the coupling portion 23*c* of the drive lead 20 as viewed in the longitudinal direction X.

In FIG. 53, as viewed in the longitudinal direction X, the third side surface 40*e* of the semiconductor element 40 overlaps an end of the sense lead 80 located toward the fourth encapsulation resin side surface 54. As viewed in the longitudinal direction X, the fourth side surface 40*f* of the semiconductor element 40 overlaps the drive pad 21 between the coupling portion 23*c* and the coupling portion 23*d* in the lateral direction Y.

As in the sixth embodiment, the semiconductor device 1 includes the first drive wire 61 and the second drive wire 62 as the drive wires 60. In the same manner as the drive electrode end 61*a* of the sixth embodiment, the drive electrode end 61*a* of the first drive wire 61 is connected to a portion of the main surface drive electrode 41 separated from the control electrode 43 in the lateral direction Y. In the same manner as the drive pad end 61*b* of the sixth embodiment, the drive pad end 61*b* of the first drive wire 61 is connected to the first end 21*a* of the drive pad 21. In the same manner as the drive electrode end 62*a* of the sixth embodiment, the drive electrode end 62*a* of the second drive wire 62 is connected to an end of the opening 45 located toward the fourth side surface 40*f* of the semiconductor element 40 in the lateral direction Y. In the same manner as the drive pad end 62*b* of the sixth embodiment, the drive pad end 62*b* of the second drive wire 62 is connected to the second end 21*b* of the drive pad 21. The drive electrode end 61*a* and the drive electrode end 62*a* are located at the same position in the longitudinal direction X and arranged in the lateral direction Y. In the longitudinal direction X, each of the drive pad end 61*b* and the drive pad end 62*b* is connected to a portion of the drive pad 21 located closer to the semiconductor element 40 than the central portion of the drive pad 21 in the longitudinal direction X.

In a plan view, a distance DW2 between the drive pad end 61*b* and the drive pad end 62*b* is greater than a distance DW1 between the drive electrode end 61*a* and the drive electrode end 62*a*. In FIG. 53, the distance DY1 in the lateral direction Y between the auxiliary line LS1 extending from the drive electrode end 61*a* in the longitudinal direction X and the auxiliary line LS2 extending from the drive pad end 61*b* in the longitudinal direction X is less than the distance DY2 in the lateral direction Y between the auxiliary line LS3 extending from the drive electrode end 62*a* in the longitudinal direction X and the auxiliary line LS4 extending from the drive pad end 62*b* in the longitudinal direction X. Thus, in a plan view, the first drive wire 61 and the second drive wire 62 are connected to the main surface drive electrode 41 and the drive pad 21 so that the first drive wire 61 and the second drive wire 62 are separated by a greater distance at the drive pad 21 than at the main surface drive electrode 41. In a plan view, the distance between the first drive wire 61 and the second drive wire 62 gradually increases from the main surface drive electrode 41 toward the drive pad 21.

This configuration increases the distance between the first drive wire 61 and the second drive wire 62, thereby decreasing the inductance between the main surface drive electrode 41 (source electrode) and the drive terminal 22 of the drive lead 20 (source terminal).

Figure 54:
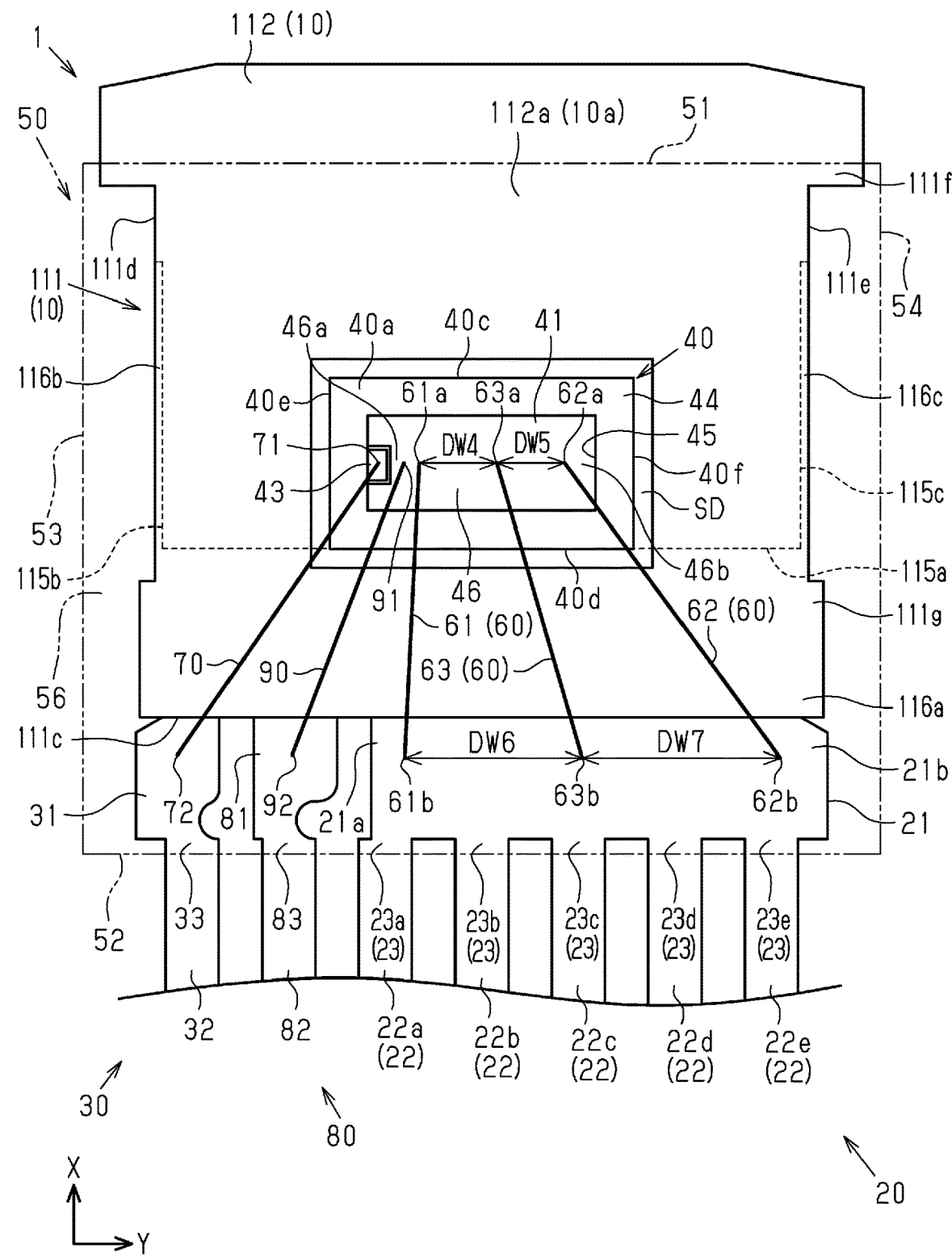
FIG. 54 is an enlarged view showing a semiconductor element and its surroundings in a modified example of the semiconductor device of the sixth embodiment.

In the modified example shown in FIG. 53, the number of drive wires 60 is not limited to two and may be changed in any manner. In an example, as shown in FIG. 54, the drive wires 60 may include three drive wires, namely, the first drive wire 61, the second drive wire 62, and the third drive wire 63. The third drive wire 63 is arranged between the first drive wire 61 and the second drive wire 62. In this case, the first drive wire 61 and the second drive wire 62 are configured to be a combination of the furthermost ones of the drive wires 60. The third drive wire 63 includes a drive electrode end 63*a* and a drive pad end 63*b*. The distance DW4 between the drive electrode end 63*a* and the drive electrode end 61*a* of the first drive wire 61 is greater than the distance DW5 between the drive electrode end 63*a* and the drive electrode end 62*a* of the second drive wire 62. The position of the drive electrode end 63*a* in relation to the main surface drive electrode 41 may be changed in any manner. In an example, the drive electrode end 63*a* may be connected to the main surface drive electrode 41 so that the distance DW4 is equal to the distance DW5.

In FIG. 54, the drive electrode end 61*a* of the first drive wire 61, the drive electrode end 62*a* of the second drive wire 62, and the drive electrode end 63*a* of the third drive wire 63 are located at the same position in the longitudinal direction X. The state in which the drive electrode ends 61*a*, 62*a*, and 63*a* are located at the same position in the longitudinal direction X includes a state in which the drive electrode ends 61*a*, 62*a*, and 63*a* overlap with each other in the longitudinal direction X and a state in which the drive electrode ends 61*a*, 62*a*, and 63*a* partially overlap due to a manufacturing error caused by wire bonding. In other words, when a difference between the drive electrode ends 61*a*, 62*a*, and 63*a* in the longitudinal direction X is an extent of a variation caused when performing wire bonding, it is considered that the drive electrode ends 61*a*, 62*a*, and 63*a* are located at the same position in the longitudinal direction X.

In the longitudinal direction X, the drive pad end 63*b* of the third drive wire 63 is arranged on a portion of the drive pad 21 located closer to the semiconductor element 40 than the central portion of the drive pad 21 in the longitudinal direction X. A distance DW6 between the drive pad end 61*b* of the first drive wire 61 and the drive pad end 63*b* is greater than the distance DW4. A distance DW7 between the drive pad end 62*b* of the second drive wire 62 and the drive pad end 63*b* is greater than the distance DW5. In FIG. 54, the distance DW7 is greater than the distance DW6.

In a plan view, the first drive wire 61 and the third drive wire 63 are connected to the main surface drive electrode 41 and the drive pad 21 so that the first drive wire 61 and the third drive wire 63 are separated by a greater distance at the drive pad 21 than at the main surface drive electrode 41. In a plan view, the distance between the first drive wire 61 and the third drive wire 63 gradually increases from the main surface drive electrode 41 toward the drive pad 21. In a plan view, the third drive wire 63 and the second drive wire 62 are connected to the main surface drive electrode 41 and the drive pad 21 so that the third drive wire 63 and the second drive wire 62 are separated by a greater distance at the drive pad 21 than at the main surface drive electrode 41. In a plan view, the distance between the third drive wire 63 and the second drive wire 62 gradually increases from the main surface drive electrode 41 toward the drive pad 21.

In a plan view, the inclination angle of the third drive wire 63 with respect to the longitudinal direction X may be changed in any manner. In an example, in a plan view, the inclination angle of the third drive wire 63 with respect to the longitudinal direction X may be equal to the inclination angle of the first drive wire 61 with respect to the longitudinal direction X or the inclination angle of the second drive wire 62 with respect to the longitudinal direction X.

In the second example shown in FIG. 55, the semiconductor element 40 is square in a plan view. The main surface drive electrode 41 (source electrode) formed on the front surface 40a of the semiconductor element 40 is substantially square in a plan view. A cutaway portion 41b is formed in an end of the semiconductor element 40 located at the second side surface 40d and the third side surface 40e. The control electrode 43 is formed in the cutaway portion 41b. The opening 45 formed in the passivation film 44 is square in a plan view. In the same manner as the sixth embodiment, the opening 45 exposes a portion of the main surface drive electrode 41 and a portion of the control electrode 43. The main surface drive electrode 41 includes the exposed region 46 exposed by the opening 45.

In the second example shown in FIG. 55, the semiconductor device 1 includes the first drive wire 61, the second drive wire 62, the third drive wire 63, and the fourth drive wire 64 as the drive wires 60. The third drive wire 63 and the fourth drive wire 64 are arranged between the first drive wire 61 and the second drive wire 62. In this case, the first drive wire 61 and the second drive wire 62 are configured to be a combination of the furthermost ones of the drive wires 60. The first drive wire 61, the second drive wire 62, the third drive wire 63, and the fourth drive wire 64 are spaced apart from each other in the lateral direction Y. In a plan view, the first drive wire 61 is located closer to the third side surface 40e of the semiconductor element 40 than the second drive wire 62, the third drive wire 63, and the fourth drive wire 64 in the lateral direction Y The second drive wire 62 is located closer to the fourth side surface 40f of the semiconductor element 40 than the first drive wire 61, the third drive wire 63, and the fourth drive wire 64 in the lateral direction Y The third drive wire 63 is located closer to the third side surface 40e of the semiconductor element 40 than the fourth drive wire 64. As described above, the first drive wire 61 and the second drive wire 62, which are configured to be a combination of the furthermost ones of the drive wires 60, are the drive wires 60 that are located at opposite ends in the lateral direction Y.

The drive electrode end 61a of the first drive wire 61 is located closer to the third encapsulation resin side surface 53 than the drive pad end 61b of the first drive wire 61. Specifically, the drive electrode end 61a overlaps the coupling portion 23a of the drive lead 20 as viewed in the longitudinal direction X. As viewed in the longitudinal direction X, the drive pad end 61b overlaps the drive pad 21 between the coupling portion 23a and the coupling portion 23b.

The drive electrode end 62a of the second drive wire 62 is located closer to the third encapsulation resin side surface 53 than the drive pad end 62b of the second drive wire 62. Specifically, as viewed in the longitudinal direction X, the drive electrode end 62a overlaps the drive pad 21 between the coupling portion 23c and the coupling portion 23d. The drive pad end 62b overlaps the coupling portion 23e of the drive lead 20 as viewed in the longitudinal direction X.

The third drive wire 63 includes a drive electrode end 63a and a drive pad end 63b. The drive electrode end 63a is an end of the third drive wire 63 connected to the main surface drive electrode 41. The drive pad end 63b is an end of the third drive wire 63 connected to the drive pad 21. The drive electrode end 63a is arranged closer to the third encapsulation resin side surface 53 than the drive pad end 63b. Specifically, the drive electrode end 63a overlaps the coupling portion 23b of the drive lead 20 as viewed in the longitudinal direction X. The drive pad end 63b overlaps the drive pad 21 between the coupling portion 23b and the coupling portion 23c as viewed in the longitudinal direction X.

The fourth drive wire 64 includes a drive electrode end 64a and a drive pad end 64b. The drive electrode end 64a is an end of the fourth drive wire 64 connected to the main surface drive electrode 41. The drive pad end 64b is an end of the fourth drive wire 64 connected to the drive pad 21. The drive electrode end 64a is located closer to the third encapsulation resin side surface 53 than the drive pad end 64b. Specifically, as viewed in the longitudinal direction X, the drive electrode end 64a overlaps the drive pad 21 between the coupling portion 23b and the coupling portion 23c. The drive pad end 64b overlaps the drive pad 21 between the coupling portion 23c and the coupling portion 23d as viewed in the longitudinal direction X.

The drive electrode end 61a and the drive electrode end 63a are connected the main surface drive electrode 41 at positions closer to the first exposed end 46a than the central portion of the exposed region 46 in the lateral direction Y. The drive electrode end 61a is connected to a position closer to the first exposed end 46a than the drive electrode end 63a in the lateral direction Y The drive electrode end 64a and the drive electrode end 62a are connected to the exposed region 46 at positions closer to the second exposed end 46b than the central portion of the exposed region 46 in the lateral direction Y. The drive electrode end 62a is connected to a position closer to the second exposed end 46b than the drive electrode end 64a.

The drive electrode end 61a of the first drive wire 61 and the drive electrode end 64a of the fourth drive wire 64 are located at positions different from the drive electrode end 62a of the second drive wire 62 and the drive electrode end 63a of the third drive wire 63 in the longitudinal direction X. Specifically, the drive electrode ends 61a and 64a are located closer to the first side surface 40c of the semiconductor element 40 than the drive electrode ends 62a and 63a. Thus, the first drive wire 61 and the fourth drive wire 64 are longer than the second drive wire 62 and the third drive wire 63. The drive electrode end 61a and the drive electrode end 64a are located at the same position in the longitudinal direction X and arranged in the lateral direction Y. The drive electrode end 62a and the drive electrode end 63a are located at the same position in the longitudinal direction X and arranged in the lateral direction Y. The state in which the drive electrode ends 61a and 64a are located at the same position in the longitudinal direction X includes a state in which the drive electrode ends 61a and 64a overlap with each other in the longitudinal direction X and a state in which the drive electrode ends 61a and 64a partially overlap due to manufacturing error caused by wire bonding. In other words, when a difference between the drive electrode ends 61a and 64a in the longitudinal direction X is an extent of a variation caused when performing wire bonding, it is considered that the drive electrode ends 61a and 64a are located at the same position in the longitudinal direction X. Also, the state in which the drive electrode ends 62a and 63a are located at the same position in the longitudinal direction X includes a state in which the drive electrode ends 62a and 63a overlap with each other in the longitudinal direction X and a state in which the drive electrode ends 62a and 63a partially overlap due to a manufacturing error caused by wire bonding. In other words, when a difference between the drive electrode ends 62a and 63a in the longitudinal direction X is an extent of a variation caused when performing wire bonding, it is considered that the drive electrode ends 62a and 63a are located at the same position in the longitudinal direction X.

The positions of the drive electrode ends 61a to 64a in the longitudinal direction X may be changed in any manner. In an example, the positions of the drive electrode ends 61a to 64a may differ from each other. The drive electrode ends 61a to 64a may be located at the same position and arranged in the lateral direction Y.

A distance DW10 between the auxiliary line LS1, which extends from the drive electrode end 61a in the longitudinal direction X, and an auxiliary line LS9 extending from the drive electrode end 63a in the longitudinal direction X is less than a distance DW11 between the auxiliary line LS9 and the auxiliary line LS11, which extends from the drive electrode end 64a in the longitudinal direction X. A distance DW12 in the lateral direction Y between the auxiliary line LS3, which extends from the drive electrode end 62a in the longitudinal direction X, and the auxiliary line LS11 is slightly less than the distance DW10. The positions of the drive electrode ends 61a to 64a in the lateral direction Y may be changed in any manner as long as the drive electrode end 61a is located closest to the third encapsulation resin side surface 53 and the drive electrode end 62a is located closest to the fourth encapsulation resin side surface 54 among the drive electrode ends 61a to 64a. In an example, the drive electrode ends 61a to 64a may be arranged so that the distance DW12 is equal to the distance DW10.

The distance DY1 in the lateral direction Y between the auxiliary line LS1 and the auxiliary line LS2, which extends from the drive pad end 61b in the longitudinal direction X, is less than the distance DY2 in the lateral direction Y between the auxiliary line LS3 and the auxiliary line LS4, which extends from the drive pad end 62b in the longitudinal direction X. The distance DY3 in the lateral direction Y between the auxiliary line LS9 and the auxiliary line LS10, which extends from the drive pad end 63b in the longitudinal direction X, is less than the distance DY4 in the lateral direction Y between the auxiliary line LS11 and the auxiliary line LS12, which extends from the drive pad end 64b in the longitudinal direction X. In FIG. 55, the distance DY1 is less than the distance DY3. The distance DY2 is greater than the distance DY4.

The drive electrode end 61a may be arranged at the limit position toward the third side surface 40e in a region where wire bonding is performable in an end of the opening 45 located toward the third side surface 40e of the semiconductor element 40 in the lateral direction Y. The drive pad end 61b may be arranged at the limit position toward the third encapsulation resin side surface 53 in a region of the first end 21a of the drive pad 21 where wire bonding is performable.

The drive electrode end 62a may be arranged at the limit position toward the fourth side surface 40f in a region where wire bonding is performable in an end of the opening 45 located toward the fourth side surface 40f of the semiconductor element 40 in the lateral direction Y. The drive pad end 62b may be arranged at the limit position toward the fourth encapsulation resin side surface 54 in a region of the second end 21b of the drive pad 21 where wire bonding is performable.

In a plan view, the first drive wire 61 and the second drive wire 62 are connected to the main surface drive electrode 41 and the drive pad 21 so that the first drive wire 61 and the second drive wire 62 are separated by a greater distance at the drive pad 21 than at the main surface drive electrode 41. In a plan view, the distance between the first drive wire 61 and the second drive wire 62 gradually increases from the main surface drive electrode 41 toward the drive pad 21. In a plan view, the first drive wire 61 and the third drive wire 63 are connected to the main surface drive electrode 41 and the drive pad 21 so that the first drive wire 61 and the third drive wire 63 are separated by a greater distance at the drive pad 21 than at the main surface drive electrode 41. In a plan view, the distance in the lateral direction Y between the first drive wire 61 and the third drive wire 63 gradually increases from the main surface drive electrode 41 toward the drive pad 21. In a plan view, the third drive wire 63 and the fourth drive wire 64 are connected to the main surface drive electrode 41 and the drive pad 21 so that the third drive wire 63 and the fourth drive wire 64 are separated by a greater distance at the drive pad 21 than at the main surface drive electrode 41. In a plan view, the distance in the lateral direction Y between the third drive wire 63 and the fourth drive wire 64 gradually increases from the main surface drive electrode 41 toward the drive pad 21. In a plan view, the fourth drive wire 64 and the second drive wire 62 are connected to the main surface drive electrode 41 and the drive pad 21 so that the fourth drive wire 64 and the second drive wire 62 are separated by a greater distance at the drive pad 21 than at the main surface drive electrode 41. In a plan view, the distance in the lateral direction Y between the fourth drive wire 64 and the second drive wire 62 gradually increases from the main surface drive electrode 41 toward the drive pad 21. In a plan view, the third drive wire 63 and the second drive wire 62 are connected to the main surface drive electrode 41 and the drive pad 21 so that the third drive wire 63 and the second drive wire 62 are separated by a greater distance at the drive pad 21 than at the main surface drive electrode 41. In a plan view, the distance in the lateral direction Y between the third drive wire 63 and the second drive wire 62 gradually increases from the main surface drive electrode 41 toward the drive pad 21.

The drive electrode end 91 of the sense wire 90 is connected to a portion of the main surface drive electrode 41 between the control electrode end 71 of the control wire 70 and the drive electrode end 61a of the first drive wire 61 in the lateral direction Y. The drive electrode end 91 is connected to an end of the main surface drive electrode 41 located toward the second side surface 40d. More specifically, the drive electrode end 91 is connected to a portion of the main surface drive electrode 41 located next to the control electrode 43 in the lateral direction Y. This configuration shortens the sense wire 90.

The material and diameter of the drive wires 60, the control wire 70, and the sense wire 90 may be changed in any manner. In an example, at least one of the drive wires 60, the control wire 70, and the sense wire 90 may have a diameter that is different from that of the others. At least one of the drive wires 60, the control wire 70, and the sense wire 90 may be formed of a material that is different from that of others.

The position of the sense pad 81 in the thickness-wise direction Z may be changed in any manner. The position of the sense pad 81 may be different from that of at least one of the drive pad 21 or the control pad 31 in the thickness-wise direction Z. In an example, the sense pad 81 and the semiconductor element 40 are located at the same position in the thickness-wise direction Z.

The first wide portion 111f may be omitted from the inner body 111 of the substrate 10. In this case, the projection 112 may be in contact with the first encapsulation resin side surface 51 of the encapsulation resin 50 in the longitudinal direction X.

The second wide portion 111g may be omitted from the inner body 111 of the substrate 10.

Figure 56:
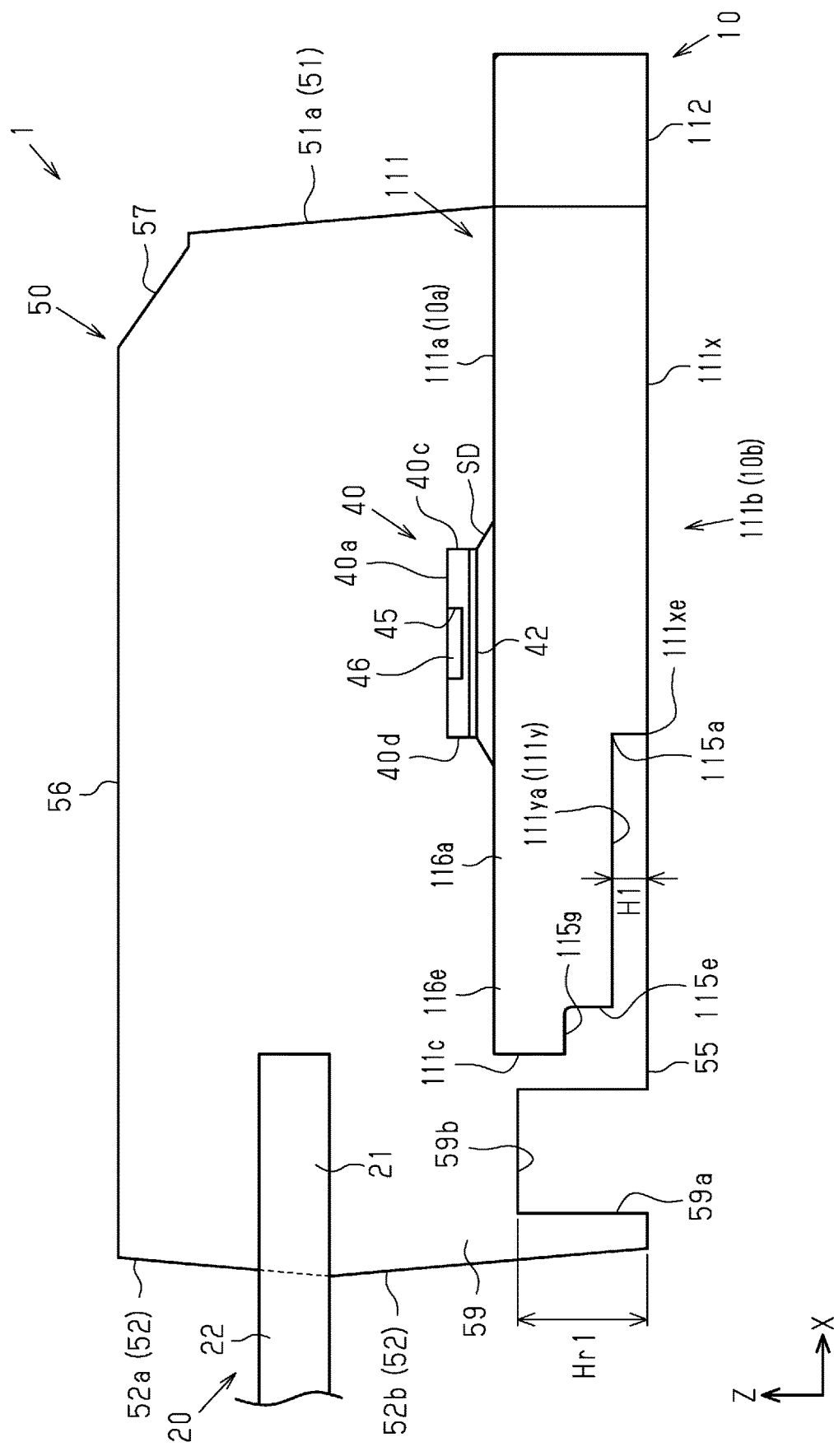
FIG. 56 is a schematic cross-sectional view showing a modified example of the semiconductor device of the sixth embodiment.

As shown in FIG. 56, the encapsulation resin 50 may include an encapsulation portion 59, which is a portion located toward the second encapsulation resin side surface 52 from the first side surface 111c of the inner body 111 and toward the encapsulation resin rear surface 55 from the drive pad 21, the control pad 31, and the sense pad 81. The encapsulation portion 59 may include a recess 59a. The recess 59a is spaced apart from the first side surface 111c of the inner body 111 in the longitudinal direction X.

The recess 59a is recessed from the encapsulation resin rear surface 55 toward the encapsulation resin top surface 56 in the thickness-wise direction Z. The recess 59a extends from the third encapsulation resin side surface 53 to the fourth encapsulation resin side surface 54 in the lateral direction Y. As viewed in the thickness-wise direction Z, the recess 59a overlaps with the drive pad 21, the control pad 31, and the sense pad 81. In an example, as shown in FIG. 56, the recess 59a is rectangular in a cross-sectional view of a plane extending in the longitudinal direction X and the thickness-wise direction Z. The recess 59a has a depth Hr1 that is, for example, greater than the depth H1 of the indent 115. Also, the depth Hr1 is greater than the depths H2 and H3 of the indents 115b and 115c (refer to FIG. 50).

The recess 59a includes a bottom surface 59b. The bottom surface 59b is located closer to the encapsulation resin top surface 56 than the second surface 115g of the indent 115e. The bottom surface 59b is located closer to the encapsulation resin rear surface 55 than the main surface 111a of the inner body 111. The position of the bottom surface 59b in the thickness-wise direction Z, that is, the depth Hr1 of the recess 59a, may be changed in any manner. In an example, the bottom surface 59b may be located at the same position as the main surface 111a of the inner body 111 in the thickness-wise direction Z or may be located closer to the encapsulation resin top surface 56 than the main surface 111a.

In a cross-sectional view of a plane extending in the longitudinal direction X and the thickness-wise direction Z, the shape of the recess 59a may be changed in any manner. In an example, the recess 59a may be curved or V-shaped in a cross-sectional view of a plane extending in the longitudinal direction X and the thickness-wise direction Z.

Figure 57:
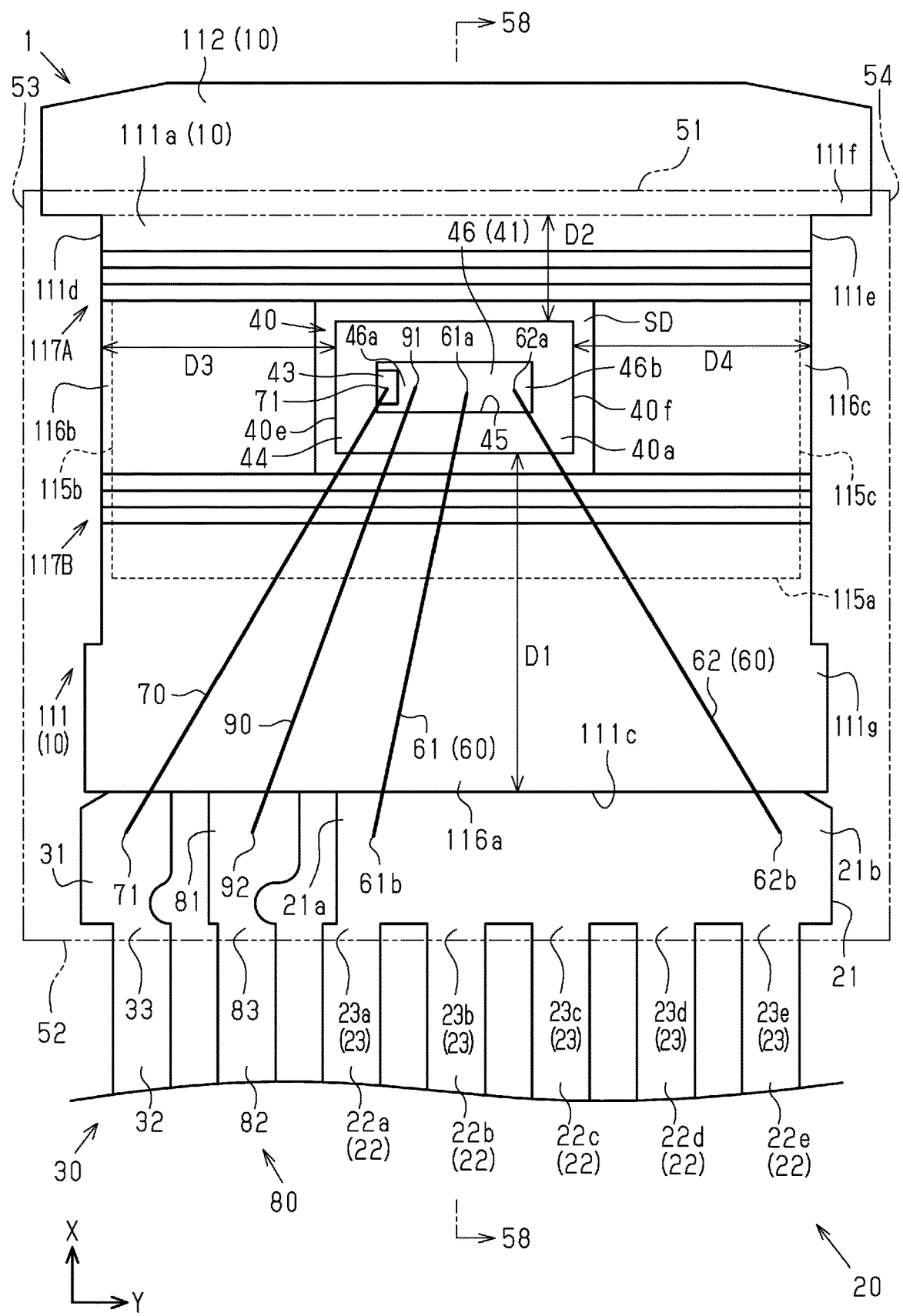
FIG. 57 is an enlarged view showing a semiconductor element and its surroundings in a modified example of the semiconductor device of the sixth embodiment.

In the sixth embodiment and the modified examples of the sixth embodiment, the position of the semiconductor element 40 in the longitudinal direction X may be changed in any manner. In an example, as shown in FIG. 57, the semiconductor element 40 is located on a portion of the main surface 111a of the inner body 111 located toward the first encapsulation resin side surface 51 in the longitudinal direction X. More specifically, in plan view, the first distance D1 between the semiconductor element 40 and the first side surface 111c of the inner body 111 is greater than the second distance D2 between the semiconductor element 40 and the first wide portion 111f.

The semiconductor element 40 is located on a central portion of the inner body 111 in the lateral direction Y. Specifically, the third distance D3 between the semiconductor element 40 and the second side surface 111d of the inner body 111 is equal to the fourth distance D4 between the semiconductor element 40 and the third side surface 111e of the inner body 111. When a difference between the third distance D3 and the fourth distance D4 is, for example, within 5% of the third distance D3, it is considered that the third distance D3 is equal to the fourth distance D4. In the present embodiment, the first distance D1 is greater than the third distance D3 and the fourth distance D4. The second distance D2 is less than the third distance D3 and the fourth distance D4.

As shown in FIG. 57, a groove 117A extends in the main surface 111a of the inner body 111 at a position closer to the first encapsulation resin side surface 51 than the semiconductor element 40. A groove 117B extends in the main surface 111a of the inner body 111 at a position closer to the second encapsulation resin side surface 52 than the semiconductor element 40. The grooves 117A and 117B abut the solder SD in the longitudinal direction X. The grooves 117A and 117B extend from the second side surface 111d to the third side surface 111e of the inner body 111 in the lateral direction Y. The groove 117A receives the solder SD, thereby limiting ingress of the solder SD toward the first encapsulation resin side surface 51 from the groove 117A. Also, the groove 117B receives the solder SD, thereby limiting ingress of the solder SD toward the second encapsulation resin side surface 52 from the groove 117B.

Figure 58:
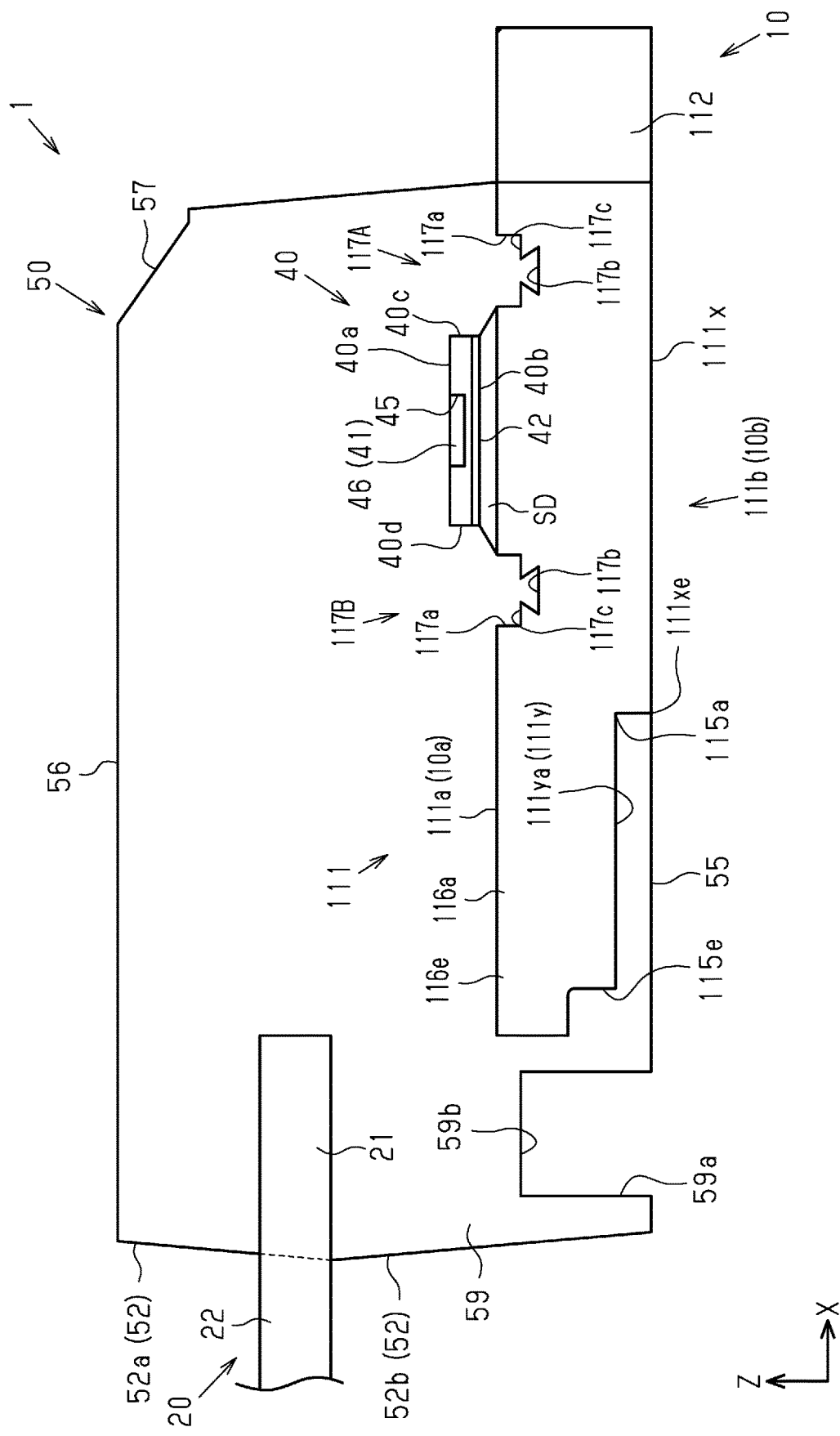
FIG. 58 is a schematic cross-sectional view taken along line 58-58 in FIG. 57.

As shown in FIGS. 57 and 58, the grooves 117A and 117B are identical in shape. An example of the groove 117A will be described below. The same reference characters are given to the groove 117A and the groove 117B, and description of the groove 117B will be omitted.

As shown in FIG. 58, the groove 117A has a first groove portion 117a and a second groove portion 117b. The first groove portion 117a is recessed from the main surface 111a to the rear surface 111b of the inner body 111. The first groove portion 117a is rectangular in a cross-sectional view of the semiconductor device 1 taken along a plane extending in the longitudinal direction X and the thickness-wise direction Z. The second groove portion 117b is recessed from a bottom surface 117c of the first groove portion 117a toward the rear surface 111b. The second groove portion 117b is tapered from the rear surface 111b toward the main surface 111a in a cross-sectional view of the semiconductor device 1 taken along a plane extending in the longitudinal direction X and the thickness-wise direction Z.

The encapsulation resin 50 is partially received in the grooves 117A and 117B. In this configuration, separation of the substrate 10 from the encapsulation resin 50 is further limited by the encapsulation resin 50 that is received in the grooves 117A and 117B. In addition, the encapsulation resin 50 is received in the second groove portion 117b that is tapered from the rear surface 111b toward the main surface 111a. This further limits separation of the substrate 10 from the encapsulation resin 50 in the thickness-wise direction Z.

The shapes of the grooves 117A and 117B may be changed in any manner. In an example, in at least one of the grooves 117A and 117B, the first groove portion 117a may be curved or tapered from the main surface 111a toward the rear surface 111b in a cross-sectional view of the semiconductor device 1 taken along a plane extending in the longitudinal direction X and the thickness-wise direction Z. In at least one of the grooves 117A and 117B, the second groove portion 117b may be rectangular, curved, or V-shaped to be tapered from the main surface 111a toward the rear surface 111b in a cross-sectional view of the semiconductor device 1 taken along a plane extending in the longitudinal direction X and the thickness-wise direction Z. The second groove portion 117*b* may be omitted from at least one of the grooves 117A and 117B.

At least one of the indents 115*b* and 115*c* may be omitted.

The depths H1, H2, and H3 of the indents 115*a*, 115*b*, and 115*c* may be changed in any manner. In an example, at least one of the depths H1, H2, and H3 of the indents 115*a*, 115*b*, and 115*c* is greater than or equal to one-third of the thickness T of the substrate 10 and less than the thickness T. This configuration allows a portion of the encapsulation resin 50 to be readily received in the at least one of the indents 115*a*, 115*b*, and 115*c*. As a result, the formation of the encapsulation resin 50 is improved, thereby improving the throughput yield of the semiconductor device 1. In an example, at least one of the depths H1, H2, and H3 of the indents 115*a*, 115*b*, and 115*c* may be greater than or equal to one-third of the thickness T of the substrate 10 and less than or equal to one-half of the thickness T. This configuration improves both the throughput yield of the semiconductor device 1 and the heat dissipation performance of the inner body 111.

The depth H1 of the indent 115*a* may differ from the depths H2 and H3 of the indents 115*b* and 115*c*. In an example, the depth H1 is less than the depths H2 and H3. In this configuration, the thickness T1 of the first thin portion 116*a* is greater than each of the thickness T2 of the second thin portion 116*b* and the thickness T3 of the third thin portion 116*c*. Thus, the volume of the inner body 111 is increased as compared to a configuration in which the thicknesses T1, T2, and T3 are equal to each other. As a result, the heat dissipation performance of the inner body 111 is improved. In an example, the depth H1 is greater than the depths H2 and H3. This configuration allows a portion of the encapsulation resin 50 to be readily received in the indent 115*a*. As a result, the formation of the encapsulation resin 50 is improved, thereby improving the throughput yield of the semiconductor device 1.

At least one of the substrate 10, the drive pad 21, the control pad 31, and the sense pad 81 may be formed by a separate metal plate. For example, the substrate 10 and the drive pad 21 may be formed from the same metal plate, and the control pad 31 and the sense pad 81 may be formed from a separate metal plate.

Modified Examples of Each Embodiment

The semiconductor device 1 of the embodiments described above may be modified, for example, as follows. The modified examples described below may be combined with one another as long as there is no technical inconsistency. The modified examples of the fifth embodiment may be combined with the modified examples of the sixth embodiment.

In the embodiment, the positions of the drive pad 21 and the control pad 31 in the thickness-wise direction Z may be changed in any manner. In an example, at least one of the drive pad 21 and the control pad 31 may be located at the same position as the semiconductor element 40 in the thickness-wise direction Z.

In the embodiments and the modified examples, the positions of the drive pad 21 and the control pad 31 in a plan view may be changed in any manner. In an example, the position of at least one of the drive pad 21 and the control pad 31 may differ from that of the substrate 10 in the lateral direction Y. More specifically, at least one of the drive pad 21 or the control pad 31 may be located toward the third encapsulation resin side surface 53 or the fourth encapsulation resin side surface 54 of the encapsulation resin 50 from the substrate 10. Thus, the position of at least one of the drive pad 21 or the control pad 31 may differ from that of the semiconductor element 40 in the lateral direction Y.

In the embodiments and the modified examples, the drive wires 60 and the control wire 70 may be formed of different metals. In an example, the drive wires 60 are formed of aluminum, and the control wire 70 is formed of gold (Au).

In the embodiments and the modified examples, the diameter of each drive wire 60 may differ from the diameter of the control wire 70. In an example, the diameter of the drive wire 60 is larger than the diameter of the control wire 70.

In the embodiments and the modified example, the diameter of each drive wire 60 is not limited to 125 µm to 250 µm and may be changed in any manner. In an example, the diameter of the drive wire 60 is 250 µm to 400 µm.

Figure 59:
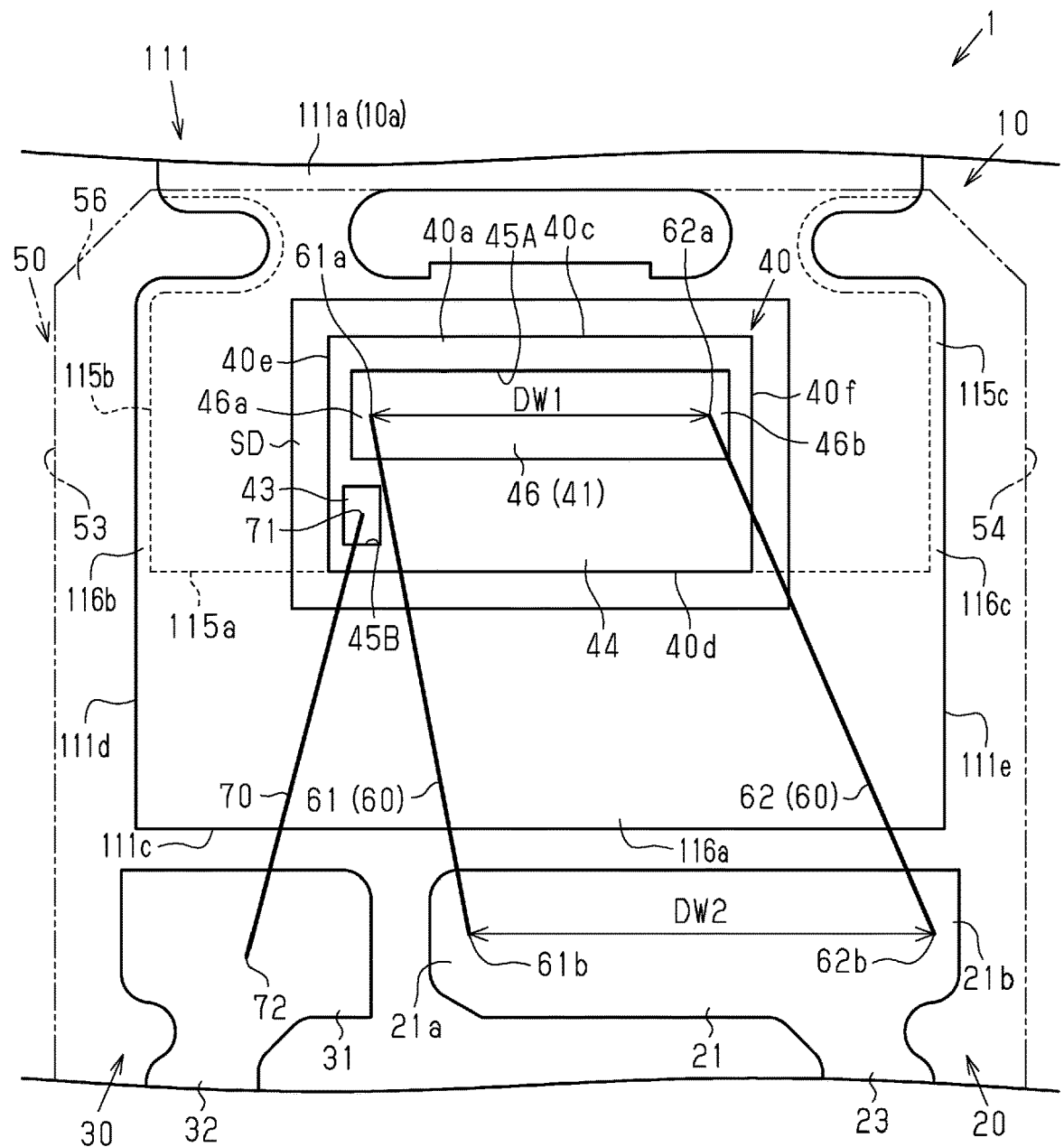
FIG. 59 is an enlarged view showing a semiconductor element and its surroundings in a modified example of the semiconductor device of each embodiment.

In the embodiments and the modified examples, the semiconductor element 40 is configured so that the main surface drive electrode 41 and the control electrode 43 are exposed by the single rectangular opening 45 in a plan view. However, the number of openings 45 is not limited to one. For example, as shown in FIG. 59, the front surface 40*a* of the semiconductor element 40 may include a first opening 45A that exposes the main surface drive electrode 41 and a second opening 45B that exposes the control electrode 43. In a plan view, the first opening 45A is rectangular so that a long-side direction conforms to the lateral direction Y and a short-side direction conforms to the longitudinal direction X. In a plan view, the second opening 45B is rectangular so that a long-side direction conforms to the longitudinal direction X and a short-side direction conforms to the lateral direction Y. The first opening 45A is located toward the first side surface 40*c* of the semiconductor element 40 in the longitudinal direction X. The first opening 45A is formed in a large portion of the front surface 40*a* of the semiconductor element 40 in the lateral direction Y. The second opening 45B is formed in an end of the semiconductor element 40 located at the second side surface 40*d* and the third side surface 40*e*.

The main surface drive electrode 41 includes the exposed region 46 exposed by the first opening 45A. The exposed region 46 includes a first exposed end 46*a* and a second exposed end 46*b* that are opposite ends in the lateral direction Y. The first exposed end 46*a* is an end of the exposed region 46 located toward the third side surface 40*e* of the semiconductor element 40. The second exposed end 46*b* is an end of the exposed region 46 located toward the fourth side surface 40*f* of the semiconductor element 40.

The first drive wire 61 and the second drive wire 62 are connected to the exposed region 46 of the main surface drive electrode 41 and the drive pad 21 of the drive lead 20. In a plan view, a distance DW2 between the drive pad end 61*b* and the drive pad end 62*b* is greater than a distance DW1 between the drive electrode end 61*a* and the drive electrode end 62*a*. In FIG. 59, in a plan view, the first drive wire 61 and the second drive wire 62 are connected to the main surface drive electrode 41 and the drive pad 21 so that the third drive wire 63 and the second drive wire 62 are separated by a greater distance at the drive pad 21 than at the main surface drive electrode 41. In a plan view, the distance between the first drive wire 61 and the second drive wire 62 gradually increases from the main surface drive electrode 41 toward the drive pad 21. The first drive wire 61 and the second drive wire 62 may be connected to the main surface drive electrode 41 and the drive pad 21 so that in a plan view, the distance between the first drive wire 61 and the second drive wire 62 gradually decreases from the main surface drive electrode 41 toward the drive pad 21.

The drive electrode end 61*a* of the first drive wire 61 is located closer to the first exposed end 46*a* than a central portion of the exposed region 46 in the lateral direction Y. In FIG. 59, the drive electrode end 61*a* is connected to the first exposed end 46*a* of the exposed region 46. In an example, the drive electrode end 61*a* is arranged at the limit position toward the third side surface 40*e* in a region of the first exposed end 46*a* of the exposed region 46 where wire bonding is performable.

The drive pad end 61*b* of the first drive wire 61 is connected to the drive pad 21 at a position closer to the first end 21*a* than a central portion of the drive pad 21 in the lateral direction Y. In FIG. 59, the drive pad end 61*b* is connected to the first end 21*a* of the drive pad 21. In an example, the drive pad end 61*b* is arranged at the limit position toward the third encapsulation resin side surface 53 in a region of the first end 21*a* of the drive pad 21 where wire bonding is performable. In the longitudinal direction X, the drive pad end 61*b* is connected to a portion of the drive pad 21 located closer to the semiconductor element 40 than the center of the drive pad 21 in the longitudinal direction X. The drive pad end 61*b* is located closer to the fourth encapsulation resin side surface 54 than the drive electrode end 61*a*.

The drive electrode end 62*a* of the second drive wire 62 is located closer to the exposed region 46 than a central portion of the second exposed end 46*b* in the lateral direction Y. In FIG. 59, the drive electrode end 62*a* is connected to the second exposed end 46*b* of the exposed region 46. In an example, the drive electrode end 62*a* is arranged at the limit position toward the fourth side surface 40*f* in a region of the second exposed end 46*b* of the exposed region 46 where wire bonding is performable. The drive electrode end 62*a* and the drive electrode end 61*a* of the first drive wire 61 are located at the same position in the longitudinal direction X and arranged in the lateral direction Y. The state in which the drive electrode end 62*a* and the drive electrode end 61*a* are located at the same position in the longitudinal direction includes a state in which the drive electrode ends 61*a* and 62*a* overlap with each other in the longitudinal direction X and a state in which the drive electrode ends 61*a* and 62*a* partially overlap due to a manufacturing error caused by wire bonding. In other words, when a difference between the drive electrode ends 61*a* and 62*a* in the longitudinal direction X is an extent of a variation caused when performing wire bonding, it is considered that the drive electrode ends 61*a* and 62*a* are located at the same position in the longitudinal direction X.

The drive pad end 62*b* of the second drive wire 62 is connected to the drive pad 21 at a position closer to the second end 21*b* than the central portion of the drive pad 21 in the lateral direction Y. In FIG. 59, the drive pad end 62*b* is connected to the second end 21*b* of the drive pad 21. In an example, the drive pad end 62*b* is arranged at the limit position toward the fourth encapsulation resin side surface 54 in a region of the second end 21*b* of the drive pad 21 where wire bonding is performable. In the longitudinal direction X, the drive pad end 62*b* is connected to a portion of the drive pad 21 located closer to the semiconductor element 40 than the center of the drive pad 21 in the longitudinal direction X. The drive pad end 62*b* is located closer to the fourth encapsulation resin side surface 54 than the drive electrode end 62*a*. In FIG. 59, the drive pad end 62*b* and the drive pad end 61*b* are located at the same position in the longitudinal direction X and arranged in the lateral direction Y. The state in which the drive pad end 62*b* and the drive pad end 61*b* are located at the same position in the longitudinal direction X includes a state in which the drive pad ends 61*b* and 62*b* overlap with each other in the longitudinal direction X and a state in which the drive pad ends 61*b* and 62*b* partially overlap due to a manufacturing error caused by wire bonding. In other words, a difference between the drive pad ends 61*b* and 62*b* in the longitudinal direction X is an extent of a variation caused when performing wire bonding, it is considered that the drive pad ends 61*b* and 62*b* are located at the same position in the longitudinal direction X.

This configuration increases the distance DW1 between the drive electrode end 61*a* of the first drive wire 61 and the drive electrode end 62*a* of the second drive wire 62, thereby decreasing the inductance between the main surface drive electrode 41 and the drive pad 21.

Figure 60:
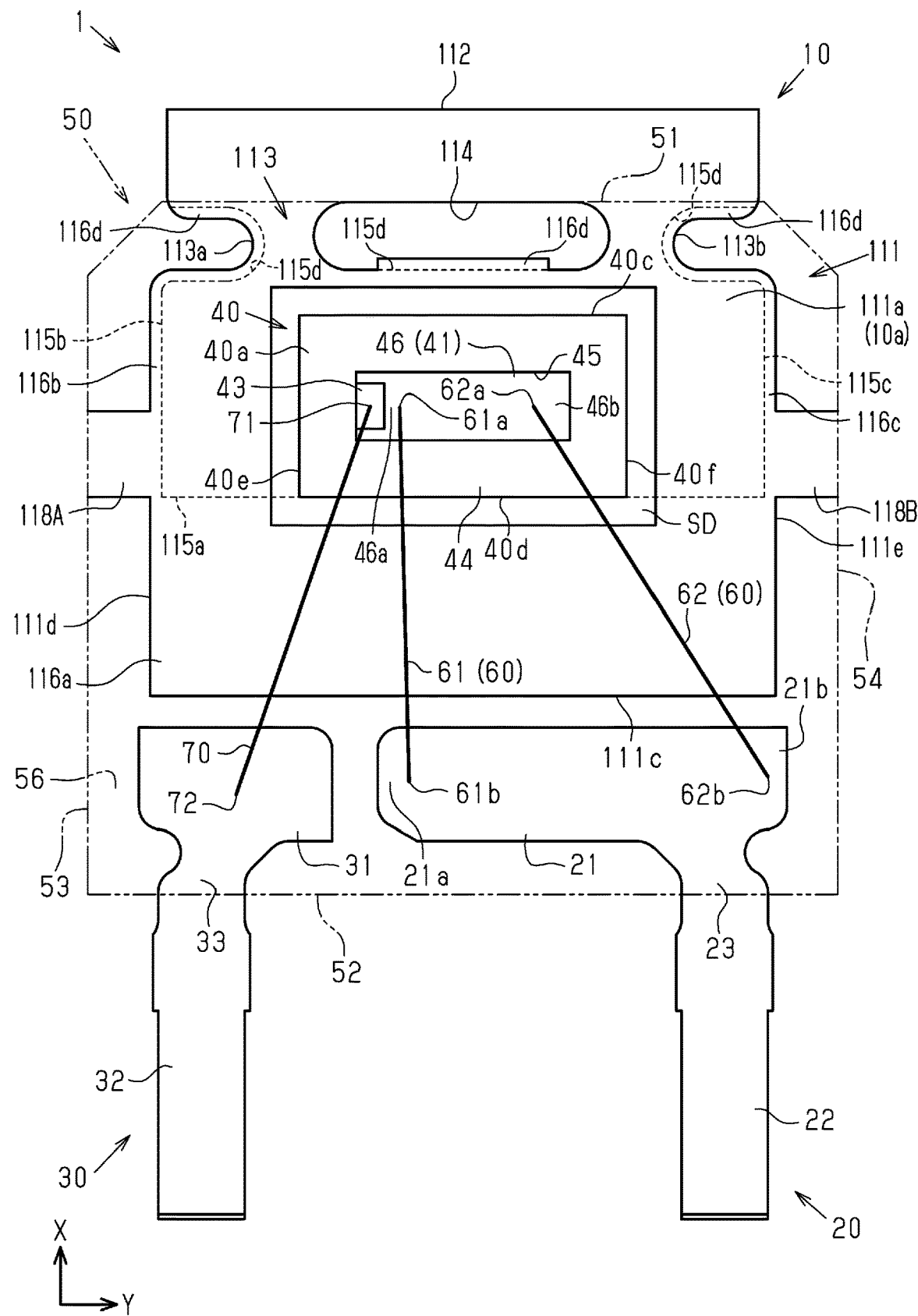
FIG. 60 is an enlarged view showing a semiconductor element and its surroundings in a modified example of the semiconductor device of each embodiment.

In the embodiments and the modified examples, the shape of the inner body 111 may be changed in any manner. In an example, as shown in FIG. 60, the inner body 111 may further include extensions 118A and 118B. The extensions 118A and 118B are arranged on portions of the inner body 111 located closer to the first wide portion 111*f* than the indent 115*a* in the longitudinal direction X. The extension 118A extends from the second side surface 111*d* of the inner body 111 toward the third encapsulation resin side surface 53 in the lateral direction Y. The extension 118B extends from the third side surface 111*e* of the inner body 111 toward the fourth encapsulation resin side surface 54 in the lateral direction Y. The extensions 118A and 118B are rectangular in a plan view.

Figure 61:
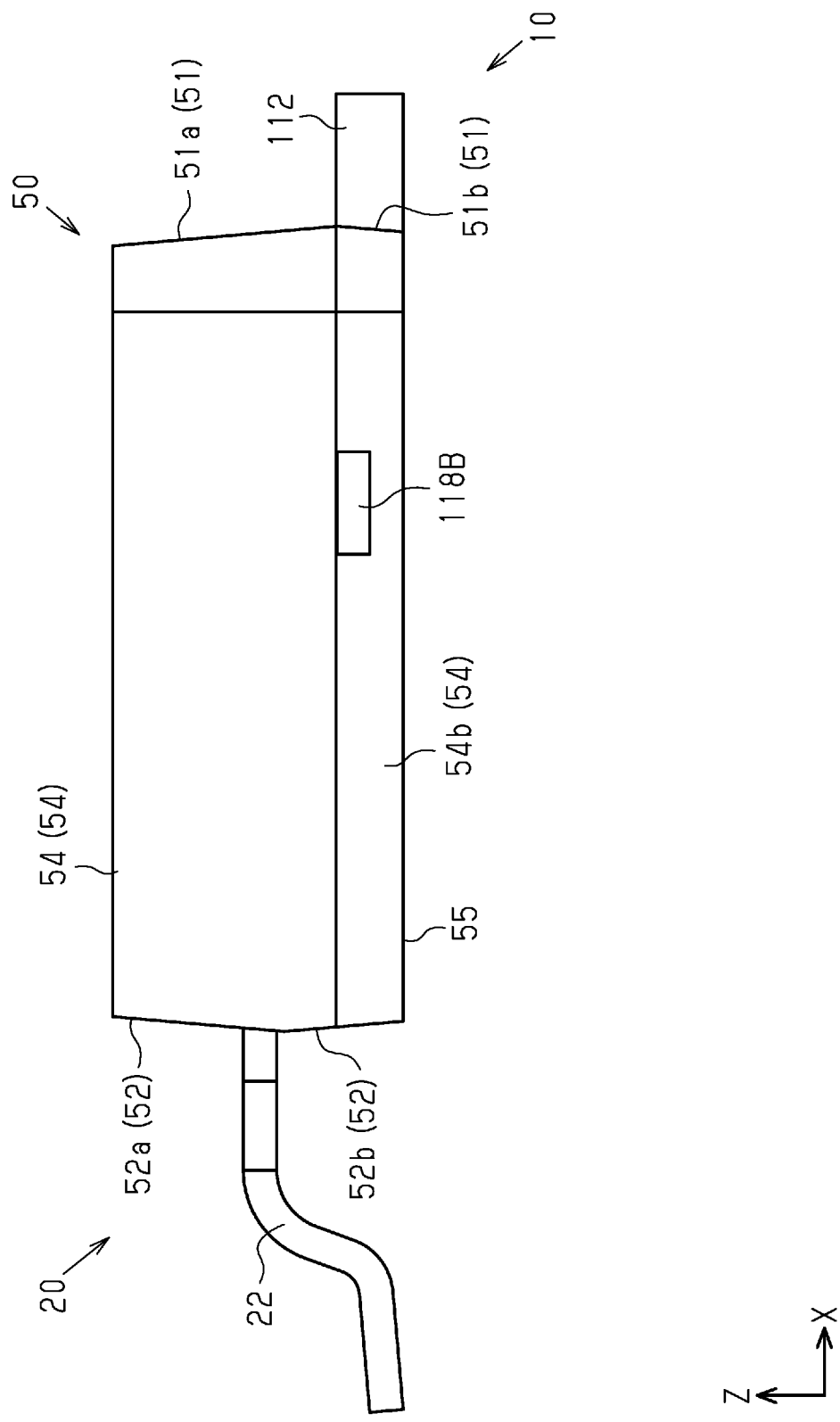
FIG. 61 is a side view of the semiconductor device shown in FIG. 60.

As shown in FIG. 61, the extension 118B is exposed from the fourth encapsulation resin side surface 54. Specifically, the extension 118B is exposed from an end of the second inclined surface 54*b* of the fourth encapsulation resin side surface 54 located toward the first inclined surface 54*a* in the thickness-wise direction Z. The extension 118B may be flush with the fourth encapsulation resin side surface 54. Although not shown in the drawings, the extension 118A is exposed from the third encapsulation resin side surface 53 in the same manner. Specifically, the extension 118A is exposed from an end of the second inclined surface 53*b* of the third encapsulation resin side surface 53 located toward the first inclined surface 53*a* in the thickness-wise direction Z. The extension 118A may be flush with the third encapsulation resin side surface 53.

The positions of the extensions 118A and 118B in the longitudinal direction X may be changed in any manner. At least one of the extensions 118A and 118B may be located at a position overlapping with the indent 115*a* of the inner body 111 in the lateral direction Y.

Figure 62:
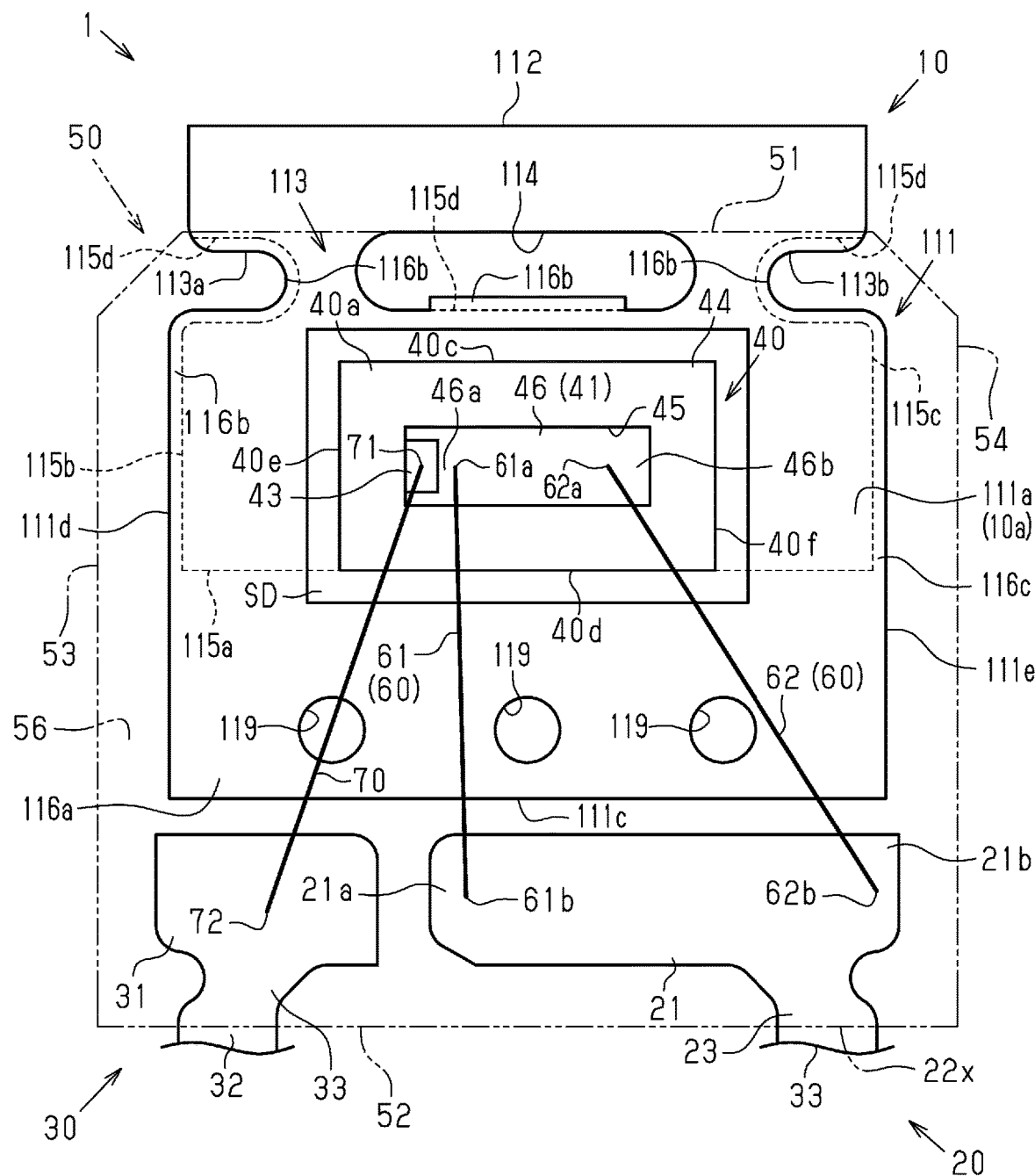
FIG. 62 is an enlarged view showing a semiconductor element and its surroundings in a modified example of the semiconductor device of each embodiment.

In the embodiments and the modified examples, the first thin portion 116*a* may include one or more through holes 119 extending through the first thin portion 116*a* in the thickness-wise direction Z. In an example, as shown in FIG. 62, the first thin portion 116*a* includes three through holes 119. The three through holes 119 are spaced apart from each other in the lateral direction Y Each through hole 119 is circular in a plan view. The through hole 119 partially receives the encapsulation resin 50. In this configuration, separation of the substrate 10 from the encapsulation resin 50 is further limited by the encapsulation resin 50 that is received in the through holes 119. The shape of the through holes 119 in a plan view may be changed in any manner. The position of the through holes 119 in relation to the first thin portion 116*a* may be changed in any manner.

Figure 63:
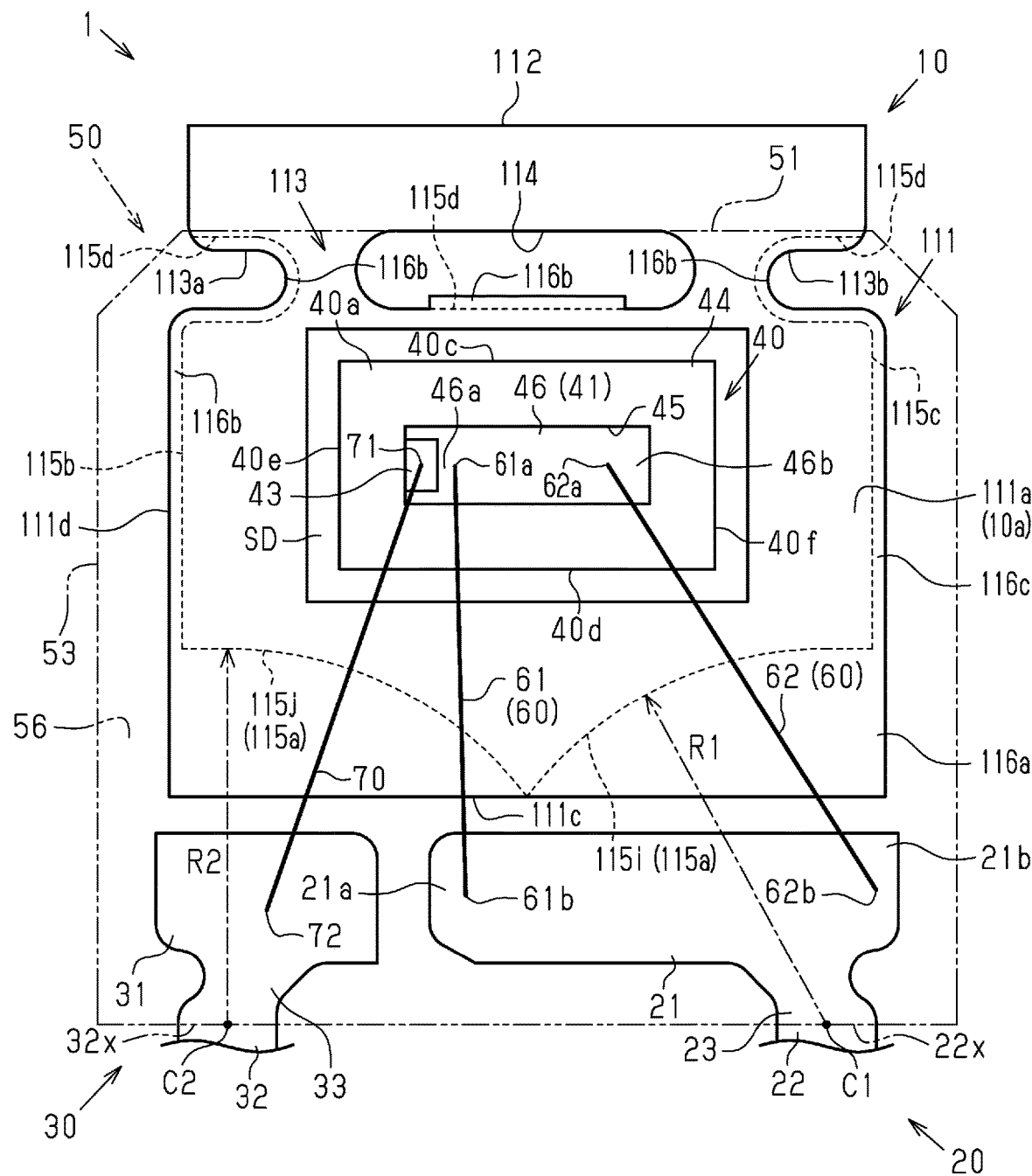
FIG. 63 is an enlarged view showing a semiconductor element and its surroundings in a modified example of the semiconductor device of each embodiment.

In the embodiments and the modified examples, the shape of the indent 115a may be changed in any manner. In an example, as shown in FIG. 63, the indent 115a includes a drive lead indent 115i and a control lead indent 115j. In a plan view, the drive lead indent 115i is shaped as an arc having a center C1 conforming to the central portion of the terminal base end 22x of the drive terminal 22 of the drive lead 20 in the lateral direction Y. In a plan view, the control lead indent 115j is shaped as an arc having a center C2 conforming to the central portion of a terminal base end 32x of the control terminal 32 of the control lead 30 in the lateral direction Y. In FIG. 63, a radius R1 of the drive lead indent 115i is equal to a radius R2 of the control lead indent 115j. When a difference between the radius R1 and the radius R2 is within 5%, it is considered that the radius R1 is equal to the radius R2.

In this configuration, the distance DP1, that is, the shortest distance from the second encapsulation resin side surface 52 to the rear surface 10b of the substrate 10 (the exposed surface 111x of the inner body 111) in the longitudinal direction X, is substantially equal to the radius R1 of the drive lead indent 115i and has substantially the same length as that in the embodiments. Therefore, while the creepage distance DP is increased in the same manner as the embodiments, the volume of the inner body 111 is increased from that in the embodiments. This improves the heat dissipation performance of the substrate 10.

The radius R1 of the drive lead indent 115i and the radius R2 of the control lead indent 115j may be changed in any manner. In an example, the distance from the center C1 to the second side surface 40d of the semiconductor element 40 in the longitudinal direction X may be set to the radius R1. Also, the distance from the center C1 to the second side surface 40d in the longitudinal direction X may be set to the radius R2. In this case, the contact point of the drive lead indent 115i and the control lead indent 115j (intersection of the drive lead indent 115i and the control lead indent 115j in a plan view) is located closer to the semiconductor element 40 than the first side surface 111c of the inner body 111 in the longitudinal direction X. This configuration increases the creepage distance DP, thereby improving the dielectric strength of the semiconductor device 1.

In the embodiments and the modified examples, the dimension L2 of the second thin portion 116b and the dimension L3 of the third thin portion 116c may be changed in any manner in a range less than the dimension L1 of the first thin portion 116a. For example, the dimension L2 may be greater than one-half of the second distance D2. The dimension L3 may be greater than one-half of the third distance D3. Preferably, as viewed in the thickness-wise direction Z, the indent 115b forming the second thin portion 116b is located at the same position as the third side surface 40e of the semiconductor element 40 or a position closer to the third encapsulation resin side surface 53 than the third side surface 40e of the semiconductor element 40. Also, preferably, as viewed in the thickness-wise direction Z, the indent 115c forming the third thin portion 116c is located at the same position as the fourth side surface 40f of the semiconductor element 40 or a position closer to the fourth encapsulation resin side surface 54 than the fourth side surface 40f of the semiconductor element 40.

In the embodiments and the modified examples, one drive wire 60 may be used instead of the multiple drive wires 60. In this case, for example, when the drive wire 60 includes the first drive wire 61, the drive electrode end 61a is connected to a central portion of the exposed region 46 of the semiconductor element 40 in the lateral direction Y, and the drive pad end 61b is connected to a central portion of the drive pad 21 in the lateral direction Y. Instead of the drive wires 60, ribbon-shaped connecting members may be used.

Figure 64:
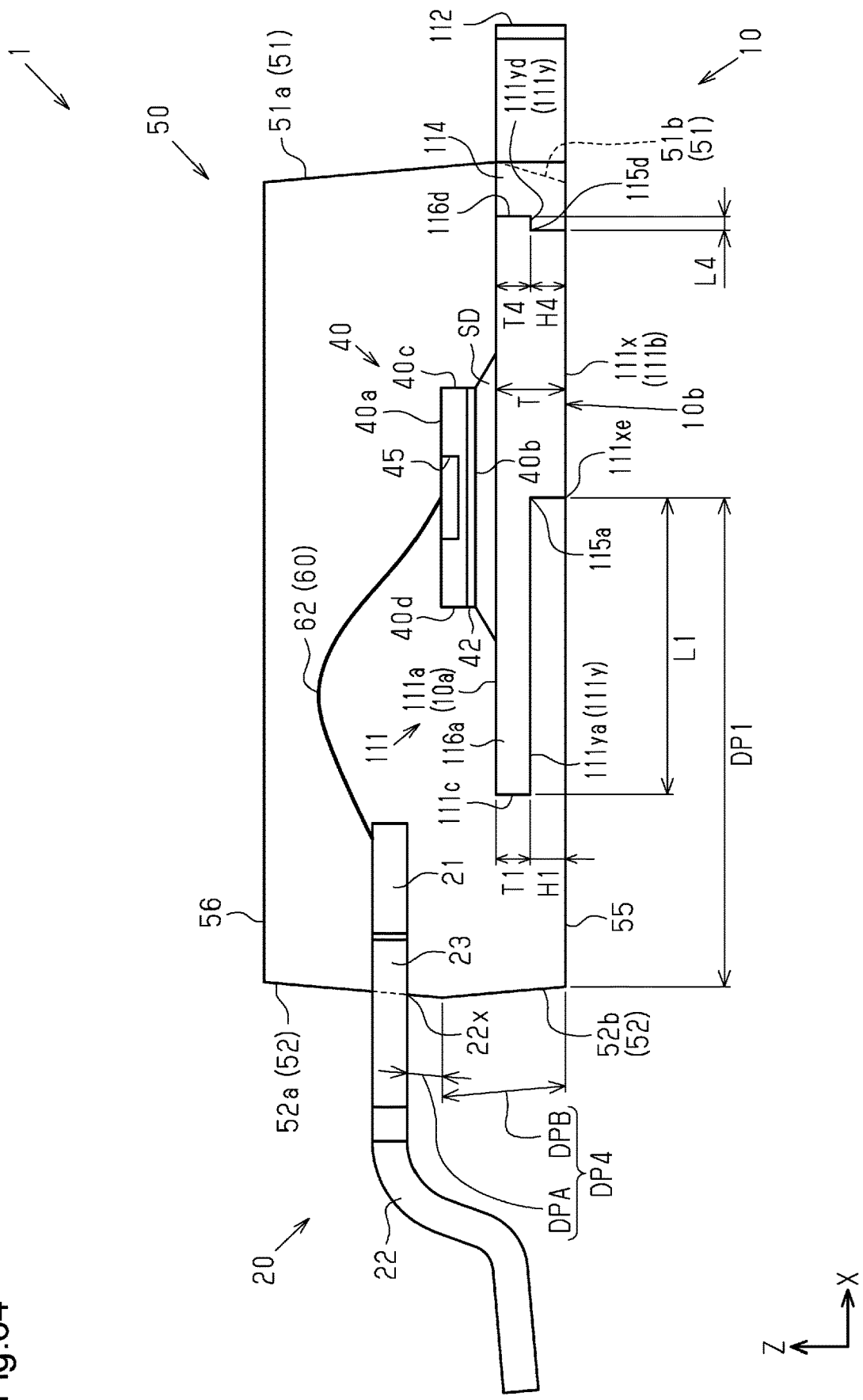
FIG. 64 is a schematic cross-sectional view showing a modified example of the semiconductor device of each embodiment.

In the embodiments, the position of the semiconductor element 40 in relation to the substrate 10 in the X direction may be changed in any manner. In an example, as shown in FIG. 64, the semiconductor element 40 may partially overlap with the first thin portion 116a. More specifically, the second side surface 40d of the semiconductor light emitting element 40 may be located on the main surface 10a of the substrate 10 at a position closer to the second encapsulation resin side surface 52 than the indent 115a of the substrate 10, and the first side surface 40c may be located on the main surface 10a at a position closer to the first encapsulation resin side surface 51 than the indent 115a. As shown in FIG. 64, the semiconductor element 40 includes a portion located toward the first encapsulation resin side surface 51 from the indent 115a and a portion located toward the second encapsulation resin side surface 52 from the indent 115a in the X direction.

Figure 65:
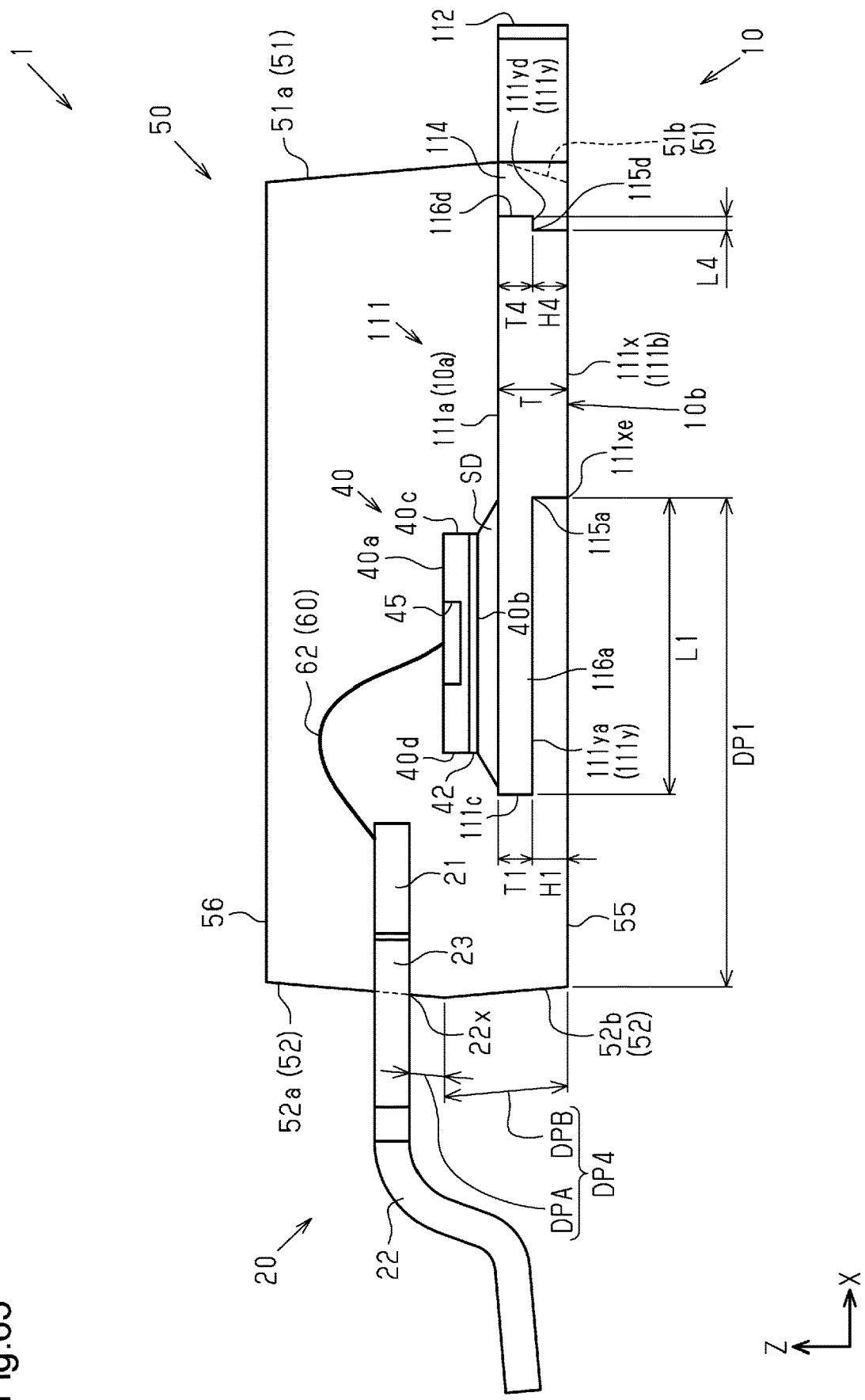
FIG. 65 is a schematic cross-sectional view showing a modified example of the semiconductor device of each embodiment.

In an example, as shown in FIG. 65, the semiconductor element 40 may entirely overlap the first thin portion 116a. More specifically, the first side surface 40c of the semiconductor light emitting element 40 may be located on the main surface 10a of the substrate 10 at a position closer to the second encapsulation resin side surface 52 than the indent 115a of the substrate 10.

This configuration decreases the distance between the semiconductor element 40 and the drive pad 21, thereby shortening the first drive wire 61 and the second drive wire 62. Thus, inductance caused by the length of the drive wires 61 and 62 is reduced.

CLAUSES

The technical aspects that are understood from the embodiments and the modified examples will be described below.

Clause 13. A semiconductor device including: a substrate including a main surface and a rear surface that face in opposite directions; a semiconductor element mounted on the main surface of the substrate, the semiconductor element including a front surface that faces in a same direction as the main surface and a drive electrode formed on the front surface and containing SiC; a drive pad; drive wires spaced apart from each other and connecting the drive electrode to the drive pad; an encapsulation resin that encapsulates the semiconductor element; and a terminal projecting from a first side surface of the encapsulation resin that faces in a direction parallel to the main surface, in which the drive wires include a first drive wire and a second drive wire configured to be a combination of furthermost ones of the drive wires, the first drive wire and the second drive wire are connected to the drive electrode and the drive pad so that the first drive wire and the second drive wire are located closer to each other at the drive pad than at the drive electrode as viewed in a first direction that is perpendicular to the main surface, the rear surface of the substrate includes a portion located toward the first side surface and including an indent that extends from the rear surface toward the main surface, and the encapsulation resin is partially received in the indent, so that a distance from the first side surface to an exposed surface of the rear surface of the substrate exposed from the encapsulation resin is greater than a distance from another side surface of the encapsulation resin to the exposed surface.

Clause 14. The semiconductor device according to clause 13, in which when a direction orthogonal to the first direction is a second direction, and a direction orthogonal to the first direction and the second direction is a third direction, the semiconductor element and the drive pad are located at different positions in at least the second direction, the drive wires are spaced apart from each other in the third direction, and the first drive wire and the second drive wire are ones of the drive wires located at opposite ends in the third direction.

Clause 15. The semiconductor device according to clause 13 or 14, further including: an insulation film formed on the drive electrode; and an opening formed in a portion of the insulation film to expose the drive electrode, in which the opening is rectangular so that a short-side direction conforms to the second direction and a long-side direction conforms to the third direction as viewed in the first direction, and the opening is greater than the drive pad in dimension in the third direction.

Clause 16. The semiconductor device according to any one of clauses 13 to 15, further including: an insulation film formed on the drive electrode, and an opening formed in a portion of the insulation film to expose the drive electrode, in which the opening is rectangular so that a short-side direction conforms to the second direction and a long-side direction conforms to the third direction as viewed in the first direction, the drive electrode includes an exposed region exposed by the opening, the exposed region includes a first exposed end and a second exposed end that are opposite ends in the third direction, the first drive wire is connected to a portion of the exposed region located closer to the first exposed end than a central portion of the exposed region in the third direction, and the second drive wire is connected to a portion of the exposed region located closer to the second exposed end than the central portion of the exposed region in the third direction.

Clause 17. The semiconductor device according to any one of clauses 14 to 16 in which each of the first drive wire and the second drive wire includes a drive electrode end connected to the drive electrode and a drive pad end connected to the drive pad, the drive pad includes a first end and a second end that are opposite ends in the third direction, the drive pad end of the first drive wire is connected to a portion of the drive pad located closer to the first end than a central portion of the drive pad in the third direction, and the drive pad end of the second drive wire is connected to a portion of the drive pad located closer to the second end than the central portion of the drive pad in the third direction.

Clause 18. The semiconductor device according to clause 17, in which the drive pad end of the first drive wire is connected to the first end, and the drive pad end of the second drive wire is connected to the second end.

Clause 19. The semiconductor device according to any one of clauses 13 to 18, in which the encapsulation resin includes a second side surface, the first side surface and the second side surface face in opposite directions, and the semiconductor element is mounted on a portion of the main surface of the substrate located closer to the second side surface than the indent.

Clause 20. The semiconductor device according to any one of clauses 13 to 19, in which the indent has a depth that is less than or equal to one-half of a thickness of the substrate.

Clause 21. The semiconductor device according to clause 20, in which the indent has a depth that is less than or equal to one-third of the thickness of the substrate.

Clause 22. The semiconductor device according to any one of clauses 13 to 21, in which when a direction perpendicular to the main surface of the substrate is a first direction, a direction in which the first side surface and the second side surface are arranged in a direction orthogonal to the first direction is a second direction, and a direction orthogonal to the first direction and the second direction is a third direction, the substrate includes a first thin portion formed by the indent and a second thin portion and a third thin portion that are formed by indents formed in portions of the substrate located closer to the second side surface than the indent at opposite ends of the substrate in the third direction.

Clause 23. The semiconductor device according to clause 22, in which a dimension of the first thin portion in the second direction is greater than a dimension of the second thin portion in the third direction and a dimension of the third thin portion in the third direction.

Clause 24. The semiconductor device according to any one of clauses 13 to 23, in which the encapsulation resin includes an encapsulation resin top surface that faces in the same direction as the main surface and an encapsulation resin rear surface that faces in the same direction as the rear surface, the terminal includes a terminal basal end, which is a basal end of the terminal located toward the first side surface, and the terminal basal end is located closer to the encapsulation resin top surface than the main surface.

Clause 25. The semiconductor device according to clause 24, in which the terminal basal end is located closer to the encapsulation resin top surface than the front surface of the semiconductor element.

Clause 26. A semiconductor device including: a substrate including a main surface and a rear surface that face in opposite directions; a semiconductor element mounted on the main surface of the substrate, the semiconductor element including a front surface that faces in a same direction as the main surface and a drive electrode formed on the front surface and containing SiC; a drive pad; drive wires spaced apart from each other and connecting the drive electrode to the drive pad, an encapsulation resin that encapsulates the semiconductor element, and a terminal projecting from a first side surface of the encapsulation resin that faces in a direction parallel to the main surface, in which the drive wires include a first drive wire and a second drive wire configured to be a combination of furthermost ones of the drive wires, each of the first drive wire and the second drive wire includes a drive electrode end connected to the drive electrode and a drive pad end connected to the drive pad, when a direction perpendicular to the main surface is a first direction, a direction orthogonal to the first direction is a second direction, and a direction orthogonal to the first direction and the second direction is a third direction, the semiconductor element and the drive pad are located at different positions in at least the second direction, the first drive wire and the second drive wire are spaced apart from each other in the third direction, the drive pad includes a first end and a second end that are opposite ends in the third direction, the drive pad end of the first drive wire is connected to a portion of the drive pad located closer to the first end than a central portion of the drive pad in the third direction, the drive pad end of the second drive wire is connected to a portion of the drive pad located closer to the second end than the central portion of the drive pad in the third direction, and the rear surface of the substrate includes a portion located toward the first side surface and including an indent that extends from the rear surface toward the main surface, and the encapsulation resin is partially received in the indent, so that a distance from the first side surface to an exposed surface of the rear surface of the substrate exposed from the encapsulation resin is greater than a distance from another side surface of the encapsulation resin to the exposed surface.

Clause 27. The semiconductor device according to clause 26, in which the drive pad end of the first drive wire is connected to the first end, and the drive pad end of the second drive wire is connected to the second end.

Clause 28. The semiconductor device according to clause 26 or 27, further including: an insulation film formed on the drive electrode; and an opening formed in a portion of the insulation film to expose the drive electrode, in which the opening is rectangular so that a short-side direction conforms to the second direction and a long-side direction conforms to the third direction as viewed in the first direction, and the drive pad is greater than the opening in dimension in the third direction.

Clause 29. The semiconductor device according to clause 28, in which the drive pad is greater than the semiconductor element in dimension in the third direction.

Clause 30. The semiconductor device according to clause 28 or 29, in which the drive pad is greater than one-half of the substrate in dimension in the third direction.

Clause 31. The semiconductor device according to clause 26, in which the drive pad includes a first drive pad and a second drive pad, the drive pad end of the first drive wire is connected to the first drive pad, the drive pad end of the second drive wire is connected to the second drive pad, and the first drive pad and the second drive pad are spaced apart from each other in the third direction.

Clause 32. The semiconductor device according to any one of clauses 26 to 31, in which the encapsulation resin includes a second side surface, the first side surface and the second side surface face in opposite directions, and the semiconductor element is mounted on a portion of the main surface of the substrate located closer to the second side surface than the indent.

Clause 33. The semiconductor device according to any one of clauses 26 to 32, in which the indent has a depth that is less than or equal to one-half of a thickness of the substrate.

Clause 34. The semiconductor device according to clause 33, in which the indent has a depth that is less than or equal to one-third of the thickness of the substrate.

Clause 35. The semiconductor device according to any one of clauses 26 to 34, in which when a direction perpendicular to the main surface of the substrate is a first direction, a direction in which the first side surface and a second side surface of the encapsulation resin that is a side surface opposed to the first side surface are arranged in a direction orthogonal to the first direction is a second direction, and a direction orthogonal to the first direction and the second direction is a third direction, the substrate includes a first thin portion formed by the indent and a second thin portion and a third thin portion that are formed by indents formed in portions of the substrate located closer to the second side surface than the indent at opposite ends of the substrate in the third direction.

Clause 36. The semiconductor device according to clause 35, in which a dimension of the first thin portion in the second direction is greater than a dimension of the second thin portion in the third direction and a dimension of the third thin portion in the third direction.

Clause 37. The semiconductor device according to any one of clauses 26 to 36, in which the encapsulation resin includes an encapsulation resin top surface that faces in the same direction as the main surface and an encapsulation resin rear surface that faces in the same direction as the rear surface, the terminal includes a terminal basal end, which is a basal end of the terminal located toward the first side surface, and the terminal basal end is located closer to the encapsulation resin top surface than the main surface.

Clause 38. The semiconductor device according to clause 37, in which the terminal basal end is located closer to the encapsulation resin top surface than the front surface of the semiconductor element.

Clause 2-1. A semiconductor device, comprising:
a substrate including a main surface;
a semiconductor element mounted on the main surface, the semiconductor element including a front surface that faces in a same direction as the main surface and a drive electrode formed on the front surface and containing SiC;
a drive pad; and
drive wires spaced apart from each other and connecting the drive electrode to the drive pad, wherein
the drive wires include a first drive wire and a second drive wire configured to be a combination of furthermost ones of the drive wires,
the first drive wire and the second drive wire are connected to the drive electrode and the drive pad so that the first drive wire and the second drive wire are separated from each other by a greater distance at the drive pad than at the drive electrode as viewed in a first direction that is perpendicular to the main surface.

Clause 2-2. The semiconductor device according to clause 2-1, wherein when a direction orthogonal to the first direction is a second direction, and a direction orthogonal to the first direction and the second direction is a third direction, the semiconductor element and the drive pad are located at different positions in at least the second direction, the drive wires are spaced apart from each other in the third direction, and the first drive wire and the second drive wire are ones of the drive wires located at opposite ends in the third direction.

Clause 2-3. The semiconductor device according to clause 2-2, further comprising:
an insulation film formed on the drive electrode; and
an opening formed in a portion of the insulation film to expose the drive electrode, wherein
the opening is rectangular so that a short-side direction conforms to the second direction and a long-side direction conforms to the third direction as viewed in the first direction, and
the drive pad is greater than the opening in dimension in the third direction.

Clause 2-4. The semiconductor device according to clause 2-3, wherein the drive pad is greater than the semiconductor element in dimension in the third direction.

Clause 2-5. The semiconductor device according to clause 2-3, wherein the first drive wire is connected to the drive electrode exposed in an end of the opening in the third direction.

Clause 2-6. The semiconductor device according to clause 2-2, wherein
each of the first drive wire and the second drive wire includes a drive electrode end connected to the drive electrode and a drive pad end connected to the drive pad, and
as viewed in the first direction, the drive electrode ends of the first drive wire and the second drive wire are located at a same position in the second direction and arranged in the third direction.

Clause 2-7. The semiconductor device according to clause 2-2, wherein
   each of the first drive wire and the second drive wire includes a drive electrode end connected to the drive electrode and a drive pad end connected to the drive pad, and
   as viewed in the first direction, the drive electrode ends of the first drive wire and the second drive wire are located at different positions in the second direction.

Clause 2-8. The semiconductor device according to clause 2-2, wherein
   each of the first drive wire and the second drive wire includes a drive electrode end connected to the drive electrode and a drive pad end connected to the drive pad,
   the drive pad includes a first end and a second end that are opposite ends in the third direction,
   the drive pad end of the first drive wire is connected to a portion of the drive pad located closer to the first end than a central portion of the drive pad in the third direction, and
   the drive pad end of the second drive wire is connected to a portion of the drive pad located closer to the second end than the central portion of the drive pad in the third direction.

Clause 2-9. The semiconductor device according to clause 2-8, wherein
   the drive pad end of the first drive wire is connected to the first end, and
   the drive pad end of the second drive wire is connected to the second end.

Clause 2-10. The semiconductor device according to clause 2-2, wherein the drive electrode is rectangular so that a short-side direction conforms to the second direction and a long-side direction conforms to the third direction as viewed in the first direction.

Clause 2-11. The semiconductor device according to clause 2-1, further comprising:
   an encapsulation resin that encapsulates the semiconductor element, wherein
   the encapsulation resin includes an encapsulation resin rear surface that exposes a rear surface of the substrate and an encapsulation resin top surface,
   the encapsulation resin rear surface and the encapsulation resin top surface face opposite sides in the first direction, and
   the drive pad is located closer to the encapsulation resin top surface than the semiconductor element in the first direction.

Clause 2-12. A semiconductor device, comprising:
   a substrate including a main surface;
   a semiconductor element mounted on the main surface, the semiconductor element including a front surface that faces in a same direction as the main surface and a drive electrode formed on the front surface and containing SiC,
   a drive pad; and
   drive wires spaced apart from each other and connecting the drive electrode to the drive pad, wherein
   the semiconductor element includes
      an insulation film formed on the drive electrode, and
      an opening formed in a portion of the insulation film to expose the drive electrode,
   when a direction perpendicular to the main surface is a first direction, a direction orthogonal to the first direction is a second direction, and a direction orthogonal to the first direction and the second direction is a third direction, the opening is rectangular so that a short-side direction conforms to the second direction and a long-side direction conforms to the third direction as viewed in the first direction,
   the drive wires include a first drive wire and a second drive wire configured to be a combination of furthermost ones of the drive wires,
   the drive electrode includes an exposed region exposed by the opening,
   the exposed region includes a first exposed end and a second exposed end that are opposite ends in the third direction,
   the first drive wire is connected to a portion of the exposed region located closer to the first exposed end than a central portion of the exposed region in the third direction, and
   the second drive wire is connected to a portion of the exposed region located closer to the second exposed end than the central portion of the exposed region in the third direction.

Clause 2-13. The semiconductor device according to clause 2-12, wherein
   the semiconductor element and the drive pad are located at different positions in at least the second direction,
   the drive wires are spaced apart from each other in the third direction, and
   the first drive wire and the second drive wire are ones of the drive wires located at opposite ends in the third direction.

Clause 2-14. The semiconductor device according to clause 2-12, wherein the drive pad is greater than the opening in dimension in the third direction.

Clause 2-15. The semiconductor device according to clause 2-12, wherein
   each of the first drive wire and the second drive wire includes a drive electrode end connected to the drive electrode and a drive pad end connected to the drive pad, and
   as viewed in the first direction, the drive electrode ends of the first drive wire and the second drive wire are located at a same position in the second direction and arranged in the third direction.

Clause 2-16. The semiconductor device according to clause 2-12, wherein
   each of the first drive wire and the second drive wire includes a drive electrode end connected to the drive electrode and a drive pad end connected to the drive pad,
   the drive pad includes a first end and a second end that are opposite ends in the third direction,
   the drive pad end of the first drive wire is connected to a portion of the drive pad located closer to the first end than a central portion of the drive pad in the third direction, and
   the drive pad end of the second drive wire is connected to a portion of the drive pad located closer to the second end than the central portion of the drive pad in the third direction.

Clause 2-17. The semiconductor device according to clause 2-16, wherein
   the drive pad end of the first drive wire is connected to the first end, and
   the drive pad end of the second drive wire is connected to the second end.

Clause 2-18. The semiconductor device according to clause 2-12, wherein the drive electrode is rectangular so that a short-side direction conforms to the second direction and a long-side direction conforms to the third direction as viewed in the first direction.

Clause 2-19. The semiconductor device according to clause 2-1, wherein
the semiconductor element includes a control electrode formed on the front surface, and
the semiconductor device further comprises:
a control pad; and
a control wire that connects the control electrode to the control pad.

Clause 2-20. The semiconductor device according to clause 2-19, wherein each of the drive wires and the control wire have a same diameter.

Clause 2-21. The semiconductor device according to clause 2-19, wherein
the control wire includes a control electrode end connected to the control electrode and a control pad end connected to the control pad, and
a distance between the control electrode end and the drive electrode end of one of the first drive wire and the second drive wire that is located closer to the control wire is less than a distance between the drive electrode end of the first drive wire and the drive electrode end of the second drive wire.

Clause 2-22. The semiconductor device according to clause 2-19, wherein when a direction orthogonal to the first direction is a second direction, and a direction orthogonal to the first direction and the second direction is a third direction, the semiconductor element and each of the drive pad and the control pad are located at different positions in at least the second direction, and the drive pad is located next to the control pad in the third direction.

Clause 2-23. The semiconductor device according to clause 2-19, further comprising:
a sense pad; and
a sense wire that connects the drive electrode to the sense pad.

Clause 2-24. The semiconductor device according to clause 2-23, wherein when a direction orthogonal to the first direction is a second direction, and a direction orthogonal to the first direction and the second direction is a third direction, the semiconductor element and each of the drive pad, the control pad, and the sense pad are located at different positions in at least the second direction, and the sense pad is located between the drive pad and the control pad in the third direction.

Clause 2-25. The semiconductor device according to clause 2-23, wherein each of the drive wires and the sense wire have a same diameter.

Clause 2-26. The semiconductor device according to clause 2-1, wherein the drive wires are formed of a same metal.

Clause 2-27. The semiconductor device according to clause 2-19, wherein the drive wires and the control wire are formed of a same metal.

Clause 2-28. The semiconductor device according to clause 2-23, wherein the drive wires, the control wire, and the sense wire are formed of a same metal.

Clause 2-29. The semiconductor device according to clause 2-23, wherein the drive wires, the control wire, and the sense wire have a same diameter.

Clause 2-30. The semiconductor device according to clause 2-1, wherein the drive wires contain aluminum.

Clause 2-31. The semiconductor device according to clause 2-1, wherein the semiconductor element is a SiC MOSFET.

Clause 2-32. The semiconductor device according to clause 2-31, wherein the SiC MOSFET switches when a signal is greater than or equal to 1 kHz or less than or equal to 100 kHz.

Clause 2-33. The semiconductor device according to clause 2-1, wherein the semiconductor element is a Schottky barrier diode.

Clause 2-34. The semiconductor device according to clause 2-1, wherein when a direction orthogonal to the first direction is a second direction, and a direction orthogonal to the first direction and the second direction is a third direction, the semiconductor device has a dimension in the third direction that is less than or equal to 10 mm.

Clause 2-35. A semiconductor device, comprising:
a substrate including a main surface and a rear surface that face in opposite directions;
a semiconductor element mounted on the main surface of the substrate and containing SiC;
an encapsulation resin that encapsulates the semiconductor element and
a terminal projecting from a first side surface of the encapsulation resin that faces in a direction parallel to the main surface, wherein
the rear surface of the substrate includes a portion located toward the first side surface and including an indent that extends from the rear surface toward the main surface, and
the encapsulation resin is partially received in the indent, so that a distance from the first side surface to an exposed surface of the rear surface of the substrate exposed from the encapsulation resin is greater than a distance from another side surface of the encapsulation resin to the exposed surface.

Clause 2-36. The semiconductor device according to clause 2-35, wherein
the encapsulation resin includes a second side surface,
the first side surface and the second side surface face in opposite directions,
when a direction perpendicular to the main surface of the substrate is a first direction, and a direction in which the first side surface and the second side surface are arranged in a direction orthogonal to the first direction is a second direction, an edge of the exposed surface located toward the first side surface is located closer to the second side surface in the second direction than a central portion of the encapsulation resin in the second direction as viewed in the first direction.

Clause 2-37. The semiconductor device according to clause 2-35, wherein
the encapsulation resin includes a second side surface,
the first side surface and the second side surface face in opposite directions, and
the semiconductor element is mounted on a portion of the main surface of the substrate located closer to the second side surface than the indent.

Clause 2-38. The semiconductor device according to clause 2-37, wherein when a direction perpendicular to the main surface of the substrate is a first direction, and a direction in which the first side surface and the second side surface are arranged in a direction orthogonal to the first direction is a second direction, as viewed in the first direction, an end of the semiconductor element located toward the first side surface is arranged on a portion of the main surface of the substrate located closer to the second side surface in the second direction than a central portion of the encapsulation resin in the second direction.

Clause 2-39. The semiconductor device according to clause 2-37, wherein when a direction perpendicular to the main surface of the substrate is a first direction, and a direction in which the first side surface and the second side surface are arranged in a direction orthogonal to the first direction is a second direction, the substrate includes a narrow portion located next to the second side surface in the second direction as viewed in the first direction, and the semiconductor element is located next to the narrow portion in the second direction as viewed in the first direction.

Clause 2-40. The semiconductor device according to clause 2-35, wherein the indent has a depth that is less than or equal to one-half of a thickness of the substrate.

Clause 2-41. The semiconductor device according to clause 2-40, wherein the depth of the indent is less than or equal to one-third of the thickness of the substrate.

Clause 2-42. The semiconductor device according to clause 2-35, wherein the indent has a depth that is greater than or equal to one-third of a thickness of the substrate and less than the thickness of the substrate.

Clause 2-43. The semiconductor device according to clause 2-35, wherein
the encapsulation resin has a second side surface, and
the first side surface and the second side surface face in opposite directions, when a direction perpendicular to the main surface of the substrate is a first direction, and a direction in which the first side surface and the second side surface are arranged in a direction orthogonal to the first direction is a second direction, the substrate includes a first thin portion formed by the indent and a second thin portion and a third thin portion that are formed by indents formed in portions of the substrate located closer to the second side surface than the indent in the second direction at opposite ends of the substrate in the third direction.

Clause 2-44. The semiconductor device according to clause 2-43, wherein when a direction orthogonal to the first direction and the second direction is a third direction, a dimension of the first thin portion in the second direction is greater than a dimension of the second thin portion in the third direction and a dimension of the third thin portion in the third direction.

Clause 2-45. The semiconductor device according to clause 2-43, wherein
the first thin portion includes a through hole extending through the first thin portion in the first direction, the encapsulation resin is partially received in the through hole.

Clause 2-46. The semiconductor device according to clause 2-35, wherein
the encapsulation resin includes an encapsulation resin top surface that faces in the same direction as the main surface, and
when a direction orthogonal to the main surface of the substrate is a first direction, the terminal includes a terminal basal end, which is a basal end of the terminal located toward the first side surface, and the terminal basal end is located closer to the encapsulation resin top surface than the main surface in the first direction.

Clause 2-47. The semiconductor device according to clause 2-46, wherein
the semiconductor element includes a front surface that faces in the same direction as the main surface,
the terminal basal end is located closer to the encapsulation resin top surface than the front surface of the semiconductor element in the first direction.

Clause 2-48. The semiconductor device according to clause 2-46, wherein when a direction perpendicular to the main surface of the substrate is a first direction, the terminal basal end is located closer to the encapsulation resin top surface in the first direction than a central portion of the encapsulation resin in the first direction.

Clause 2-49. The semiconductor device according to clause 2-35, wherein
the encapsulation resin includes an encapsulation resin rear surface that faces in the same direction as the rear surface of the substrate,
the encapsulation resin includes a recess recessed from the encapsulation resin rear surface at a position between the first side surface and the exposed surface.

Clause 2-50. The semiconductor device according to clause 2-35, wherein
the encapsulation resin includes a second side surface, and
the first side surface and the second side surface face in opposite directions,
the substrate includes an extension exposed in a side surface of the encapsulation resin that is different from the first side surface and the second side surface.

Clause 2-51. The semiconductor device according to clause 2-50, wherein the extension is arranged in a portion of the substrate located closer to the second side surface than the indent.

Clause 2-52. The semiconductor device according to clause 2-35, wherein
the semiconductor element includes a front surface that faces in the same direction as the main surface and a drive electrode formed on the front surface,
the semiconductor device further comprises:
a drive pad; and
drive wires spaced apart from each other and connecting the drive electrode to the drive pad, wherein
the drive wires include a first drive wire and a second drive wire configured to be a combination of furthermost ones of the drive wires,
the first drive wire and the second drive wire are connected to the drive electrode and the drive pad so that the first drive wire and the second drive wire are separated from each other by a greater distance at the drive pad than at the drive electrode as viewed in a first direction that is perpendicular to the main surface.

Clause 2-53. The semiconductor device according to clause 2-52, wherein when a direction orthogonal to the first direction is a second direction, and a direction orthogonal to the first direction and the second direction is a third direction, the semiconductor element and the drive pad are located at different positions in at least the second direction, the drive wires are spaced apart from each other in the third direction, and the first drive wire and the second drive wire are ones of the drive wires located at opposite ends in the third direction.

Clause 2-54. The semiconductor device according to clause 2-52, wherein the substrate and the drive pad are formed of a same metal.

Clause 2-55. The semiconductor device according to clause 2-52, wherein
the semiconductor element includes
an insulation film formed on the drive electrode, and
an opening formed in a portion of the insulation film to expose the drive electrode, the opening is rectangular so that a short-side direction conforms to the second direction and a long-side direction conforms to the third direction as viewed in the first direction, and the drive pad is greater than the opening in dimension in the third direction.

Clause 2-56. The semiconductor device according to clause 2-55, wherein the drive pad is greater than the semiconductor element in dimension in the third direction.

Clause 2-57. The semiconductor device according to clause 2-55, wherein the first drive wire is connected to the drive electrode exposed in an end of the opening in the third direction.

Clause 2-58. The semiconductor device according to clause 2-55, wherein
 each of the first drive wire and the second drive wire includes a drive electrode end connected to the drive electrode and a drive pad end connected to the drive pad, and
 as viewed in the first direction, the drive electrode ends of the first drive wire and the second drive wire are located at a same position in the second direction and arranged in the third direction.

Clause 2-59. The semiconductor device according to clause 2-55, wherein
 each of the first drive wire and the second drive wire includes a drive electrode end connected to the drive electrode and a drive pad end connected to the drive pad, and
 as viewed in the first direction, the drive electrode ends of the first drive wire and the second drive wire are located at different positions in the second direction.

Clause 2-60. The semiconductor device according to clause 2-55, wherein
 each of the first drive wire and the second drive wire includes a drive electrode end connected to the drive electrode and a drive pad end connected to the drive pad,
 the drive pad includes a first end and a second end that are opposite ends in the third direction,
 the drive pad end of the first drive wire is connected to a portion of the drive pad located closer to the first end than a central portion of the drive pad in the third direction, and
 the drive pad end of the second drive wire is connected to a portion of the drive pad located closer to the second end than the central portion of the drive pad in the third direction.

Clause 2-61. The semiconductor device according to clause 2-60, wherein
 the drive pad end of the first drive wire is connected to the first end, and
 the drive pad end of the second drive wire is connected to the second end.

Clause 2-62. The semiconductor device according to clause 2-55, wherein the drive electrode is rectangular so that a short-side direction conforms to the second direction and a long-side direction conforms to the third direction as viewed in the first direction.

Clause 2-63. The semiconductor device according to clause 2-35, wherein
 the semiconductor element includes
  a front surface that faces in the same direction as the main surface,
  a drive electrode formed on the front surface,
  an insulation film formed on the drive electrode, and
  an opening formed in a portion of the insulation film to expose the drive electrode,
 the semiconductor device further comprises:
  a drive pad; and
  drive wires spaced apart from each other and connecting the drive electrode to the drive pad,
 when a direction perpendicular to the main surface is a first direction, a direction orthogonal to the first direction is a second direction, and a direction orthogonal to the first direction and the second direction is a third direction, the opening is rectangular so that a short-side direction conforms to the second direction and a long-side direction conforms to the third direction as viewed in the first direction,
 the drive wires include a first drive wire and a second drive wire configured to be a combination of furthermost ones of the drive wires,
 the drive electrode includes an exposed region exposed by the opening,
 the exposed region includes a first exposed end and a second exposed end that are opposite ends in the third direction,
 the first drive wire is connected to a portion of the exposed region located closer to the first exposed end than a central portion of the exposed region in the third direction, and
 the second drive wire is connected to a portion of the exposed region located closer to the second exposed end than the central portion of the exposed region in the third direction.

Clause 2-64. The semiconductor device according to clause 2-63, wherein
 the semiconductor element and the drive pad are located at different positions in at least the second direction,
 the drive wires are spaced apart from each other in the third direction, and
 the first drive wire and the second drive wire are ones of the drive wires located at opposite ends in the third direction.

Clause 2-65. The semiconductor device according to clause 2-63, wherein the drive pad is greater than the opening in dimension in the third direction.

Clause 2-66. The semiconductor device according to clause 2-63, wherein
 each of the first drive wire and the second drive wire includes a drive electrode end connected to the drive electrode and a drive pad end connected to the drive pad, and
 as viewed in the first direction, the drive electrode ends of the first drive wire and the second drive wire are located at a same position in the second direction and arranged in the third direction.

Clause 2-67. The semiconductor device according to clause 2-63, wherein
 each of the first drive wire and the second drive wire includes a drive electrode end connected to the drive electrode and a drive pad end connected to the drive pad,
 the drive pad includes a first end and a second end that are opposite ends in the third direction,
 the drive pad end of the first drive wire is connected to a portion of the drive pad located closer to the first end than a central portion of the drive pad in the third direction, and the drive pad end of the second drive wire is connected to a portion of the drive pad located closer to the second end than the central portion of the drive pad in the third direction.

Clause 2-68. The semiconductor device according to clause 2-67, wherein
the drive pad end of the first drive wire is connected to the first end, and
the drive pad end of the second drive wire is connected to the second end. Clause 2-69. The semiconductor device according to clause 2-63, wherein the drive electrode is rectangular so that a short-side direction conforms to the second direction and a long-side direction conforms to the third direction as viewed in the first direction.

Clause 2-70. The semiconductor device according to clause 2-52, wherein
the semiconductor element includes a control electrode formed on the front surface, and
the semiconductor device further comprises:
a control pad; and
a control wire that connects the control electrode to the control pad.

Clause 2-71. The semiconductor device according to clause 2-70, wherein each of the drive wires and the control wire have a same diameter.

Clause 2-72. The semiconductor device according to clause 2-70, wherein
the control wire includes a control electrode end connected to the control electrode and a control pad end connected to the control pad, and
a distance between the control electrode end and the drive electrode end of one of the first drive wire and the second drive wire that is located closer to the control wire is less than a distance between the drive electrode end of the first drive wire and the drive electrode end of the second drive wire.

Clause 2-73. The semiconductor device according to clause 2-70, wherein when a direction orthogonal to the first direction is a second direction, and a direction orthogonal to the first direction and the second direction is a third direction, the semiconductor element and each of the drive pad and the control pad are located at different positions in at least the second direction, and the drive pad is located next to the control pad in the third direction.

Clause 2-74. The semiconductor device according to clause 2-70, wherein the substrate, the drive pad, and the control pad are formed of a same metal.

Clause 2-75. The semiconductor device according to clause 2-70, further comprising:
a sense pad; and
a sense wire that connects the drive electrode to the sense pad.

Clause 2-76. The semiconductor device according to clause 2-75, wherein when a direction orthogonal to the first direction is a second direction, and a direction orthogonal to the first direction and the second direction is a third direction, the semiconductor element and each of the drive pad, the control pad, and the sense pad are located at different positions in at least the second direction, and the sense pad is located between the drive pad and the control pad in the third direction.

Clause 2-77. The semiconductor device according to clause 2-75, wherein the substrate, the drive pad, the control pad, and the sense pad are formed of a same metal.

Clause 2-78. The semiconductor device according to clause 2-75, wherein each of the drive wires and the sense wire have a same diameter.

Clause 2-79. The semiconductor device according to clause 2-52, wherein the drive wires are formed of a same metal.

Clause 2-80. The semiconductor device according to clause 2-70, wherein the drive wires and the control wire are formed of a same metal.

Clause 2-81. The semiconductor device according to clause 2-76, wherein the drive wires, the control wire, and the sense wire are formed of a same metal.

Clause 2-82. The semiconductor device according to clause 2-76, wherein the drive wires, the control wire, and the sense wire have a same diameter.

Clause 2-83. The semiconductor device according to clause 2-52, wherein the drive wires contain aluminum.

Clause 2-84. The semiconductor device according to clause 2-35, wherein the semiconductor element is a SiC MOSFET.

Clause 2-85. The semiconductor device according to clause 2-84, wherein the SiC MOSFET switches when a signal is greater than or equal to 1 kHz or less than or equal to 100 kHz.

Clause 2-86. The semiconductor device according to clause 2-35, wherein when a direction perpendicular to the main surface of the substrate is a first direction, a direction orthogonal to the first direction is a second direction, and a direction orthogonal to the first direction and the second direction is a third direction, the semiconductor device has a dimension in the third direction that is less than or equal to 10 mm.

DESCRIPTION OF THE REFERENCE NUMERALS 1) semiconductor device; 10) substrate; 10a) main surface; 10b) rear surface; 21) drive pad; 21C) first drive pad (drive pad); 21D) second drive pad (drive pad); 21a) first end; 21b) second end; 21c) first end; 21d) second end; 21e) first end; 21f) second end; 31) control pad; 40) semiconductor element; 40a) front surface; 41) main surface drive electrode (drive electrode); 43) control electrode; 44) passivation film (insulation film); 45) opening; 45A) first opening (opening); 46) exposed region 46a) first exposed end; 46b) second exposed end; 50) encapsulation resin; 55) encapsulation resin rear surface; 56) encapsulation resin top surface; 60) drive wires; 61) first drive wire (drive wire); 61a) drive electrode end; 61b) drive pad end; 62) second drive wire (drive wire); 62a) drive electrode end; 62b) drive pad end; 63) third drive wire (drive wire); 63a) drive electrode end; 63b) drive pad end; 64) fourth drive wire (drive wire); 64a) drive electrode end; 64b) drive pad end; 70) control wire; 81) sense pad; 90) sense wire; X) longitudinal direction (second direction); Y) lateral direction (third direction); Z) thickness-wise direction (first direction); 111x) exposed surface; 113) narrow portion; 115a) indent; 115b) indent 115c) indent; 116a) first thin portion; 116b) second thin portion; 116c) third thin portion; 118A, 118B) extension; 119) through hole; 22) drive terminal (terminal); 22x) terminal base end; 22xa to 22xe) terminal base end; 51) first encapsulation resin side surface (second side surface); 52) second encapsulation resin side surface (first side surface); 59a) recess

The invention claimed is:
1. A semiconductor device, comprising:
a substrate including a main surface;
a semiconductor element mounted on the main surface, the semiconductor element including a front surface that faces in a same direction as the main surface and a first electrode formed on the front surface and containing SiC;
a first pad arranged away from the substrate; and
wires spaced apart from each other and connecting the first electrode to the first pad, wherein
the wires include a first wire and a second wire configured to be a combination of furthermost ones of the wires,
the first wire and the second wire are connected to the first electrode and the first pad so that the first wire and the second wire are separated from each other by a greater distance at the first pad than at the first electrode as viewed in a first direction that is perpendicular to the main surface,
when a direction orthogonal to the first direction is a second direction, and a direction orthogonal to the first direction and the second direction is a third direction, the semiconductor element and the first pad are located at different positions in at least the second direction, the wires are spaced apart from each other in the third direction, and the first wire and the second wire are ones of the wires located at opposite ends in the third direction, and
the semiconductor device further comprises:
an insulation film formed on the first electrode; and
an opening formed in a portion of the insulation film to expose the first electrode, wherein
the opening is rectangular so that a short-side direction conforms to the second direction and a long-side direction conforms to the third direction as viewed in the first direction, and
a dimension of the first pad in the third direction is greater than a dimension of the opening in the third direction.

2. The semiconductor device according to claim 1, wherein the first pad is greater than the semiconductor element in dimension in the third direction.

3. The semiconductor device according to claim 1, wherein the first wire is connected to an end of the first electrode in the third direction exposed in the opening.

4. The semiconductor device according to claim 1, wherein
each of the first wire and the second wire includes a first electrode end connected to the first electrode and a first pad end connected to the first pad, and
as viewed in the first direction, the first electrode ends of the first wire and the second wire are located at a same position in the second direction and arranged in the third direction.

5. The semiconductor device according to claim 1, wherein
each of the first wire and the second wire includes a first electrode end connected to the first electrode and a first pad end connected to the first pad, and
as viewed in the first direction, the first electrode ends of the first wire and the second wire are located at different positions in the second direction.

6. A semiconductor device, comprising:
a substrate including a main surface;
a semiconductor element mounted on the main surface, the semiconductor element including a front surface that faces in a same direction as the main surface and a first electrode formed on the front surface and containing SiC;
a first pad arranged away from the substrate; and
wires spaced apart from each other and connecting the first electrode to the first pad, wherein
the semiconductor element includes
an insulation film formed on the first electrode, and
an opening formed in a portion of the insulation film to expose the first electrode,
when a direction perpendicular to the main surface is a first direction, a direction orthogonal to the first direction is a second direction, and a direction orthogonal to the first direction and the second direction is a third direction, the opening is rectangular so that a short-side direction conforms to the second direction and a long-side direction conforms to the third direction as viewed in the first direction,
the wires are arranged along the long-side direction and include a first wire and a second wire configured to be a combination of furthermost ones of the wires,
the first electrode includes an exposed region exposed by the opening,
the exposed region includes a first exposed end and a second exposed end that are opposite ends in the third direction,
a portion of the first wire connected to the exposed region is connected to a portion of the exposed region located closer to the first exposed end than a central portion of the exposed region in the long-side direction, and
a portion of the second wire connected to the exposed region is connected to a portion of the exposed region located closer to the second exposed end than the central portion of the exposed region in the long-side direction.

7. The semiconductor device according to claim 6, wherein
the semiconductor element and the first pad are located at different positions in at least the second direction,
the wires are spaced apart from each other in the third direction, and
the first wire and the second wire are ones of the wires located at opposite ends in the third direction.

8. The semiconductor device according to claim 6, wherein the first pad is greater than the opening in dimension in the third direction.

9. The semiconductor device according to claim 6, wherein
each of the first wire and the second wire includes a first electrode end connected to the first electrode and a first pad end connected to the first pad, and
as viewed in the first direction, the first electrode ends of the first wire and the second wire are located at a same position in the second direction and arranged in the third direction.

10. The semiconductor device according to claim 6, wherein
each of the first wire and the second wire includes a first electrode end connected to the first electrode and a first pad end connected to the first pad,
the first pad includes a first end and a second end that are opposite ends in the third direction,
the first pad end of the first wire is connected to a portion of the first pad located closer to the first end than a central portion of the first pad in the third direction, and
the first pad end of the second wire is connected to a portion of the first pad located closer to the second end than the central portion of the first pad in the third direction.

11. The semiconductor device according to claim 10, wherein
the first pad end of the first wire is connected to the first end, and the first pad end of the second wire is connected to the second end.

12. The semiconductor device according to claim 6, wherein the first electrode is rectangular so that a short-side direction conforms to the second direction and a long-side direction conforms to the third direction as viewed in the first direction.

13. A semiconductor device, comprising:
a substrate including a main surface and a rear surface that face in opposite directions;
a semiconductor element mounted on the main surface of the substrate and containing SiC;
an encapsulation resin that encapsulates the semiconductor element and at least a portion of the substrate; and
a first terminal projecting from a first side surface of the encapsulation resin in a direction parallel to the main surface, wherein
the rear surface of the substrate includes a portion located toward the first side surface and including an indent that extends from a portion of the rear surface below the semiconductor element toward the main surface, and
the encapsulation resin is partially received in the indent, so that a distance from the first side surface to an exposed surface of the rear surface of the substrate exposed from the encapsulation resin is greater than a distance from another side surface of the encapsulation resin to the exposed surface.

14. The semiconductor device according to claim 13, wherein
the encapsulation resin includes a second side surface,
a second terminal of the semiconductor device projects from the second side surface,
the first side surface and the second side surface face in opposite directions, and
when a direction perpendicular to the main surface of the substrate is a first direction, and a direction in which the first side surface and the second side surface are arranged in a direction orthogonal to the first direction is a second direction, an edge of the exposed surface located toward the first side surface is located closer to the second side surface in the second direction than a central portion of the encapsulation resin in the second direction as viewed in the first direction.

15. The semiconductor device according to claim 14, wherein
the second side surface is located at an opposite side of the first side surface, and
the semiconductor element is mounted on a portion of the main surface of the substrate located closer to the second side surface than the indent.

16. The semiconductor device according to claim 15, wherein when a direction perpendicular to the main surface of the substrate is a first direction, and a direction in which the first side surface and the second side surface are arranged in a direction orthogonal to the first direction is a second direction, as viewed in the first direction, an end of the semiconductor element located toward the first side surface is arranged on a portion of the main surface of the substrate located closer to the second side surface in the second direction than a central portion of the encapsulation resin in the second direction.

17. The semiconductor device according to claim 14, wherein when a direction perpendicular to the main surface of the substrate is a first direction, and a direction in which the first side surface and the second side surface are arranged in a direction orthogonal to the first direction is a second direction, the substrate includes narrow portions connected to a portion of the second terminal projecting from the second side surface in the second direction and located adjacent to each other along the second side surface as viewed in the first direction, and the semiconductor element is located away from the narrow portion in the second direction as viewed in the first direction.

18. The semiconductor device according to claim 13, wherein the indent has a depth that is less than or equal to one-half of a thickness of the substrate.

19. The semiconductor device according to claim 1, wherein
the substrate is formed of metal and includes a second pad on which the semiconductor element is arranged,
the semiconductor element includes a second electrode and a third electrode, the second electrode formed on a portion of the semiconductor element located closer to the substrate and electrically connected to the substrate, the third electrode formed on the front surface of the semiconductor element and performs a switching operation between the first electrode and the second electrode, and
the semiconductor device further comprises:
a third pad arranged away from the substrate and the first pad; and
a third wire connecting the third electrode to the third pad.

20. The semiconductor device according to claim 19, wherein
the semiconductor element is a MOSFET,
the first electrode is a source electrode,
the second electrode is a drain electrode, and
the third electrode is a gate electrode.

\* \* \* \* \*